United States Patent
Park et al.

(10) Patent No.: US 12,279,517 B2
(45) Date of Patent: Apr. 15, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Bumwoo Park, Yongin-si (KR); Ohyun Kwon, Seoul (KR); Sangdong Kim, Seongnam-si (KR); Virendra Kumar Rai, Hwaseong-si (KR); Hwayoung Cho, Hwaseong-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 876 days.

(21) Appl. No.: 17/382,952

(22) Filed: Jul. 22, 2021

(65) Prior Publication Data

US 2022/0246866 A1 Aug. 4, 2022

(30) Foreign Application Priority Data

Jan. 28, 2021 (KR) .................. 10-2021-0012634

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ............. H01L 51/0085; H01L 51/5012; H01L 51/009; H01L 51/0094; C07F 15/0033; C09K 11/06
(Continued)

(56) References Cited

U.S. PATENT DOCUMENTS 9,478,756 B2 10/2016 Lee et al.
9,512,355 B2 12/2016 Ma et al.
(Continued)

FOREIGN PATENT DOCUMENTS

JP 2016219490 A 12/2016
KR 20160073788 A 6/2016
(Continued)

OTHER PUBLICATIONS

English Translation of Office Action dated Sep. 19, 2024, issued in corresponding KR Patent Application No. 10-2021-0012634, 8 pp.
(Continued)

*Primary Examiner* — Vu A Nguyen
(74) *Attorney, Agent, or Firm* — CANTOR COLBURN LLP

(57) ABSTRACT

An organometallic compound, represented by Formula 1:

$$M(L_1)_{n1}(L_2)_{n2} \quad \text{Formula 1}$$

wherein M is a transition metal, $L_1$ is a ligand represented by Formula 2-1, $L_2$ is a ligand represented by Formula 2-2, n1 is 0, 1, or 2, n2 is 1, 2, or 3, and $L_1$ and $L_2$ are different from each other, (Continued)

Formula 2-1

Formula 2-2 wherein $R_1$ to $R_4$, rings $CY_1$ to $CY_3$, rings $CY_{41}$ and $CY_{42}$, $Y_1$ to $Y_3$, $X_4$, $Z_4$, a1 to a3, b4, *, and *' are each as defined herein.

22 Claims, 1 Drawing Sheet

(51) Int. Cl.
| | |
|---|---|
| *C09K 11/06* | (2006.01) |
| *H10K 85/40* | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.
CPC ......... *H10K 85/361* (2023.02); *H10K 85/40* (2023.02); *C09K 2211/1033* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search
USPC .......................................................... 428/690
See application file for complete search history.

(56) References Cited

U.S. PATENT DOCUMENTS

| | | | |
|---|---|---|---|
| 9,923,154 B2 | 3/2018 | Oshiyama et al. | |
| 10,454,046 B2 | 10/2019 | Ma et al. | |
| 2008/0074033 A1 | 3/2008 | Ionkin et al. | |
| 2014/0103316 A1* | 4/2014 | Kim ..................... | C09K 11/06 257/40 |
| 2016/0190485 A1* | 6/2016 | Boudreault ......... | H10K 85/342 546/4 |
| 2016/0190486 A1* | 6/2016 | Lin ........................ | C09K 11/06 546/4 |
| 2020/0287143 A1* | 9/2020 | Kim ..................... | H10K 85/342 |
| 2021/0020839 A1 | 1/2021 | Choi et al. | |
| 2021/0050533 A1 | 2/2021 | Choi et al. | |
| 2022/0259237 A1 | 8/2022 | Lee et al. | |

FOREIGN PATENT DOCUMENTS

| | | |
|---|---|---|
| KR | 1020160109909 A | 9/2016 |
| KR | 1020180020878 A | 2/2018 |
| KR | 20190053610 A | 5/2019 |
| WO | 2012111548 A1 | 8/2012 |
| WO | 2016056562 A1 | 4/2016 |

OTHER PUBLICATIONS

Office Action dated Sep. 19, 2024, issued in corresponding KR Patent Application No. 10-2021-0012634, 9 pp.

* cited by examiner

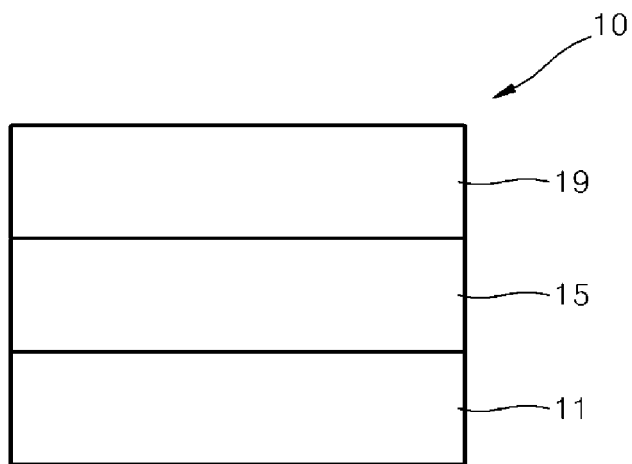

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to Korean Patent Application No. 10-2021-0012634, filed on Jan. 28, 2021, in the Korean Intellectual Property Office, and all the benefits accruing therefrom under 35 U.S.C. § 119, the content of which is incorporated by reference herein in its entirety.

BACKGROUND

1. Field

One or more embodiments relate to an organometallic compound, an organic light-emitting device including the same, and an electronic apparatus including the organic light-emitting device.

2. Description of the Related Art

Organic light-emitting devices (OLEDs) are self-emissive devices, which have improved characteristics in terms of viewing angles, response time, brightness, driving voltage, and response speed. In addition, OLEDs can be used to produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light, for example visible light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to an aspect, provided is an organometallic compound represented by Formula 1.

$$M(L_1)_{n1}(L_2)_{n2} \qquad \text{Formula 1}$$

In Formula 1,
M is a transition metal,
$L_1$ is a ligand represented by Formula 2-1,
n1 is 0, 1, or 2, wherein, when n1 is 2 or more, two or more $L_1$(s) are identical to or different from each other,
$L_2$ is a ligand represented by Formula 2-2,
n2 is 1, 2, or 3, wherein, when n2 is 2 or more, two or more $L_2$(s) are identical to or different from each other, and
$L_1$ and $L_2$ are different from each other,

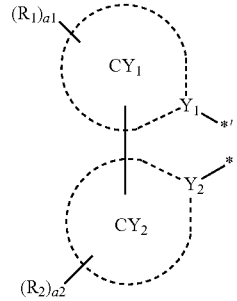

Formula 2-1

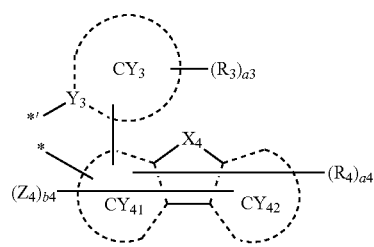

Formula 2-2

$$\text{*-}(T_4)_{c4}\text{-}Y_4(Q_{41})(Q_{42})(Q_{43}) \qquad \text{Formula 3}$$

wherein, $Y_1$ and $Y_2$ in Formula 2-1 are each independently C or N,
$Y_3$ in Formula 2-2 is N,
a bond between $Y_3$ in Formula 2-2 and M in Formula 1 is a coordinate bond,
ring $CY_1$, ring $CY_2$, and ring $CY_3$ in Formulae 2-1 and 2-2 are each independently a $C_5$-$C_{30}$ carbocyclic group or a $C_1$-$C_{30}$ heterocyclic group,
ring $CY_{41}$ and ring $CY_{42}$ in Formula 2-2 are each independently a π electron-rich $C_5$-$C_{30}$ cyclic group,
a carbon atom of ring $CY_{41}$ in Formula 2-2 and M in Formula 1 are bonded to each other via a covalent bond,
$X_4$ in Formula 2-2 is O, S, Se, $N(R_{48})$, $C(R_{48})(R_{49})$, or $Si(R_{48})(R_{49})$,
$Z_4$ in Formula 2-2 is a group represented by Formula 3,
b4 in Formula 2-2 is an integer from 1 to 20,
$Y_4$ in Formula 3 is Si or Ge,
$T_4$ in Formula 3 is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$,
c4 in Formula 3 is an integer from 1 to 10,
$R_1$ to $R_4$, $R_{48}$, $R_{49}$, and $Q_{41}$ to $Q_{43}$ in Formulae 2-1, 2-2, and 3 re each independently hydrogen, deuterium, —F, —Cl, —Br, —I, —SF$_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 to a4 in Formulae 2-1 and 2-2 are each independently an integer from 0 to 20, $R_{10a}$ is as defined in connection with $R_2$,

* and *' in Formulae 2-1 and 2-2 each indicate a binding site to M in Formula 1,

* in Formula 3 indicates a binding site to a neighboring atom, two or more of a plurality of $R_1$(s) in Formula 2-1 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$(s) in Formula 2-1 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$(s) in Formula 2-2 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$(s) in Formula 2-2 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_4$ are optionally inked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or a combination thereof, —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

According to another aspect, provided is an organic light-emitting device including a first electrode, a second electrode, and an organic layer located between the first electrode and the second electrode, wherein the organic layer includes an emission layer, and wherein the organic layer further includes at least one of the organometallic compound represented by Formula 1.

The organometallic compound may be included in the emission layer, and the organometallic compound included in the emission layer may act as a dopant.

According to another aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with the accompanying drawing, wherein FIGURE is a schematic cross-sectional view of an organic light-emitting device according to one or more embodiments.

DETAILED DESCRIPTION

Reference will now be made in detail to one or more exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect provides an organometallic compound, which is represented by Formula 1:

$$M(L_1)_{n1}(L_2)_{n2} \qquad \text{Formula 1}$$

wherein, M in Formula 1 is a transition metal.

In one or more embodiments, M may be a first-row transition metal of the Periodic Table of Elements, a second-row transition metal of Periodic Table of Elements, or a third-row transition metal of Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

In Formula 1, $L_1$ is a ligand represented by Formula 2-1, and $L_2$ is a ligand represented by Formula 2-2:

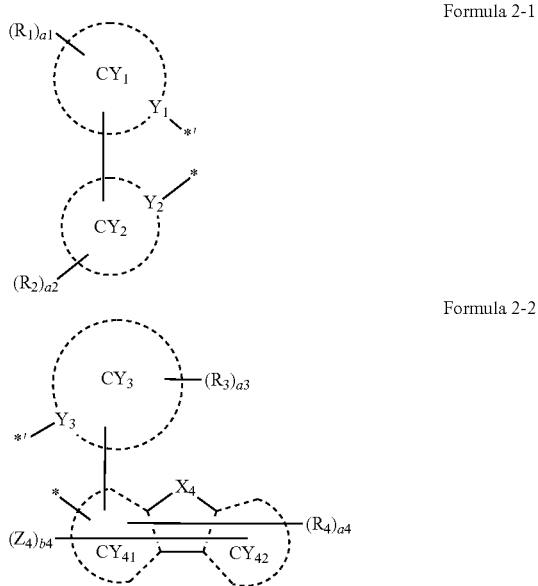

Formula 2-1

Formula 2-2 wherein Formulae 2-1 and 2-2 are each as defined in the present specification.

$Z_4$ in Formula 2-2 is a group represented by Formula 3:

*-$(T_4)_{c4}$-$Y_4(Q_{41})(Q_{42})(Q_{43})$     Formula 3 wherein Formula 3 is as defined in the present specification.

n1 and n2 in Formula 1 indicate numbers of groups $L_1$ and $L_2$, respectively, wherein n1 is 0, 1, or 2, and n2 is 1, 2, or 3. When n1 is 2, two $L_1$(s) are identical to or different from each other, and when n2 is 2, two $L_2$(s) are identical to or different from each other.

In one or more embodiments, in Formula 1, i) n1 may be 2, and n2 may be 1, ii) n1 may be 1, and n2 may be 2, or iii) n2 may be 3.

In one or more embodiments, in Formula 1, i) M may be Ir or Os, and the sum of n1 and n2 may be 3 or 4, or ii) M may be Pt, and the sum of n1 and n2 may be 2.

$L_1$ and $L_2$ in Formula 1 are different from each other.

$Y_1$ and $Y_2$ in Formula 2-1 are each independently C or N.

In one or more embodiments, $Y_1$ may be N, and $Y_2$ may be C.

$Y_3$ in Formula 2-2 is N.

A bond between $Y_3$ in Formula 2-2 and M in Formula 1 is a coordinate bond.

Ring $CY_1$ to ring $CY_3$ in Formulae 2-1 and 2-2 are each independently a $C_5$-$C_{30}$ carbocyclic group or a $C_1$-$C_{30}$ heterocyclic group, and ring $CY_{41}$ and ring $CY_{42}$ in Formula 2-2 are each independently a π electron-rich $C_5$-$C_{30}$ cyclic group.

In one or more embodiments, ring $CY_1$ to ring $CY_3$ in Formulae 2-1 and 2-2 may each independently be i) a first ring, ii) a second ring, iii) a condensed ring wherein two or more first rings are condensed with each other, iv) a condensed ring wherein two or more second rings are condensed with each other, or v) a condensed ring wherein one or more first rings and one or more second rings are condensed with each other, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_{41}$ and ring $CY_{42}$ in Formula 2-2 may each independently be i) a third ring, ii) a fourth ring, iii) a condensed ring wherein two or more third rings are condensed with each other, iv) a condensed ring wherein two or more fourth rings are condensed with each other, or v) a condensed ring wherein one or more third rings and one or more fourth rings are condensed with each other, the third ring may be a cyclopentane group, a cyclopentadiene group, a furan group, a thiophene group, a pyrrole group, a silole group, a germole group, a borole group, a selenophene group, or a phosphole group, and the fourth ring may be an adamantane group, a norbornane group (bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, or a benzene group.

In one or more embodiments, ring $CY_1$ to ring $CY_3$ in Formulae 2-1 and 2-2 may each independently be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_{41}$ and ring $CY_{42}$ in Formula 2-2 may each independently be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a norbornane group, or a norbornene group.

In one or more embodiments, ring $CY_1$ and ring $CY_3$ in Formulae 2-1 and 2-2 may each independently be a pyridine group, a pyrimidine group, a triazine group, a quinoline group, an isoquinoline group, a quinoxaline group, a benzoquinoline group, a benzoisoquinoline group, a benzoquinoxaline group, a naphthoquinoline group, a naphthoisoquinoline group, a naphthoquinoxaline group, a pyridine group condensed with a cyclohexane group, a pyridine group condensed with a norbornane group, an imidazole group, a benzimidazole group, a naphthoimidazole group, or a phenanthrenoimidazole group.

In one or more embodiments, ring $CY_1$ in Formula 2-1 may be a pyridine group, a pyrimidine group, a triazine group, a quinoline group, an isoquinoline group, a quinoxaline group, a benzoquinoline group, a benzoisoquinoline group, a benzoquinoxaline group, a naphthoquinoline group, a naphthoisoquinoline group, a naphthoquinoxaline group, a pyridine group condensed with a cyclohexane group, or a pyridine group condensed with a norbornane group.

In one or more embodiments, ring $CY_2$ in Formula 2-1 may be a benzene group, a naphthalene group, an anthracene group, a phenanthrene group, a triphenylene group, a 1,2,3,4-tetrahydronaphthalene group, a benzene group condensed with a norbornane group, a carbazole group, a fluorene group, a dibenzosilole group, a dibenzothiophene group, a dibenzofuran group, or a dibenzoselenophene group.

In one or more embodiments, ring $CY_{41}$ and ring $CY_{42}$ in Formula 2-2 may each independently be:
i) a benzene group, a naphthalene group, an anthracene group, a phenanthrene group, or a triphenylene group; or
ii) a polycyclic group wherein at least one benzene group and at least one B group are condensed with each other, wherein the B group may be a cyclohexane group, a norbornane group, a furan group, a thiophene group, a selenophene group, a pyrrole group, a cyclopentadiene group, or a silole group.

A carbon atom of ring $CY_{41}$ in Formula 2-2 and M in Formula 1 are bonded to each other via a covalent bond.

$X_4$ in Formula 2-2 is O, S, Se, $N(R_{48})$, $C(R_{48})(R_{49})$, or $Si(R_{48})(R_{49})$.

b4 in Formula 2-2 indicates the number of $Z_4$, and is an integer from 1 to 20 (for example, an integer from 1 to 10). When b4 is 2 or more, two or more of $Z_4$(s) may be identical to or different from each other. In one or more embodiments, b4 may be 1, 2, or 3. In one or more embodiments, b4 may be 1 or 2.

In Formula 3, $Y_4$ is Si or Ge.

In Formula 3, $T_4$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In one or more embodiments, $T_4$ in Formula 3 may be:
a single bond; or
a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or benzothiadiazole group, each unsubstituted or substituted with at least one $R_{10a}$.

In one or more embodiments, $T_4$ in Formula 3 may be:
a single bond; or
a benzene group unsubstituted or substituted with at least one $R_{10a}$.

In one or more embodiments, $T_4$ in Formula 3 may be:
a single bond; or
a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

c4 in Formula 3 indicates the number of $T_4$, and is an integer from 1 to 10 (for example, an integer from 1 to 5). When c4 is 2 or more, two or more of $T_4$(s) may be identical to or different from each other. In one or more embodiments, c4 may be 1, 2, or 3.

$R_1$ to $R_4$, $R_{48}$, $R_{49}$, and $Q_{41}$ to $Q_{43}$ in Formulae 2-1, 2-2, and 3 are each independently hydrogen, deuterium, —F, —Cl, —Br, —I, —SF$_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$). $Q_1$ to $Q_9$ are each as defined in the present specification.

In one or more embodiments, $R_1$ to $R_4$, $R_{48}$, $R_{49}$, and $Q_{41}$ to $Q_{43}$ in Formulae 2-1, 2-2, and 3 may each independently be:

hydrogen, deuterium, —F, —Cl, —Br, —I, a hydroxyl group, a cyano group, a nitro group, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group (bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{29}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), —Ge($Q_{33}$)($Q_{34}$)($Q_{35}$), or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), and $Q_1$ to $Q_9$ and $Q_{33}$ to $Q_{35}$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or a combination thereof.

In one or more embodiments, $R_1$ to $R_4$, $R_{48}$, and $R_{49}$ may each independently be:

hydrogen, deuterium, —F, or a cyano group;

a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof; or —Si($Q_3$)($Q_4$)($Q_5$) or —Ge($Q_3$)($Q_4$)($Q_5$).

In one or more embodiments, $Q_{41}$ to $Q_{43}$ may each independently be a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

In one or more embodiments, $Q_{41}$ to $Q_{43}$ in Formula 3 may each independently be —CH$_3$, —CH$_2$CH$_3$, —CD$_3$, —CD$_2$H, —CDH$_2$, —CH$_2$CD$_3$, or —CD$_2$CH$_3$.

In one or more embodiments, $Q_{41}$ to $Q_{43}$ in Formula 3 may be identical to or different from each other.

In one or more embodiments, $R_1$ to $R_4$, $R_{48}$, and $R_{49}$ in Formulae 2-1 and 2-2 may each independently be hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, —OCH$_3$, —OCDH$_2$, —OCD$_2$H, —OCD$_3$, —SCH$_3$, —SCDH$_2$, —SCD$_2$H, —SCD$_3$, a group represented by one of Formulae 9-1 to 9-39, a group represented by one of Formulae 9-1 to 9-39 wherein at least one hydrogen is substituted with deuterium, a group represented by one of Formulae 9-1 to 9-39 wherein at least one hydrogen is substituted with —F, a group represented by one of Formulae 9-201 to 9-230, a group represented by one of Formulae 9-201 to 9-230 wherein at least one hydrogen is substituted with deuterium, a group represented by one of Formulae 9-201 to 9-230 wherein at least one hydrogen is substituted with —F, a group represented by one of Formulae 10-1 to 10-145, a group represented by one of Formulae 10-1 to 10-145 wherein at least one hydrogen is substituted with deuterium, a group represented by one of Formulae 10-1 to 10-145 wherein at least one hydrogen is substituted with —F, a group represented by one of Formulae 10-201 to 10-354, a group represented by one of Formulae 10-201 to 10-354 wherein at least one hydrogen is substituted with deuterium, a group represented by one of Formulae 10-201 to 10-354 wherein at least one hydrogen is substituted with —F, —Si($Q_3$)($Q_4$)($Q_5$), or —Ge($Q_3$)($Q_4$)($Q_5$) (wherein $Q_3$ to $Q_5$ are each as defined in the present specification):

9-1

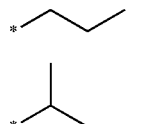

9-2

9-3

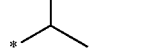

9-4

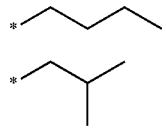

9-5

9-6

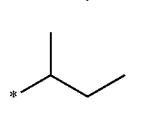

9-7

9-8

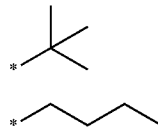

9-9

9-10

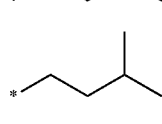

9-11

9-12

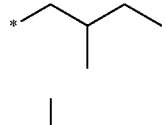

9-13

9-14

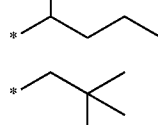

9-15

9-16

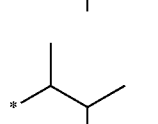

9-17

9-18

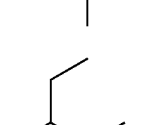

9-19

9-20

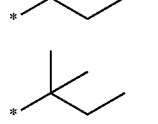
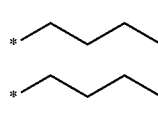
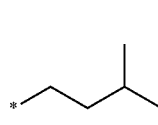
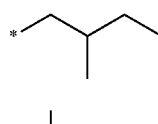
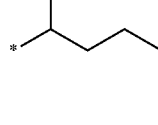

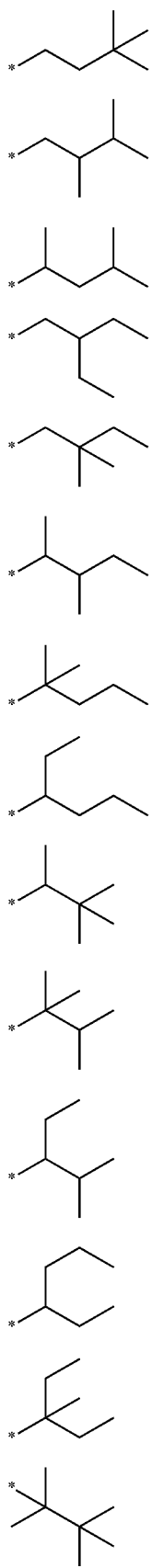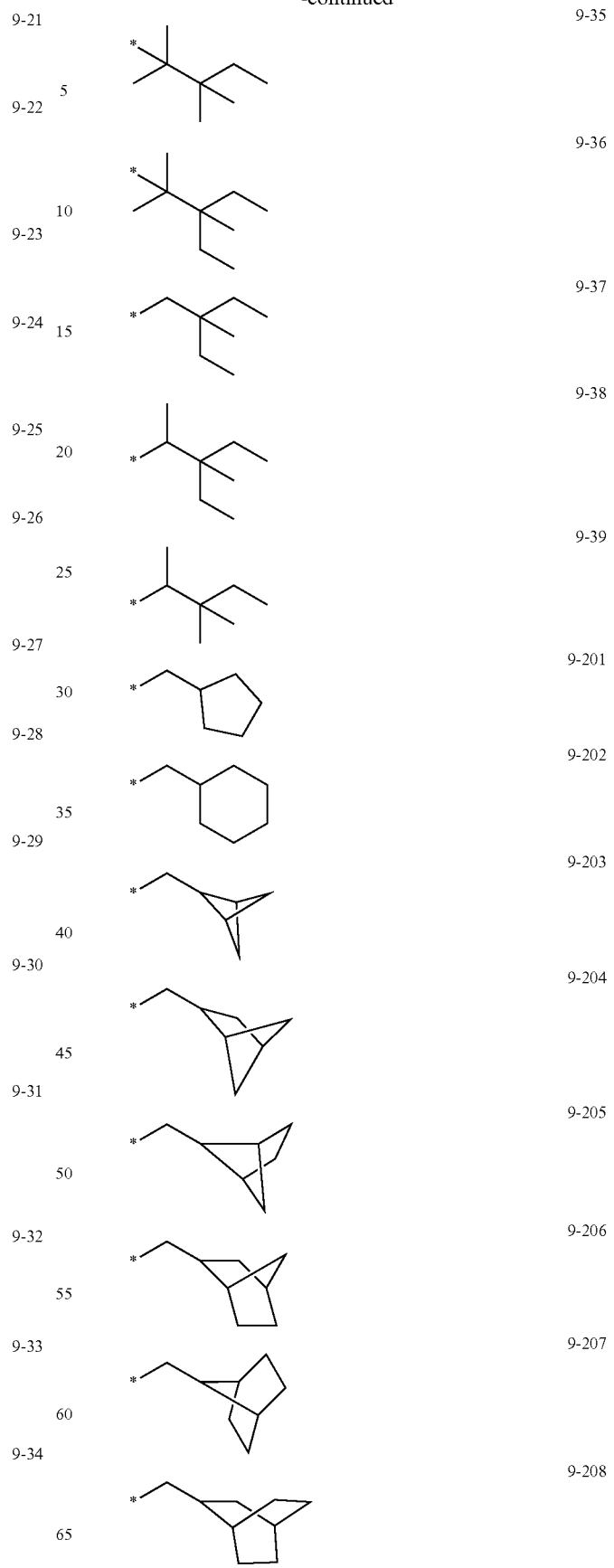

-continued
9-209 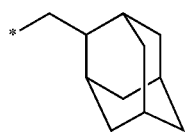
9-210 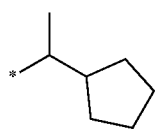
9-211 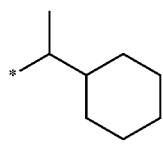
9-212 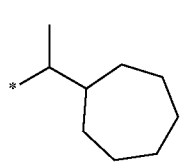
9-213 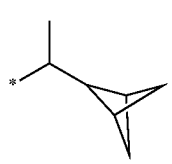
9-213 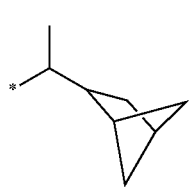
9-214 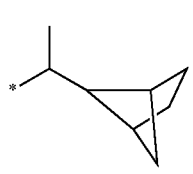
9-215 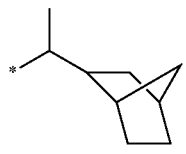
9-216 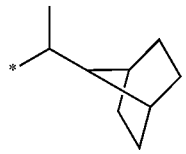
9-217 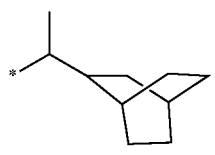
-continued
9-218 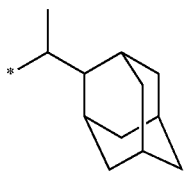
9-219 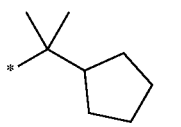
9-220 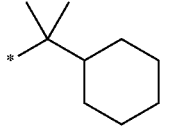
9-221 
9-222 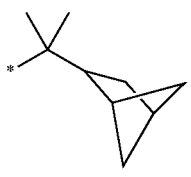
9-223 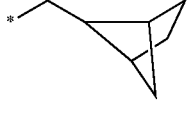
9-224 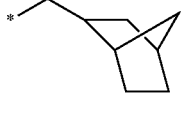
9-225 
9-226 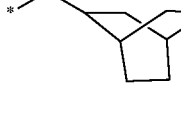
9-227

-continued
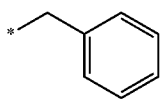
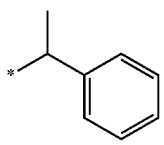
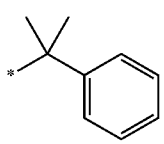
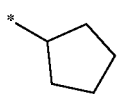
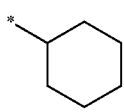
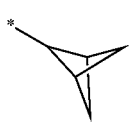
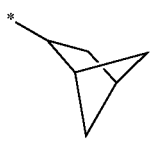
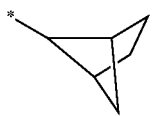
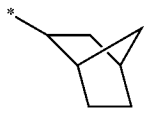
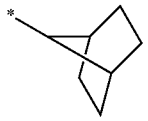
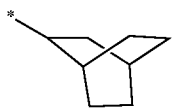
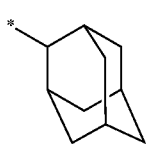
-continued
9-228
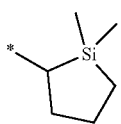
9-229
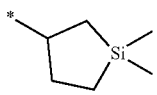
9-230
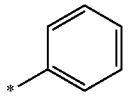
10-1
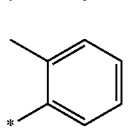
10-2
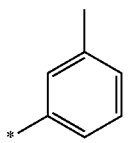
10-3
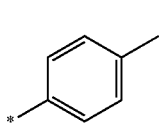
10-4
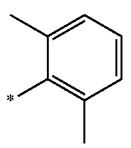
10-5
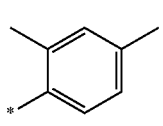
10-6
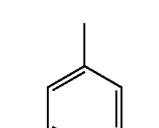
10-7
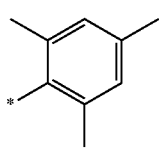
10-8
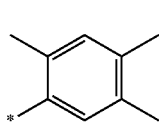
10-9
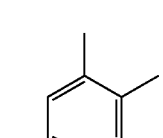
10-10
10-11
10-12
10-13
10-14
10-15
10-16
10-17
10-18
10-19
10-20
10-21

-continued
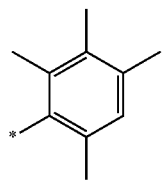
10-22
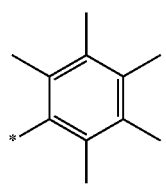
10-23
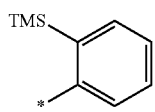
10-24
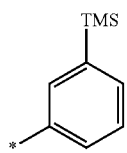
10-25
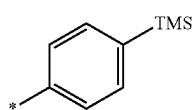
10-26
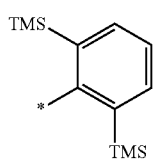
10-27
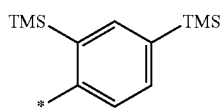
10-28
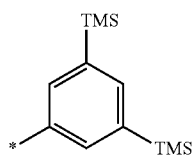
10-29
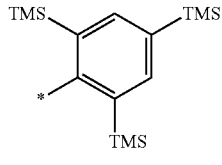
10-30
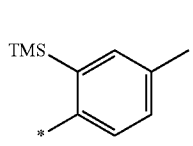
10-31
-continued
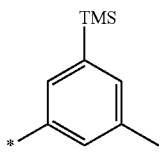
10-32
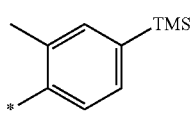
10-33
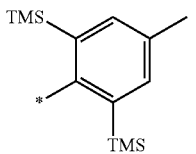
10-34
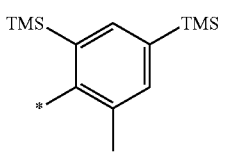
10-35
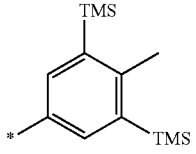
10-36
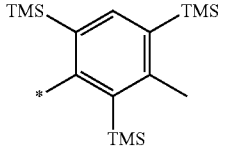
10-37
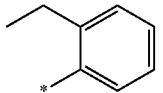
10-38
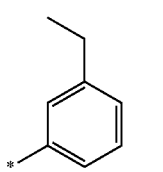
10-39
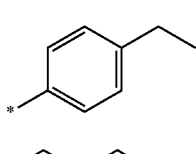
10-40
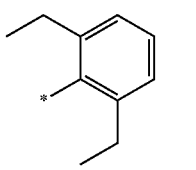
10-41
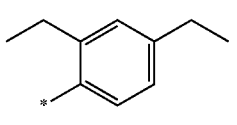
10-42

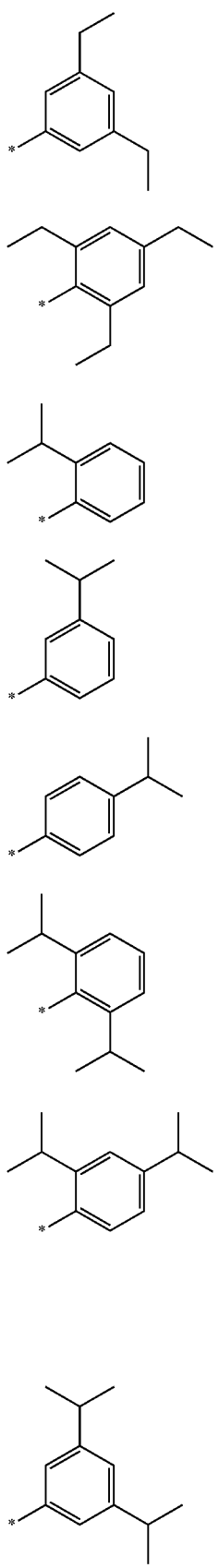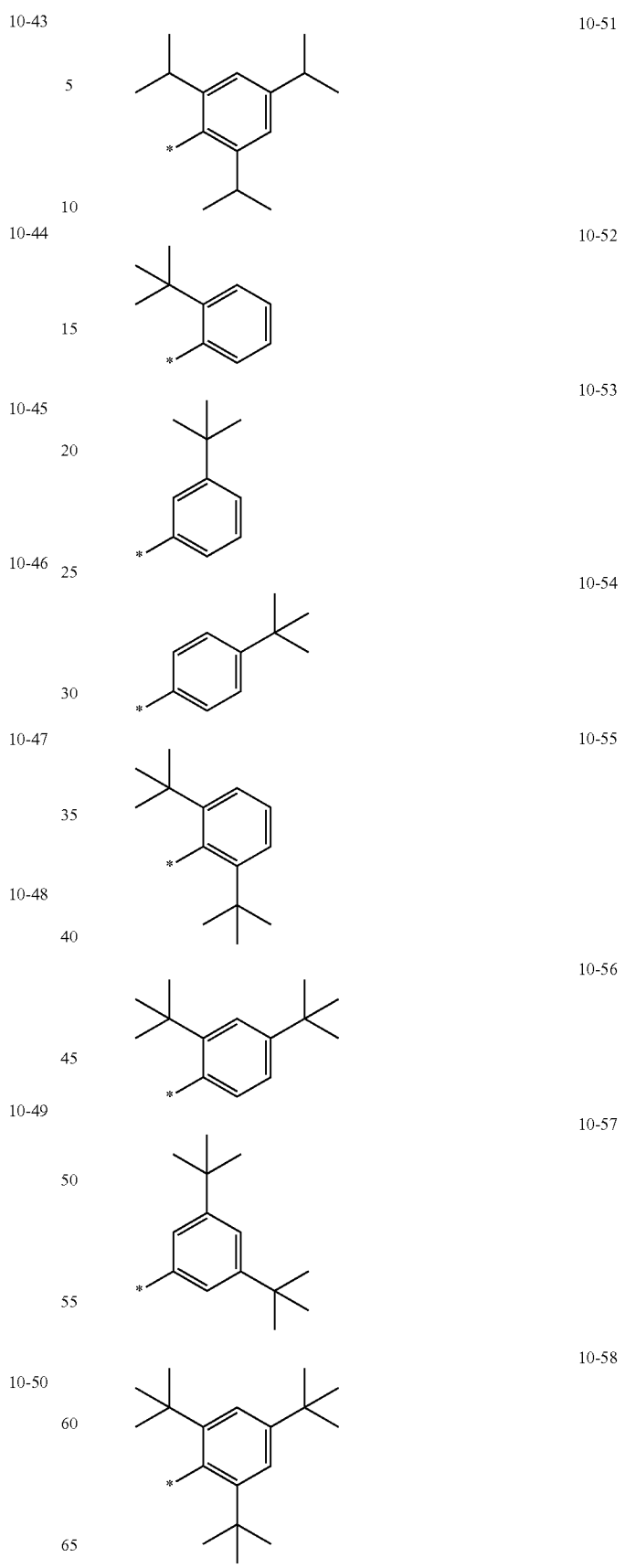

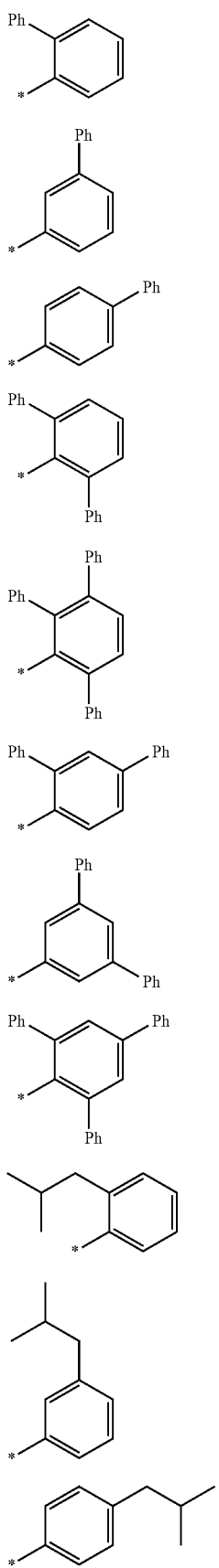
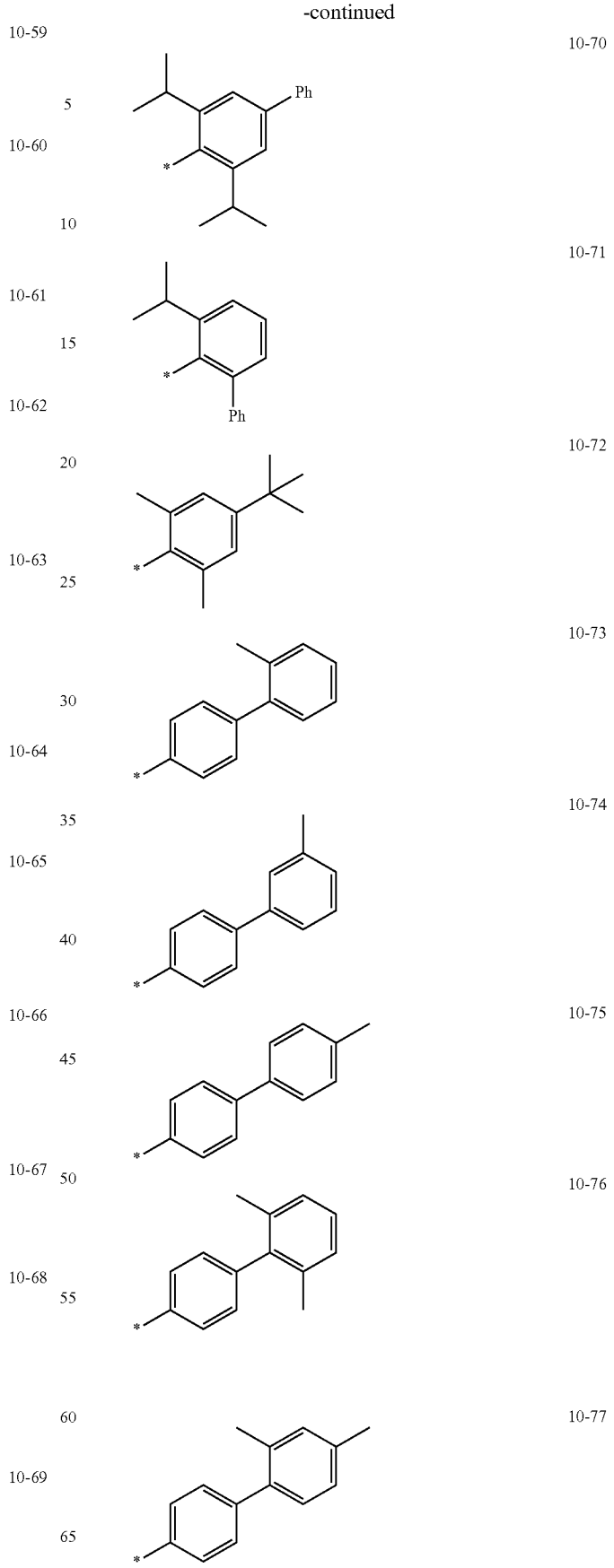

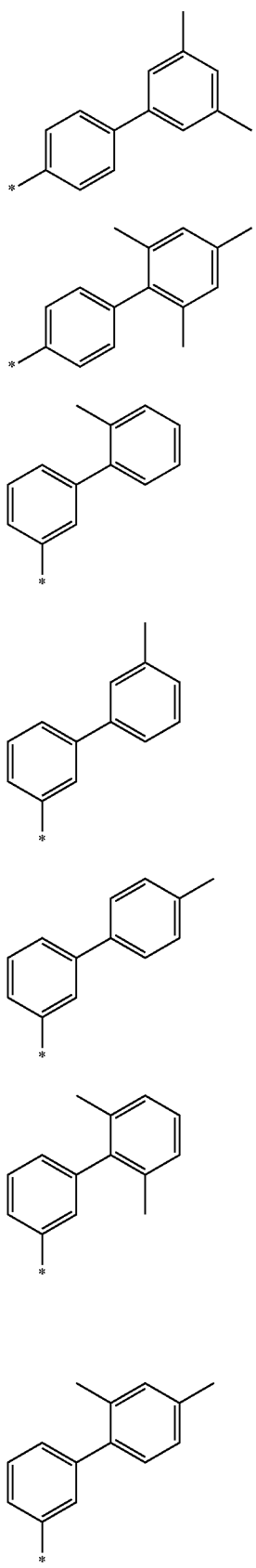
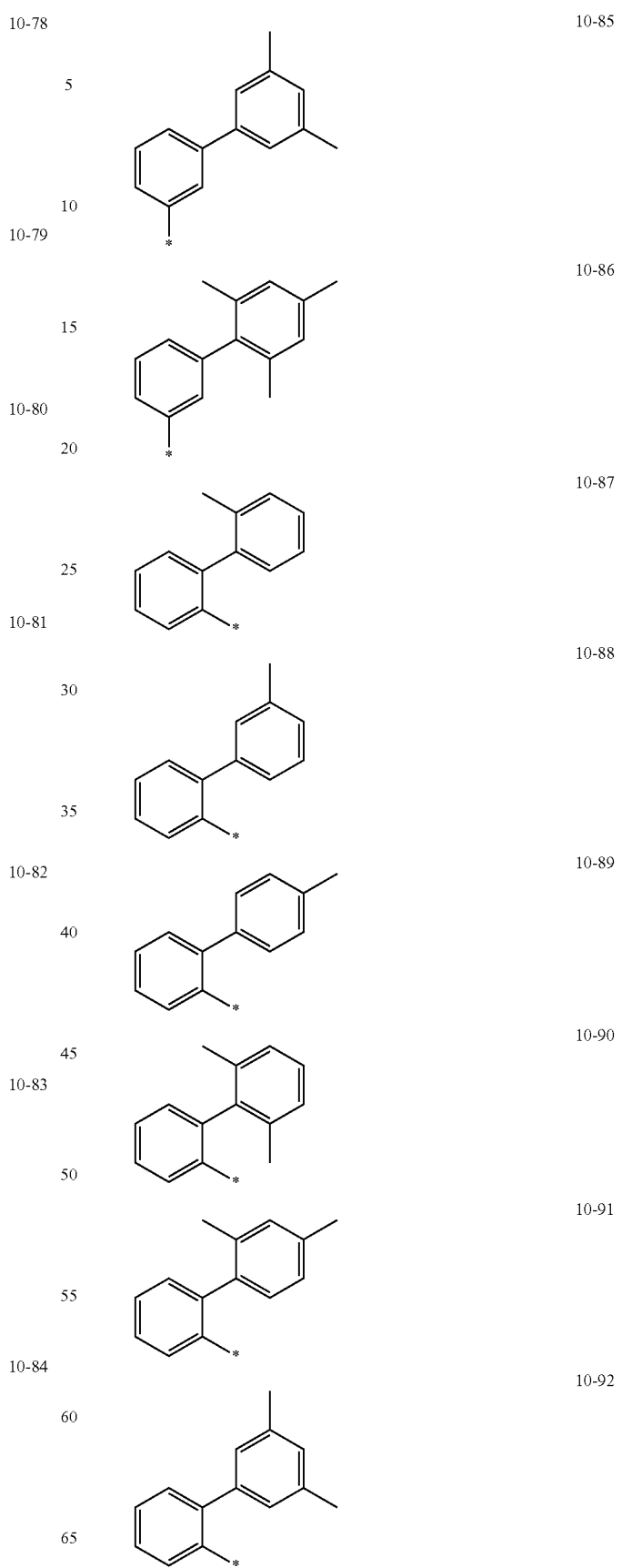

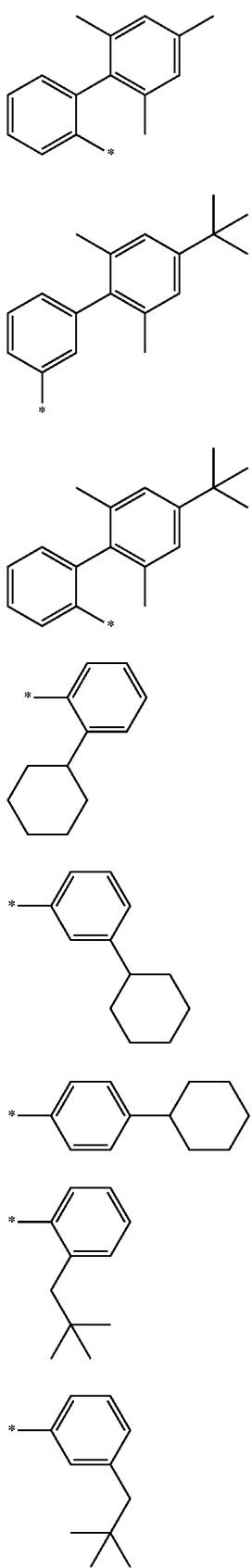
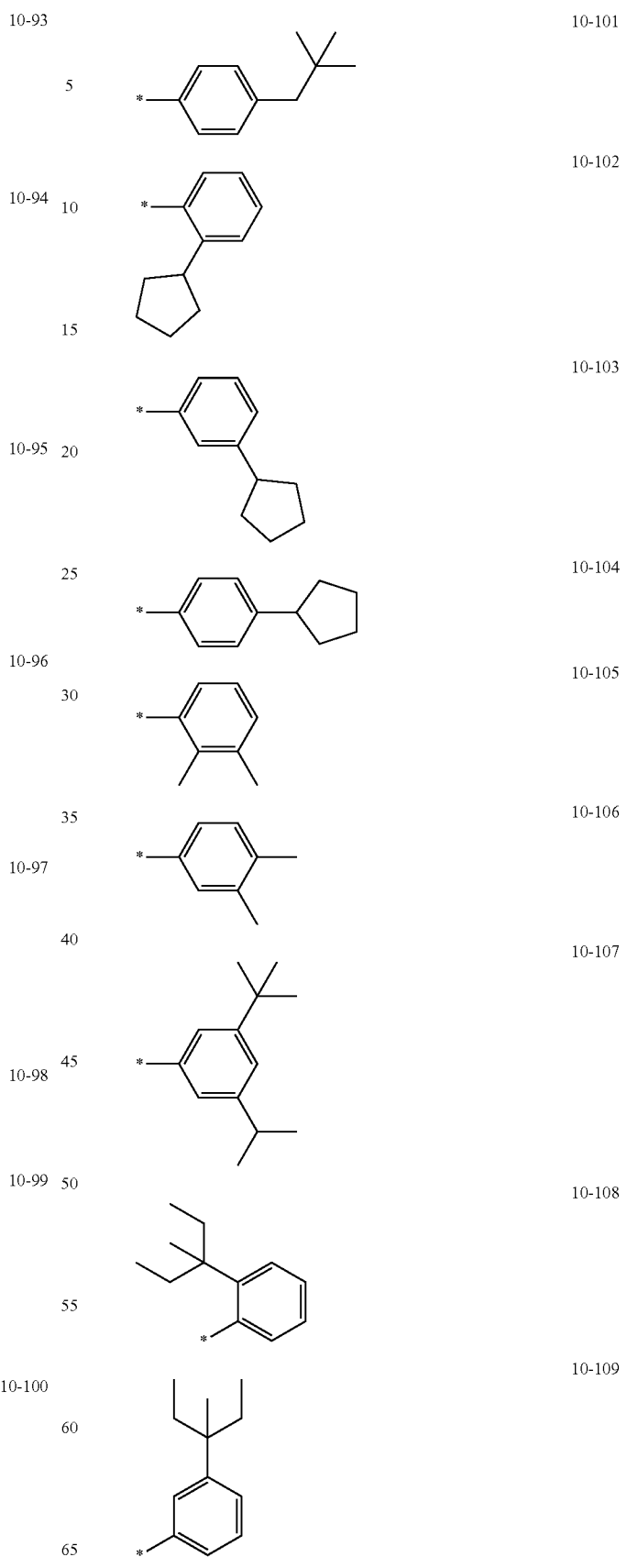

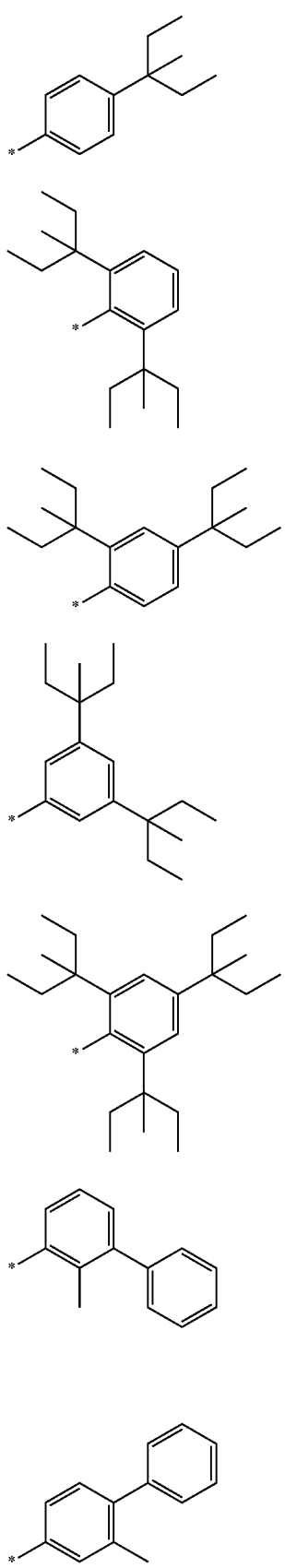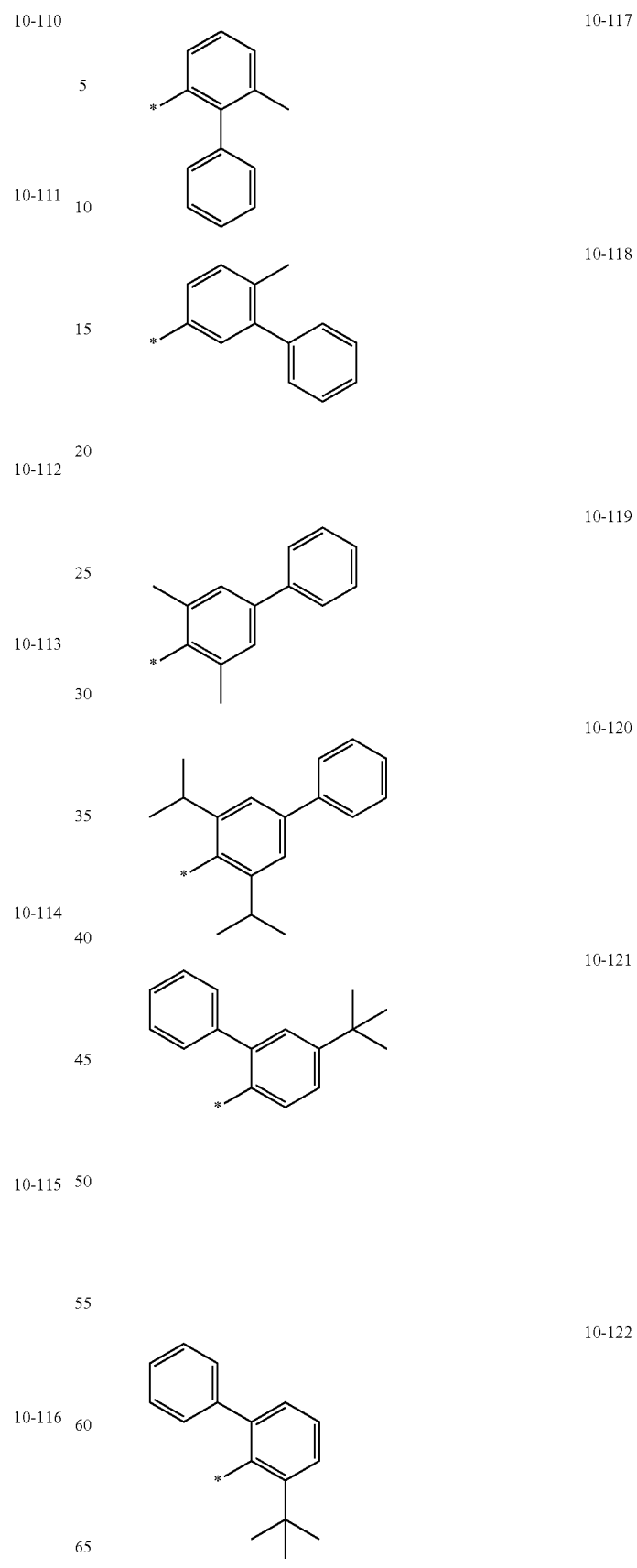

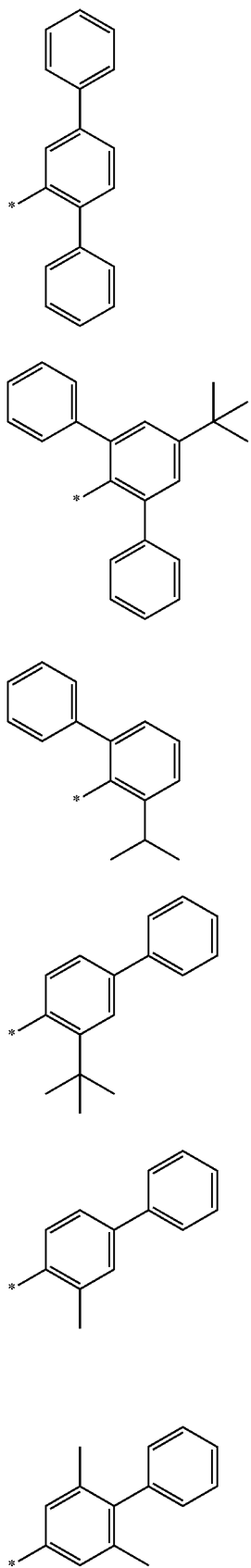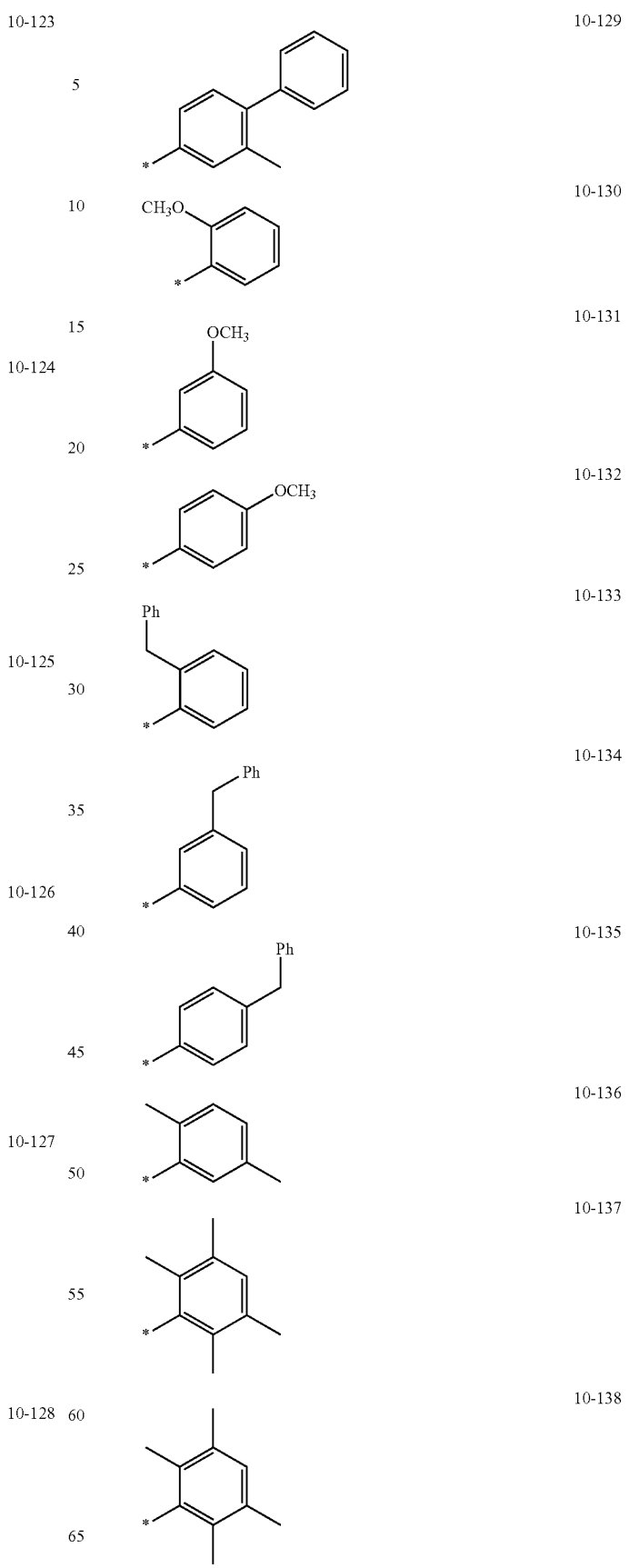

-continued
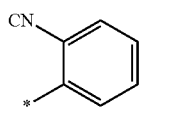
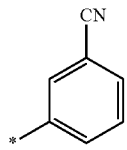
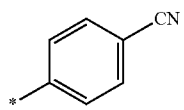
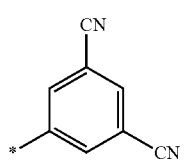
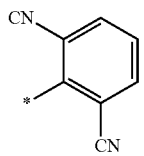
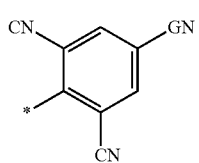
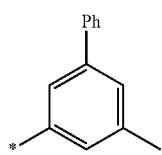
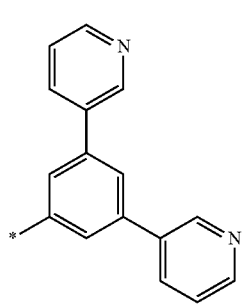
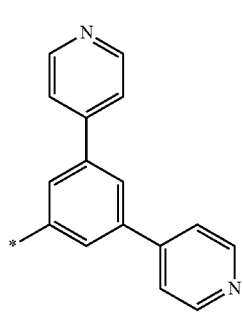
-continued
10-139
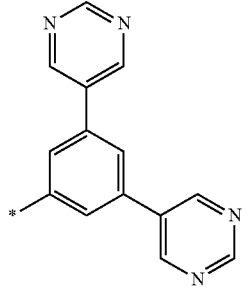
10-140
10-141
10-142
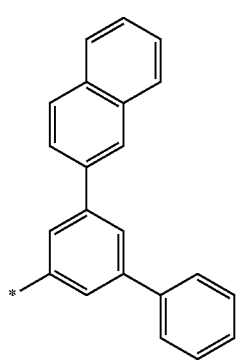
10-143
10-144
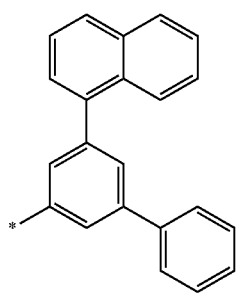
10-145
10-201
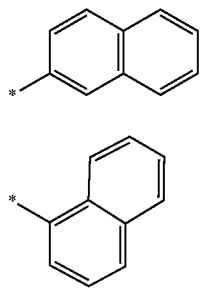
10-202
10-203
10-204
10-205
10-206
10-207
10-208
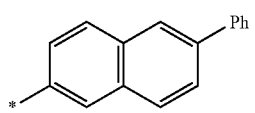
10-209
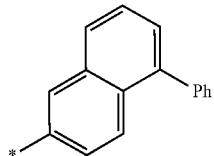

-continued
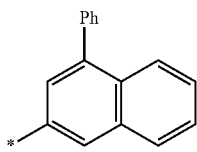
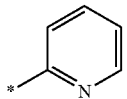
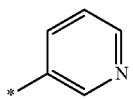
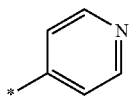
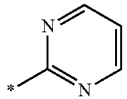
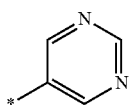
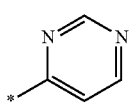
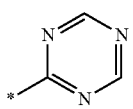
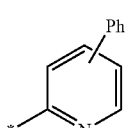
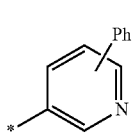
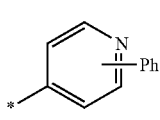
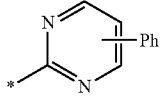
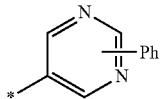
-continued
10-210
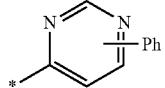
10-211
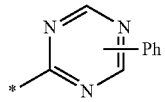
10-212
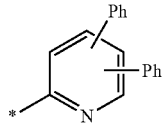
10-213
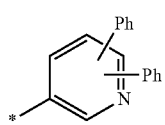
10-214
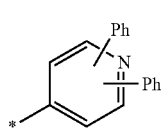
10-215
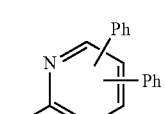
10-216
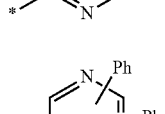
10-217
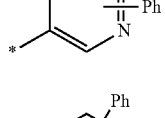
10-218
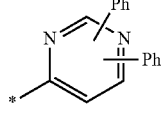
10-219
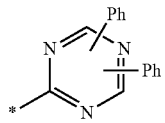
10-220
10-221
10-222
10-223
10-224
10-225
10-226
10-227
10-228
10-229
10-230
10-231
10-232
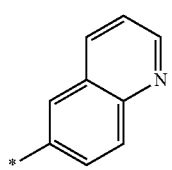
10-233
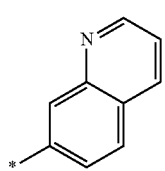
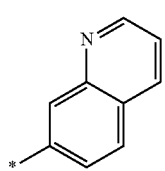

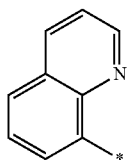
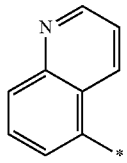
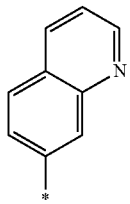
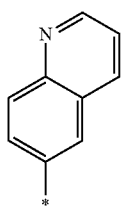
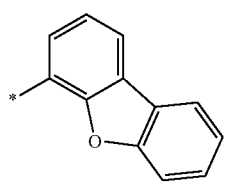
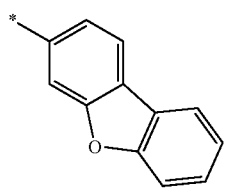
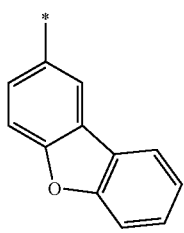
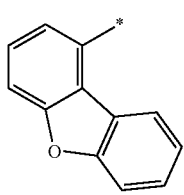
10-234
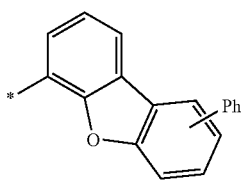
10-235
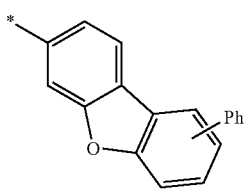
10-236
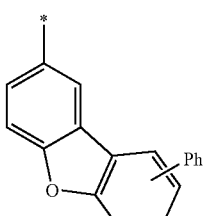
10-237
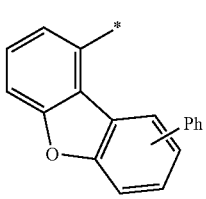
10-238
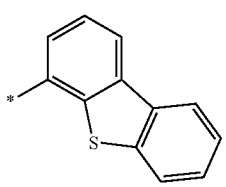
10-239
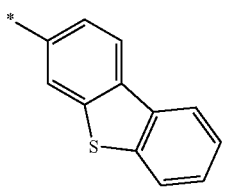
10-240
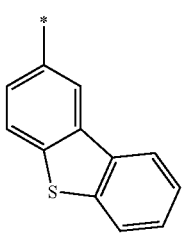
10-241
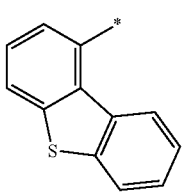
10-242
10-243
10-244
10-245
10-246
10-247
10-248
10-249

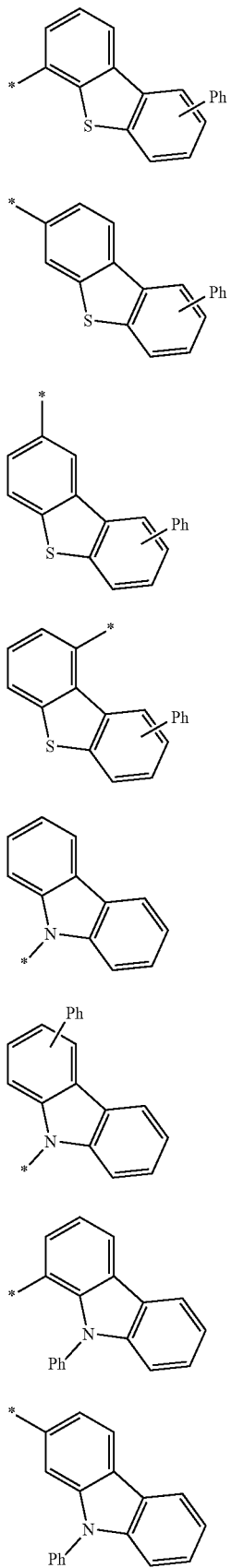
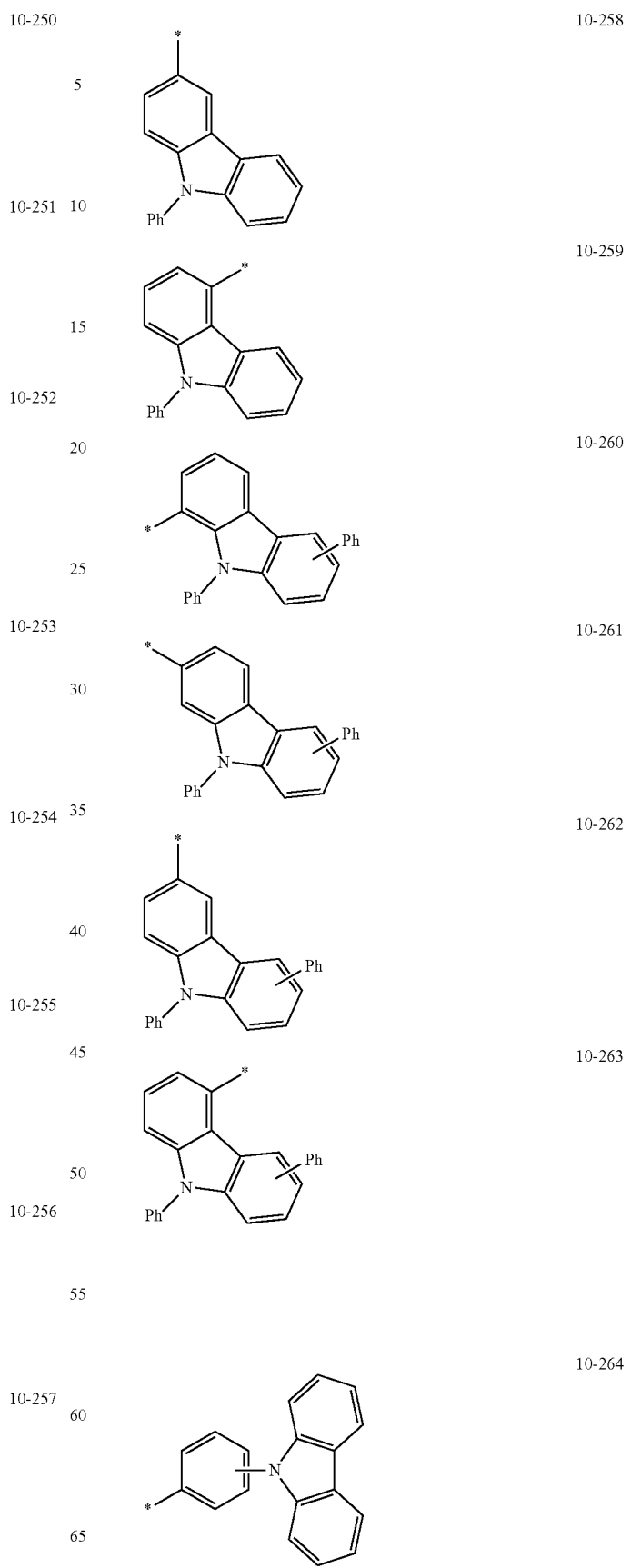

10-265 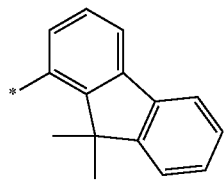
10-266 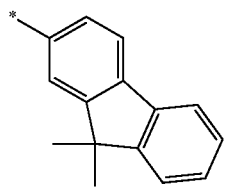
10-267 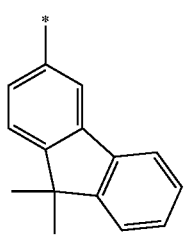
10-268 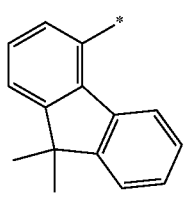
10-269 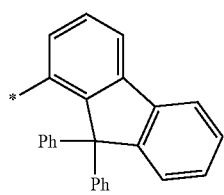
10-270 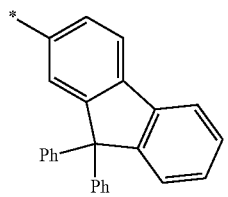
10-271 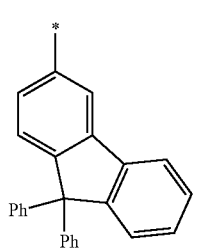
10-272 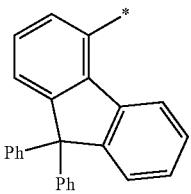
10-273 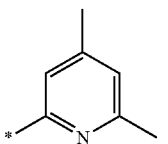
10-274 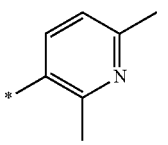
10-275 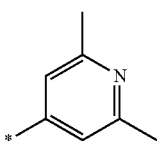
10-276 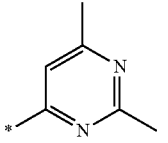
10-277 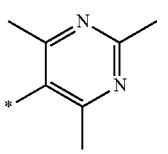
10-278 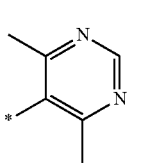
10-279 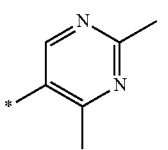
10-280
10-281

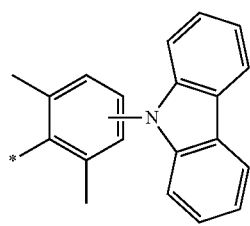
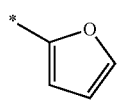
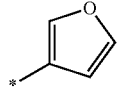
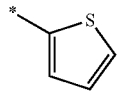
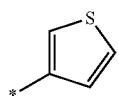
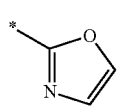
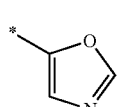
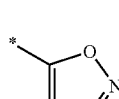
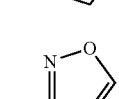
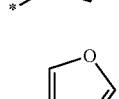
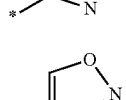
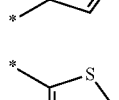
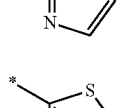
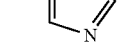
10-282
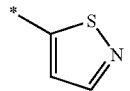
10-283
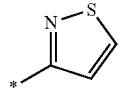
10-284
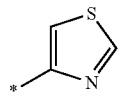
10-285
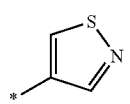
10-286
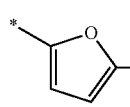
10-287
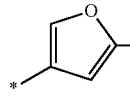
10-288
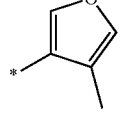
10-289
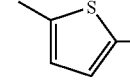
10-290
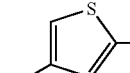
10-291
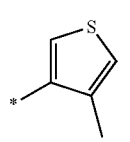
10-292
10-293
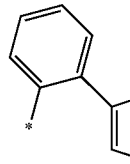
10-294
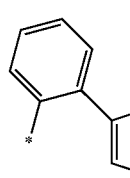
10-295
10-296
10-297
10-298
10-299
10-300
10-301
10-302
10-303
10-304
10-305
10-306

-continued
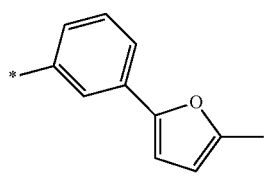
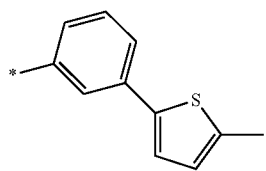
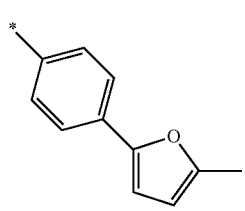
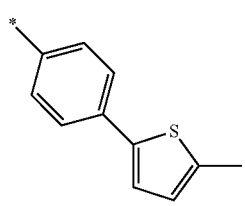
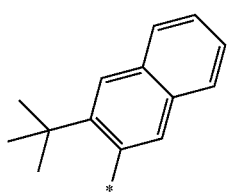
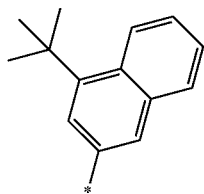
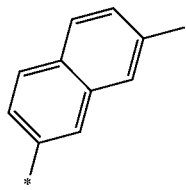
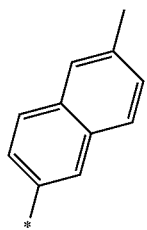
-continued
10-307
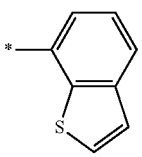
10-308
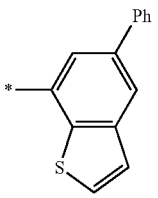
10-309
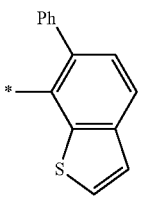
10-310
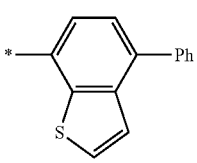
10-311
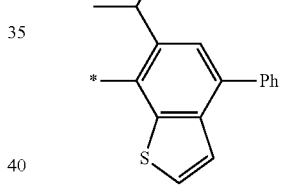
10-312
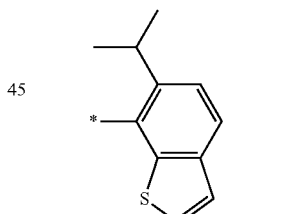
10-313
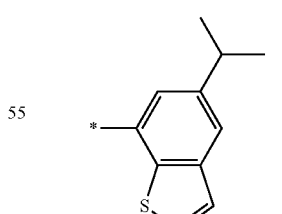
10-314
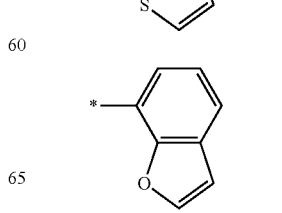
10-315
10-316
10-317
10-318
10-319
10-320
10-321
10-322

10-323 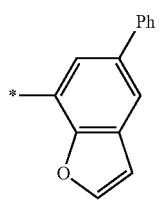
10-324 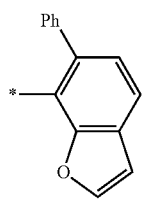
10-325 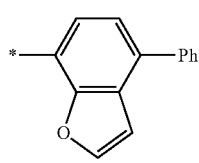
10-326 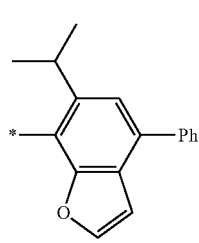
10-327 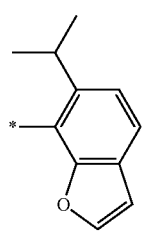
10-328 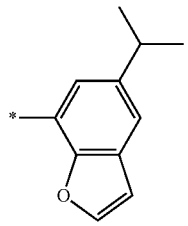
10-329 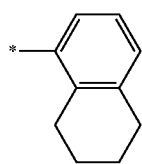
10-330 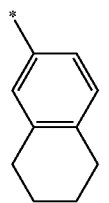
10-331 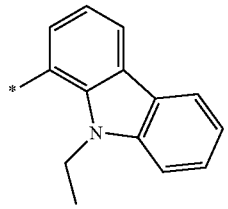
10-332 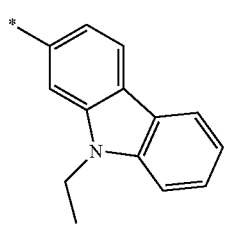
10-333 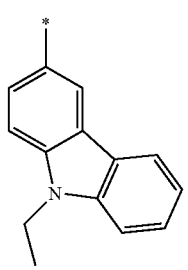
10-334 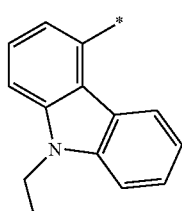
10-335 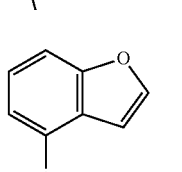
10-336 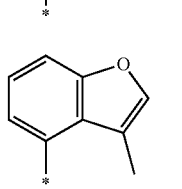
10-337
10-338 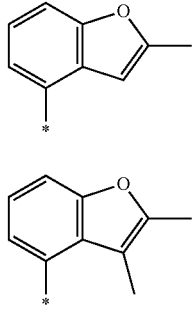

10-339 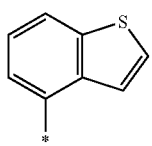

10-340 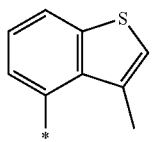

10-341 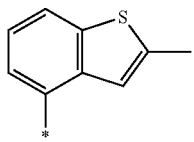

10-342 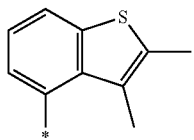

10-343 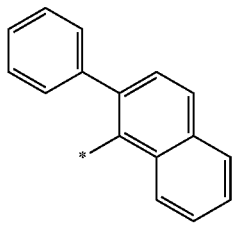

10-344 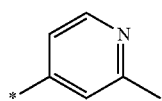

10-345 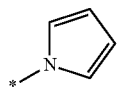

10-346 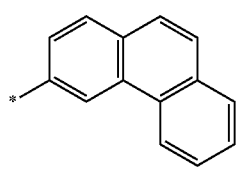

10-347 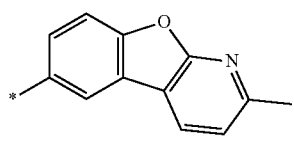

10-348 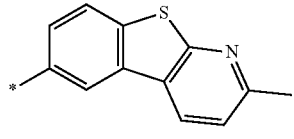

10-349 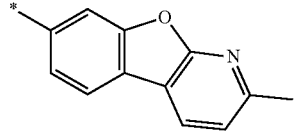

10-350 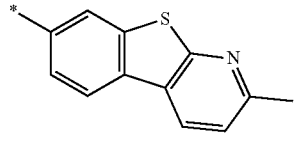

10-351 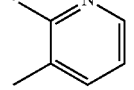

10-352 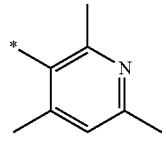

10-353 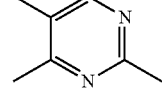

10-354 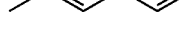

* in Formulae 9-1 to 9-39, 9-201 to 9-230, 10-1 to 10-145, and 10-201 to 10-354 indicates a binding site to a neighboring atom, Ph is a phenyl group, TMS is a trimethylsilyl group, TMG is a trimethylgermyl group, and OMe is a methoxy group.

The "group represented by one of Formulae 9-1 to 9-39 wherein at least one hydrogen is substituted with deuterium" and the "group represented by one of Formulae 9-201 to 9-230 wherein at least one hydrogen is substituted with deuterium" may be, for example, a group represented by one of Formulae 9-501 to 9-514 and 9-601 to 9-637:

9-501 

9-502 

9-503 

| | |
|---|---|
| 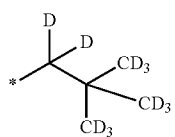 | 9-504 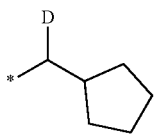 9-601 |
| 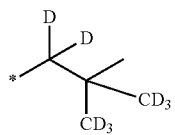 | 9-505 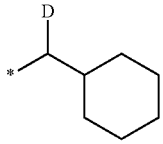 9-602 |
| 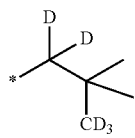 | 9-506 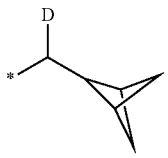 9-603 |
| 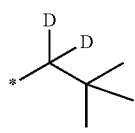 | 9-507 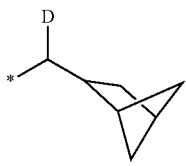 9-604 |
| 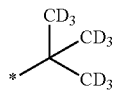 | 9-508 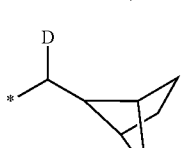 9-605 |
| 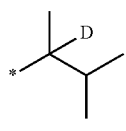 | 9-509 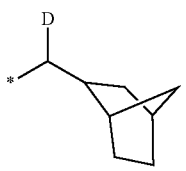 9-606 |
| 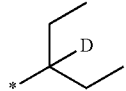 | 9-510 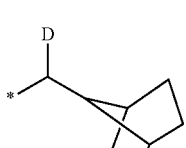 9-607 |
| 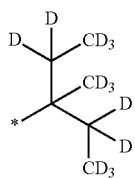 | 9-511 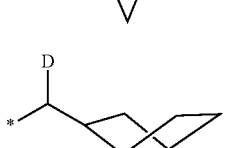 9-608 |
| 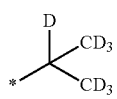 | 9-512 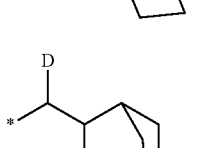 9-609 |
| 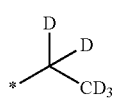 | 9-513 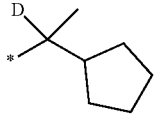 9-610 |
| 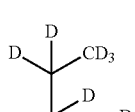 | 9-514 |
| 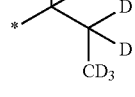 | |

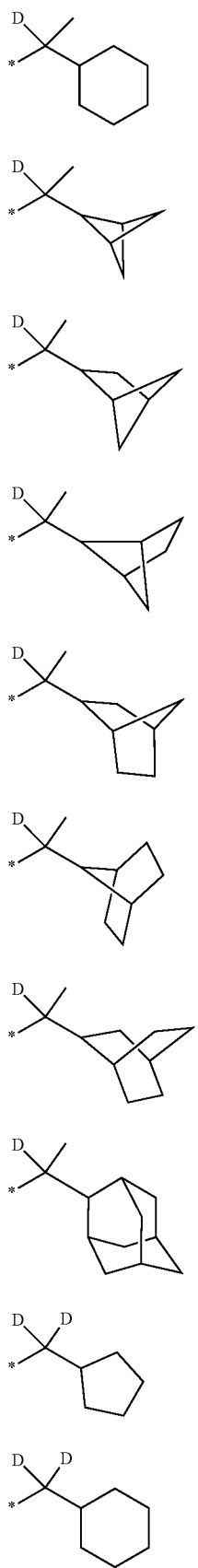
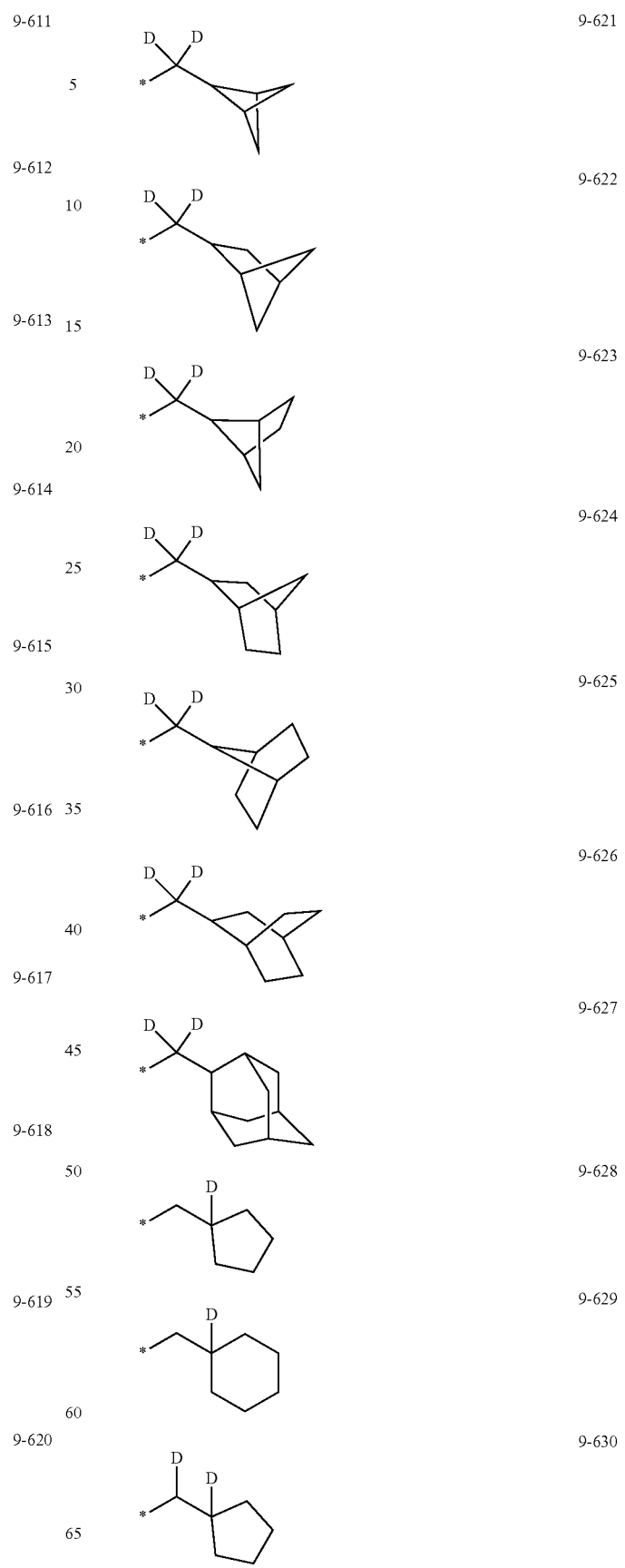

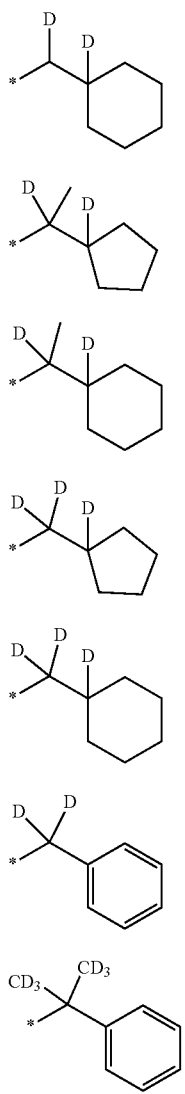

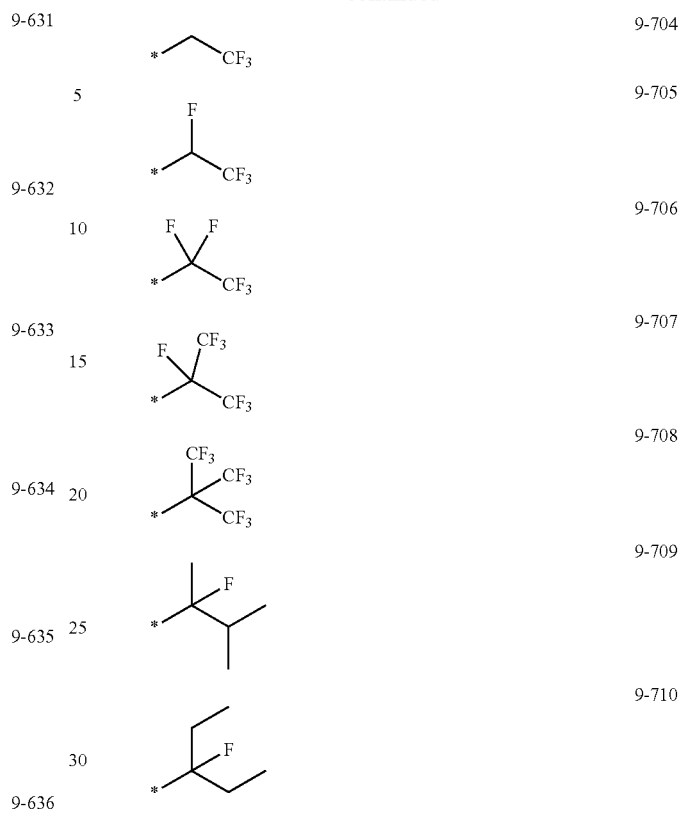

The "group represented by one of Formulae 9-1 to 9-39 wherein at least one hydrogen is substituted with —F" and the "group represented by one of Formulae 9-201 to 9-230 wherein at least one hydrogen is substituted with —F" may be, for example, a group represented by one of Formulae 9-701 to 9-710:

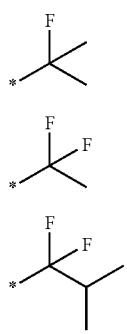

The "group represented by one of Formulae 10-1 to 10-145 wherein at least one hydrogen is substituted with deuterium" and the "group represented by one of Formulae 10-201 to 10-354 wherein at least one hydrogen is substituted with deuterium" may be, for example, a group represented by one of Formulae 10-501 to 10-553:

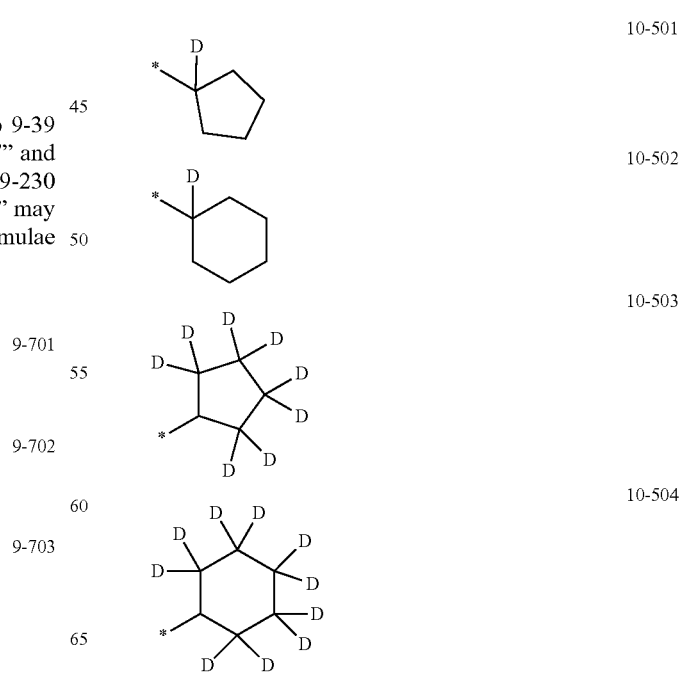

| | |
|---|---|
| 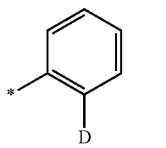 | 10-505 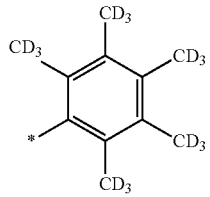 |
| 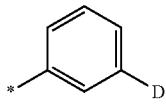 | 10-506 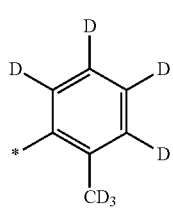 |
| 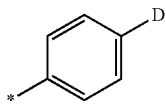 | 10-507 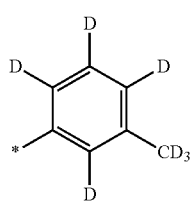 |
| 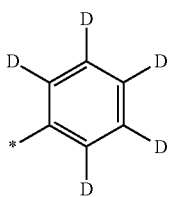 | 10-508 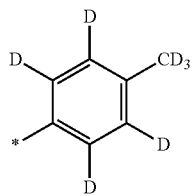 |
| 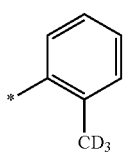 | 10-509 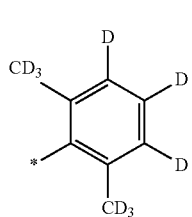 |
| 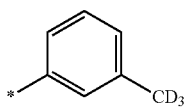 | 10-510 |
| 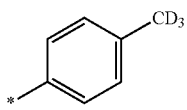 | 10-511 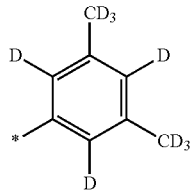 |
| 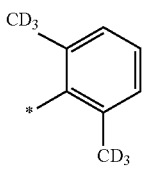 | 10-512 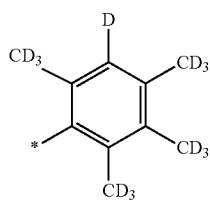 |
| 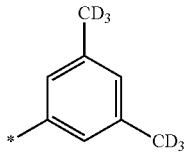 | 10-513 |
| 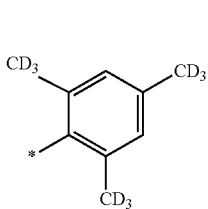 | 10-514 10-522 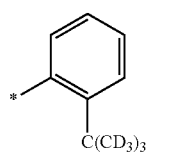 |
10-515
10-516
10-517
10-518
10-519
10-520
10-521

10-523 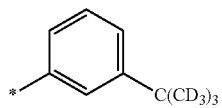
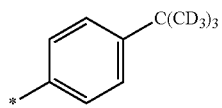
10-524 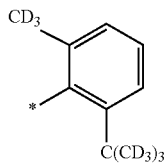
10-525 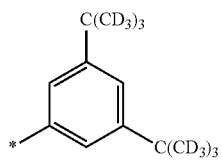
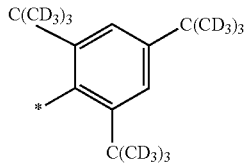
10-526 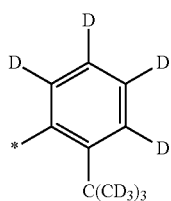
10-527 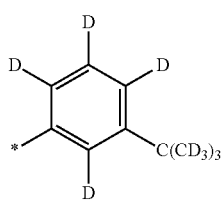
10-528 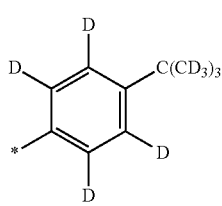
10-529 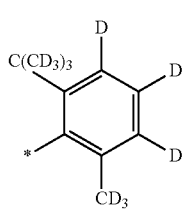
10-530
10-531
10-532 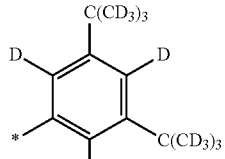
10-533 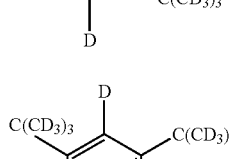
10-534 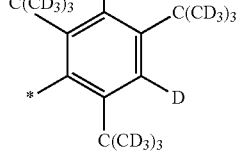
10-535 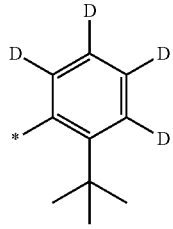
10-536 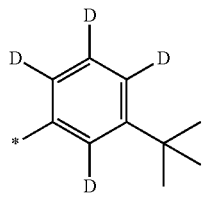
10-537 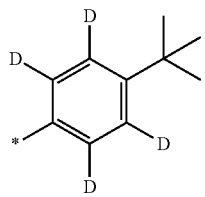
10-538 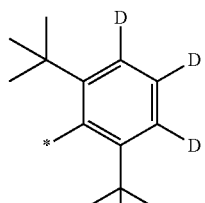
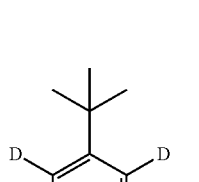
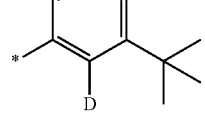

10-540 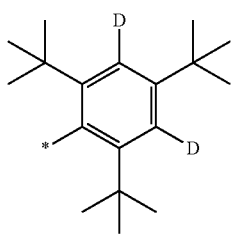
10-541 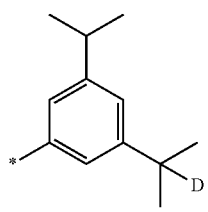
10-542 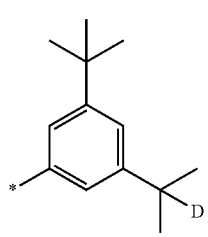
10-543 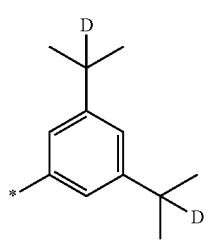
10-544 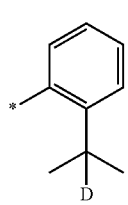
10-545 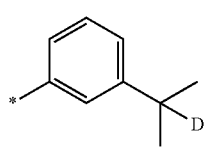
10-546 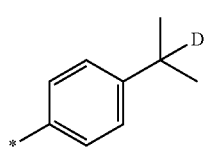
10-547 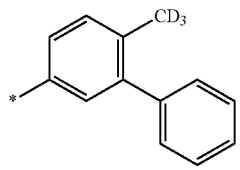
10-548 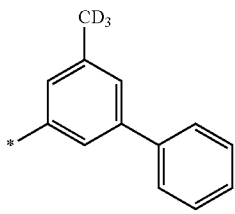
10-549 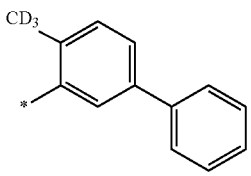
10-550 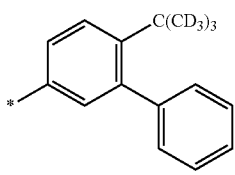
10-551 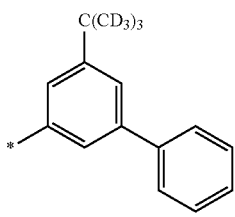
10-552 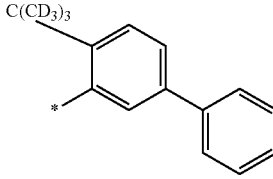
10-553 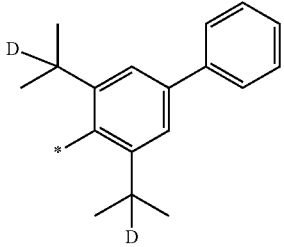
The "group represented by one of Formulae 10-1 to 10-145 wherein at least one hydrogen is substituted with —F" and the "group represented by one of Formulae 10-201 to 10-354 wherein at least one hydrogen is substituted with —F" may be, for example, a group represented by one of Formulae 10-601 to 10-636:
10-601 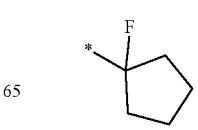

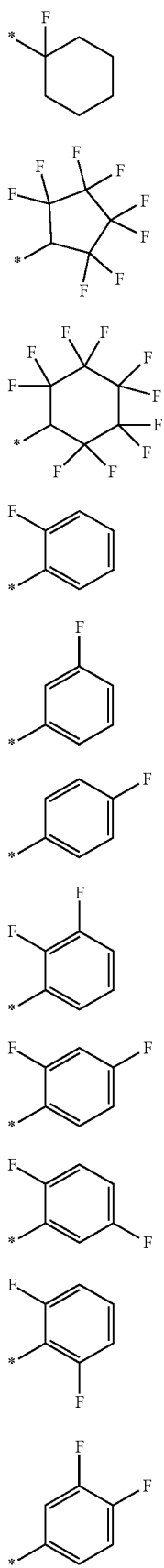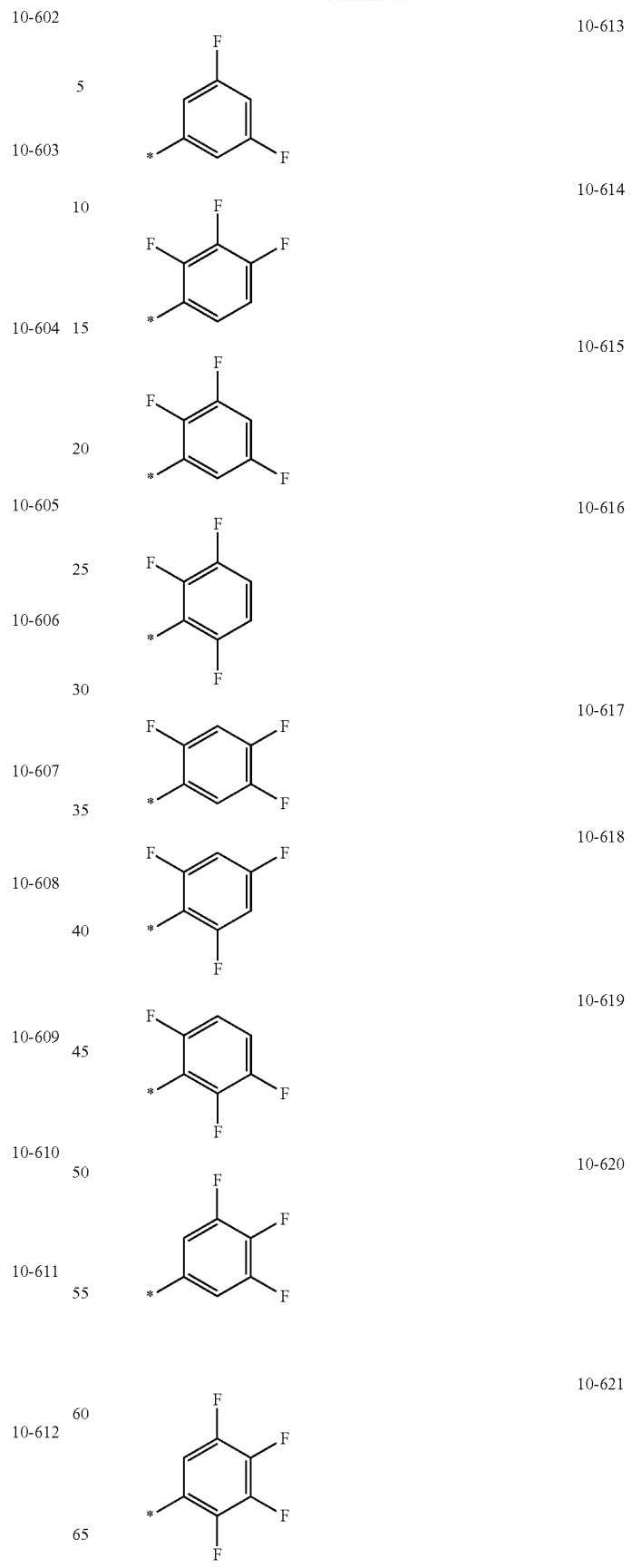

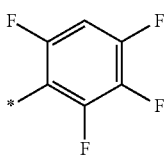 10-622

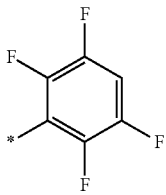 10-623

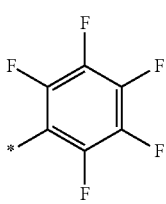 10-624

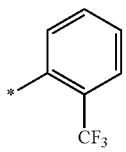 10-625

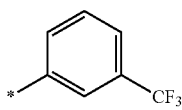 10-626

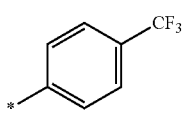 10-627

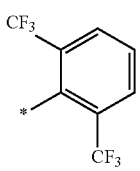 10-628

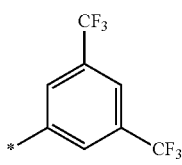 10-629

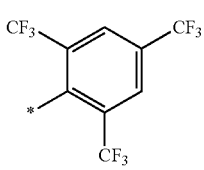 10-630

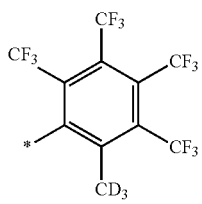 10-631

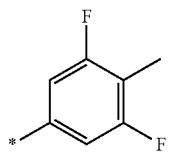 10-632

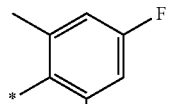 10-633

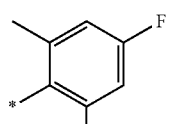 10-634

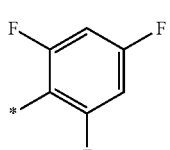 10-635

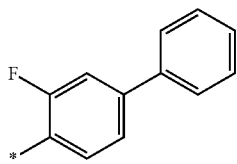 10-636 a1 to a4 in Formulae 2-1 and 2-2 indicate numbers of $R_1$ to $R_4$, respectively, and a1 to a4 are each independently an integer from 0 to 20 (for example, an integer from 0 to 10). When a1 is 2 or more, two or more of $R_1(s)$ may be identical to or different from each other, when a2 is 2 or more, two or more of $R_2(s)$ may be identical to or different from each other, when a3 is 2 or more, two or more of $R_3(s)$ may be identical to or different from each other, and when a4 is 2 or more, two or more of $R_4(s)$ may be identical to or different from each other.

In one or more embodiments, in Formula 2-1, i) a1 may be 1 or more, and at least one of $R_1(s)$ in the number of a1 may be —Si$(Q_3)(Q_4)(Q_5)$ or —Ge$(Q_3)(Q_4)(Q_5)$, or ii) a2 may be 2 or more, and at least one of $R_2(s)$ in the number of a2 may be —Si$(Q_3)(Q_4)(Q_5)$ or —Ge$(Q_3)(Q_4)(Q_5)$.

In one or more embodiments, an organometallic compound represented by Formula 1 may include deuterium, a fluoro group, or a combination thereof.

In one or more embodiments, an organometallic compound represented by Formula 1 may satisfy at least one of Condition 1 to Condition 8:

Condition 1
At least one of $R_1$(s) in the number of a1 is not hydrogen, and $R_1$ includes at least one deuterium
Condition 2
At least one of $R_2$(s) in the number of a2 is not hydrogen, and $R_2$ includes at least one deuterium
Condition 3
At least one of $R_3$(s) in the number of a3 is not hydrogen, and $R_3$ includes least one deuterium
Condition 4
At least one of $R_4$(s) in the number of a4 is not hydrogen, and $R_4$ includes at least one deuterium
Condition 5
At least one of $R_1$(s) in the number of a1 is not hydrogen, and $R_1$ includes at least one fluoro group
Condition 6
At least one of $R_2$(s) in the number of a2 is not hydrogen, and $R_2$ includes at least one fluoro group
Condition 7
At least one of $R_3$(s) in the number of a3 is not hydrogen, and $R_3$ includes at least one fluoro group
Condition 8
At least one of $R_4$(s) in the number of a4 is not hydrogen, and $R_4$ includes at least one fluoro group In Formulae 2-1 and 2-2, i) two or more of a plurality of $R_1$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $R_3$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) two or more of a plurality of $R_4$(s) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and v) two or more of $R_1$ to $R_4$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ is as defined in connection with $R_2$ in the present specification. In one or more embodiments, $R_{10a}$ may be as defined in connection with $R_2$, wherein $R_{10a}$ may not be hydrogen.

* and *' in Formulae 2-1 and 2-2 each indicate a binding site to a neighboring atom.

* in Formula 3 indicates a binding site to a neighboring atom.

In one or more embodiments, a group represented by

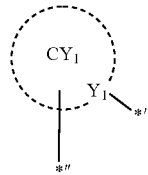

in Formula 2-1 may be a group represented by one of Formulae $CY_1$-1 to $CY_1$-25:

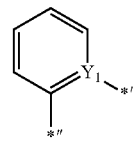
CY1-1

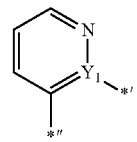
CY1-2

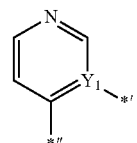
CY1-3

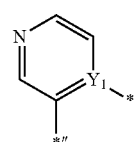
CY1-4

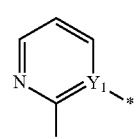
CY1-5

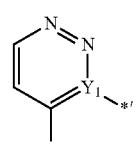
CY1-6

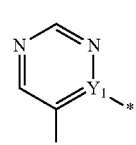
CY1-7

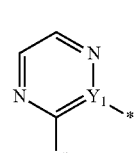
CY1-8

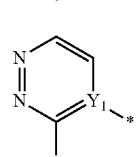
CY1-9

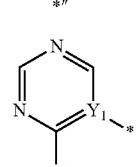
CY1-10

-continued
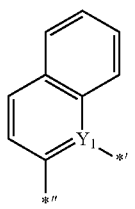
CY₁-11
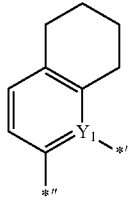
CY₁-12
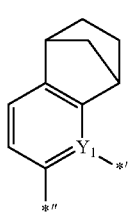
CY₁-13
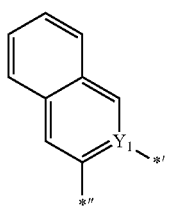
CY₁-14
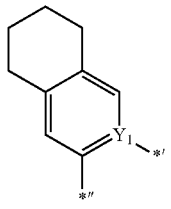
CY₁-15
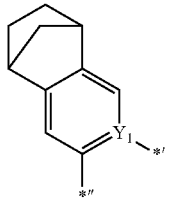
CY₁-16
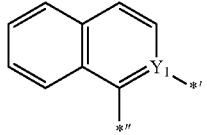
CY₁-17
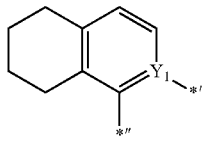
CY₁-18
-continued
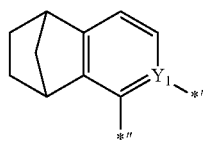
CY₁-19
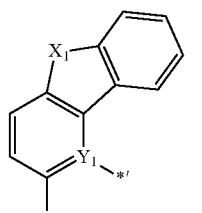
CY₁-20
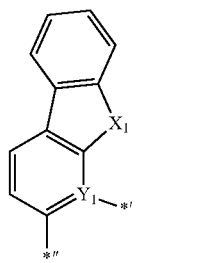
CY₁-21
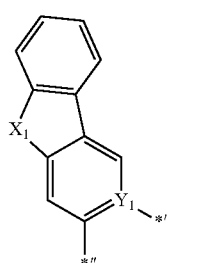
CY₁-22
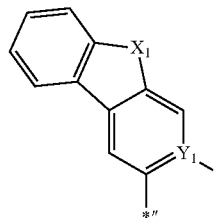
CY₁-23
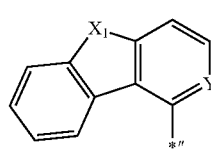
CY₁-24
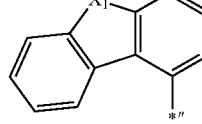
CY₁-25
wherein, in Formulae CY₁-1 to CY₁-25,
Y₁ is as defined in the present specification,
X₁ may be O, S, Se, N(R₁₈)(R₁₉), C(R₁₈)(R₁₉), or Si(R₁₈)(R₁₉),
R₁₈ and R₁₉ are each as defined in connection with R₁ in the present specification,

*' indicates a binding site to M in Formula 1, and
*" indicates a binding site to a neighboring atom in Formula 2-1.
In one or more embodiments, a group represented by
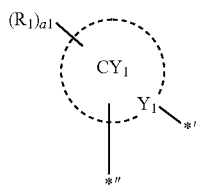
in Formula 2-1 may be a group represented by one of Formulae CY₁(1) to CY₁(16):
CY1(1)
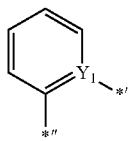
CY1(2)
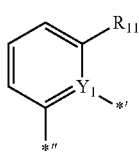
CY1(3)
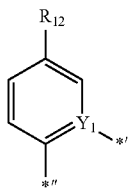
CY1(4)
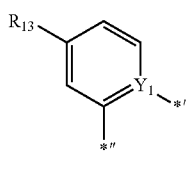
CY1(5)
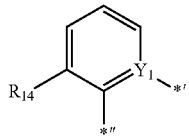
CY1(6)
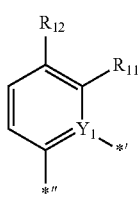
CY1(7)
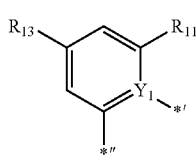
-continued
CY1(8)
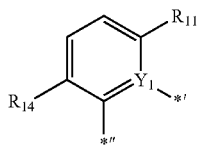
CY1(9)
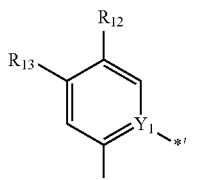
CY1(10)
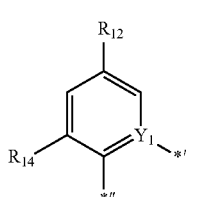
CY1(11)
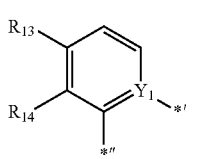
CY1(12)
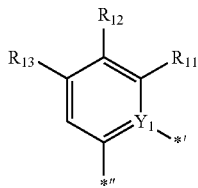
CY1(13)
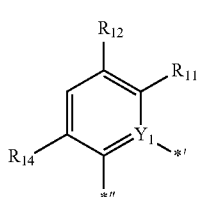
CY1(14)
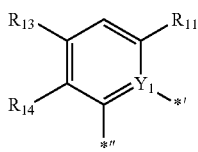
CY1(15)
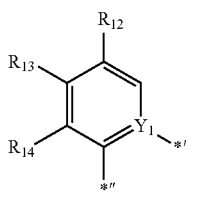

CY1(16)

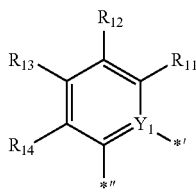

wherein, in Formulae $CY_1(1)$ to $CY_1(16)$, $Y_1$ is as defined in the present specification, $R_{11}$ to $R_{14}$ are each as defined in connection with $R_1$ in the present specification, wherein each of $R_{11}$ to $R_{14}$ may not be hydrogen,

*' indicates a binding site to M in Formula 1, and

*'' indicates a binding site to a neighboring atom in Formula 2-1.

In one or more embodiments, a group represented by

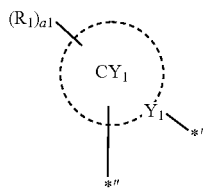

in Formula 2-1 may be a group represented by one of Formulae $CY_1(1)$, $CY_1(3)$, $CY_1(4)$, and $CY_1(9)$, and $R_{12}$ and $R_{13}$ in Formulae $CY_1(3)$, $CY_1(4)$, and $CY_1(9)$ may each independently be a $C_1$-$C_{20}$ alkyl group, a deuterated $C_1$-$C_{20}$ alkyl group, —Si($Q_3$)($Q_4$)($Q_5$), or —Ge($Q_3$)($Q_4$)($Q_5$). In Formula 2-1, *' indicates a binding site to M in Formula 1, and *'' indicates a binding site to a neighboring atom.

In one or more embodiments, a group represented by

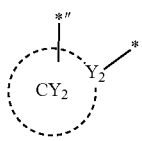

in Formula 2-1 may be a group represented by one of Formulae $CY_2$-1 to $CY_2$-50:

CY2-1

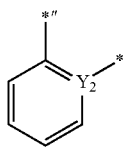

CY2-2

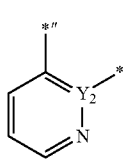

CY2-3

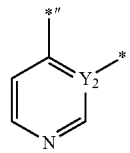

CY2-4

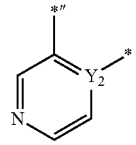

CY2-5

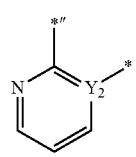

CY2-6

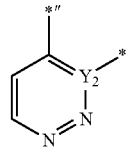

CY2-7

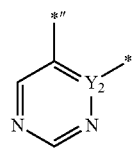

CY2-8

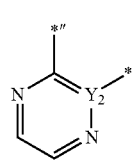

CY2-9

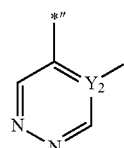

CY2-10

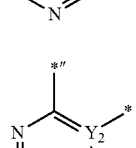

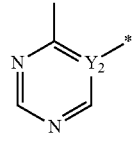

CY2-11

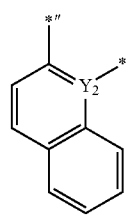

-continued
CY2-12
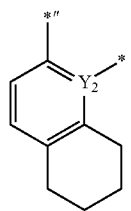
CY2-13
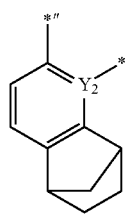
CY2-14
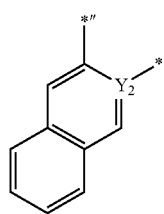
CY2-15
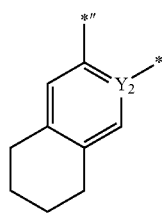
CY2-16
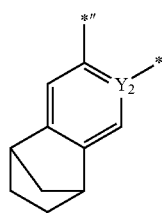
CY2-17
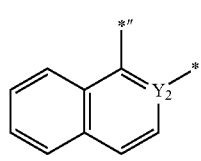
CY2-18
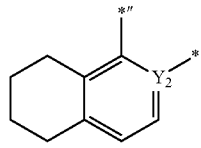
CY2-19
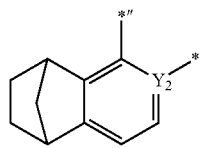
-continued
CY2-20
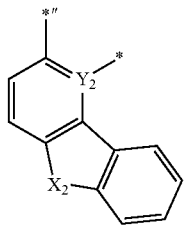
CY2-21
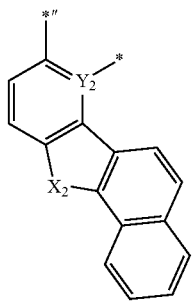
CY2-22
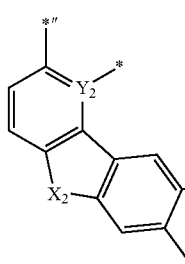
CY2-23
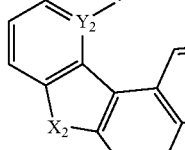
CY2-24
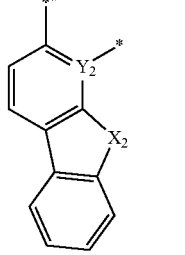
CY2-25
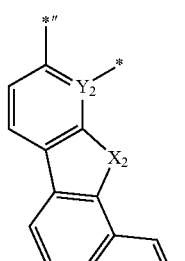

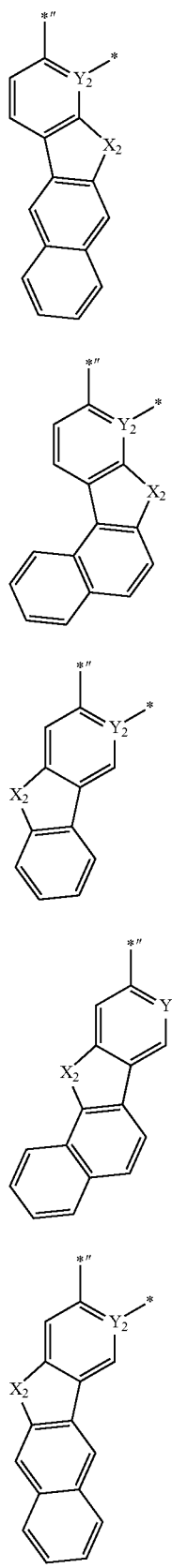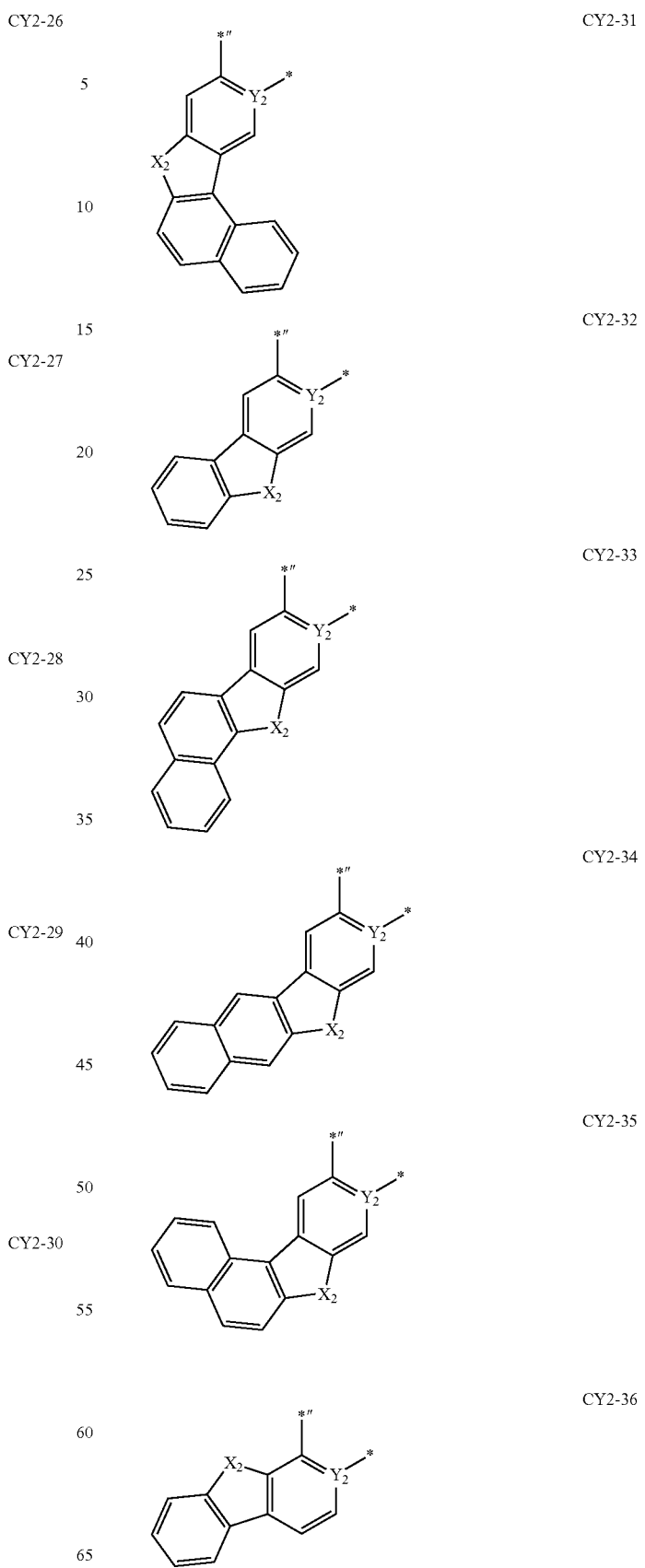

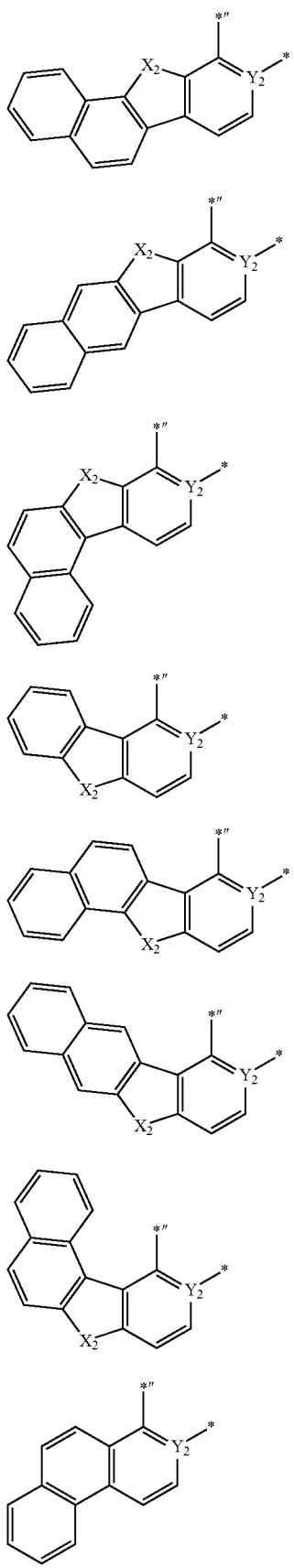
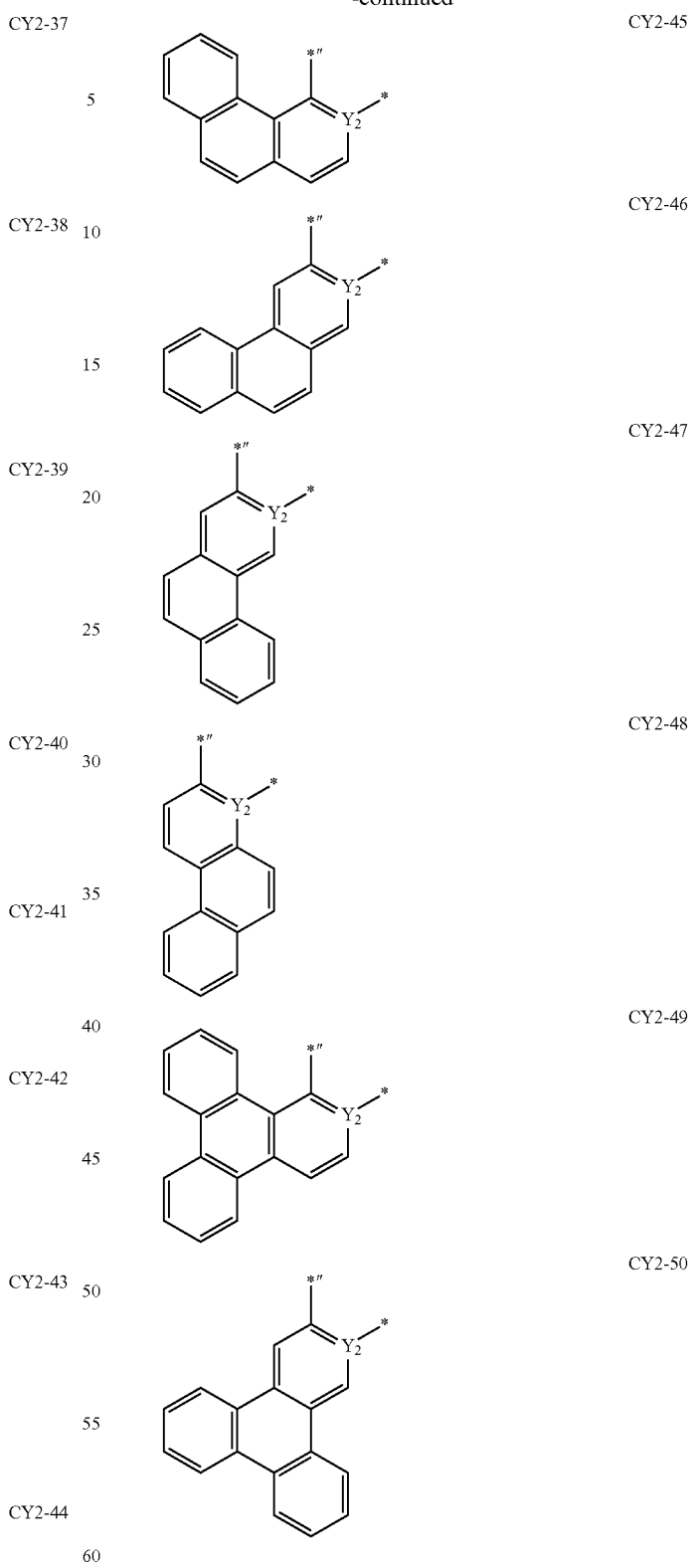
wherein, in Formulae CY$_2$-1 to CY$_2$-50,
Y$_2$ is as defined in the present specification,
X$_2$ may be O, S, Se, N(R$_{28}$), C(R$_{28}$)(R$_{29}$), or Si(R$_{28}$)(R$_{29}$),
R$_{28}$ and R$_{29}$ are each as defined in connection with R$_2$ in the present specification,

*‴ indicates a binding site to a neighboring atom in Formula 2-1, and
* indicates a binding site to M in Formula 1.
In one or more embodiments, a group represented by
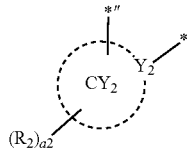
in Formula 2-1 may be a group represented by one of Formulae CY₂(1) to CY₂(57):
CY2(1)
CY2(2)
CY2(3)
CY2(4)
CY2(5)
CY2(6)
CY2(7)
CY2(8)
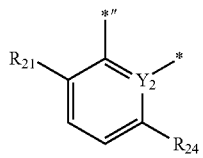
CY2(9)
CY2(10)
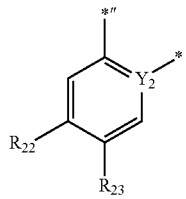
CY2(11)
CY2(12)
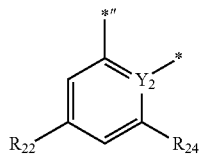
CY2(13)
CY2(14)
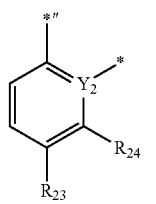
CY2(15)
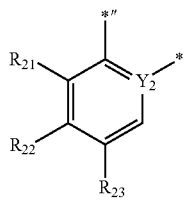
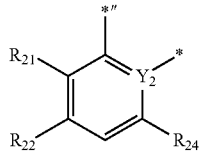
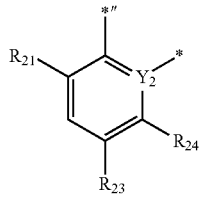
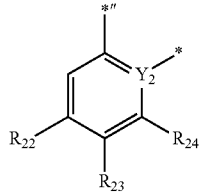

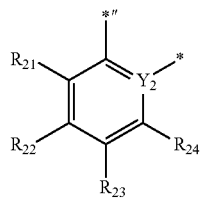 CY2(16)
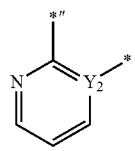 CY2(17)
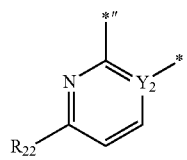 CY2(18)
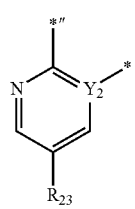 CY2(19)
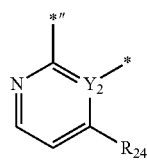 CY2(20)
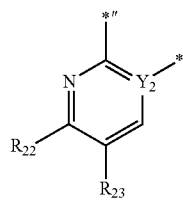 CY2(21)
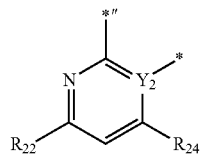 CY2(22)
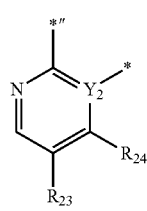 CY2(23)
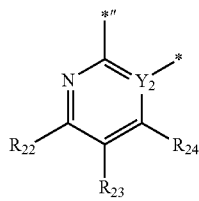 CY2(24)
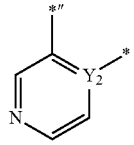 CY2(25)
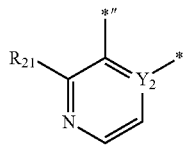 CY2(26)
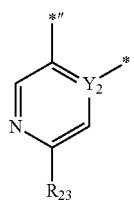 CY2(27)
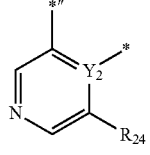 CY2(28)
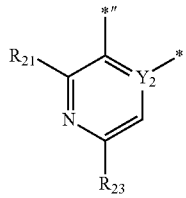 CY2(29)
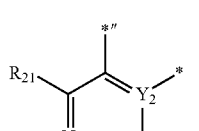 CY2(30)
 CY2(31)
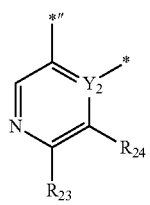

CY2(32) 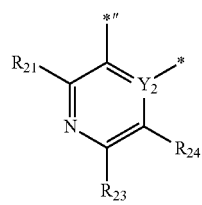
CY2(33) 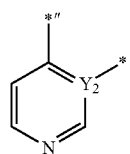
CY2(34) 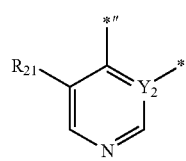
CY2(35) 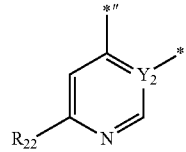
CY2(36) 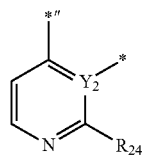
CY2(37) 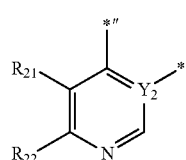
CY2(38) 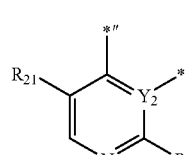
CY2(39) 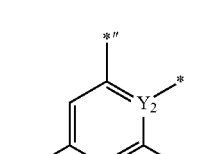
CY2(40) 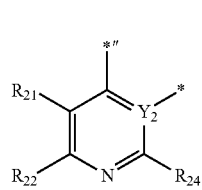
CY2(41) 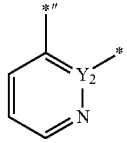
CY2(42) 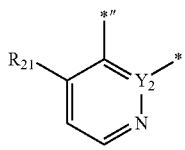
CY2(43) 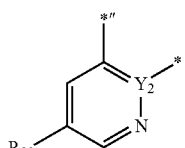
CY2(44) 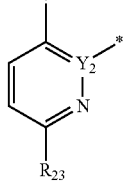
CY2(45) 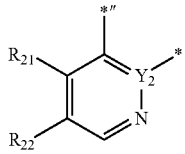
CY2(46) 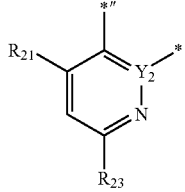
CY2(47) 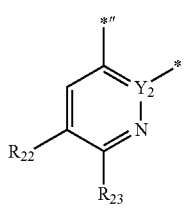
CY2(48) 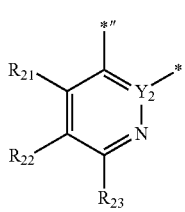
CY2(49) 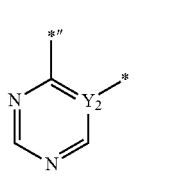

-continued

CY2(50)
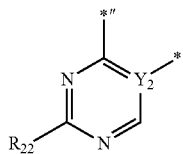

CY2(51)
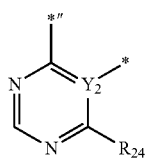

CY2(52)
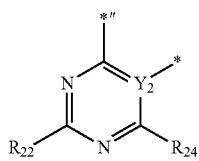

CY2(53)
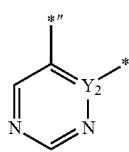

CY2(54)
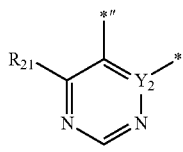

CY2(55)
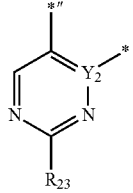

CY2(56)
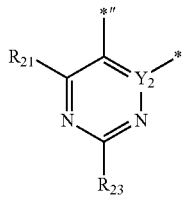

CY2(57)
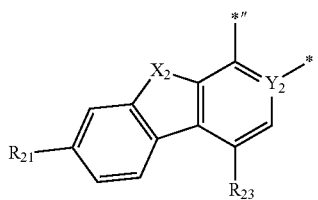

wherein, in Formulae CY$_2$(1) to CY$_2$(57),

Y$_2$ is as defined in the present specification,

R$_{21}$ to R$_{24}$ are each as defined in connection with R$_2$, wherein each of R$_{21}$ to R$_{24}$ may not be hydrogen,

*''' indicates a binding site to a neighboring atom in Formula 2-1, and

* indicates a binding site to M in Formula 1.

In one or more embodiments, a group represented by

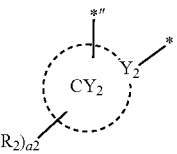

in Formula 2-1 may be a group represented by one of Formulae CY$_2$-11 to CY$_2$-50, wherein *''' indicates a binding site to a neighboring atom in Formula 2-1, and * indicates a binding site to M in Formula 1.

In one or more embodiments, a group represented by

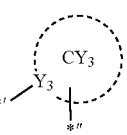

in Formula 2-2 may be a group represented by one of Formulae CY3-1 to CY3-33:

CY3-1
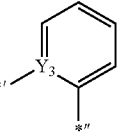

CY3-2
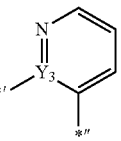

CY3-3
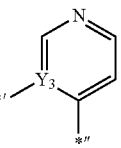

CY3-4
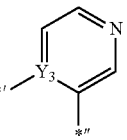

CY3-5
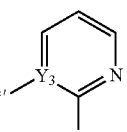

CY3-6
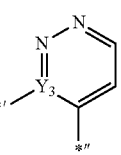

-continued
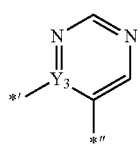 CY3-7
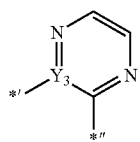 CY3-8
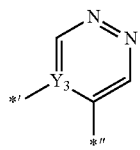 CY3-9
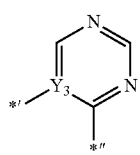 CY3-10
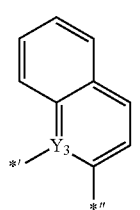 CY3-11
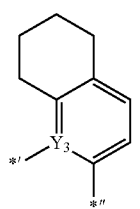 CY3-12
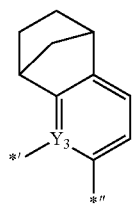 CY3-13
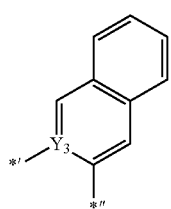 CY3-14
-continued
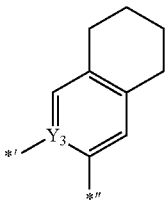 CY3-15
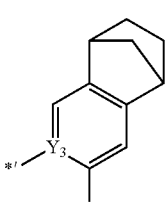 CY3-16
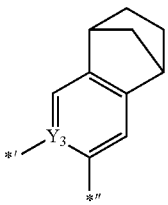 CY3-17
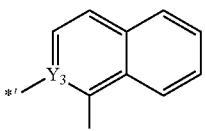 CY3-18
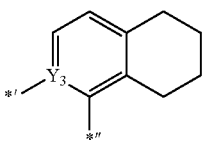 CY3-19
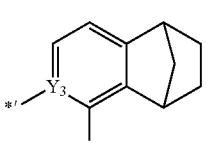 CY3-20
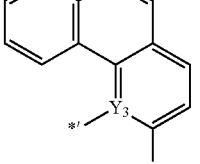 CY3-21
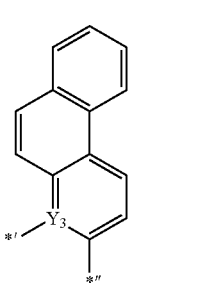 CY3-22

-continued

CY3-23
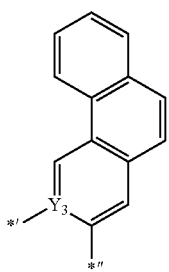

CY3-24
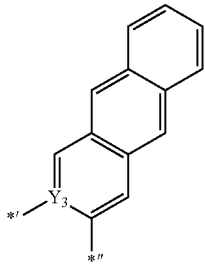

CY3-25
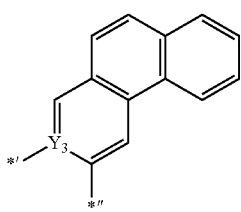

CY3-26
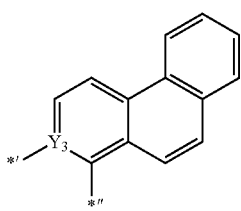

CY3-27
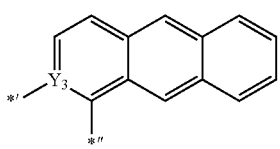

CY3-28
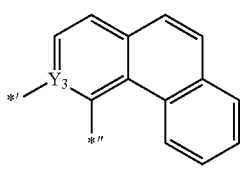

CY3-29
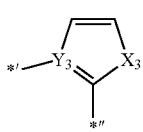

CY3-30
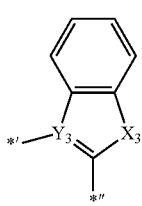

-continued

CY3-31
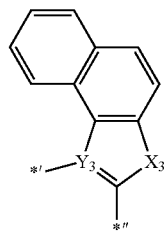

CY3-32
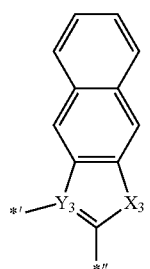

CY3-33
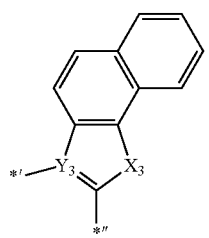

wherein, in Formulae CY3-1 to CY3-33,
$Y_3$ is as defined in the present specification,
$X_3$ may be O, S, Se, $N(R_{38})$, $C(R_{38})(R_{39})$, or $Si(R_{38})(R_{39})$,
$R_{38}$ and $R_{39}$ are each as defined in connection with $R_3$ in the present specification,
*' indicates a binding site to M in Formula 1, and
*" indicates a binding site to a neighboring atom in Formula 2-2.

In one or more embodiments, a group represented by

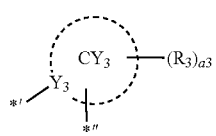

in Formula 2-2 may be a group represented by one of Formulae CY3(1) to CY3(16):

CY3(1)
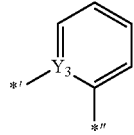

CY3(2)
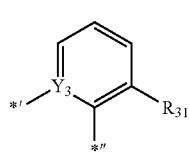

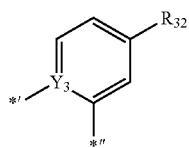 CY3(3)

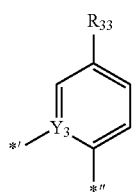 CY3(4)

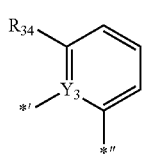 CY3(5)

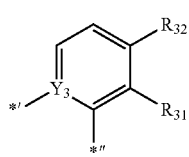 CY3(6)

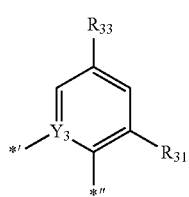 CY3(7)

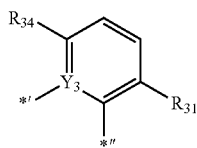 CY3(8)

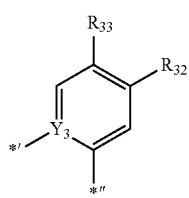 CY3(9)

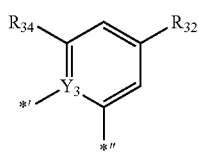 CY3(10)

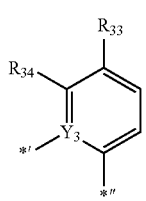 CY3(11)

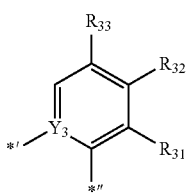 CY3(12)

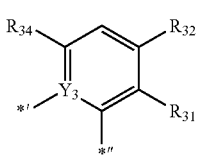 CY3(13)

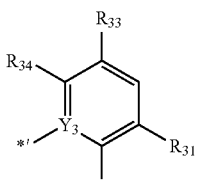 CY3(14)

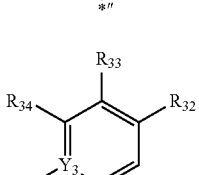 CY3(15)

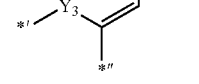 CY3(16)

wherein, in Formulae CY3(1) to CY3(16), $Y_3$ is as defined in the present specification, $R_{31}$ to $R_{34}$ are each as defined in connection with $R_3$ in the present specification, wherein each of $R_{31}$ to $R_{34}$ may not be hydrogen,

*' indicates a binding site to M in Formula 1, and

*'' indicates a binding site to a neighboring atom in Formula 2-2.

In one or more embodiments, a group represented by

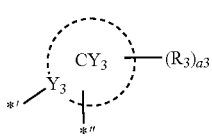

in Formula 2-2 may be a group represented by one of Formulae CY3-29 to CY3-33.

In one or more embodiments, a group represented by

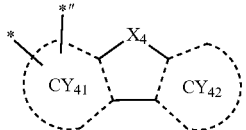

in Formula 2-2 may be represented by one of Formulae CY4-1 to CY4-6:

CY4-1

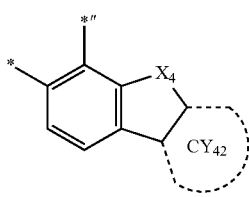

CY4-2

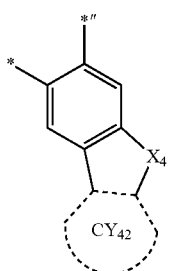

CY4-3

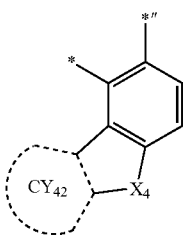

CY4-4

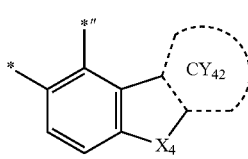

CY4-5

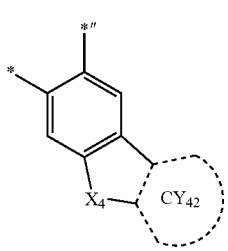

CY4-6

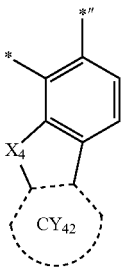

wherein, in Formulae CY4-1 to CY4-6, $X_4$ and ring CY42 are each the same as described in the present specification,

* indicates a binding site to M in Formula 1, and

*'' indicates a binding site to ring $CY_3$ in Formula 2-2.

In one or more embodiments, a group represented by

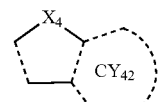

of the structure

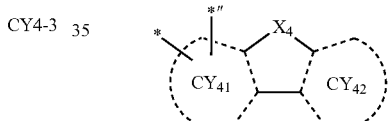

in Formula 2-2 may be represented by one of Formulae CY401 to CY413:

CY401

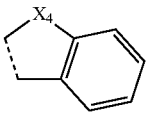

CY402

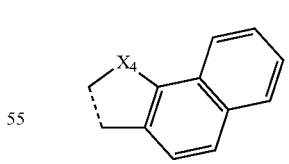

CY403

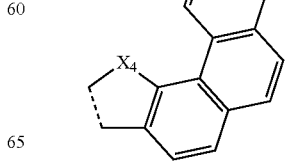

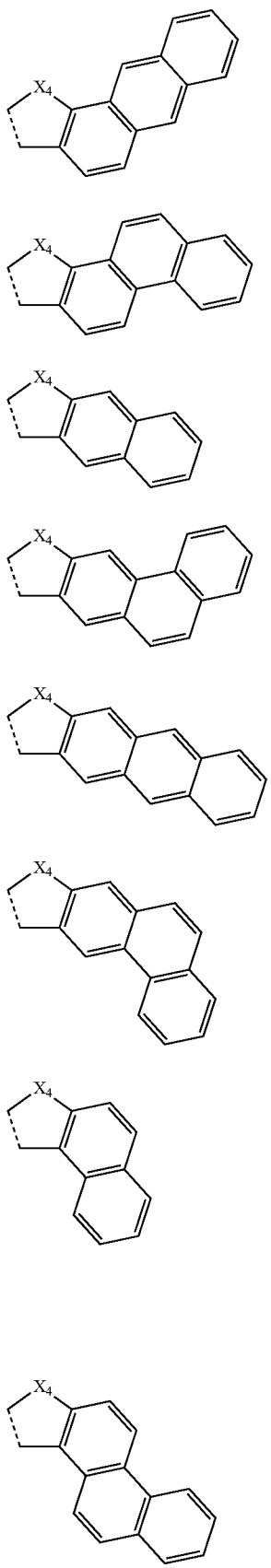

CY404
CY405
CY406
CY407
CY408
CY409
CY410
CY411

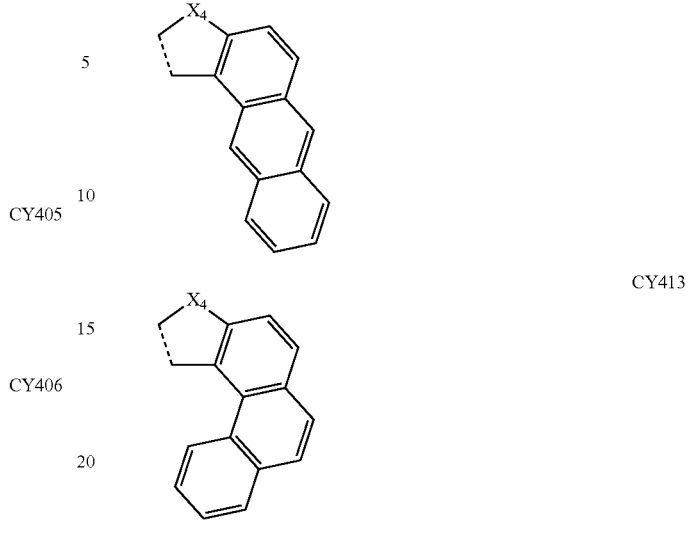

CY412
CY413 wherein, in Formulae CY401 to CY413, $X_4$ is as defined in the present specification, and an $X_4$-containing 5-membered ring may be condensed with a neighboring ring $CY_{41}$.

In one or more embodiments, ring $CY_{42}$ in Formula 2-2 may be substituted with at least one $Z_4$.

In one or more embodiments, a group represented by

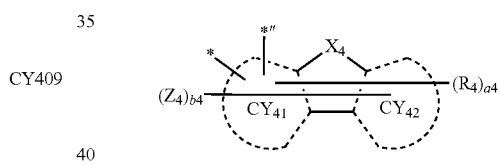

in Formula 2-2 may be represented by one of Formulae CY4(1) to CY4(21):

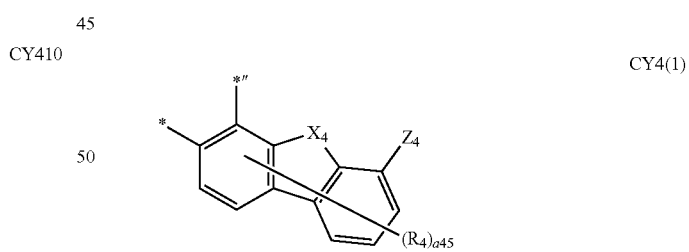

CY4(1)

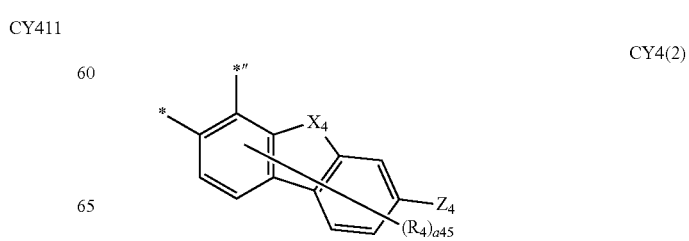

CY4(2)

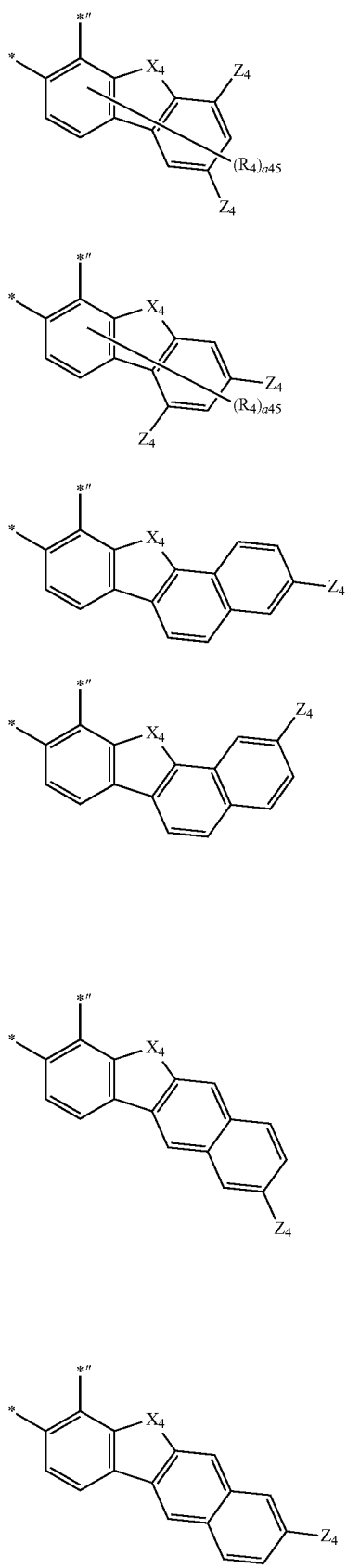
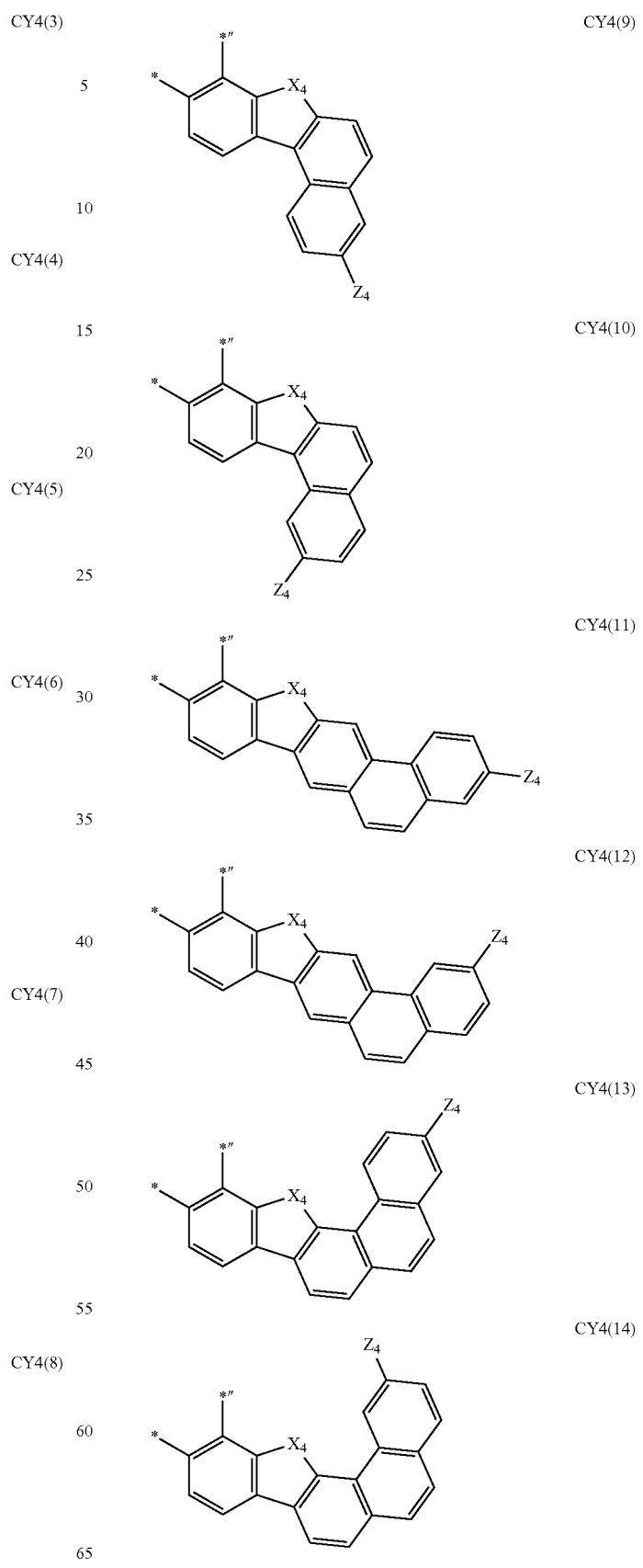

CY4(15)

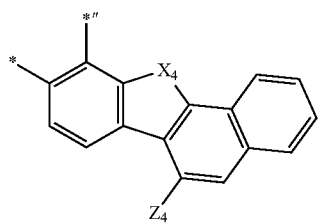

CY4(16)

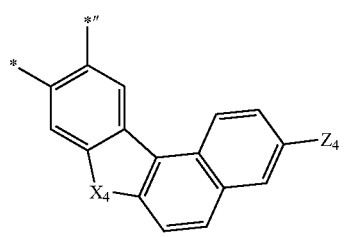

CY4(21)

CY4(17)

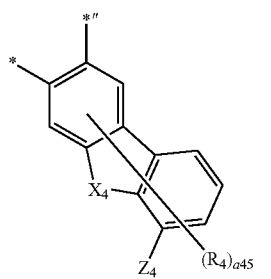

CY4(18)

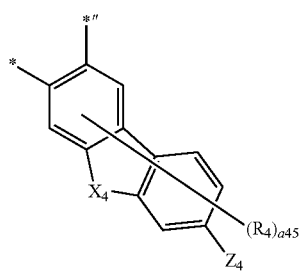

CY4(19)

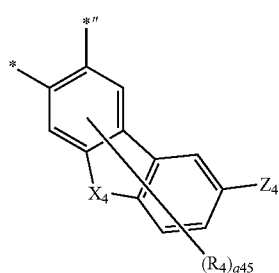

CY4(20)

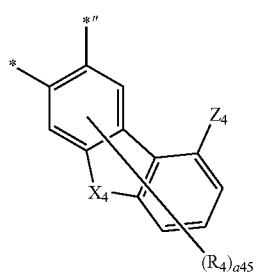

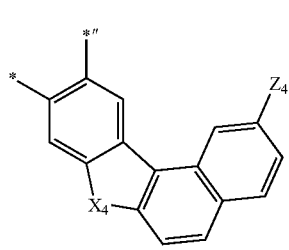

wherein, in Formulae CY4(1) to CY4(21), $X_4$, $R_4$, and $Z_4$ are each the same as described in the present specification, a45 may be an integer from 0 to 5,

* indicates a binding site to M in Formula 1, and

*''' indicates a binding site to ring $CY_3$ in Formula 2-2.

In one or more embodiments, $R_1$ to $R_4$ in Formulae 2-1 and 2-2 may not include Si and Ge.

In one or more embodiments, at least one of $R_1$ to $R_3$ in Formulae 2-1 and 2-2 may include Si or Ge.

In one or more embodiments, the organometallic compound represented by Formula 1 may emit red light or green light, for example, red or green light having a maximum emission wavelength of about 500 nanometers (nm) or more, for example, from about 500 nm or more to about 850 nm or less. In one or more embodiments, the organometallic compound may emit green light.

In one or more embodiments, the organometallic compound may be one of Compounds 1 to 174:

1

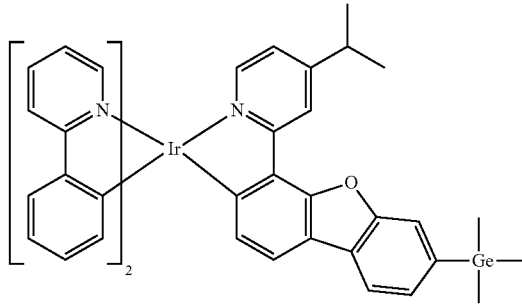

2

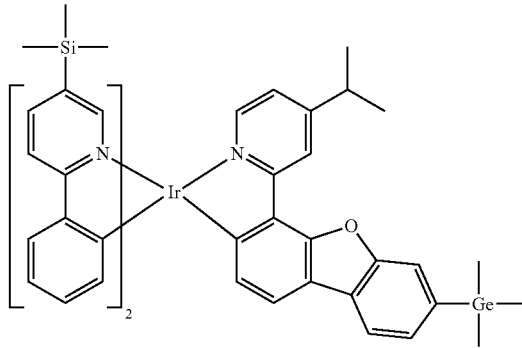

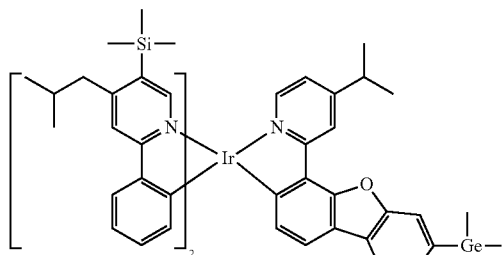
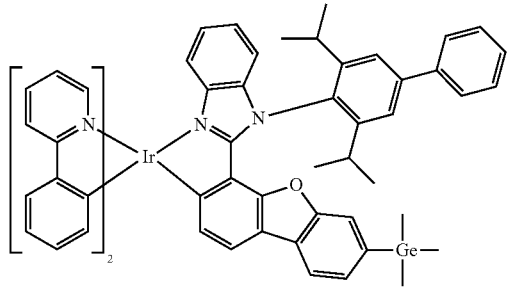
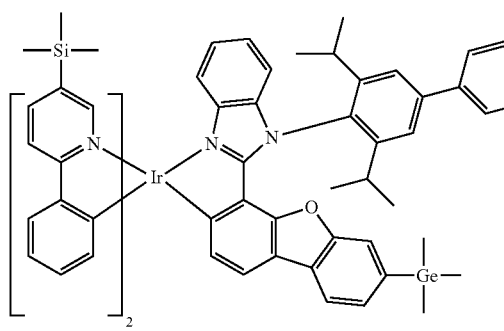
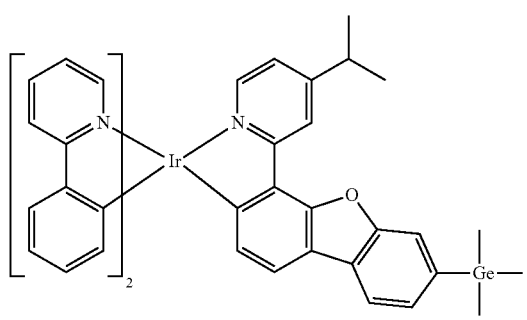
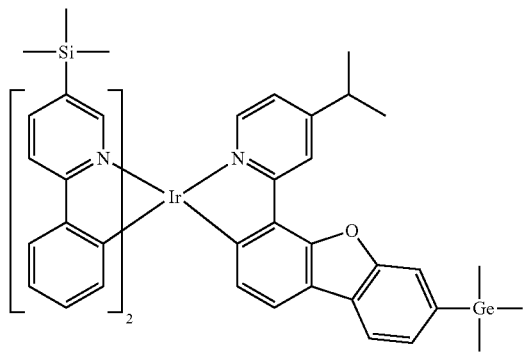
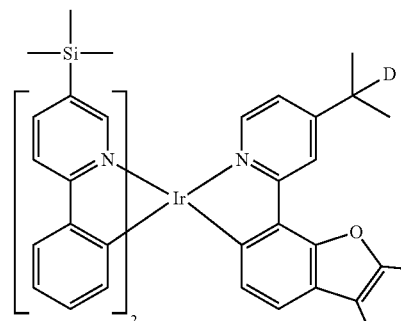
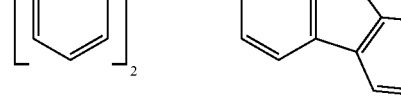
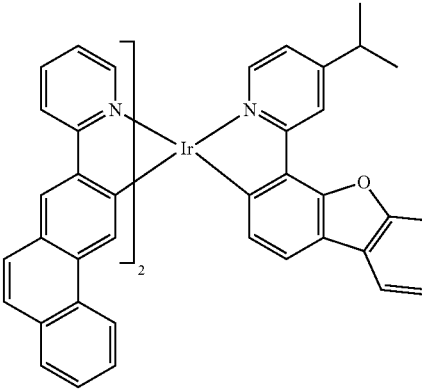
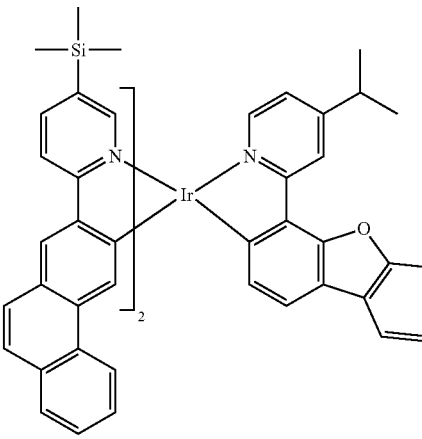

11
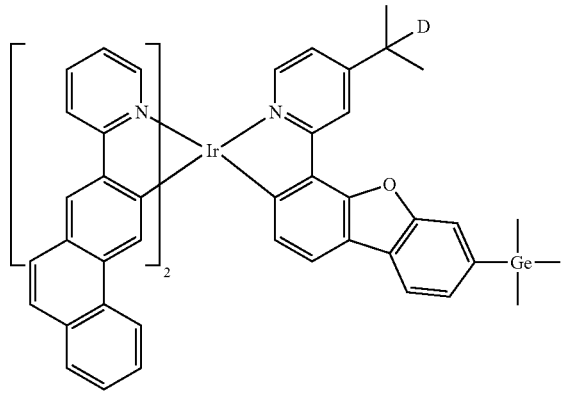
12
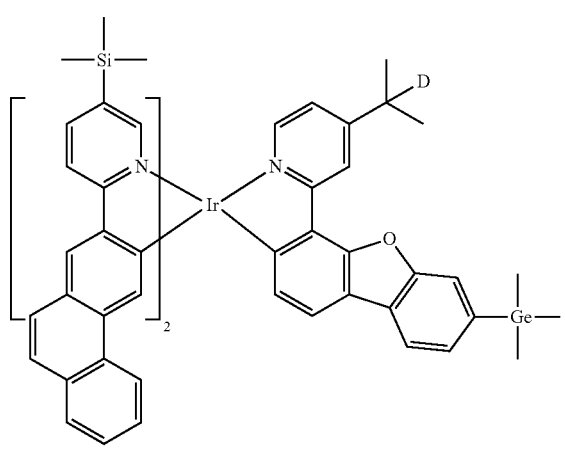
13
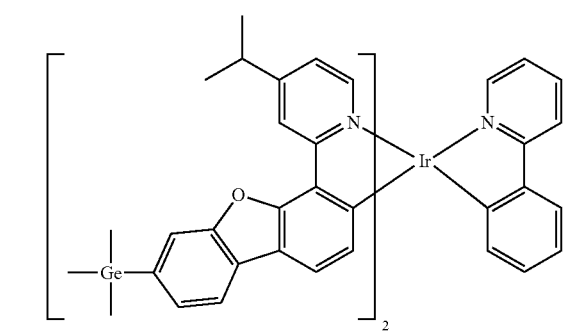
14
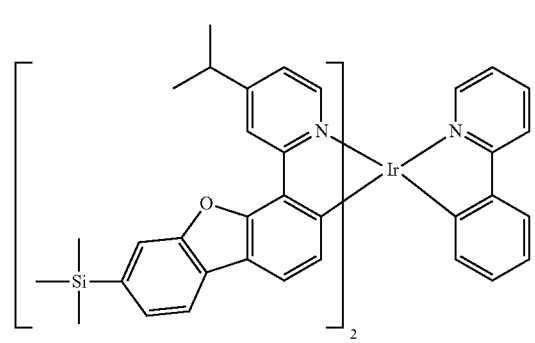
15
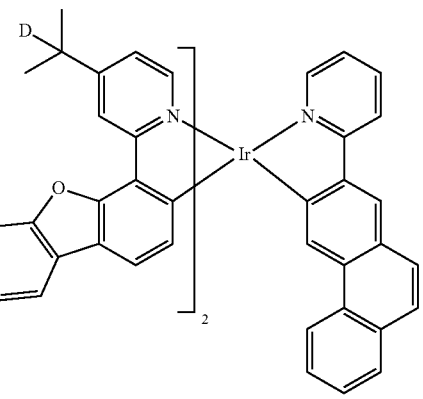
16
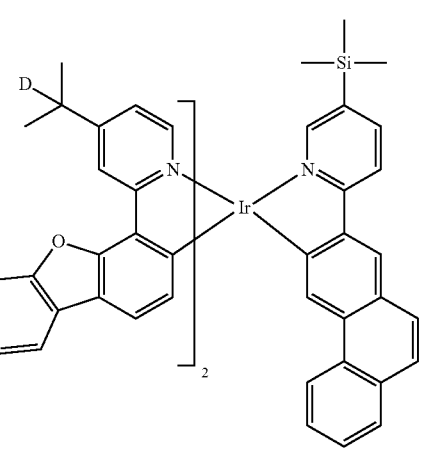
17
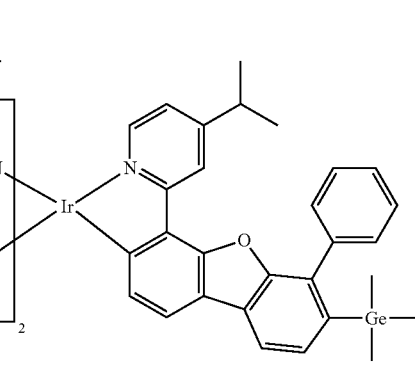
18
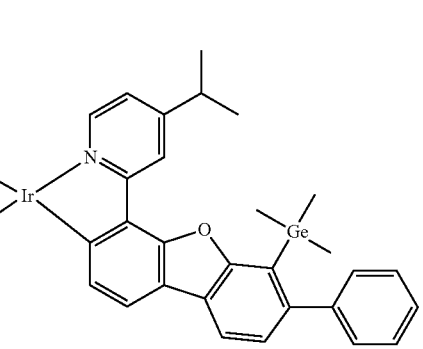

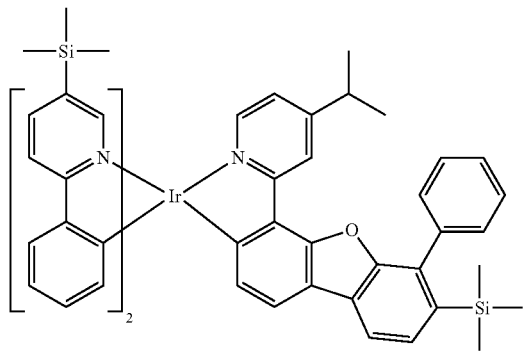
19
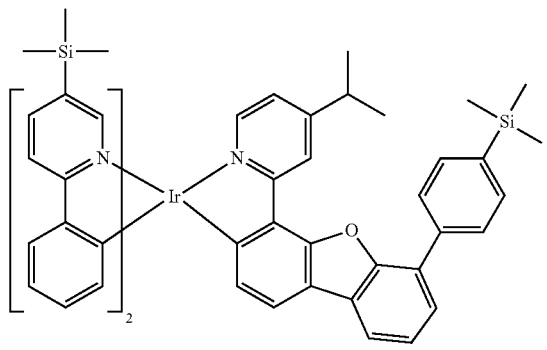
23
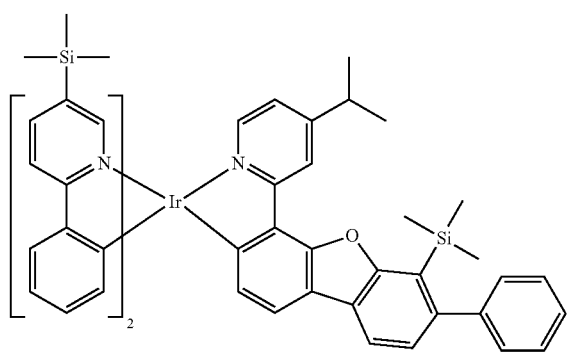
20
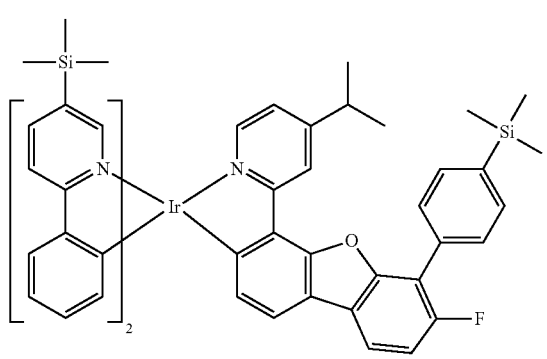
24
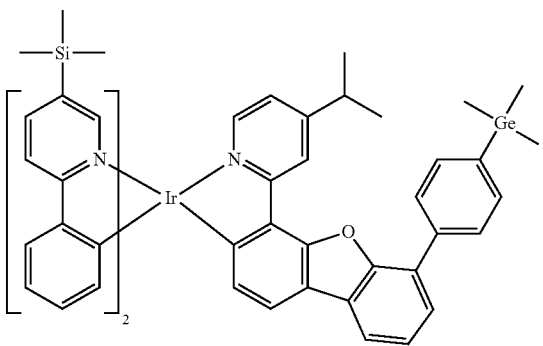
21
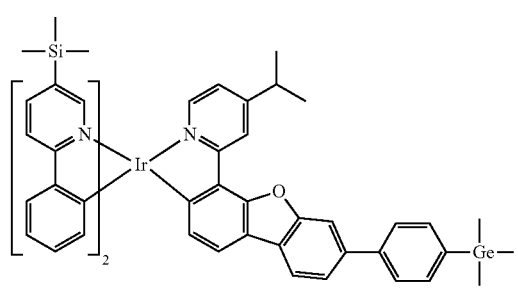
25
22
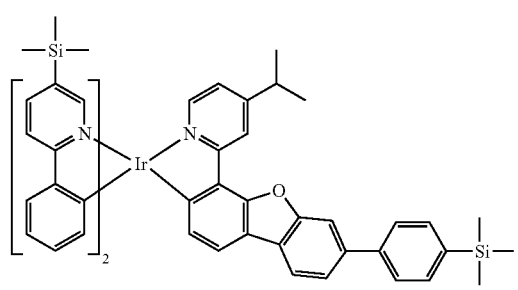
26
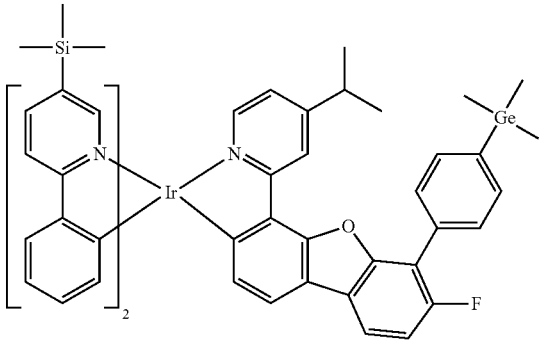
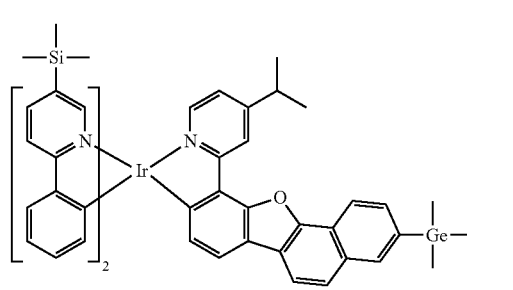
27

28
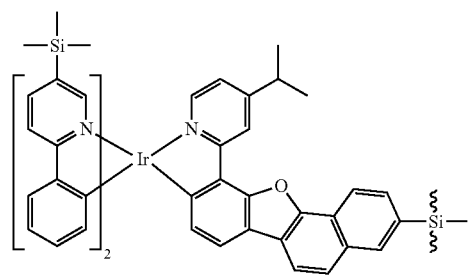
29
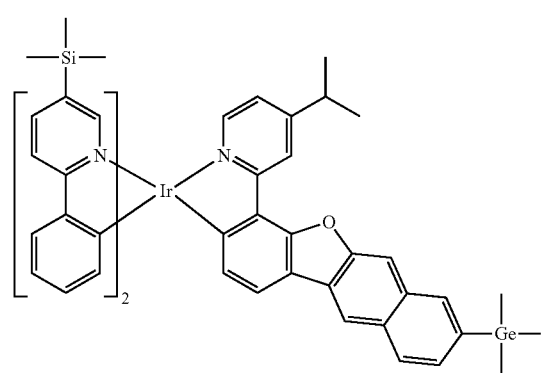
30
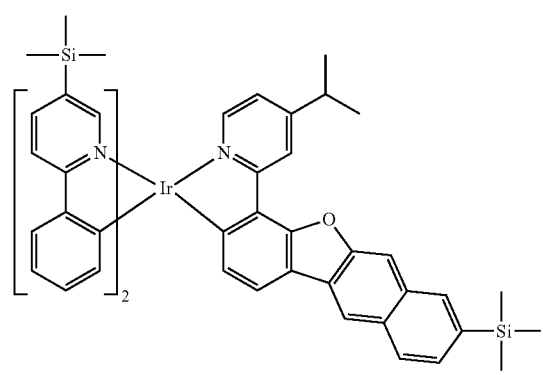
31
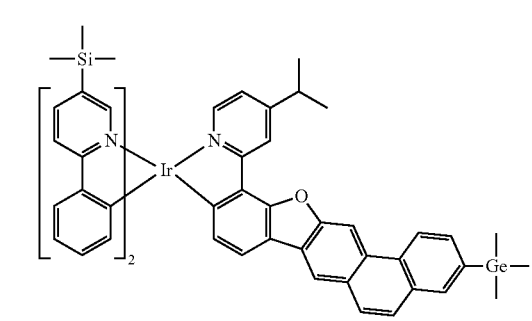
32
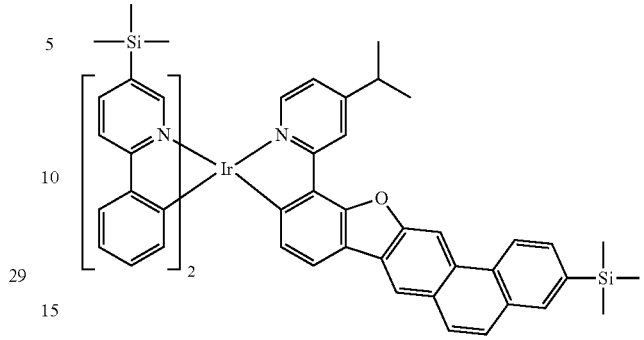
33
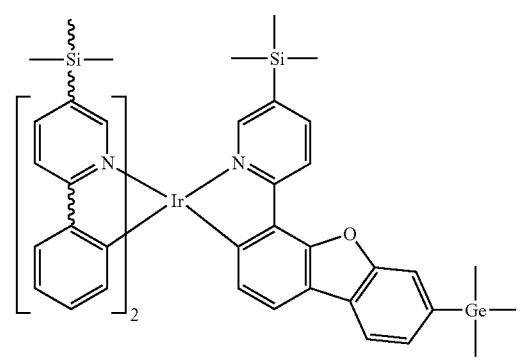
34
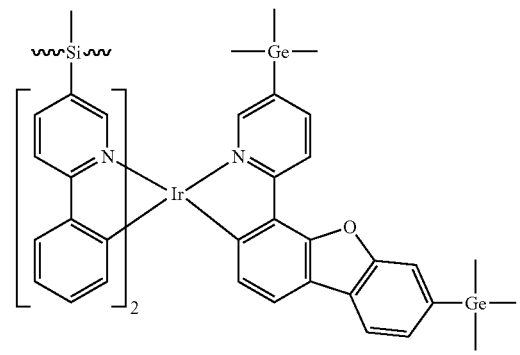
35
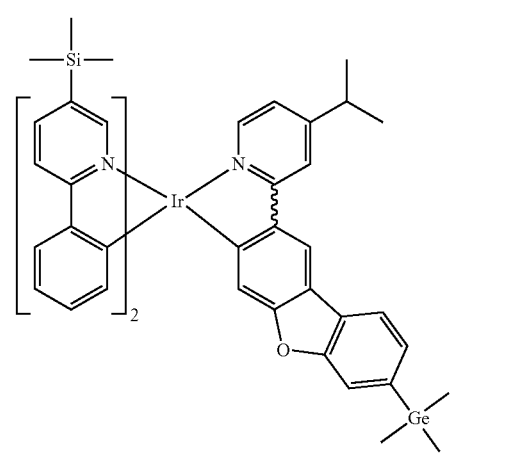

36
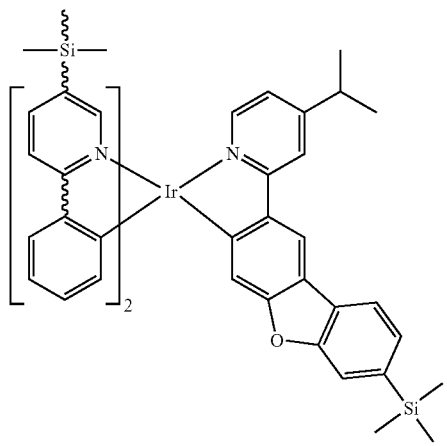
37
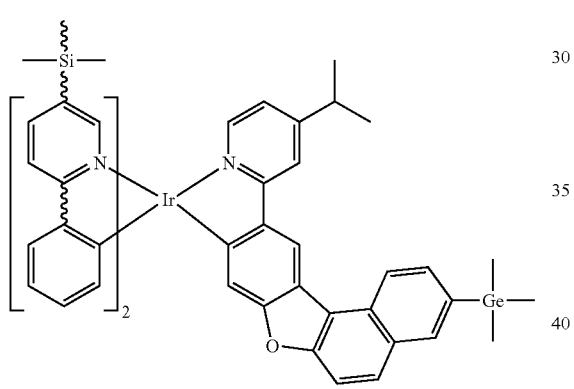
38
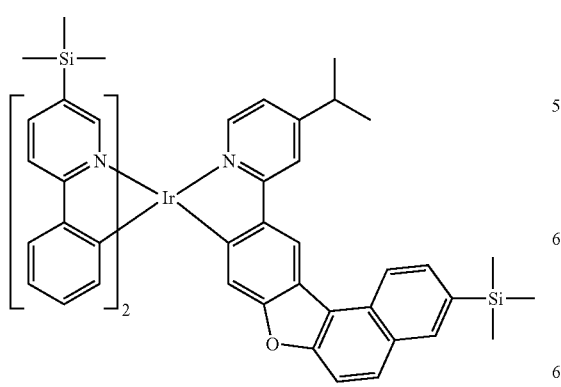
39
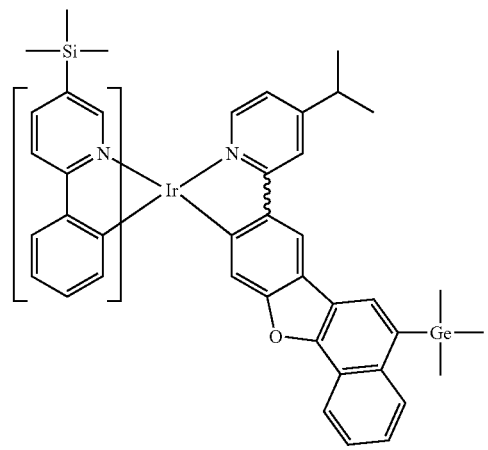
40
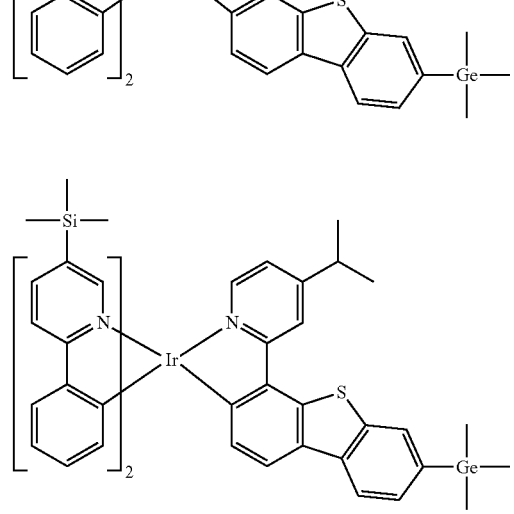
41
42
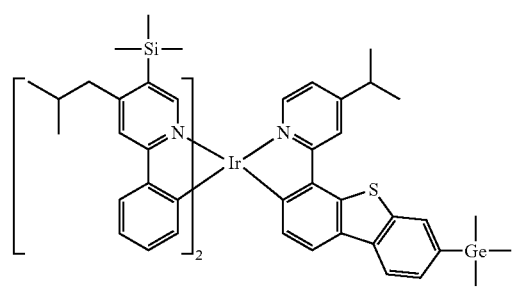

43
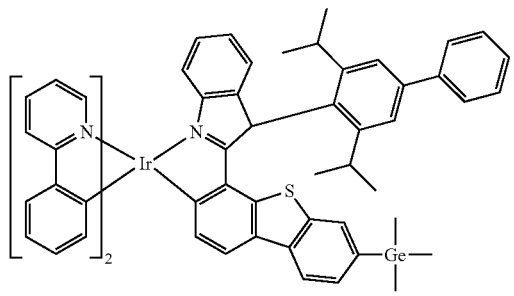
44
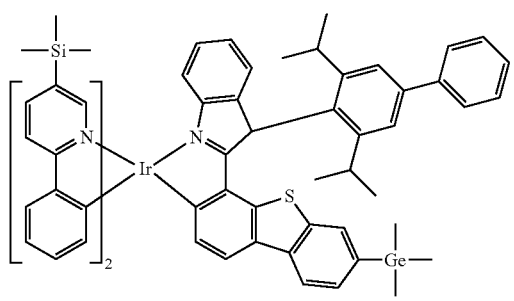
45
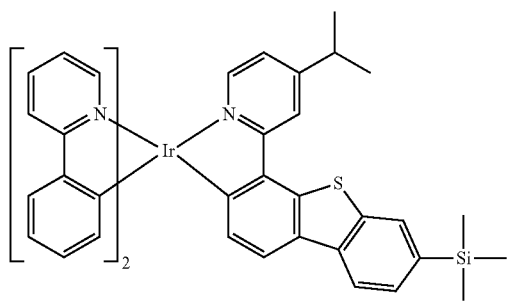
46
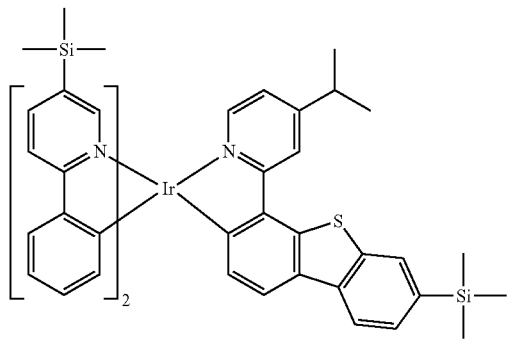
47
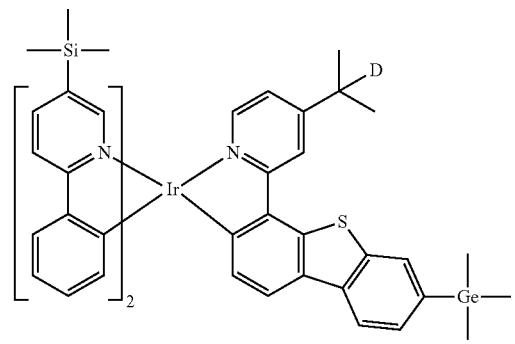
48
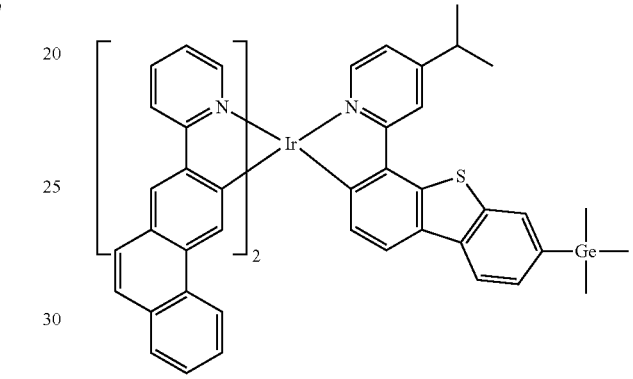
49
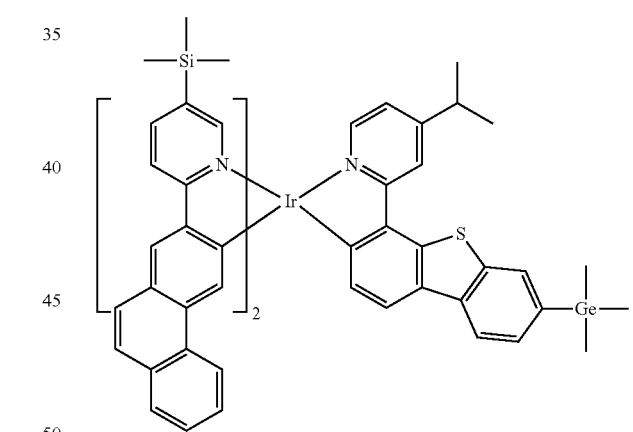
50
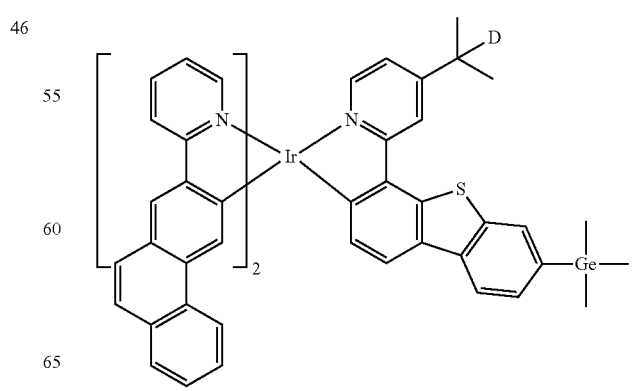

51
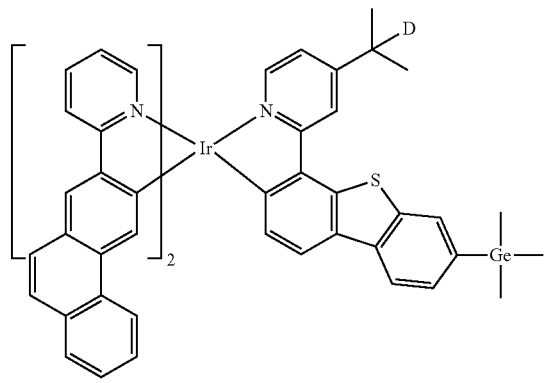
52
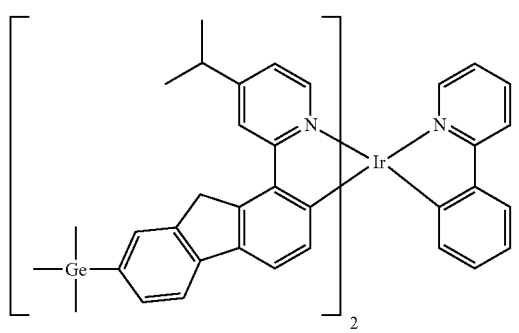
53
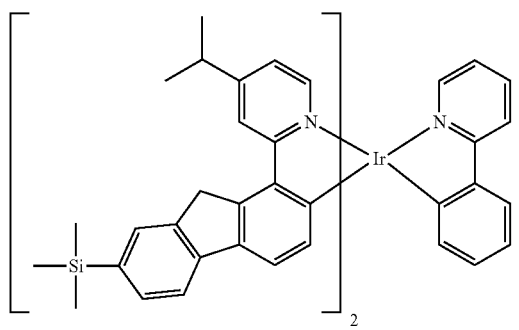
54
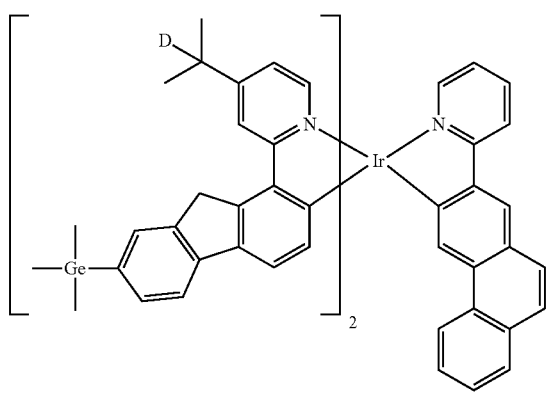
55
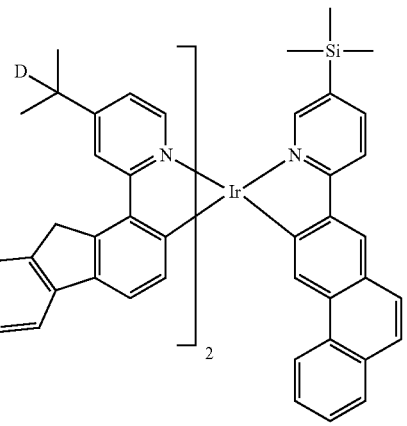
56
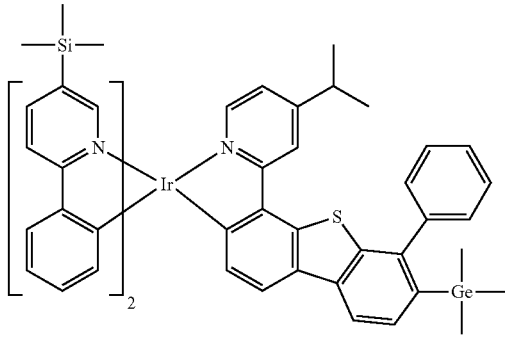
57
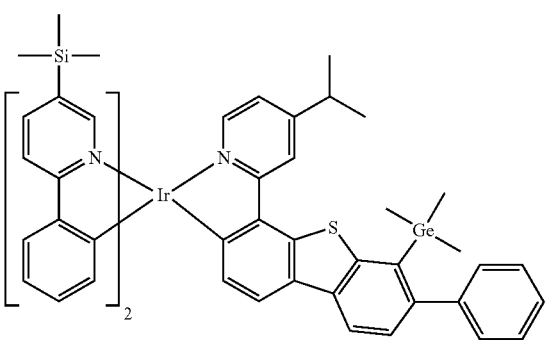
58
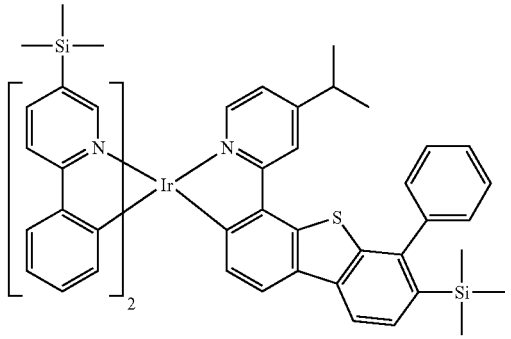

59
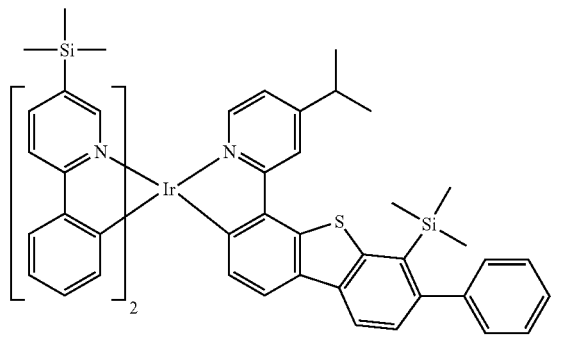
60
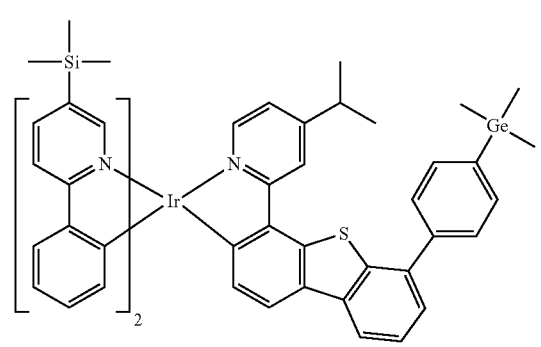
61
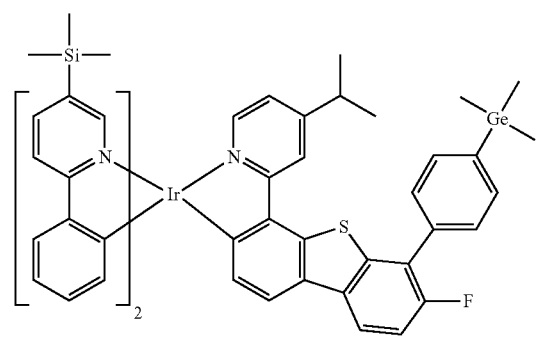
62
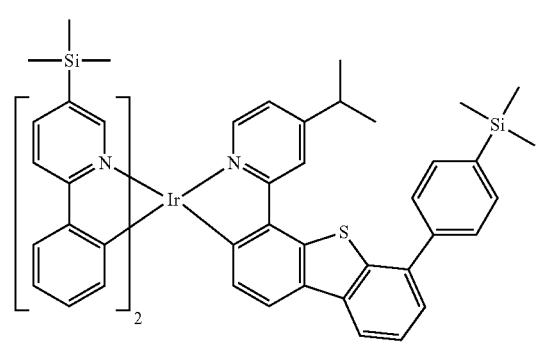
63
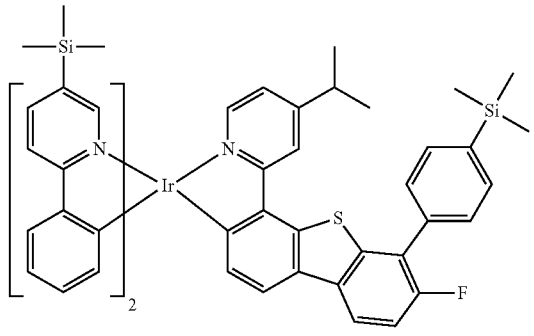
64
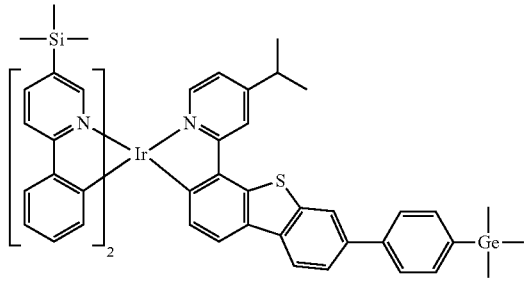
65
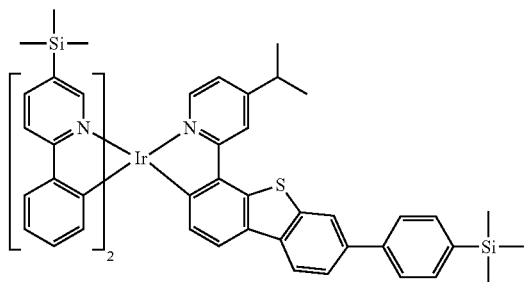
66
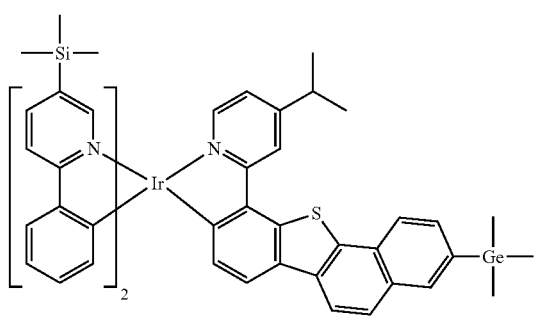
67
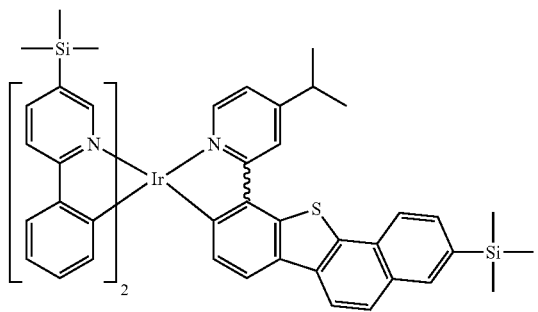

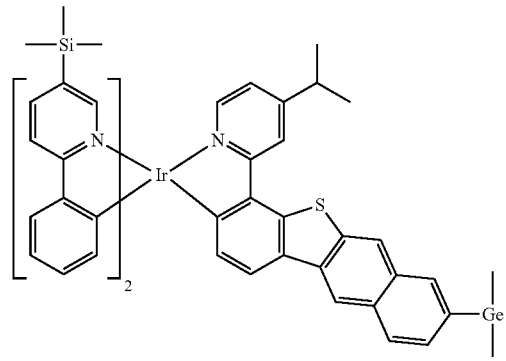
68
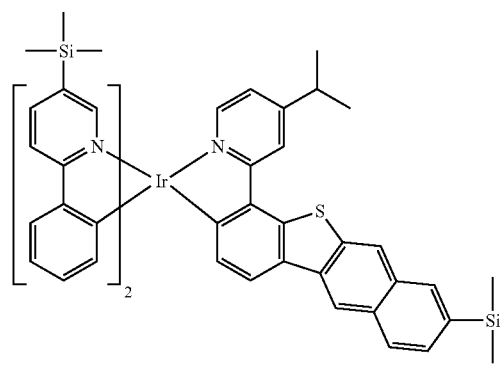
69
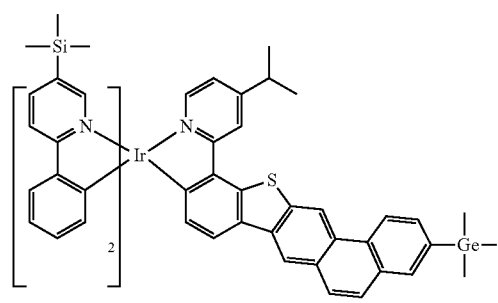
70
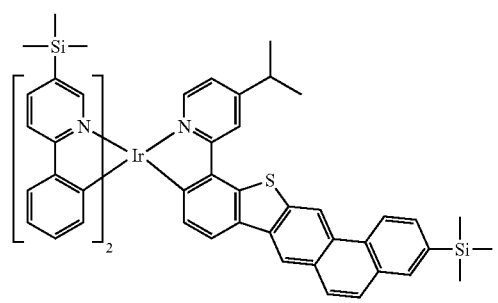
71
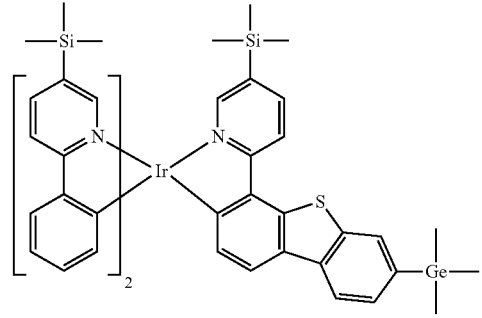
72
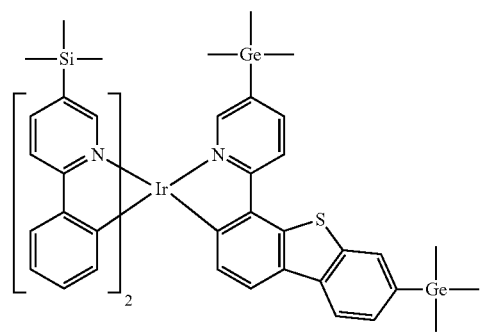
73
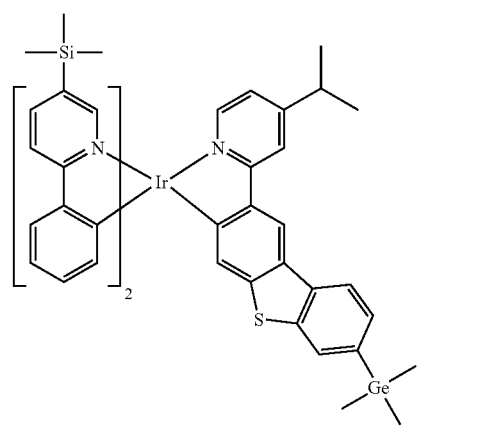
74
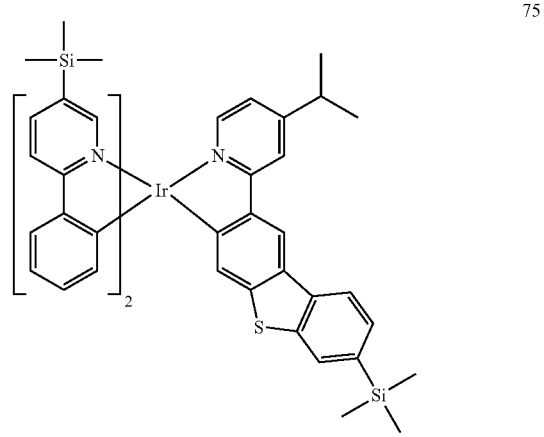
75

76
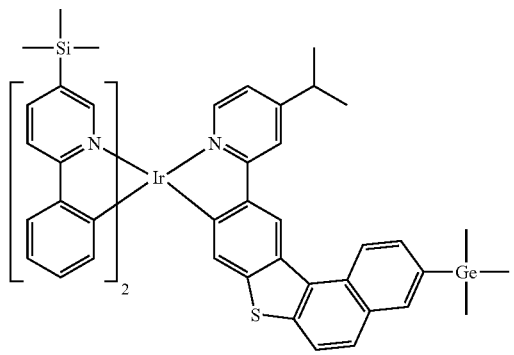
77
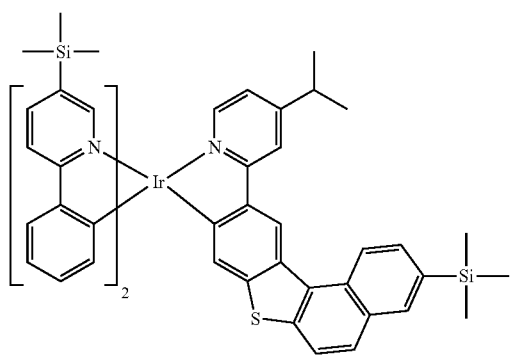
78
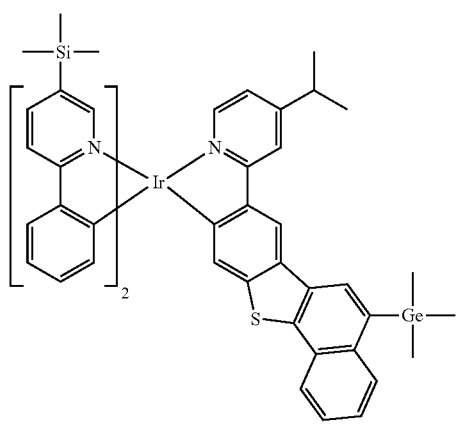
79
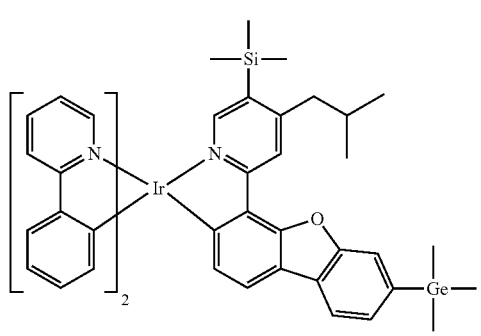
80
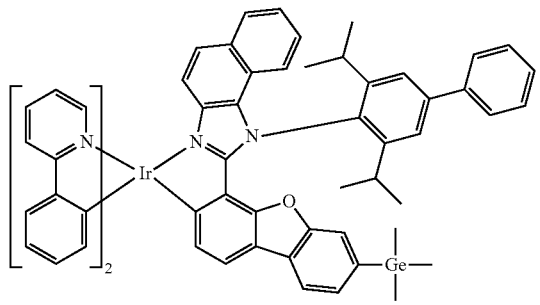
81
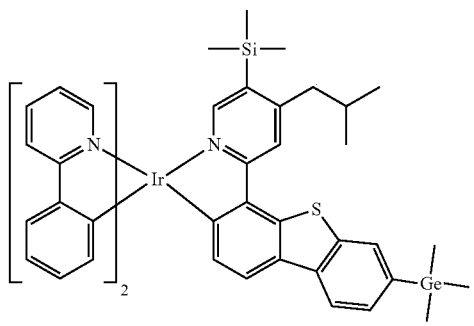
82
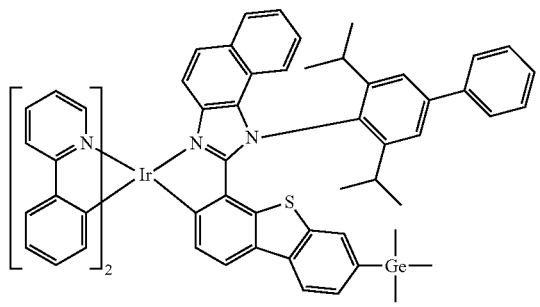
83
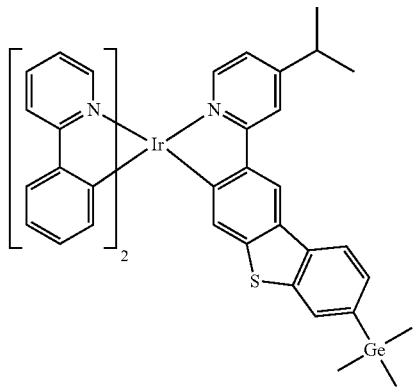

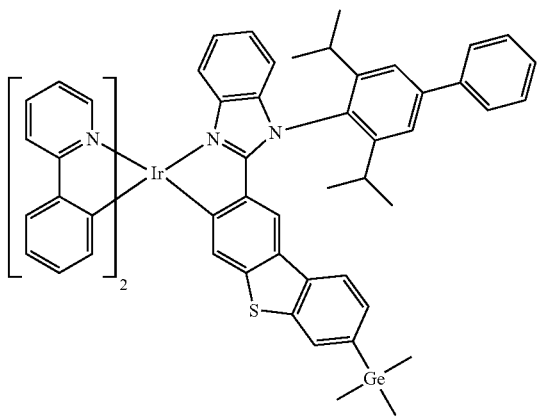
84
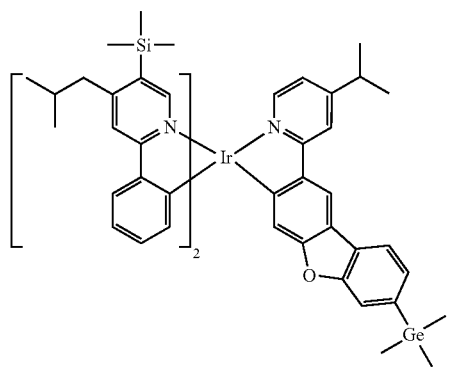
85
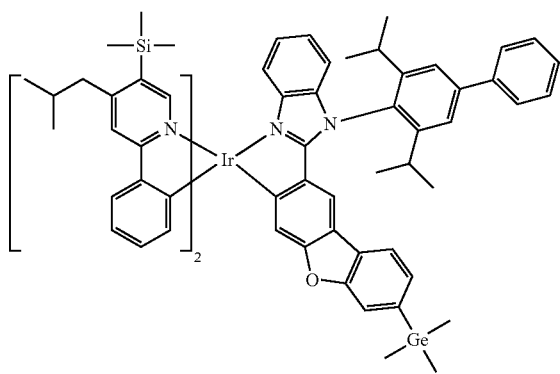
86
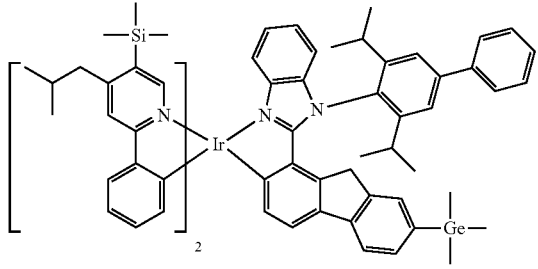
87
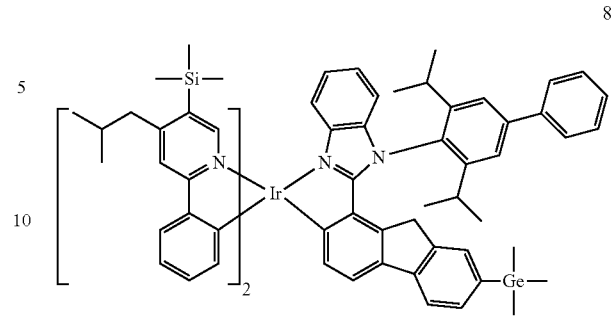
88
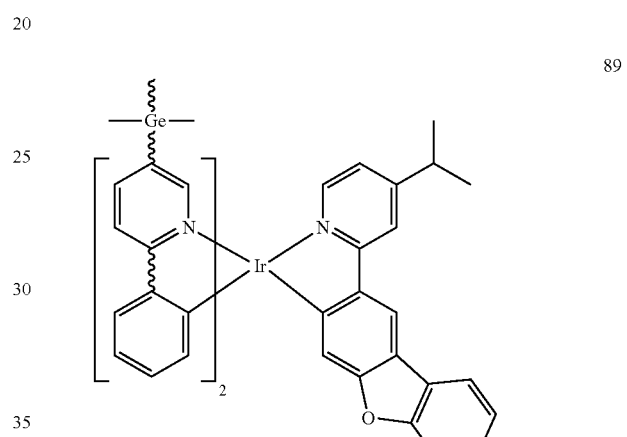
89
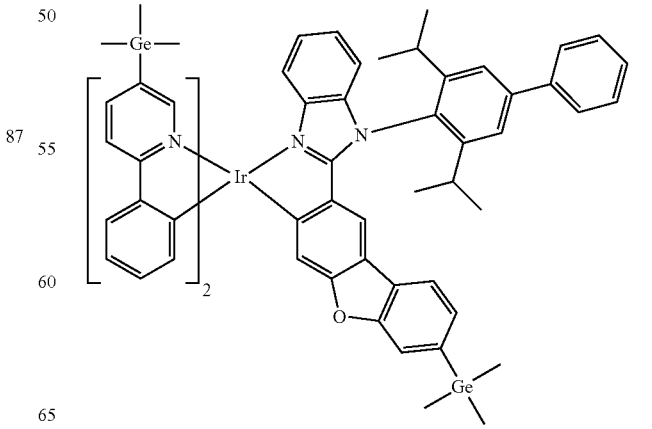
90

91
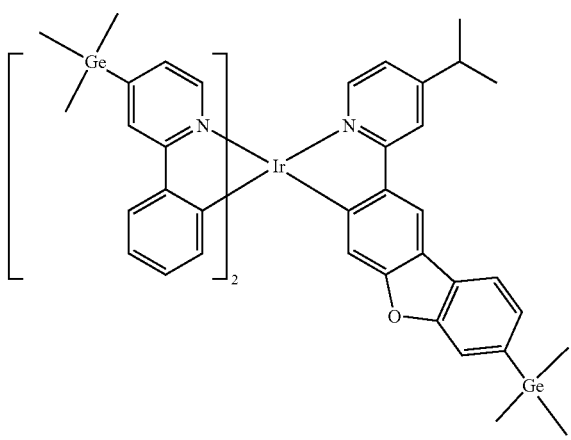
92
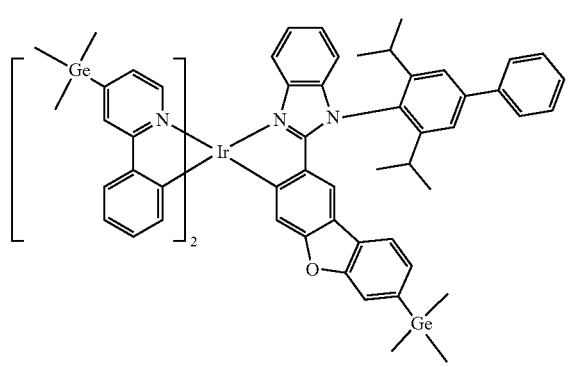
93
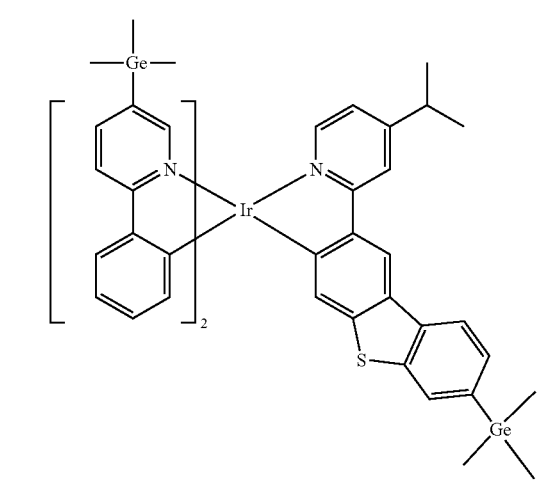
94
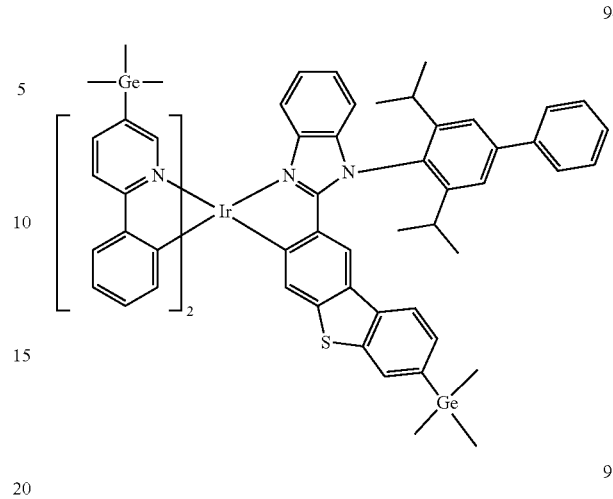
95
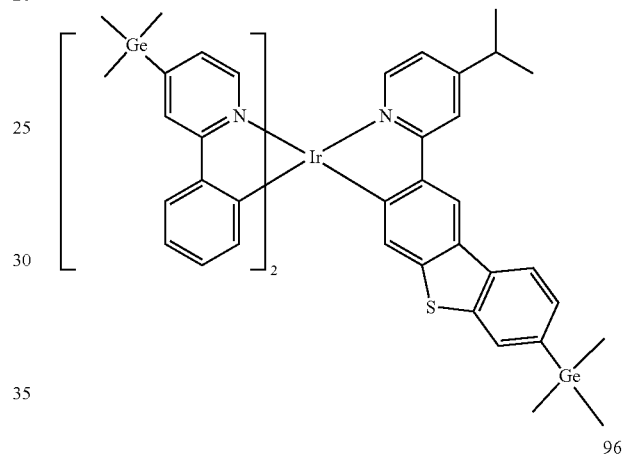
96
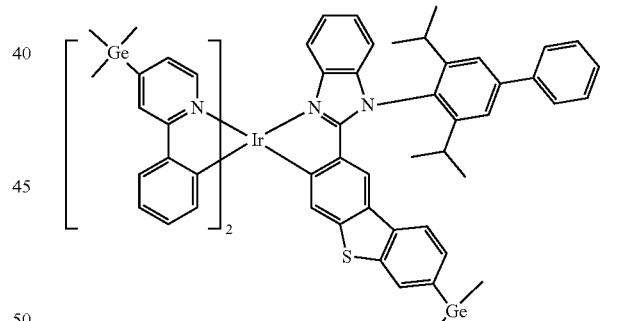
97
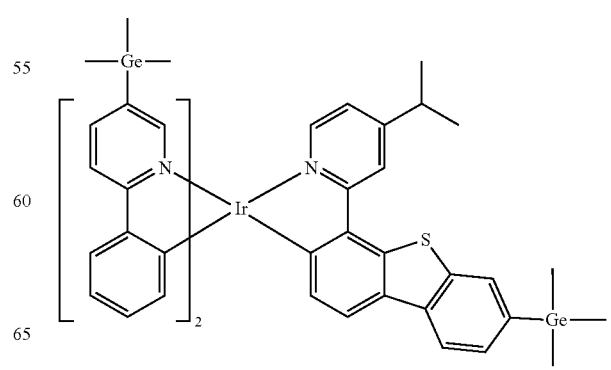

98
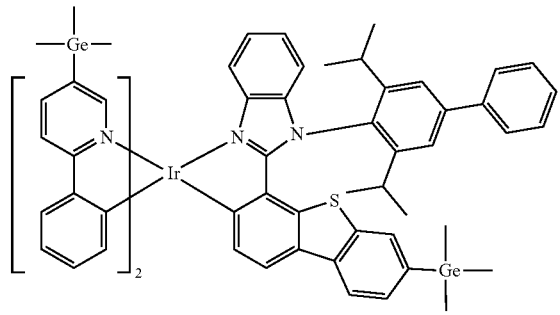
99
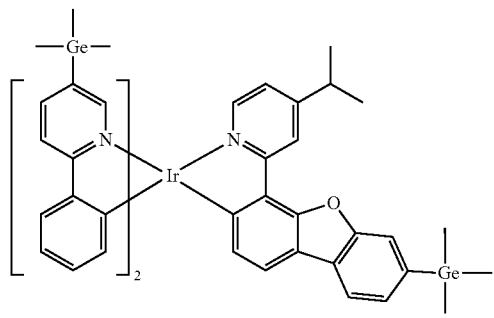
100
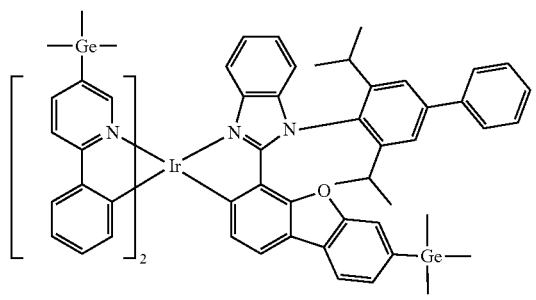
101
102
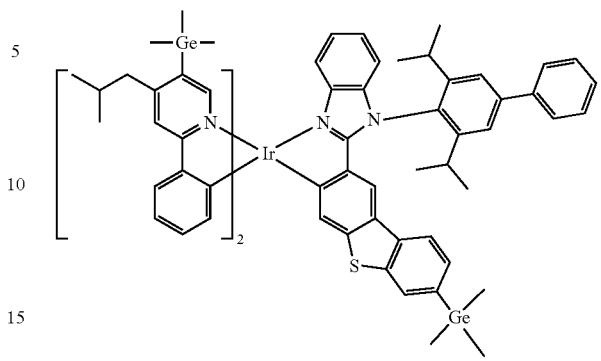
103
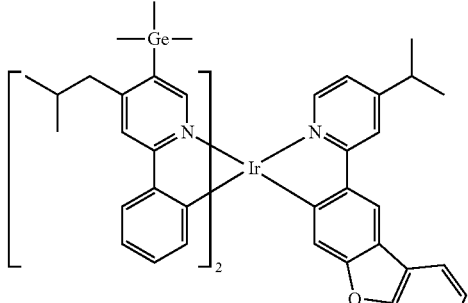
104
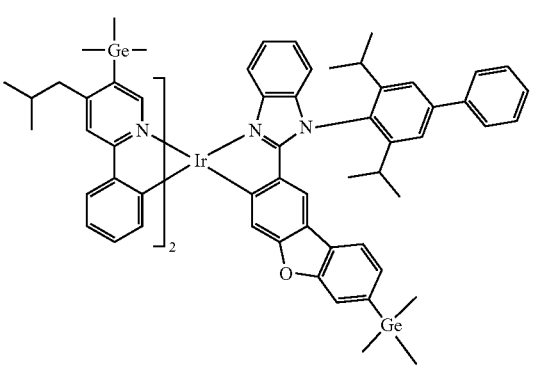
105
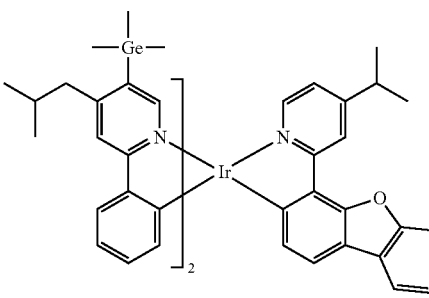

106
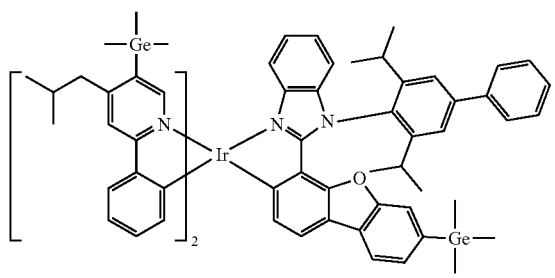
107
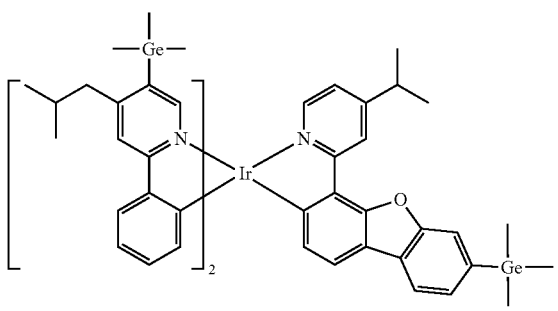
108
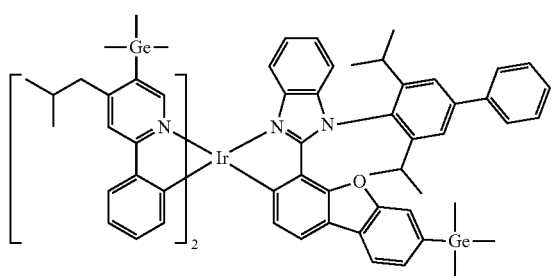
109
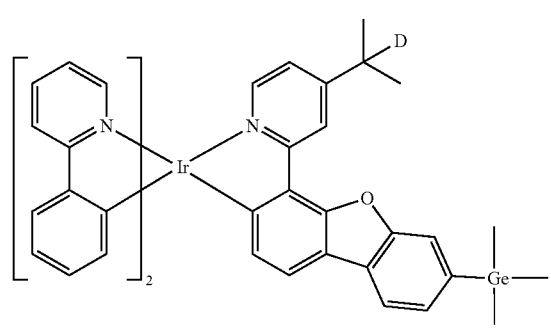
110
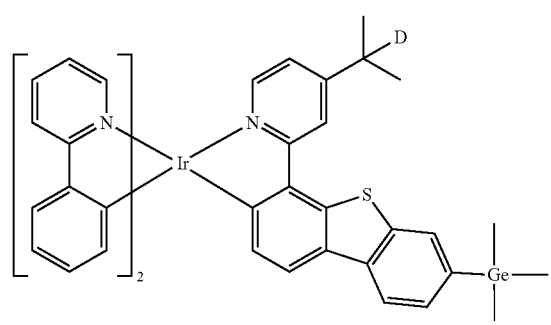
111
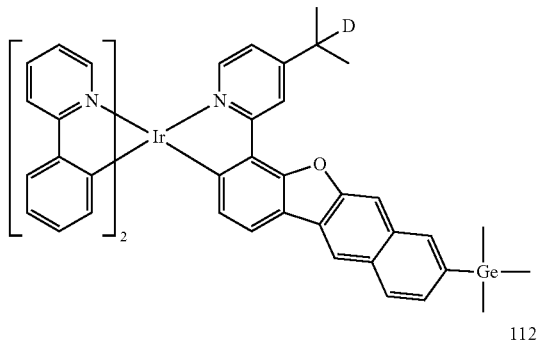
112
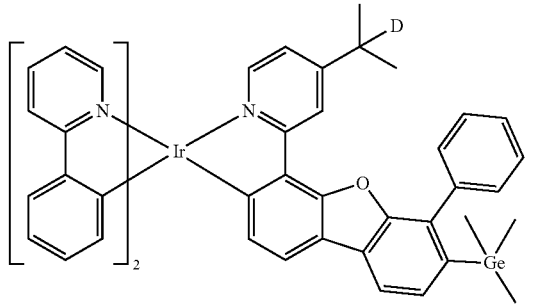
113
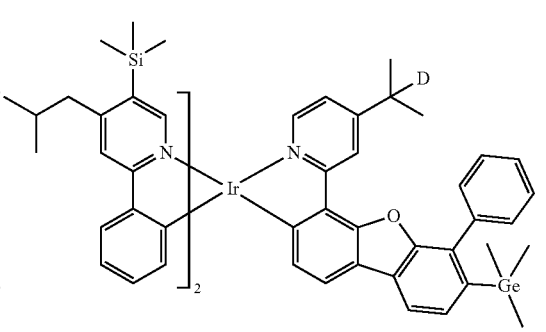
114
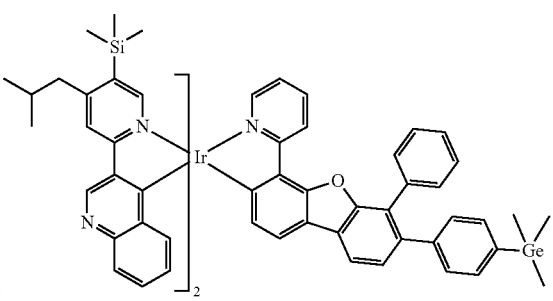
115

116
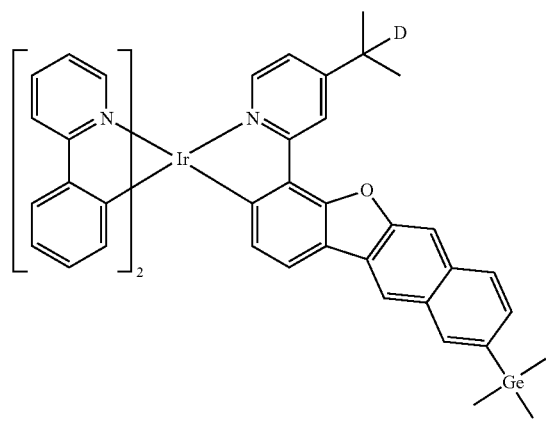
117
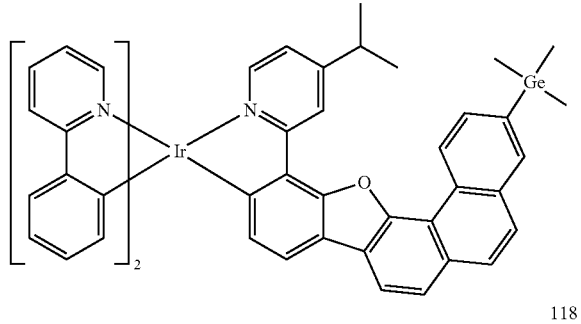
118
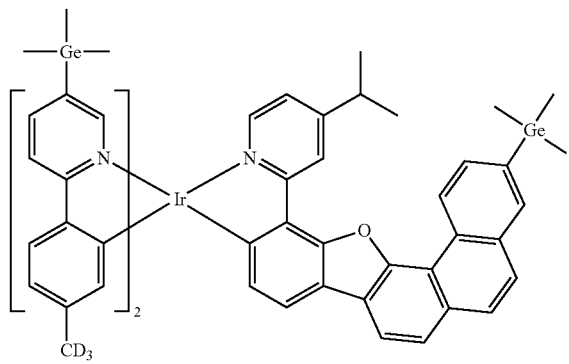
119
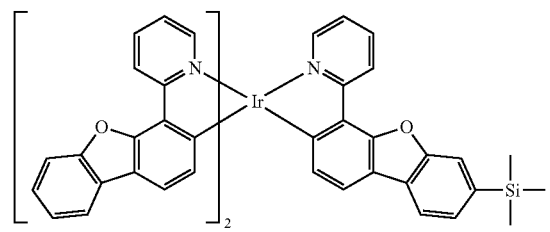
120
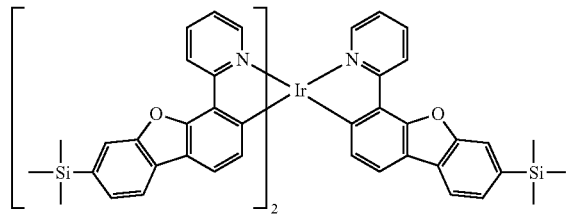
121
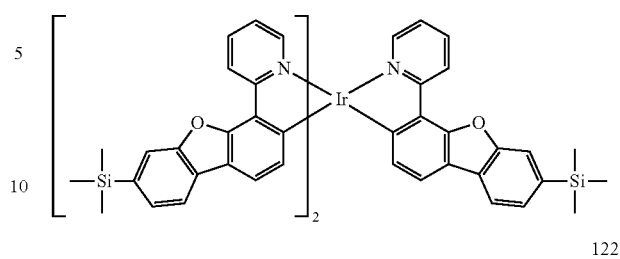
122
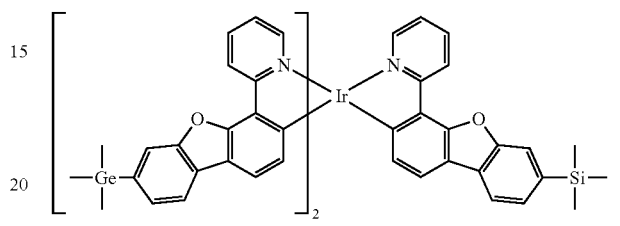
123
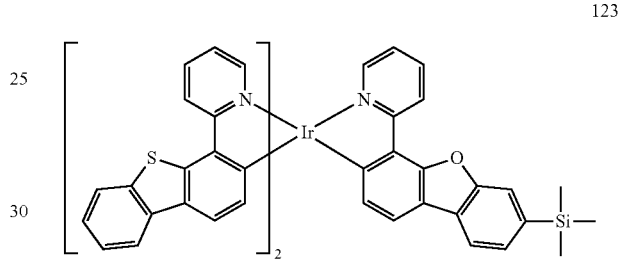
124
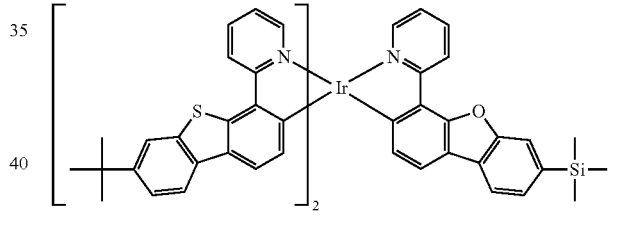
125
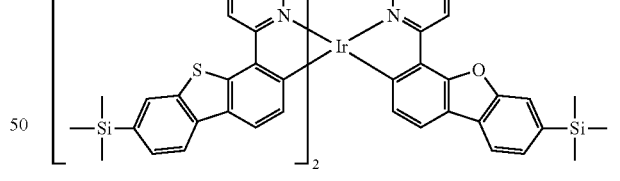
126
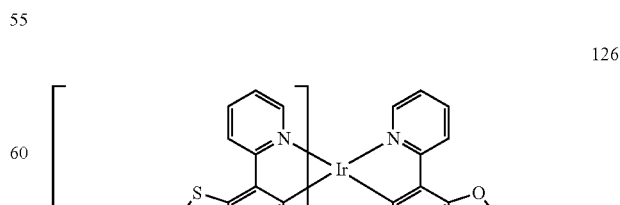
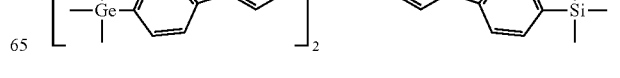

-continued
127
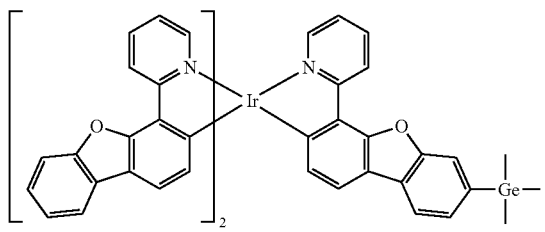
128
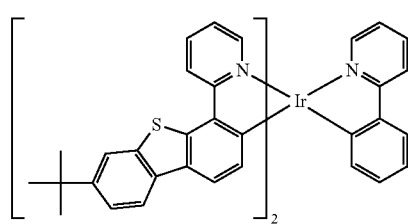
129
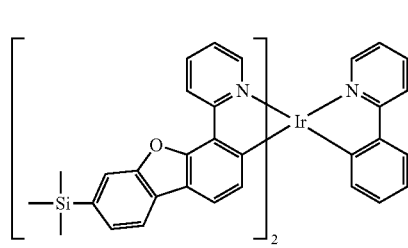
130
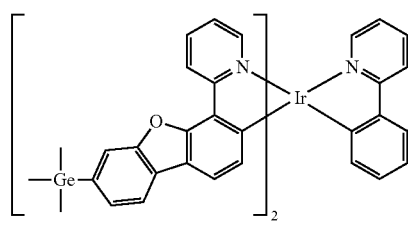
131
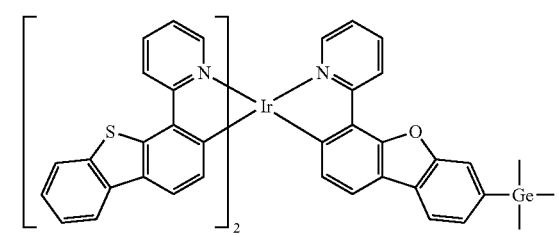
132
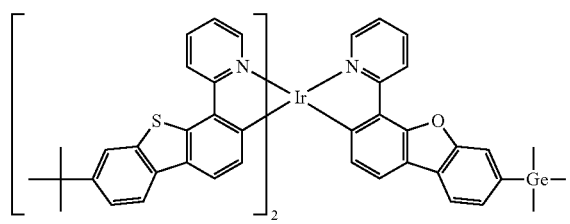
-continued
133
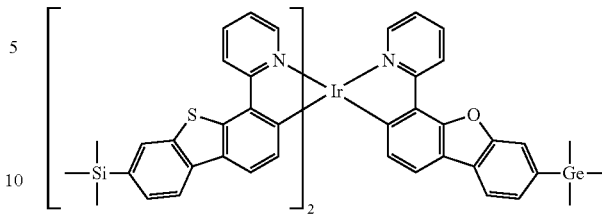
134
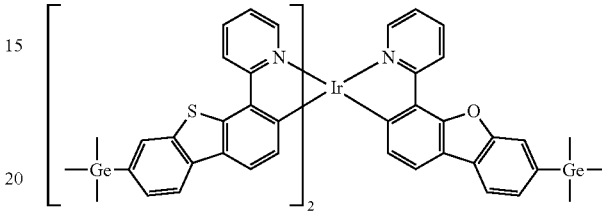
135
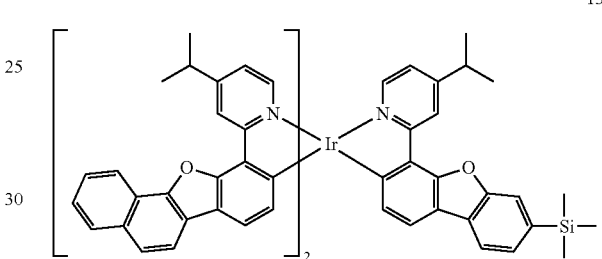
136
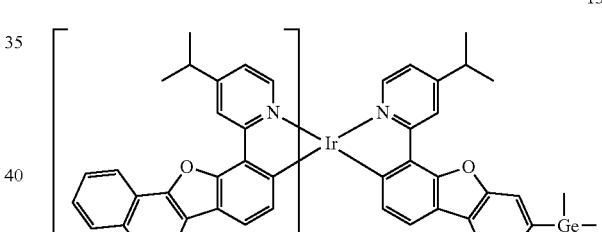
137
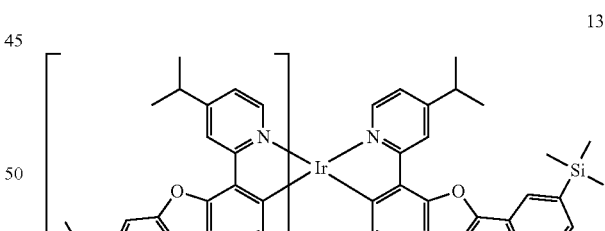
138
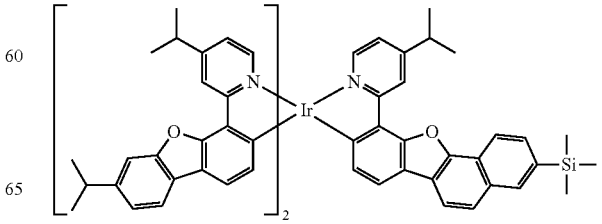

139
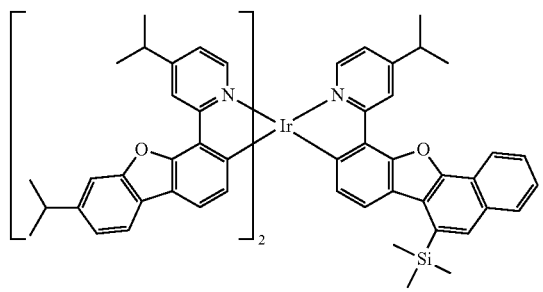
140
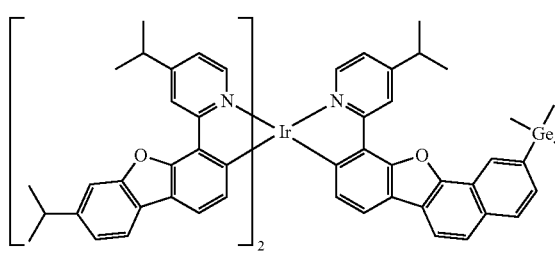
141
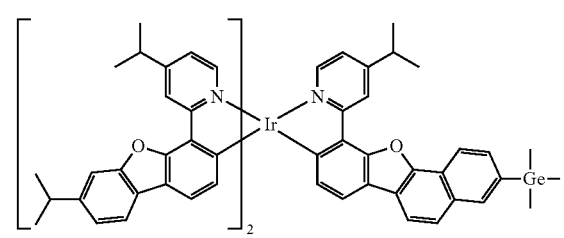
142
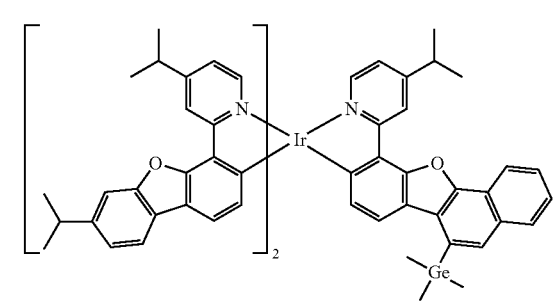
143
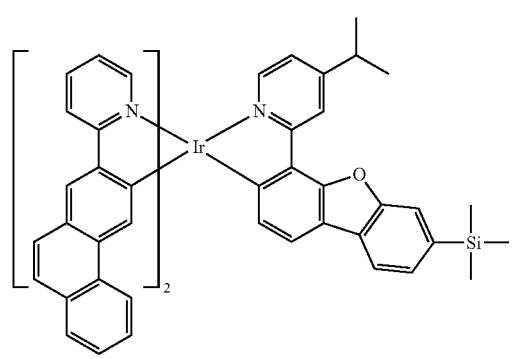
144
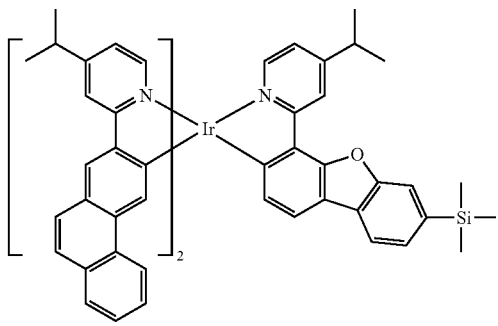
145
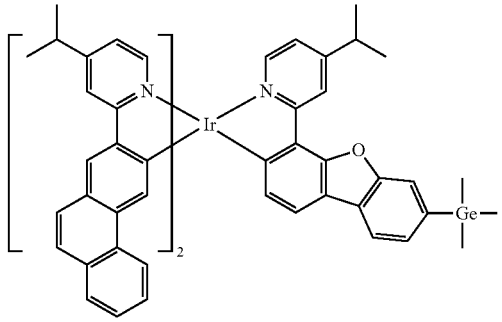
146
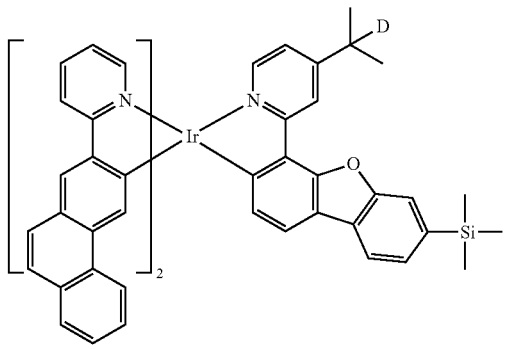
147
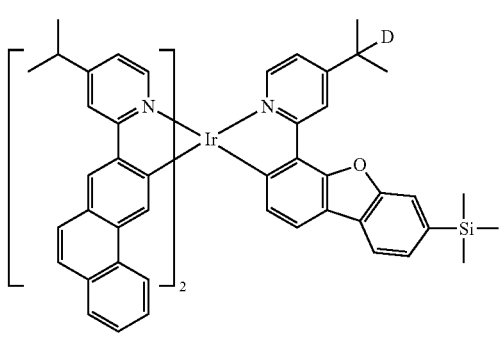

148
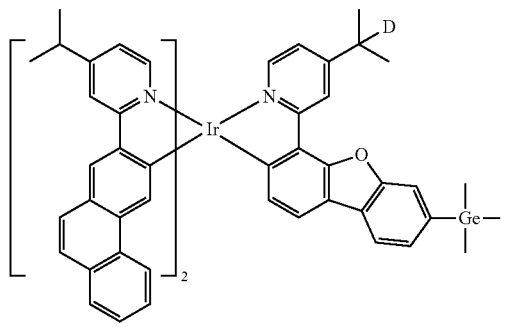
149
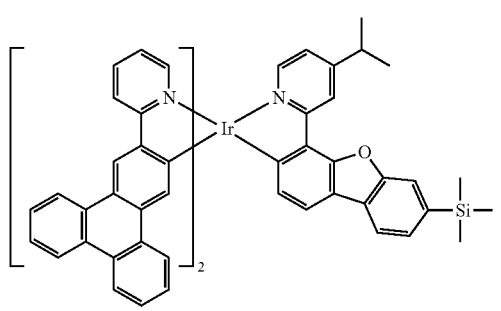
150
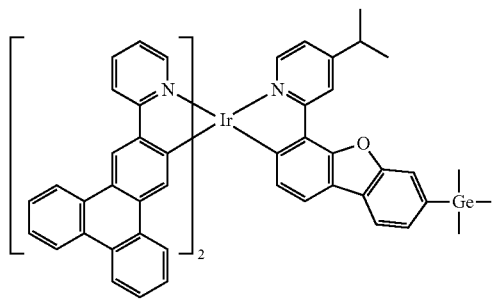
151
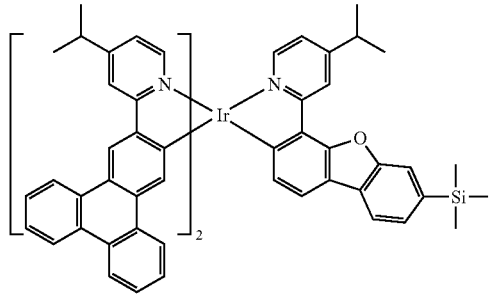
152
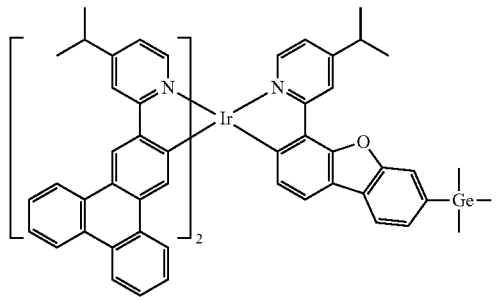
153
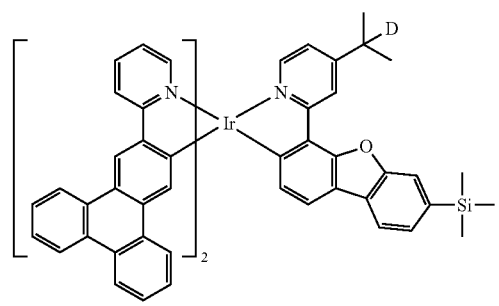
154
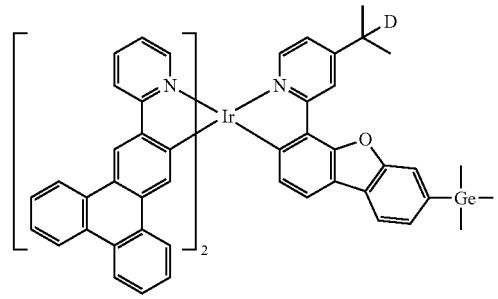
155
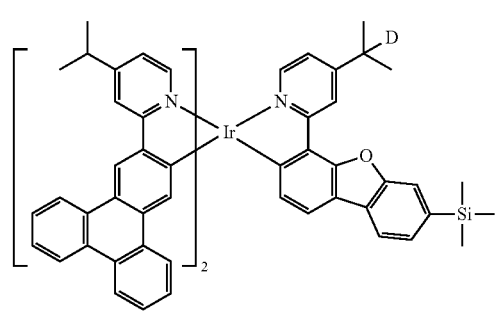
156
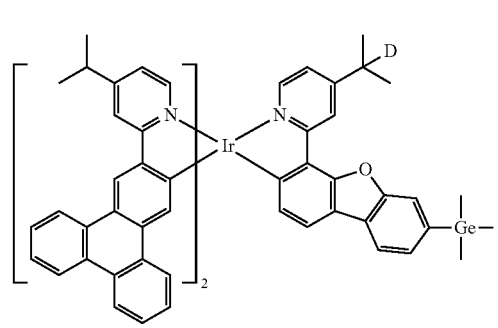
157
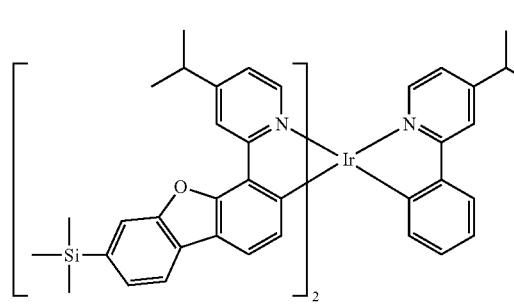

158
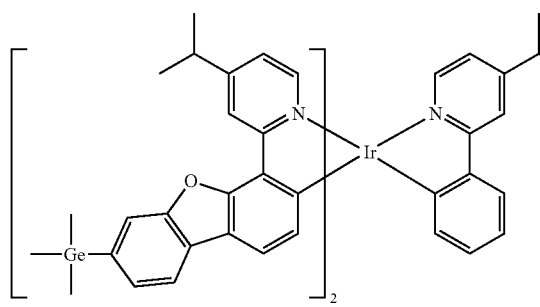
159
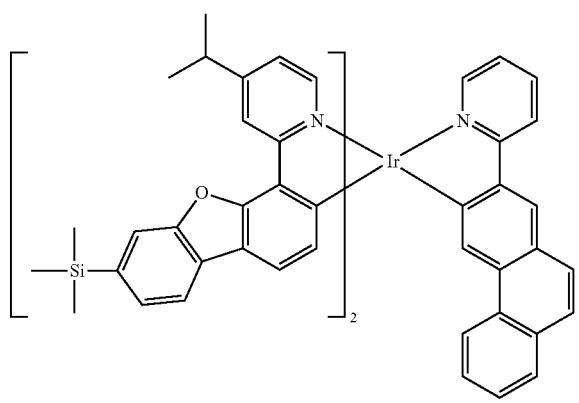
160
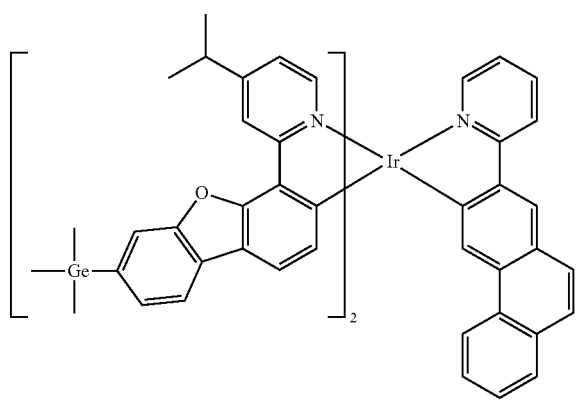
161
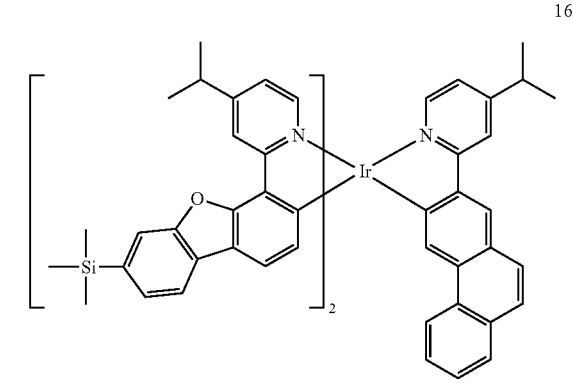
162
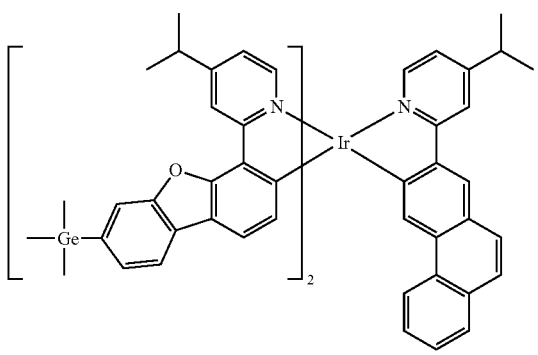
163
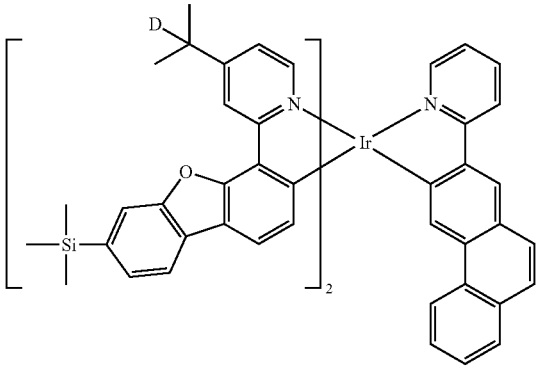
164
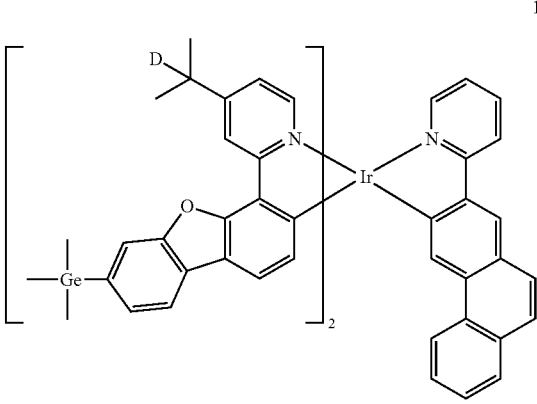
165
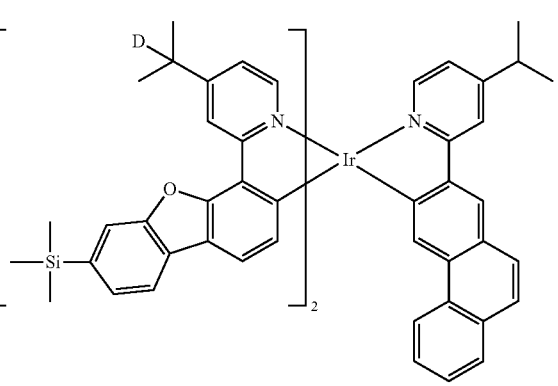

166
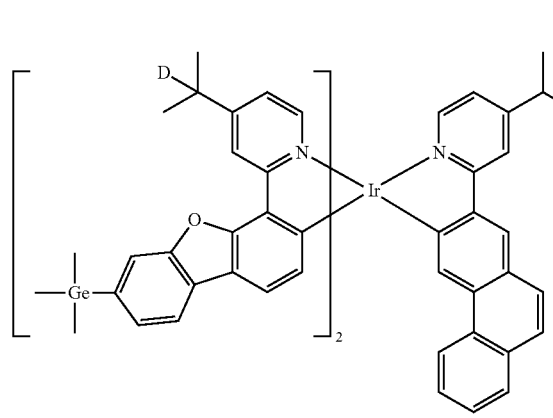
167
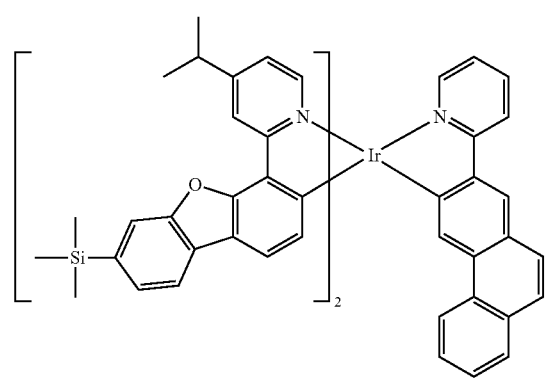
168
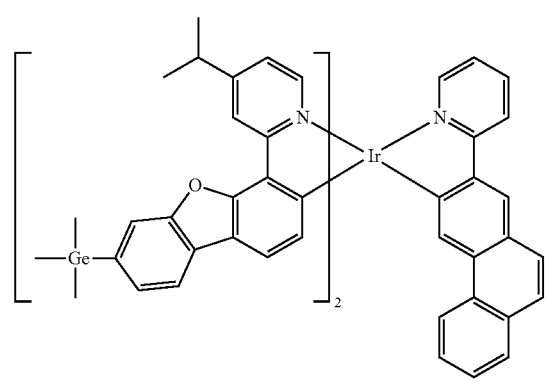
169
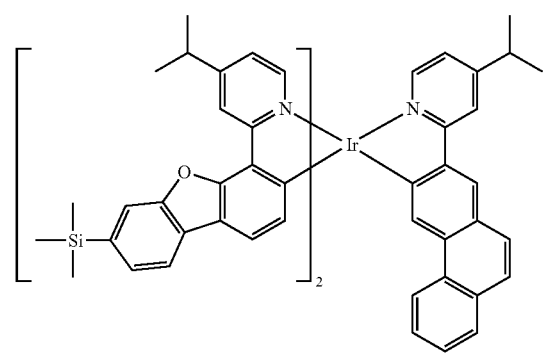
170
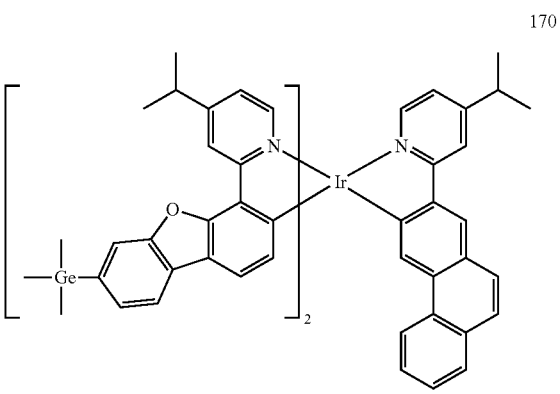
171
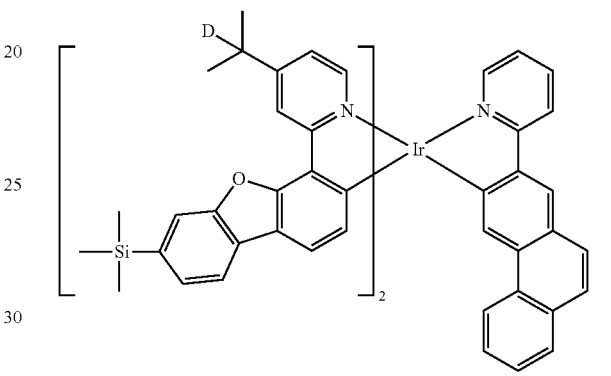
172
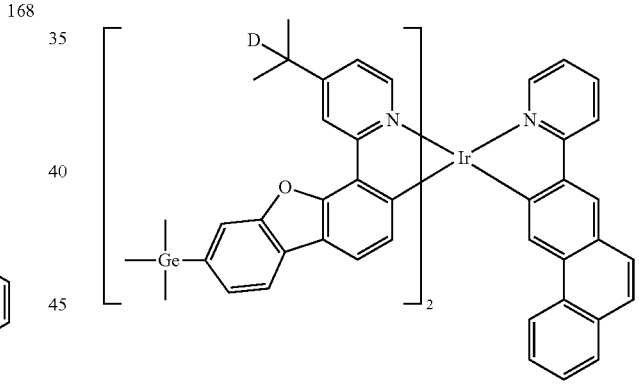
173
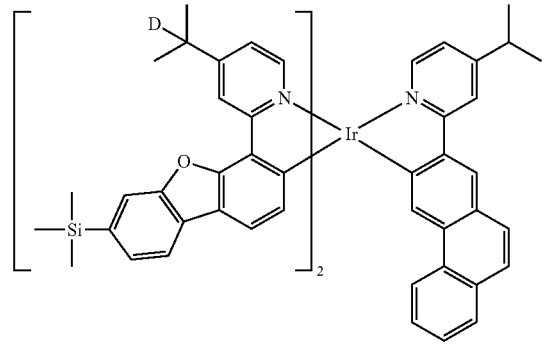

174

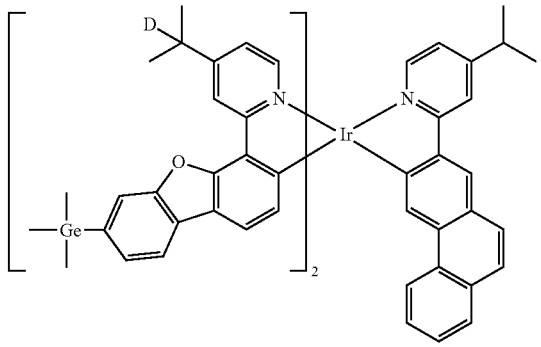

In the organometallic compound represented by Formula 1, $L_2$ is a ligand represented by Formula 2-2, and n2 which is the number of $L_2$ is 1, 2, or 3. That is, the organometallic compound includes at least one $L_2$ which is a ligand represented by Formula 2-2.

In Formula 2-2, i) a carbon of ring $CY_{41}$ and M in Formula 1 are bonded to each other via a covalent bond, ii) $Z_4$ is a group represented by Formula 3, and iii) b4 which is the number of $Z_4$ is an integer from 1 to 20, and $Y_4$ in Formula 3 is Si or Ge. Also, ring $CY_{41}$ and ring $CY_{42}$ in Formula 2-2 are each independently a π electron-rich $C_5$-$C_{30}$ cyclic group. Accordingly, due to a charge-transfer mechanism, quantum efficiency of the organometallic compound represented by Formula 1 may be improved.

A highest occupied molecular orbital (HOMO) energy level, lowest unoccupied molecular orbital (LUMO) energy level, lowest singled ($S_1$) energy level, and lowest triplet ($T_1$) energy level of selected compounds of the organometallic compound represented by Formula 1 were evaluated by density functional theory (DFT) using the Gaussian 09 program with the molecular structure optimization obtained at the B3LYP level, and results thereof are shown in Table 1. The energy levels are reported in electron volts (eV).

TABLE 1

| Compound No. | HOMO (eV) | LUMO (eV) | $S_1$ (eV) | $T_1$ (eV) |
|---|---|---|---|---|
| 1 | −4.806 | −1.233 | 2.881 | 2.528 |
| 2 | −4.798 | −1.241 | 2.821 | 2.520 |
| 3 | −4.802 | −1.236 | 2.845 | 2.525 |

From Table 1, it was confirmed that the organometallic compound represented by Formula 1 has such electric characteristics that are suitable for use as a dopant for an electric device, for example, an organic light-emitting device.

Synthesis methods of the organometallic compound represented by Formula 1 may be recognizable by one of ordinary skill in the art by referring to the Synthesis Examples provided herein.

Accordingly, the organometallic compound represented by Formula 1 is suitable for use as a material for an organic layer of an organic light-emitting device, for example, a dopant in an emission layer of the organic layer. Thus, according to another aspect, provided is an organic light-emitting device including: a first electrode; a second electrode; and an organic layer located between the first electrode and the second electrode, wherein the organic layer includes an emission layer, and wherein the organic layer further includes at least one of the organometallic compounds represented by Formula 1.

The organic light-emitting device includes the organic layer including the organometallic compound represented by Formula 1 as described above, and thus, may have improved external quantum efficiency (EQE, %) and improved lifespan characteristics.

The organometallic compound represented by Formula 1 may be used (i.e., disposed) between a pair of electrodes of an organic light-emitting device. In one or more embodiments, the organometallic compound represented by Formula 1 may be included in the emission layer. In this regard, the organometallic compound may act as a dopant, and the emission layer may further include a host (that is, an amount (for example, a weight) of the organometallic compound represented by Formula 1 is smaller than an amount (for example, a weight) of the host). The emission layer may emit red or green light, for example, red or green light having a maximum emission wavelength of about 500 nm or more, for example, from about 500 nm or more and about 850 nm or less. In one or more embodiments, the organometallic compound may emit green light.

The expression "(an organic layer) includes at least one of organometallic compounds" used herein may include a case wherein "(an organic layer) includes identical organometallic compounds represented by Formula 1" and a case wherein "(an organic layer) includes two or more different organometallic compounds represented by Formula 1."

In one or more embodiments, the organic layer may include, as the organometallic compound, only Compound 1. In this case, Compound 1 may be present in the emission layer of the organic light-emitting device. In one or more embodiments, the organic layer may include, as the organometallic compound, Compound 1 and Compound 2. In this regard, Compound 1 and Compound 2 may be present in an identical layer (for example, both Compound 1 and Compound 2 may be present in the emission layer).

The first electrode may be an anode which is a hole injection electrode and the second electrode may be a cathode which is an electron injection electrode, or the first electrode may be a cathode which is an electron injection electrode and the second electrode may be an anode which is a hole injection electrode.

For example, in one or more embodiments of the organic light-emitting device, the first electrode may be an anode, the second electrode may be a cathode, the organic layer may further include a hole transport region located between the first electrode and the emission layer, and an electron transport region located between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers located or disposed between the first electrode and the second electrode of the organic light-emitting device. The "organic layer" may include, in addition to an organic compound, an organometallic complex including metal.

The FIGURE is a schematic cross-sectional view of an organic light-emitting device 10 according to one or more embodiments of the disclosure. Hereinafter, a structure of an organic light-emitting device according to one or more embodiments of the disclosure and a method of manufacturing an organic light-emitting device according to one or more embodiments of the disclosure will be described in connection with FIGURE. The organic light-emitting device 10 has a structure wherein a first electrode 11, an organic layer 15, and a second electrode 19 are sequentially stacked.

A substrate may be additionally located under the first electrode 11 or above the second electrode 19. For use as the substrate, any substrate that is used in organic light-emitting devices available in the art may be used, and, for example, the substrate may be a glass substrate or a transparent plastic substrate, each having excellent mechanical strength, thermal stability, transparency, surface smoothness, ease of handling, and water resistance.

In one or more embodiments, the first electrode 11 may be formed or prepared by depositing or sputtering a material for forming the first electrode 11 on the substrate (e.g., on a surface of the substrate). The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be located between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11 and towards the second electrode 19.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a tempera-ture at which a heat treatment is performed to remove a solvent after coating may be from about 80° C. to about 200° C.

The conditions for forming the hole transport layer and the electron blocking layer may each be the same as the conditions for forming the hole injection layer.

The hole transport region may include 4,4',4"-tris(3-methylphenylphenylamino)triphenylamine (m-MTDATA), 4,4', 4"-tris(N,N-diphenylamino)triphenylamine (TDATA), 4,4', 4"-tris{N-(2-naphthyl)-N-phenylamino}-triphenylamine (2-TNATA), N,N'-di(1-naphthyl)-N,N'-diphenylbenzidine (NPB), β-NPB, TPD, Spiro-TPD, Spiro-NPB, methylated NPB, 4,4'-cyclohexylidene bis[N,N-bis(4-methylphenyl)benzenamine] (TAPC), 4,4'-bis[N, N'-(3-tolyl)amino]-3,3'-dimethylbiphenyl (HMTPD), 4,4', 4"-tris (N-carbazolyl)triphenylamine (TCTA), polyaniline/dodecyl benzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

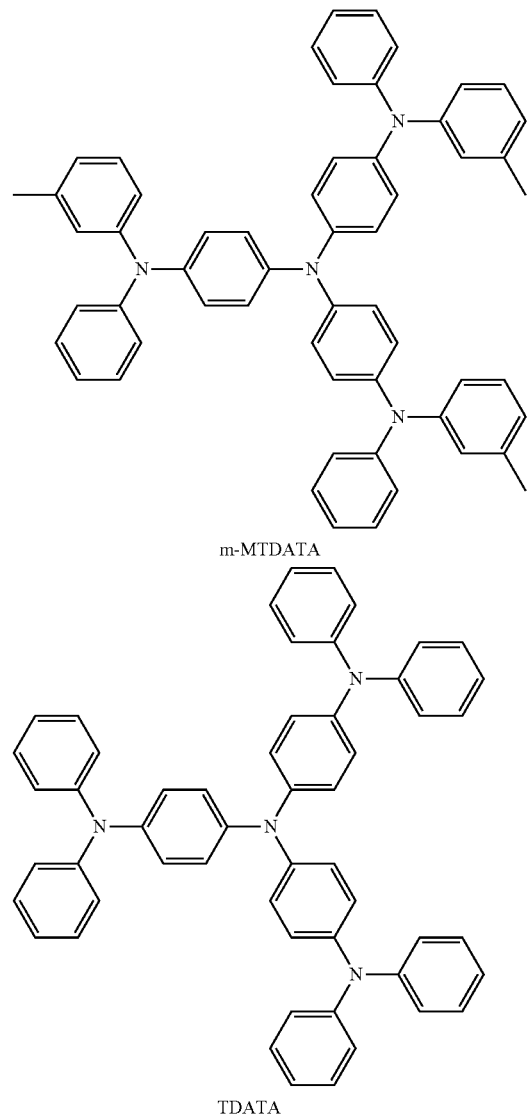

m-MTDATA

TDATA

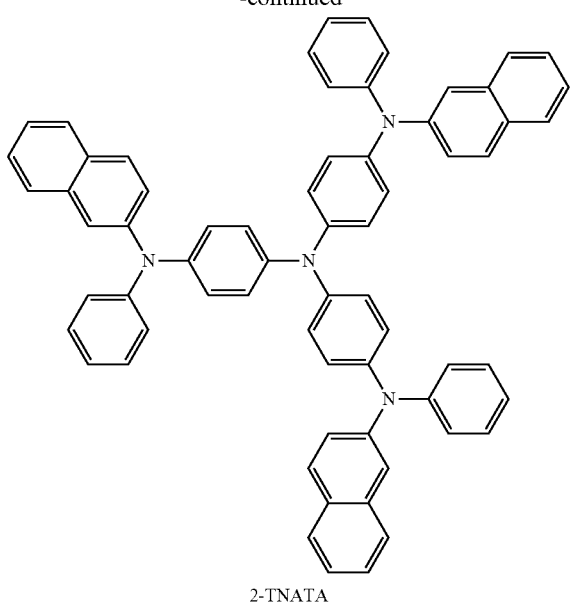
2-TNATA
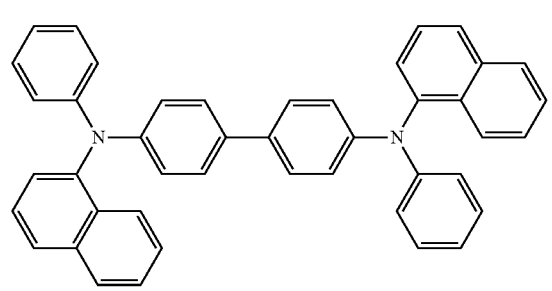
NPB
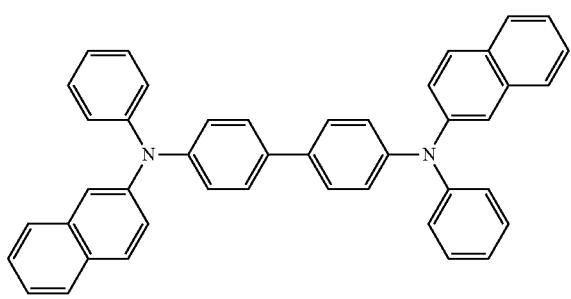
β-NPB
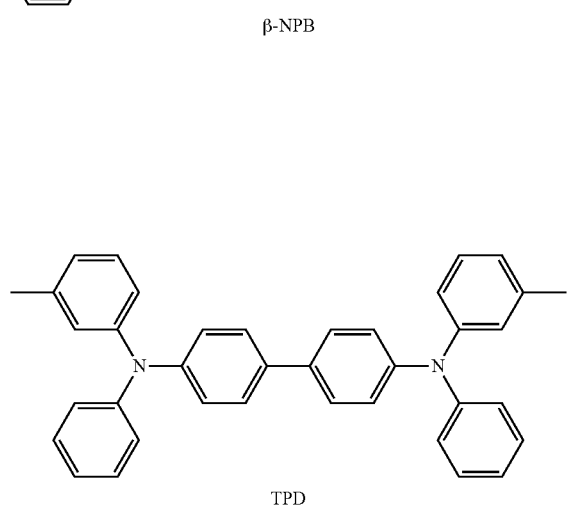
TPD
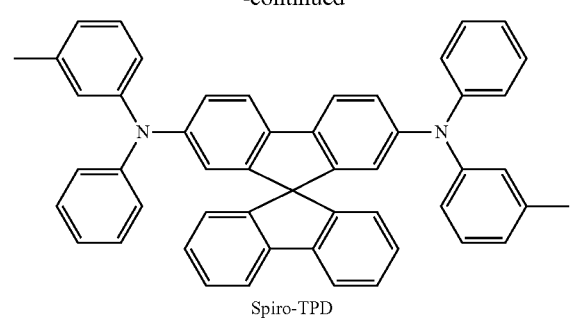
Spiro-TPD
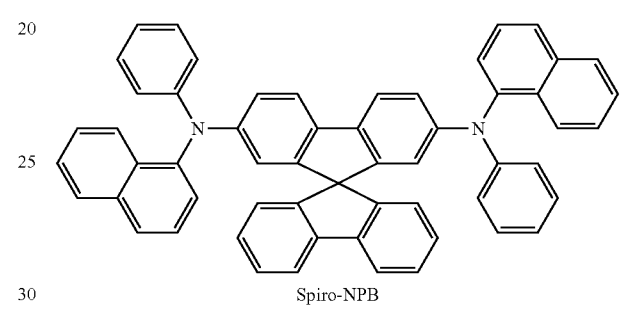
Spiro-NPB
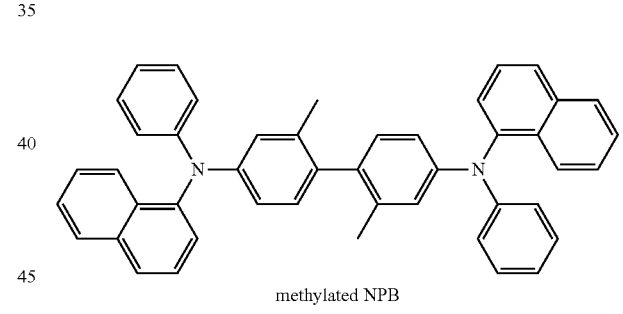
methylated NPB
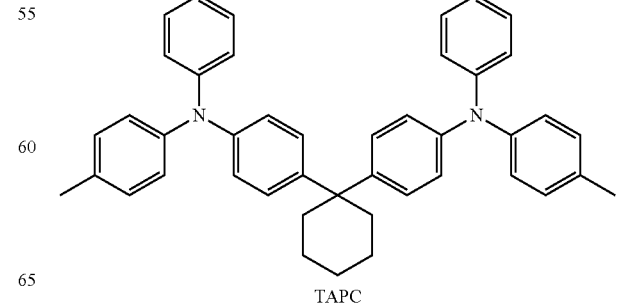
TAPC

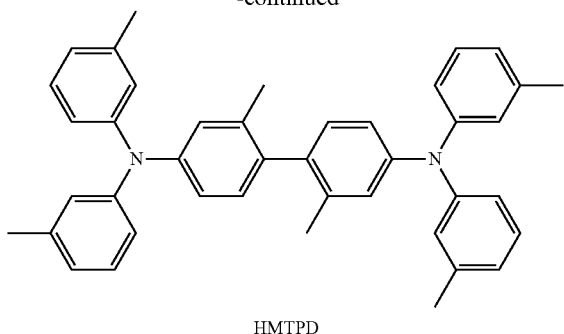

HMTPD

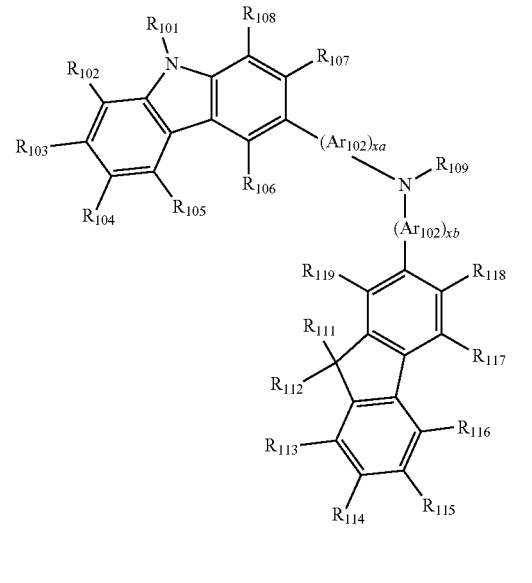

Formula 201

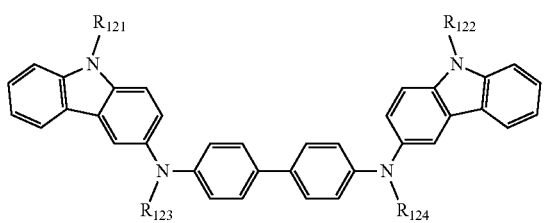

Formula 202 wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic, or a combination thereof.

In Formula 201, xa and xb may each independently be an integer from 0 to 5, or may each independently be 0, 1, or 2. In one or more embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, a $C_1$-$C_{10}$ alkyl group, a $C_1$-$C_{10}$ alkoxy group, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, a compound represented by Formula 201 may be represented by Formula 201A:

Formula 201A

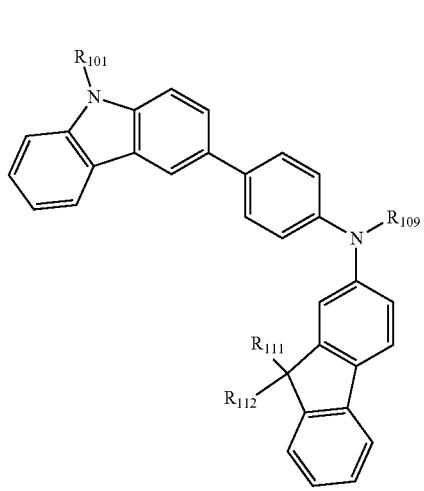

wherein, in Formula 201A, $R_{101}$, $R_{111}$, $R_{112}$, and $R_{109}$ are each as defined herein.

In one or more embodiments, a compound represented by Formula 201 and a compound represented by Formula 202 may each include one of Compounds HT1 to HT20:
HT1
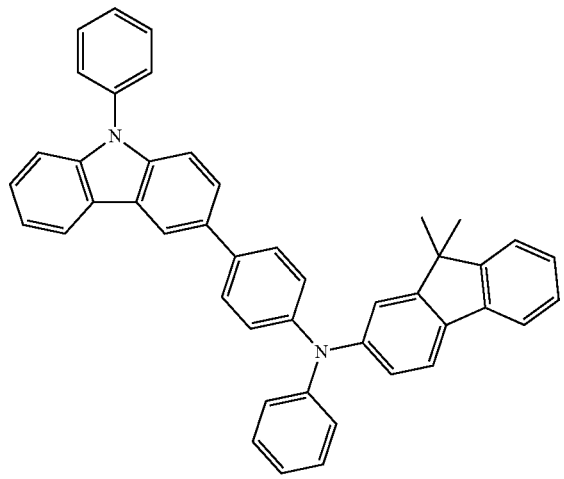
HT2
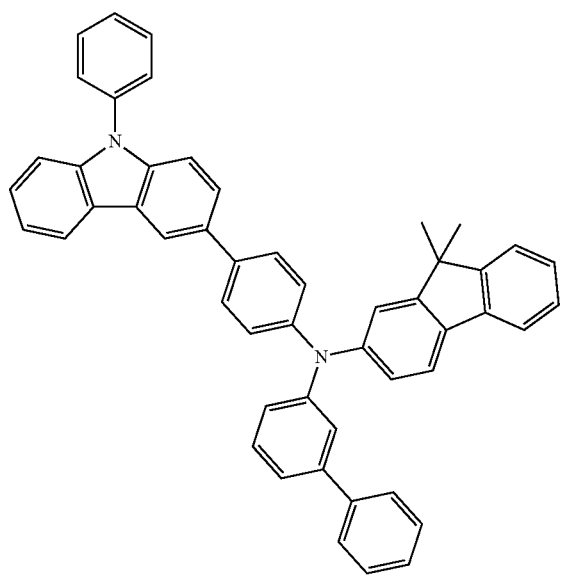
HT3
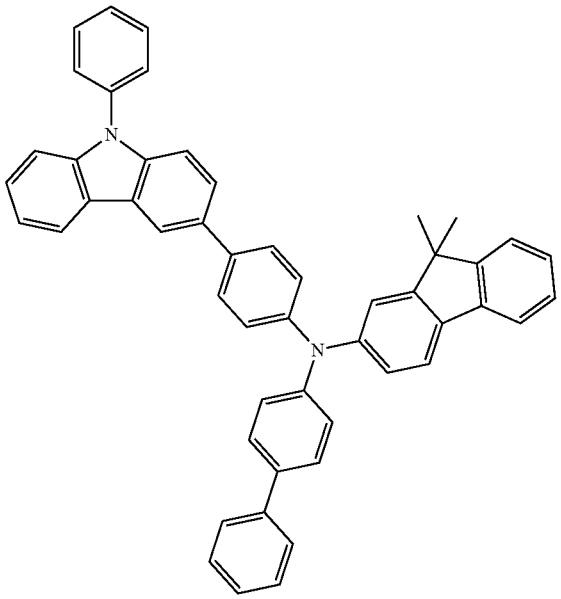
HT4
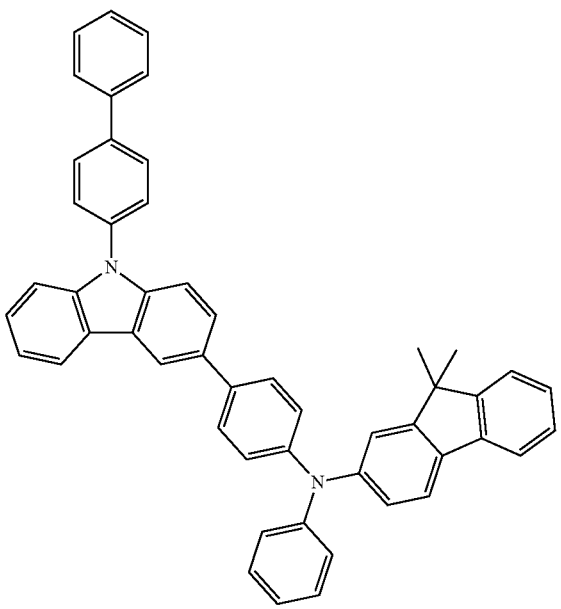

HT5
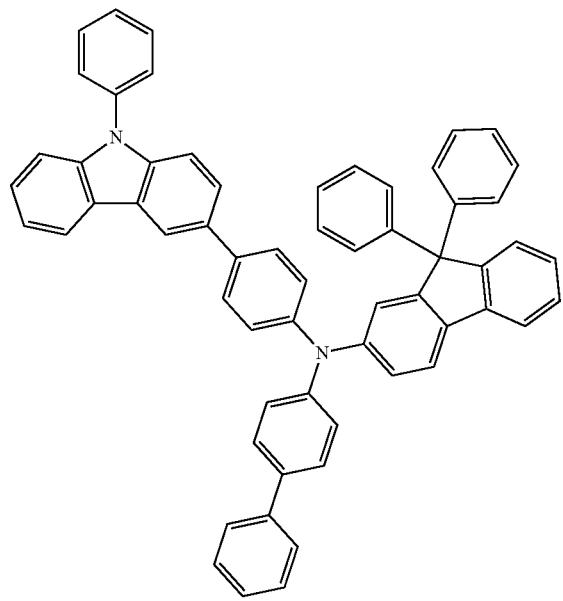
HT6
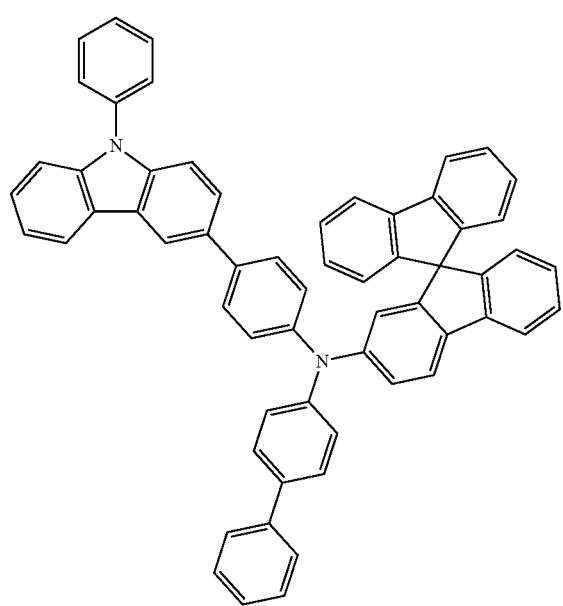
HT7
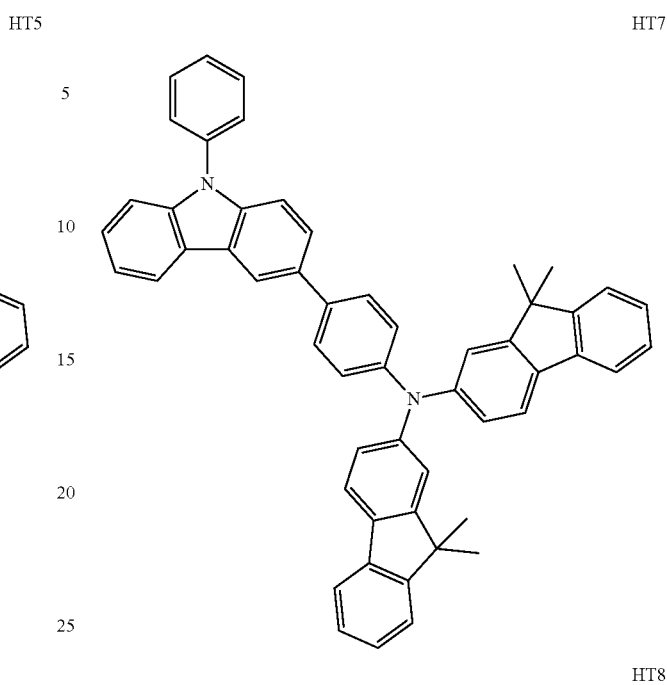
HT8
HT9
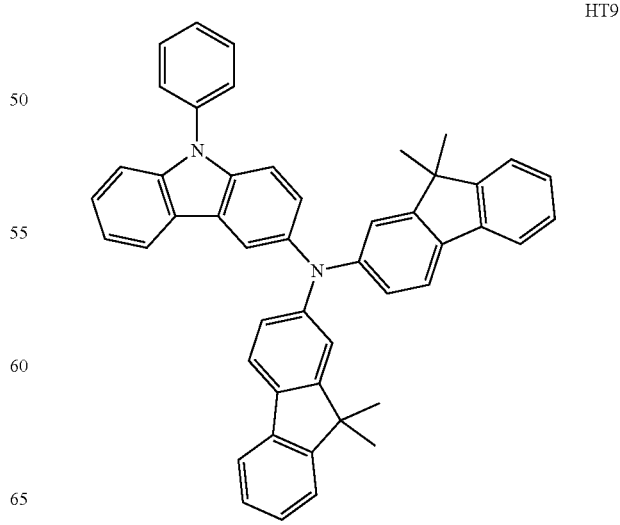

HT10
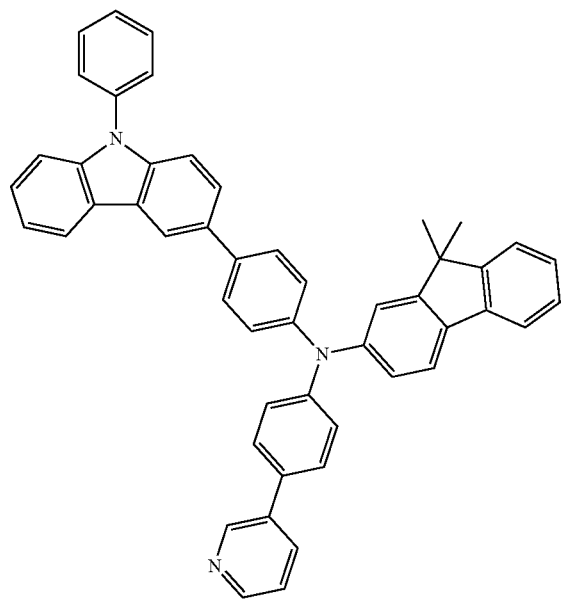
HT11
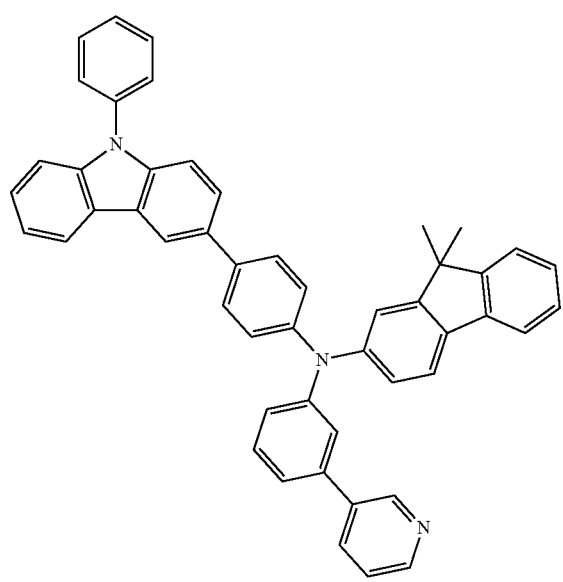
HT12
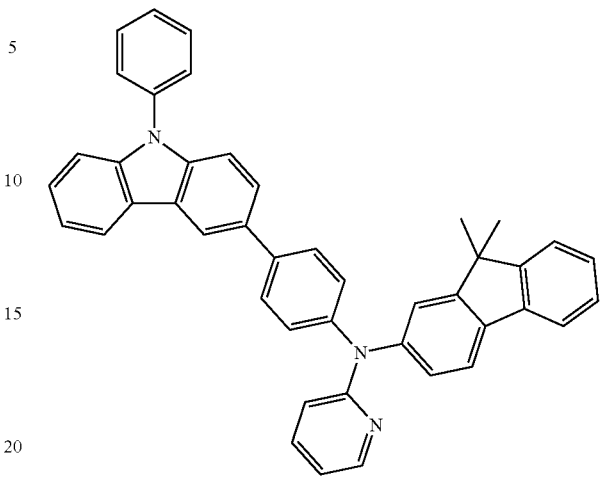
HT13
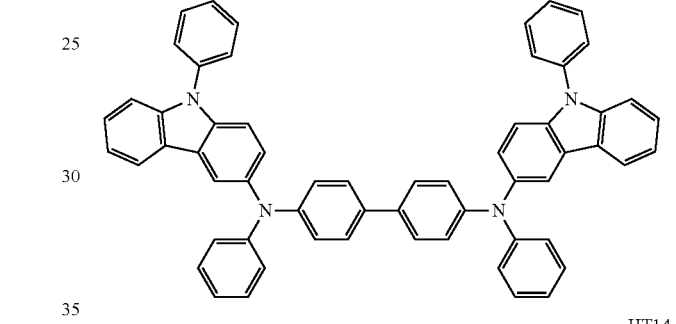
HT14
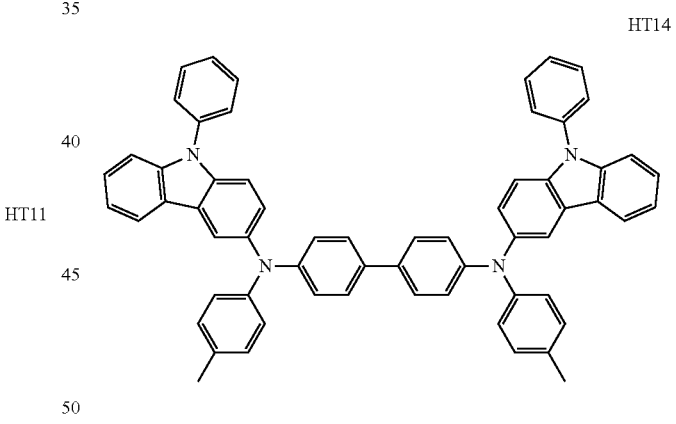
HT15
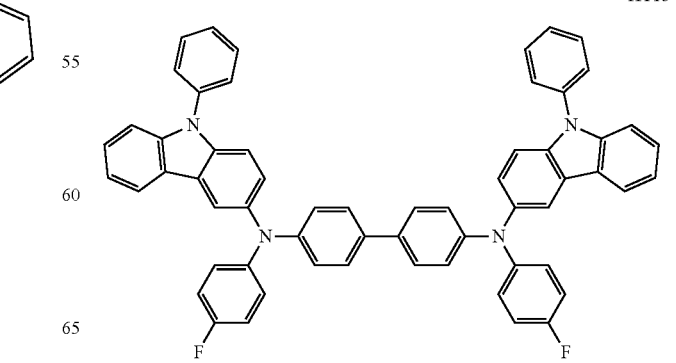

HT16

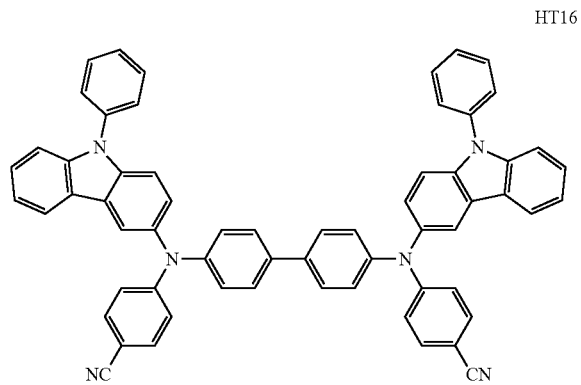

HT20

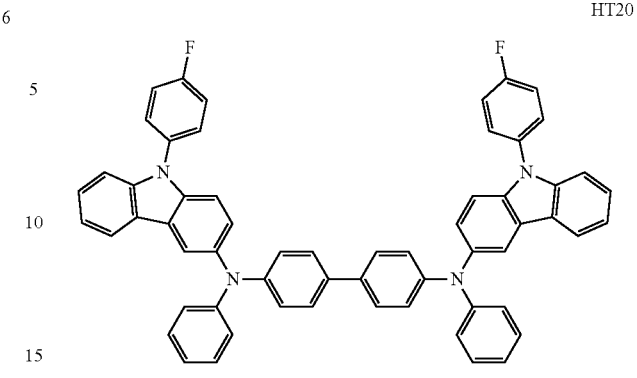

A thickness of the hole transport region may be from about 100 angstroms (Å) to about 10,000 Å, for example, from about 100 Å to about 1,000 Å. When the hole transport region includes at least one of a hole injection layer and a hole transport layer, a thickness of the hole injection layer may be from about 100 Å to about 10,000 Å, for example, from about 100 Å to about 1,000 Å, and a thickness of the hole transport layer may be from about 50 Å to about 2,000 Å, for example, from about 100 Å to about 1,500 Å. When thicknesses of the hole transport region, the hole injection layer, and the hole transport layer are within the range described above, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound. In one or more embodiments, non-limiting examples of the p-dopant may be a quinone derivative such as tetracyanoquinonedimethane (TCNQ), 2,3,5,6-tetrafluoro-tetracyano-1,4-benzoquinonedimethane (F4-TCNQ), or F6-TCNNQ; a metal oxide such as tungsten oxide and molybdenum oxide; and a cyano group-containing compound such as Compound HT-D1 or Compound HT-D2.

HT17

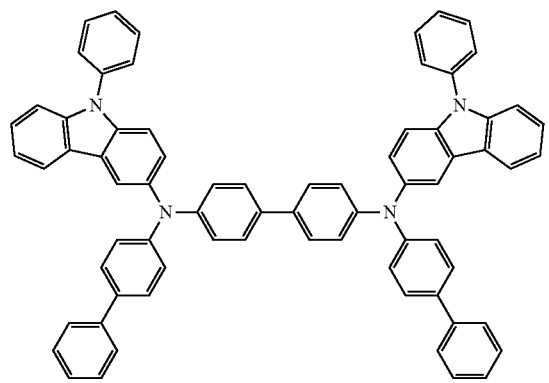

HT-D1

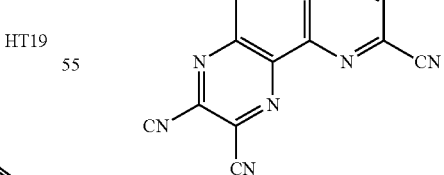

HT18

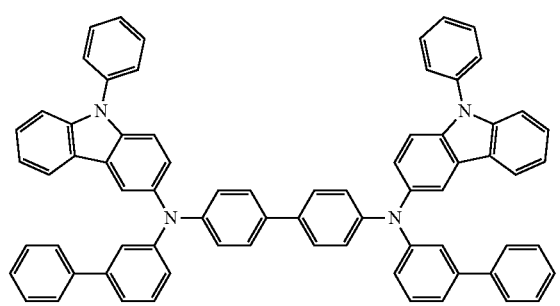

F4-TCNQ

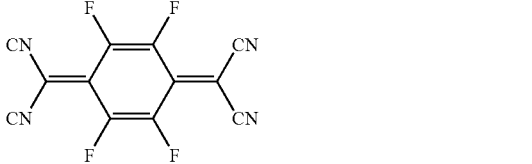

HT19

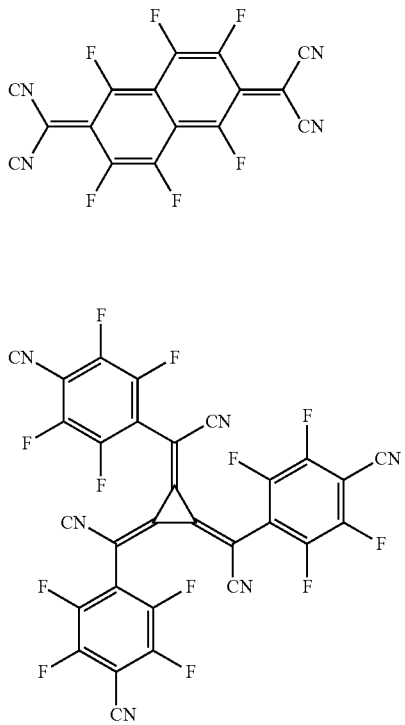

F6-TCNNQ

HT-D2

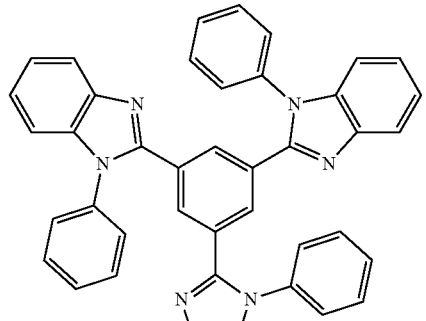

TPBi

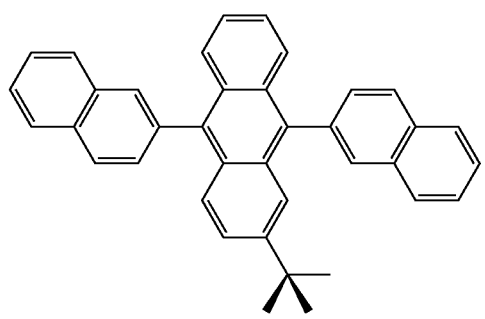

TBADN

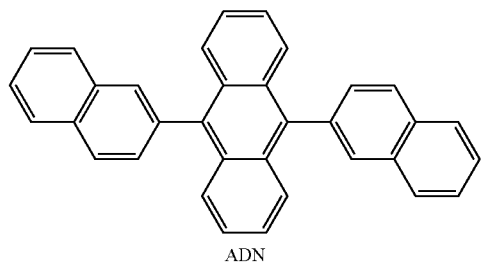

ADN

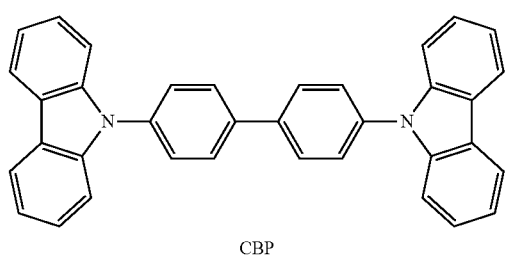

CBP

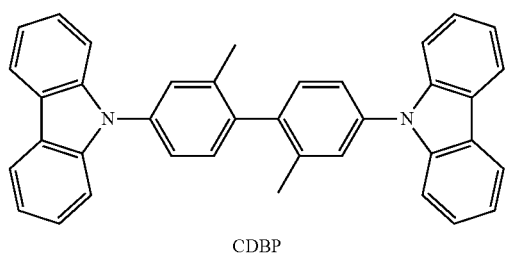

CDBP

The hole transport region may further include a buffer layer.

The buffer layer may compensate for an optical resonance distance according to a wavelength of light emitted from the emission layer, and thus, efficiency of a formed organic light-emitting device may be improved.

In one or more embodiments, when the hole transport region includes an electron blocking layer, a material for forming the electron blocking layer may include a material that is used in the hole transport region as described above, a host material described below, or a combination thereof. In one or more embodiments, when the hole transport region includes an electron blocking layer, a material for the electron blocking layer may be mCP, which will be explained later.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1.

The host may include 1,3,5-tris(N-phenylbenzimidazole-2-yl)benzene (TPBi), 3-tert-butyl-9,10-di(naphth-2-yl)anthracene (TBADN), 9,10-di(naphthalene-2-yl)anthracene (ADN, also referred to as "DNA"), 4,4'-bis(N-carbazolyl)-1,1'-biphenyl (CBP), 4,4'-bis(9-carbazolyl)-2,2'-dimethyl-biphenyl (CDBP), TCP, mCP, Compound H50, Compound H51, Compound H52, or a combination thereof:

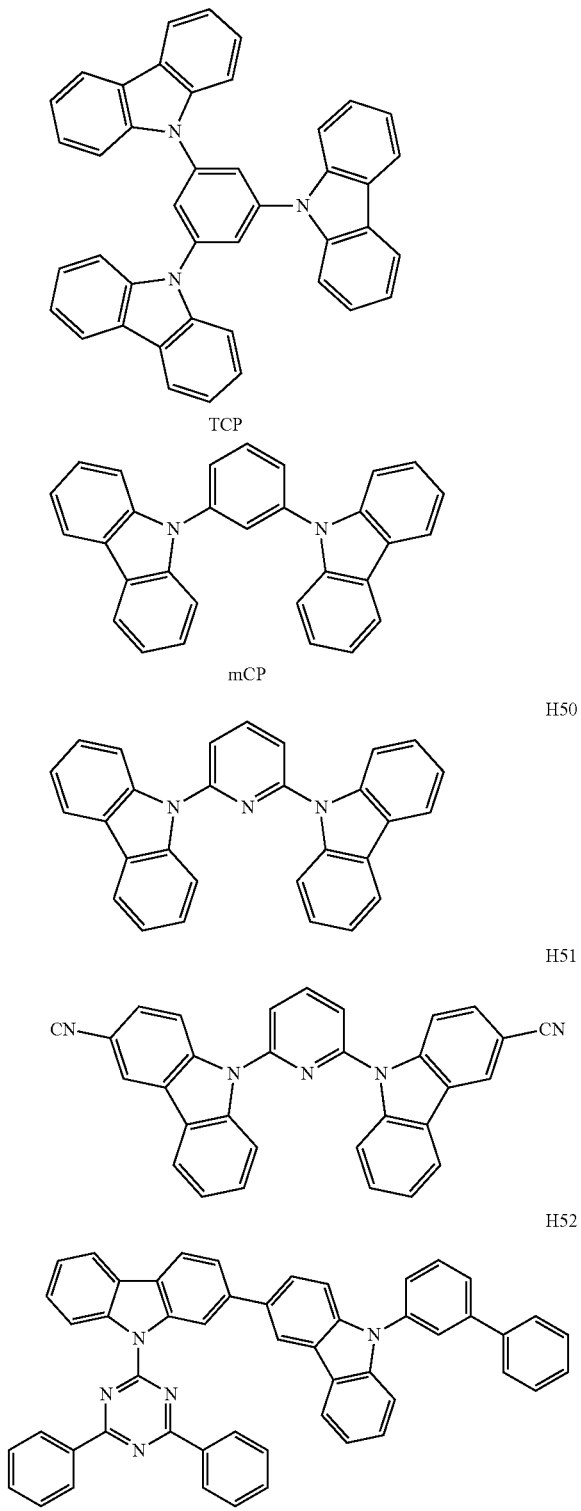

TCP mCP

H50

H51

H52

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

Then, an electron transport region may be located on (e.g., disposed on) the emission layer.

The electron transport region may include a hole blocking layer, an electron transport layer, an electron injection layer, or a combination thereof.

In one or more embodiments, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, 2,9-dimethyl-4,7-diphenyl-1,10-phenanthroline (BCP), bis (2-methyl-8-quinolinolato-N1,08)-(1,1'-biphenyl-4-olato) aluminum (Bphen), BAlq, or a combination thereof.

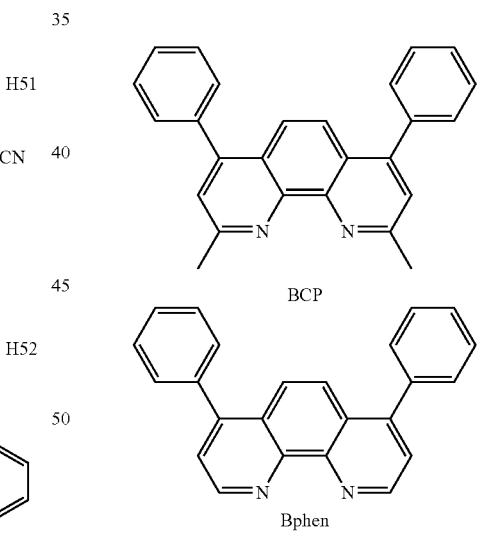

BCP

Bphen

A thickness of the hole blocking layer may be in a range of about 20 Å to about 1,000 Å, for example, about 30 Å to about 300 Å. When the thickness of the hole blocking layer is within the range as described above, excellent hole blocking characteristics may be obtained without a substantial increase in driving voltage.

The electron transport layer may include BCP, Bphen, tris(8-hydroxyquinolino)aluminum (Alq3), BAlq, 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof.

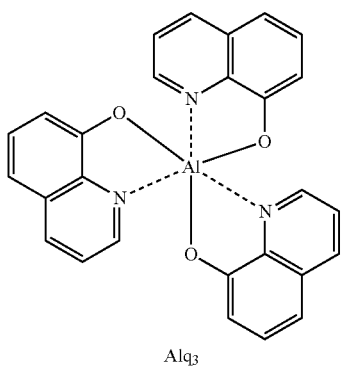
Alq₃
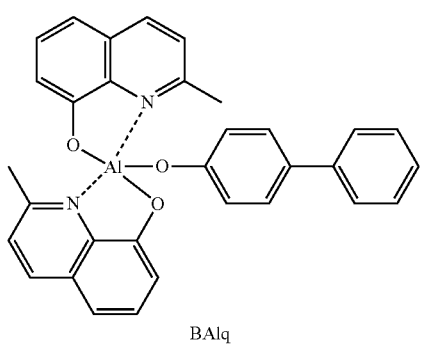
BAlq
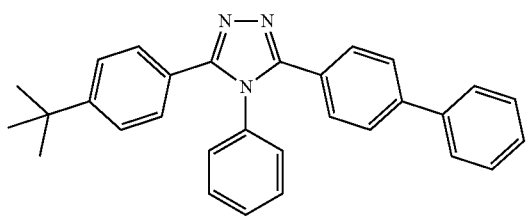
TAZ
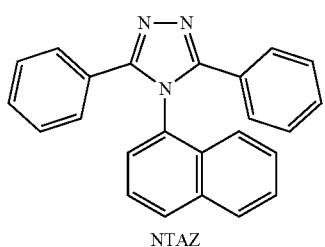
NTAZ
In one or more embodiments, the electron transport layer may include one of Compounds ET1 to ET25 or a combination thereof.
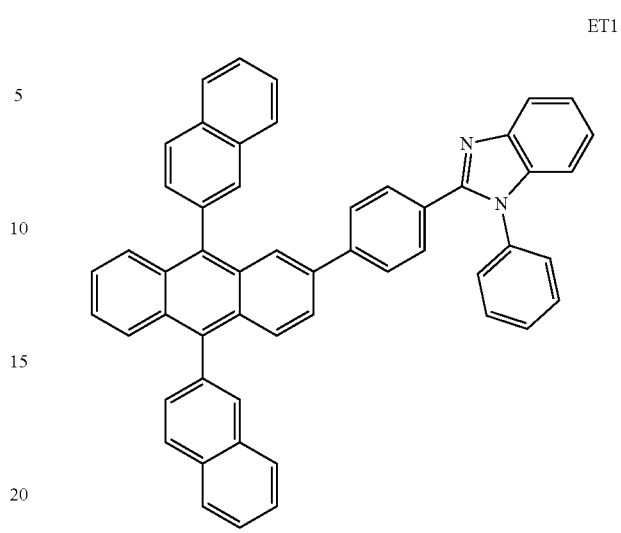
ET1
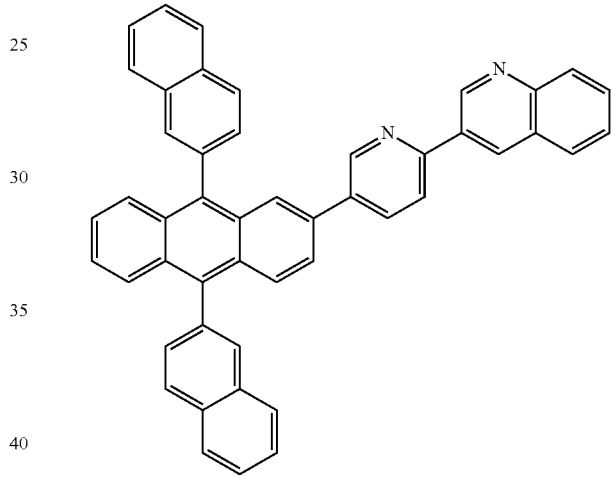
ET2
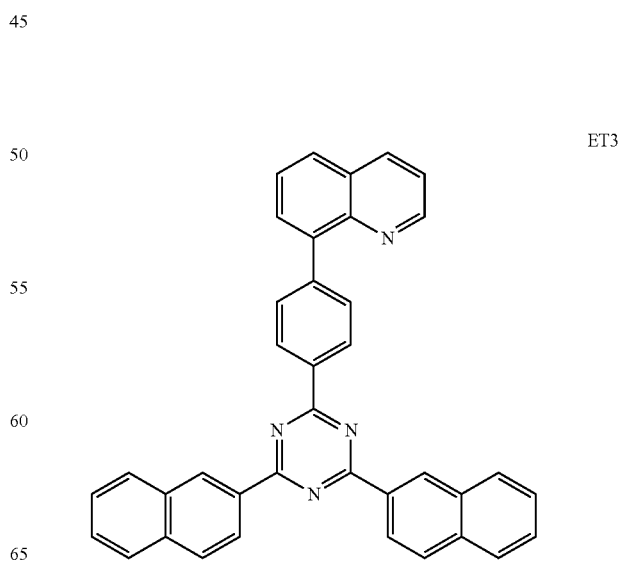
ET3

ET4
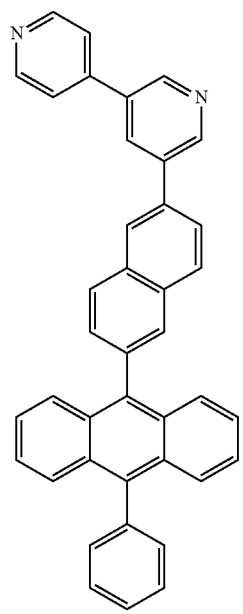
ET7
ET5
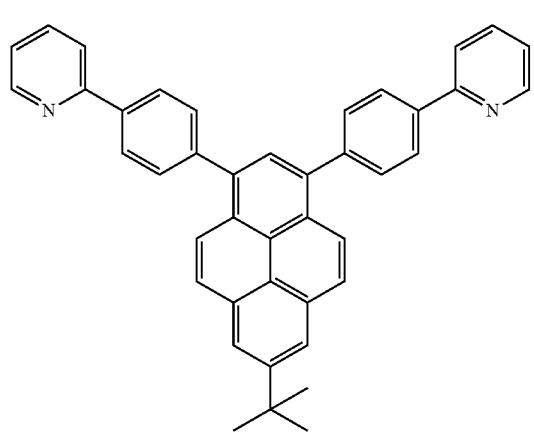
ET8
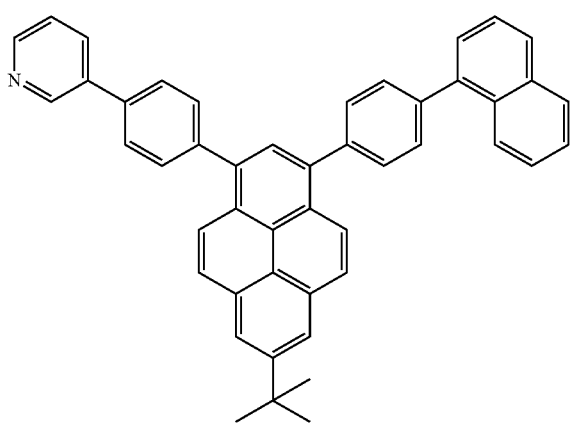
ET6
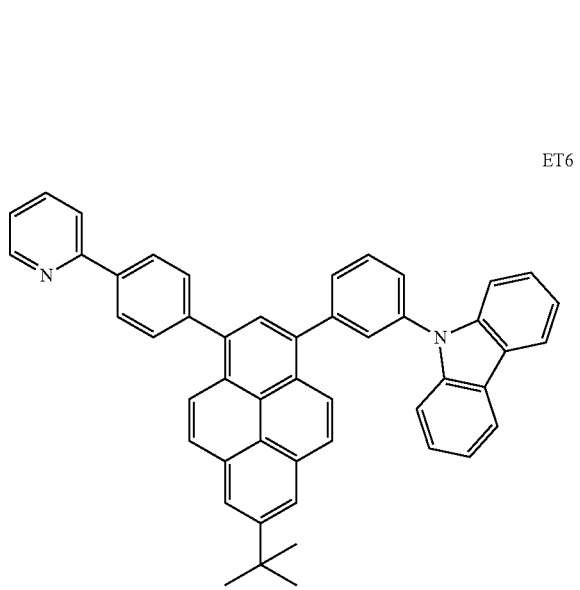
ET9
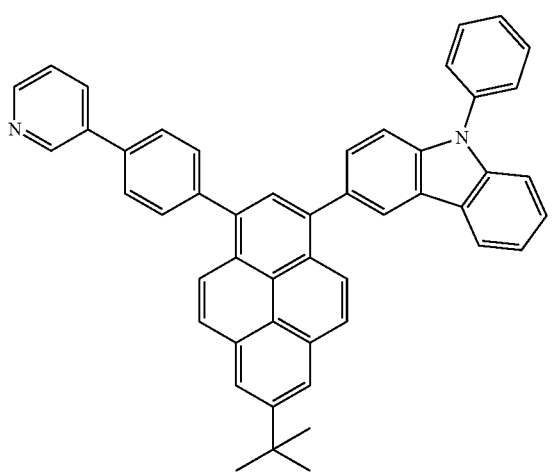

ET10
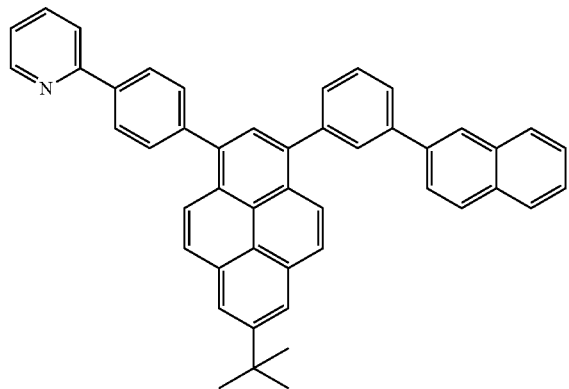
ET11
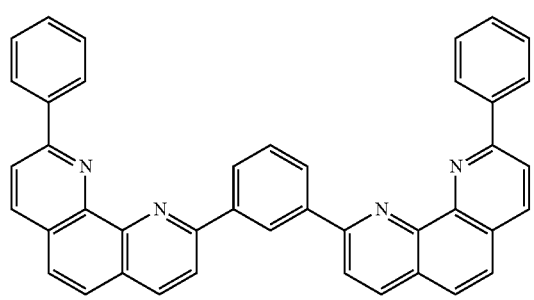
ET12
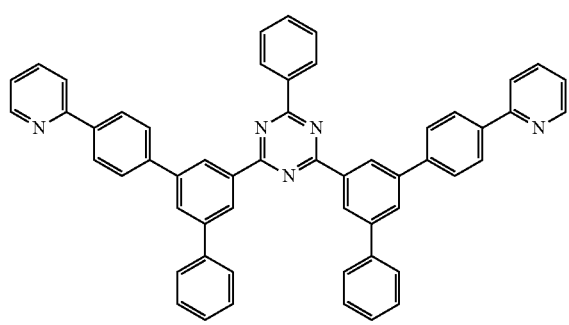
ET13
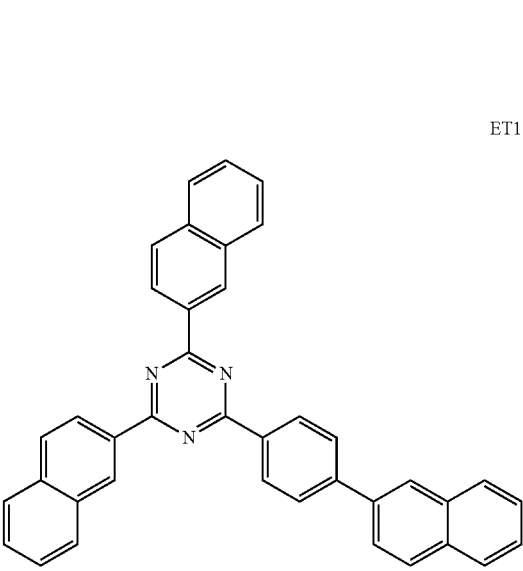
ET14
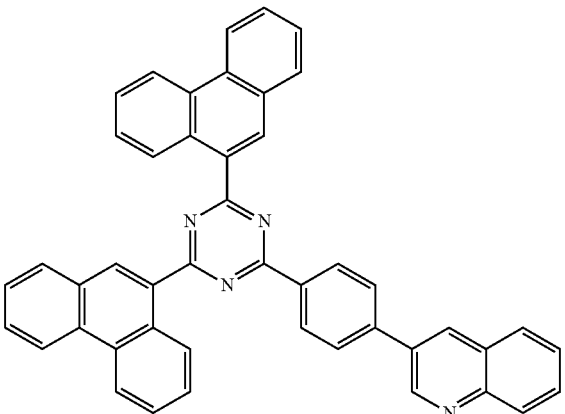
ET15
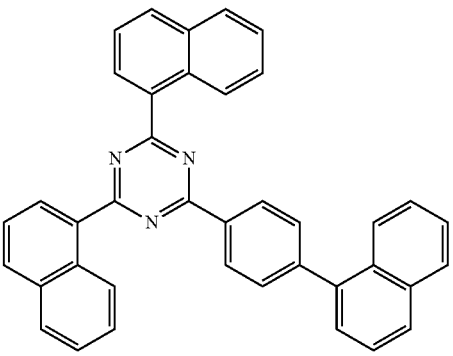
ET16

ET17
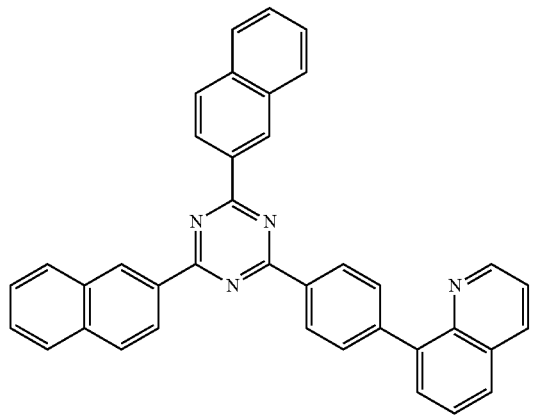
ET20
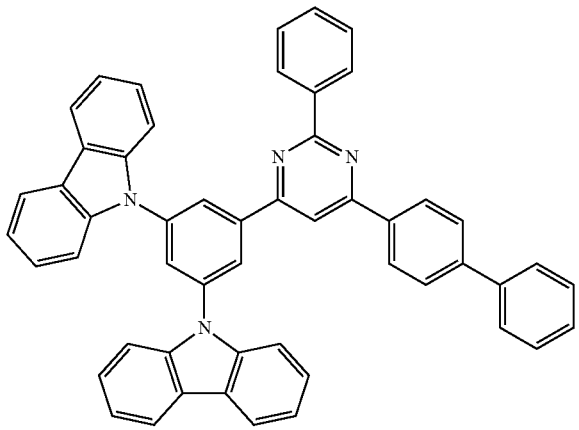
ET18
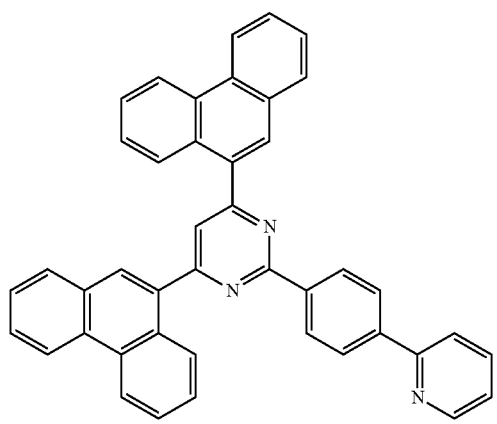
ET21
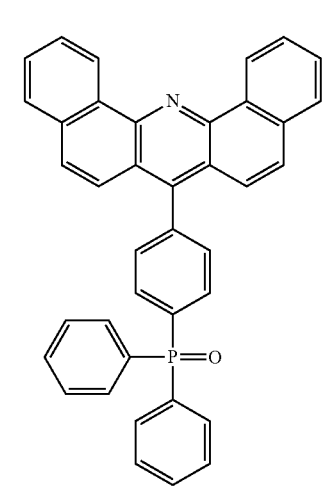
ET19
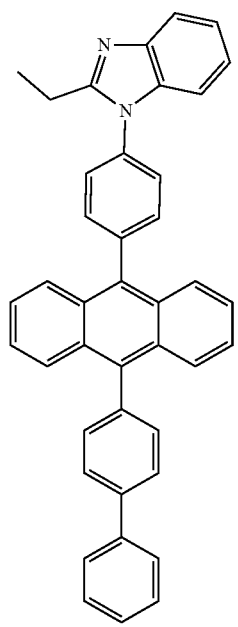
ET22
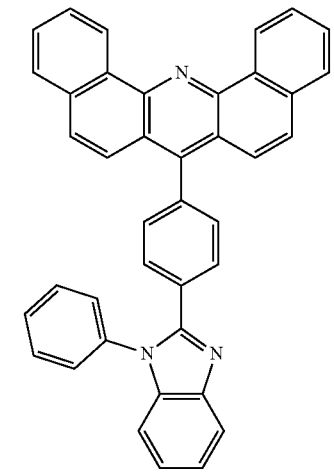

ET23

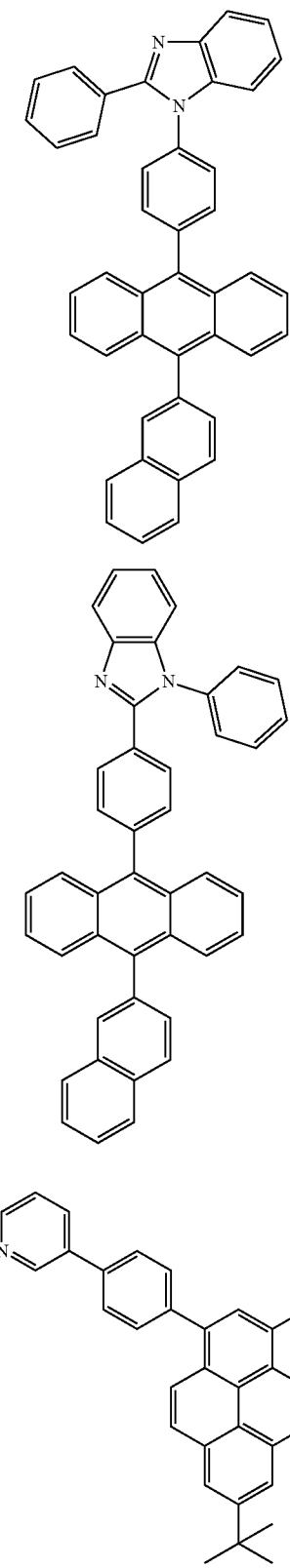

ET24

ET25 transport layer is within the range as described above, satisfactory electron transporting characteristics may be obtained without a substantial increase in driving voltage.

The electron transport layer may include a metal-containing material in addition to the material as described above.

The metal-containing material may include a $L_1$ complex. The $L_1$ complex may include, for example, one of Compounds ET-D1 (LiQ) or ET-D2.

ET-D1

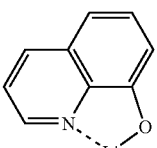

ET-D2

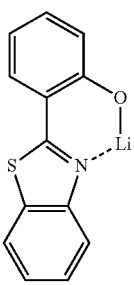

Also, the electron transport region may include an electron injection layer that facilitates the flow of electrons from the second electrode 19.

The electron injection layer may include LiF, NaCl, CsF, $Li_2O$, BaO, or a combination thereof.

A thickness of the electron injection layer may be from about 1 Å to about 100 Å, for example, from about 3 Å to about 90 Å. When the thickness of the electron injection layer is within the range as described above, satisfactory electron injection characteristics may be obtained without a substantial increase in driving voltage.

The second electrode 19 is located on the organic layer 15. The second electrode 19 may be a cathode. A material for forming the second electrode 19 may be a metal, an alloy, an electrically conductive compound, or a combination thereof, which have a relatively low work function. In one or more embodiments, lithium ($L_1$), magnesium (Mg), silver (Ag), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

According to another aspect, provided is a diagnostic composition including at least one organometallic compound represented by Formula 1.

A thickness of the electron transport layer may be in the range of about 100 Å to about 1,000 Å, for example, about 150 Å to about 500 Å. When the thickness of the electron The organometallic compound represented by Formula 1 provides high luminescence efficiency. Accordingly, the diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group—as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof may include a methoxy group, an ethoxy group, a propoxy group, a butoxy group, and a pentoxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a cyclic group that includes at least one hetero atom selected from N, O, P, Si, S, Se, Ge, and B as a ring-forming atom and 1 to 10 carbon atoms, and the $C_1$-$C_{10}$ heterocycloalkylene group refers to a divalent group having the same structure as the heterocycloalkyl group.

Examples of the $C_1$-$C_{10}$ heterocycloalkyl group may include a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one hetero atom selected from N, O, P, Si, S, Se, Ge, and B as a ring-forming atom, 2 to 10 carbon atoms, and at least one carbon-carbon double bond in its ring. Examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having at least one hetero atom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, Ge, and B as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein refers to a group of formula —$OA_{102}$ (wherein $A_{102}$ indicates the $C_6$-$C_{60}$ aryl group). The term "$C_6$-$C_{60}$ arylthio group" as used herein refers to a group of formula —$SA_{103}$ (wherein $A_{103}$ indicates the $C_6$-$C_{60}$ aryl group). The term "$C_1$-$C_{60}$ alkylthio group" as used herein refers to a group of formula —$SA_{104}$ (wherein $A_{104}$ indicates the $C_1$-$C_{60}$ alkyl group).

The term "$C_1$-$C_{60}$ heteroaryloxy group" as used herein refers to a group of formula —$OA_{102}$, (wherein $A_{102a}$ indicates the $C_1$-$C_{60}$ heteroaryl group). The term "$C_1$-$C_{60}$ heteroarylthio group" as used herein refers to a group of formula —$SA_{103a}$ (wherein $A_{103a}$ indicates the $C_1$-$C_{60}$ heteroaryl group).

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, S, Se, Ge, and B, other than carbon atoms (for example, having 1 to 60 carbon atoms), as a ring-forming atom, and non-aromaticity in its molecular structure when considered as a whole. Examples of the monovalent non-aromatic condensed heteropolycyclic group include a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" as used herein may include an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_{30}$ heterocyclic group may be a monocyclic group or a polycyclic group. The "$C_1$-$C_{30}$ heterocyclic group (unsubstituted or substituted with at least one $R_{10a}$)" may include, for example, a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

In one or more embodiments, examples of the term "$C_5$-$C_{30}$ carbocyclic group" and "$C_1$-$C_{30}$ heterocyclic group" as used herein may include i) a first ring, ii) a second ring, iii) a condensed ring wherein two or more first rings are condensed with each other, iv) a condensed ring wherein two or more second rings are condensed with each other, or v) a condensed ring wherein one or more first rings and one or more second rings are condensed with each other, the first ring may be a cyclopentane group, a cyclopentene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The term "fluoro group" as used herein refers to a group of the formula —F.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F), at least one substituent group that is substituted with at least one fluoro group, or a combination thereof. For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated heterocycloalkyl group," and "deuterated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium, at least one substituent group that is substituted with at least one deuterium, or a combination thereof. For example, "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" may be, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated heterocycloalkyl group, or a fully deuterated phenyl group, wherein, in each group, all hydrogen included therein is substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated heterocycloalkyl group, or a partially deuterated phenyl group, wherein, in each group, all hydrogen included therein is not substituted with deuterium.

The term "($C_1$-$C_{20}$ alkyl)'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. Examples of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" as used herein each respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," wherein, in each group, at least one of ring-forming carbon atom is substituted with nitrogen.

At least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{39}$)($Q_{39}$), or a combination thereof.

$Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl, —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

For example, $Q_1$ to $Q_9$, $Q_{11}$ to $Q_{19}$, $Q_{21}$ to $Q_{29}$, and $Q_{31}$ to $Q_{39}$ as used herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or a combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

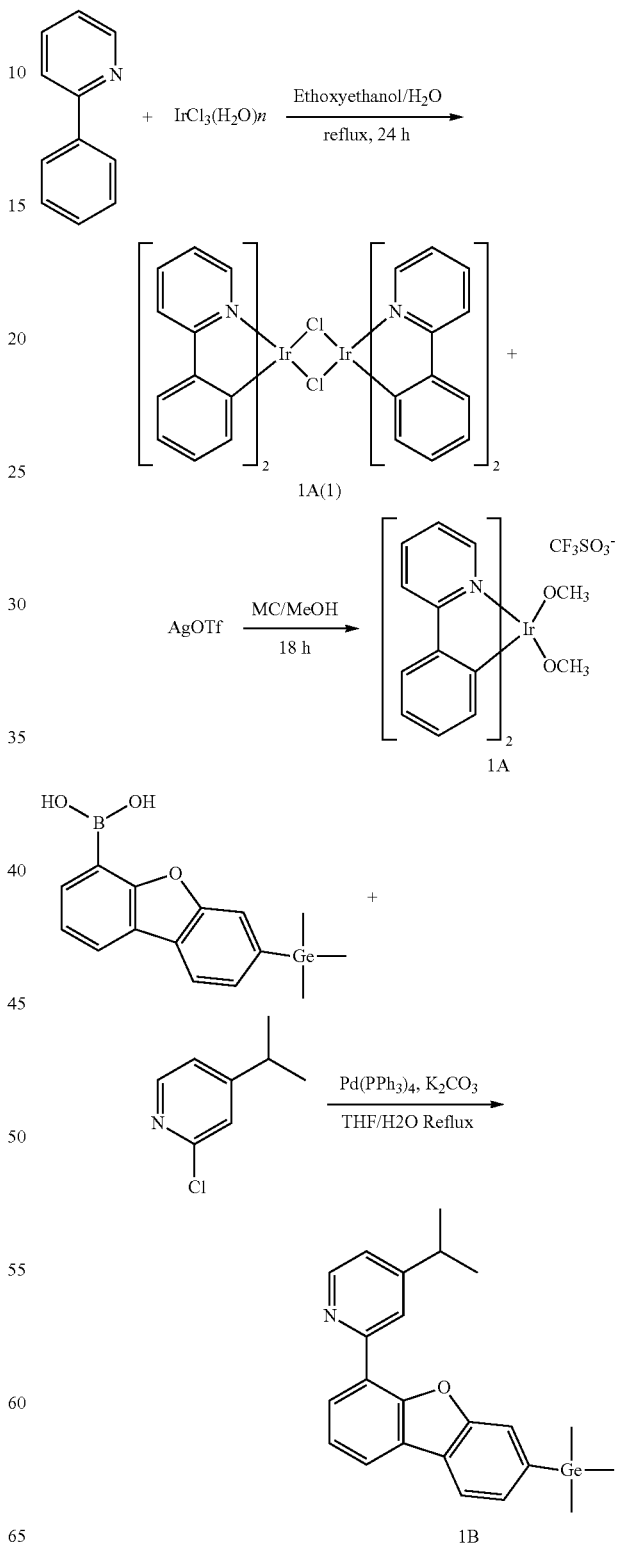

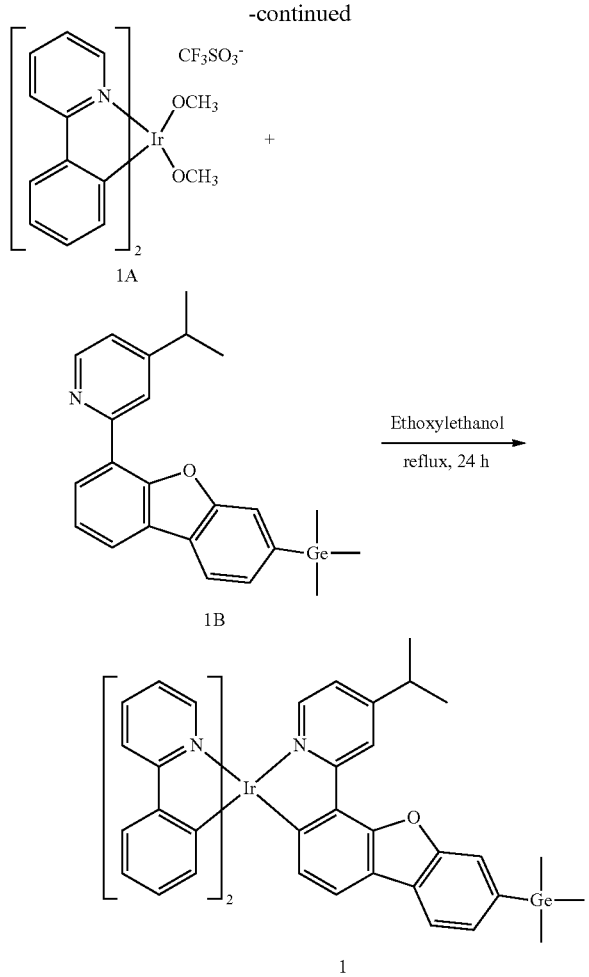

Synthesis of Compound 1A(1)

2-phenyl-pyridine (5.2 grams (g), 33.1 millimoles (mmol)) and iridium chloride hydrate (5.2 g, 14.7 mmol) were mixed with a mixture of 120 milliliters (mL) of ethoxyethanol and 40 ml of deionized water (DI water), the mixture was stirred at reflux for 24 hours, and then the temperature was allowed to cool to room temperature. The resulting solid was separated by filtration, washed sufficiently with water, methanol, and hexanes, in this stated order, and then dried in a vacuum oven, to thereby obtain 8.2 g (yield of 92%) of Compound 1A(1). Compound 1A(1) obtained was used in the next reaction without an additional purification process.

Synthesis of Compound 1A

Compound 1A(1) (1.6 g, 1.5 mmol) and 45 mL of methylene chloride were mixed together, and then silver trifluoromethanesulfonate (AgOTf) (0.8 g, 3.1 mmol) was added thereto after being mixed with 15 mL of methanol. Afterwards, the mixture was stirred for 18 hours at room temperature while light was blocked with aluminum foil, and then the mixture was filtered through Celite to remove the resulting solid, and the filtrate was subjected to reduced pressure to obtain a solid (Compound 1A). Compound 1A was used in the next reaction without an additional purification process.

Synthesis of Compound 1B

In a nitrogen atmosphere, (7-(trimethylgermyl)dibenzo[b,d]furan-4-yl) boronic acid (1.0 g, 6.5 mmol) and 2-chloro-4-isopropylpyridine (1.8 g, 5.5 mmol) were added to a mixture of 100 mL of tetrahydrofuran, a mixture of potassium carbonate ($K_2CO_3$) (1.7 g, 16.4 mmol) and 25 mL of DI water was added thereto, tetrakis(triphenylphosphine) palladium(0) ($Pd(PPh_3)_4$) (0.63 g, 0.54 mmol) was added thereto as a catalyst, and then the resultant mixture was stirred while heating at reflux at 100° C. After being allowed to cool to room temperature, the solid extracted from the resultant reaction mixture was subjected to column chromatography (eluent: methylene chloride (MC) and hexanes) to thereby obtain 1.8 g (yield of 81%) of Compound 1B (4-isopropyl-2-(7-(trimethylgermyl)dibenzo[b,d]furan-4-yl) pyridine). The obtained compound was identified by high resolution mass spectrometry (HRMS, using matrix assisted laser desorption ionization (MALDI)) and high-performance liquid chromatography (HPLC) analysis.

HRMS (MALDI) calcd for $C_{23}H_{25}GeNO$: m/z: 404.09. Found: 405.28

Synthesis of Compound 1

Compound 1A (1.2 g, 1.7 mmol) and Compound 1B (0.8 g, 1.9 mmol) were mixed with 50 mL of 2-ethoxyethanol, the mixture was stirred while refluxing for 24 hours, the temperature was cooled down, and then the water layer was removed from the resultant extracted using methylene chloride and water. The resultant obtained was treated using anhydrous magnesium sulfate, filtered, and then concentrated under reduced pressure, to obtain a solid which was then subjected to column chromatography (eluent: methylene chloride (MC) and hexane), to thereby obtain 0.6 g (yield of 41%) of Compound 1. The obtained compound was identified by HRMS and HPLC analysis.

HRMS (MALDI) calcd for $C_{45}H_{40}GeIrN_3O$: m/z: 903.68. Found: 905.44.

Synthesis Example 2 (Compound 2)

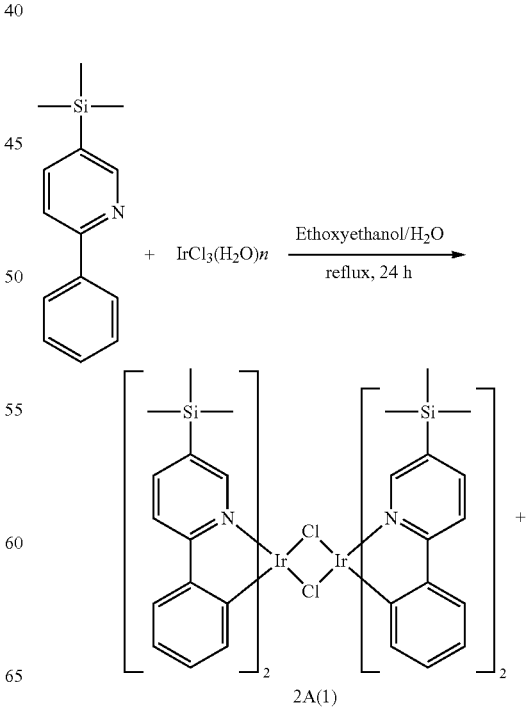

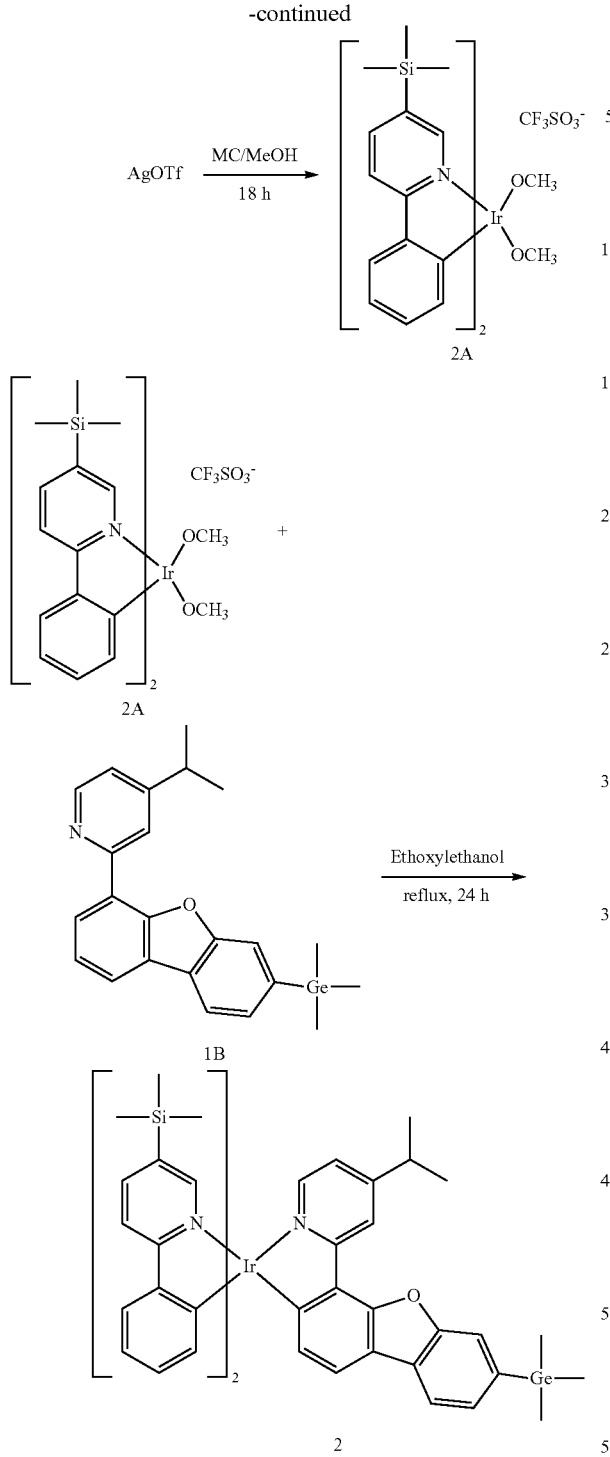

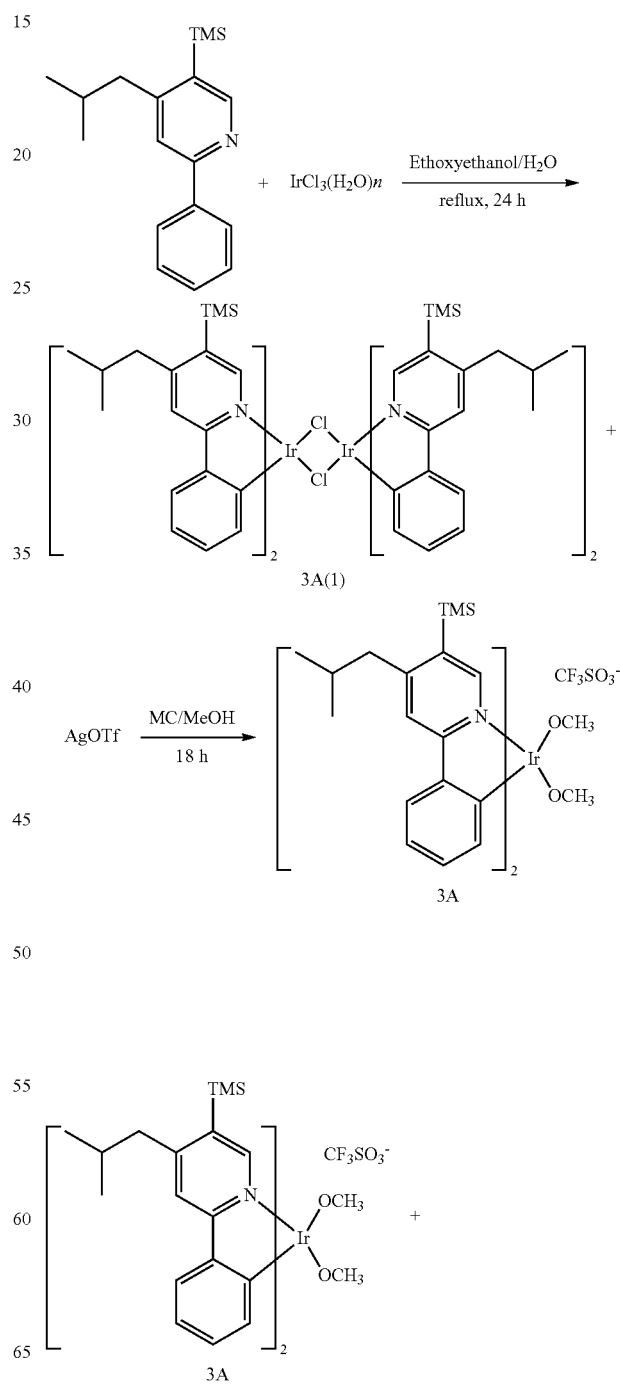

Synthesis of Compound 2A(1)

Compound 2A(1) was obtained in the manner as used to obtain Compound 1A(1) of Synthesis Example 1, except that 2-phenyl-5-(trimethylsilyl)pyridine (8.7 g, 38.3 mmol) was used instead of 2-phenyl-pyridine.

Synthesis of Compound 2A

Compound 2A was obtained in the manner as used to obtain Compound 1A of Synthesis Example 1, except that Compound 2A(1) was used instead of Compound 1A(1).

Synthesis of Compound 2

0.65 g (yield of 44%) of Compound 2 was obtained in the manner as used to obtain Compound 1 of Synthesis Example 1, except that Compound 2A was used instead of Compound 1A. The obtained compound was identified by HRMS and HPLC analysis.

HRMS (MALDI) calcd for $C_{51}H_{56}GeIrN_3OSi_2$: m/z: 1048.05. Found: 1049.25.

Synthesis Example 3 (Compound 3)

-continued

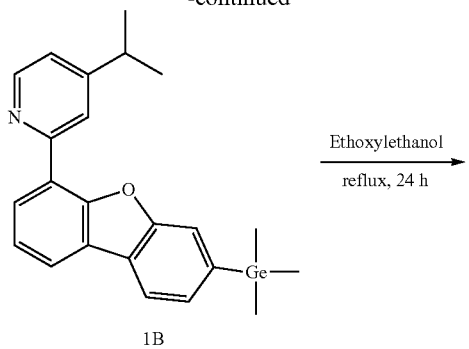

1B

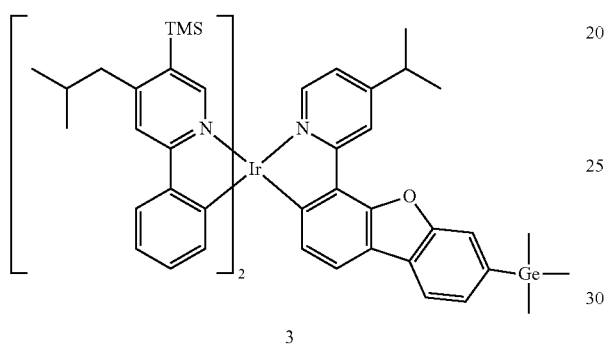

3

Synthesis of Compound 3A(1)

Compound 3A(1) was obtained in the manner as used to obtain Compound 1A(1) of Synthesis Example 1, except that 4-isobutyl-2-phenyl-5-(trimethylsilyl)pyridine (8.1 g, 28.7 mmol) was used instead of 2-phenyl-pyridine.

Synthesis of Compound 3A

Compound 3A was obtained in the manner as used to obtain Compound 1A of Synthesis Example 1, except that Compound 3A(1) was used instead of Compound 1A(1).

Synthesis of Compound 3

0.59 g (yield of 41%) of Compound 3 was obtained in the manner as used to obtain Compound 1 of Synthesis Example 1, except that Compound 3A was used instead of Compound 1A. The obtained compound was identified by HRMS and HPLC analysis.

HRMS (MALDI) calcd for $C_{59}H_{72}GeIrN_3OSi_2$: m/z: 1160.26. Found: 1162.43.

Example 1

A glass substrate on which an ITO as an anode is patterned was cut to a size of 50 millimeters (mm)×50 mm×0.5 mm, sonicated with isopropyl alcohol and DI water, each for 5 minutes, and then cleaned by irradiation of ultraviolet rays and exposure of ozone thereto for 30 minutes. The resultant glass substrate was loaded onto a vacuum deposition apparatus.

Compounds HT3 and HT-D2 were co-deposited by vacuum on the anode at a weight ratio of 98:2 to form a hole injection layer having a thickness of 100 Å, and Compound HT3 was vacuum deposited on the hole injection layer to form a hole transport layer having a thickness of 1,650 Å.

Then, H52 (host) and Compound 1 (dopant) were co-deposited at a weight ratio of 92:8 on the hole transport layer to form an emission layer having a thickness of 400 Å.

Then, Compounds ET3 and ET-D1 were co-deposited at a volume ratio of 1:1 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

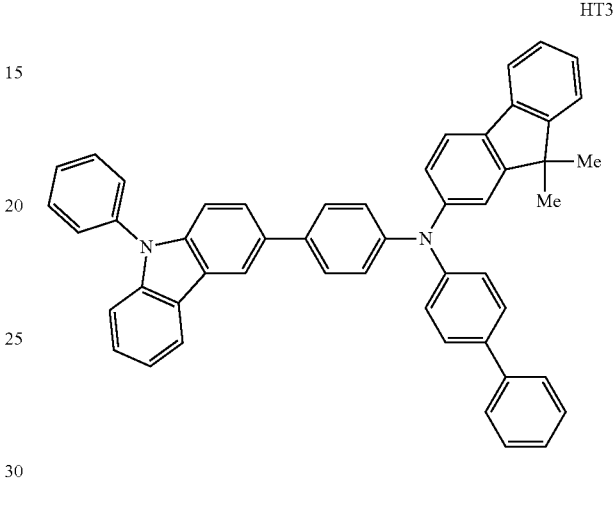

HT3

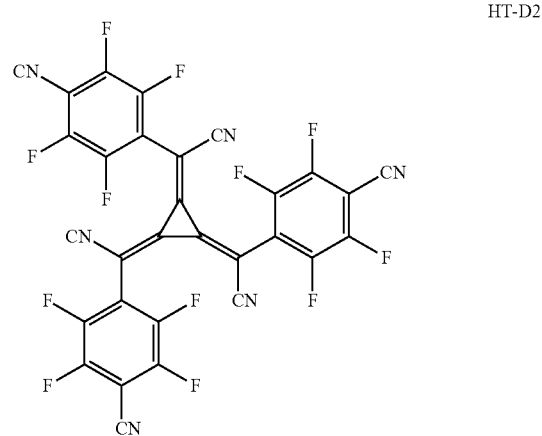

HT-D2

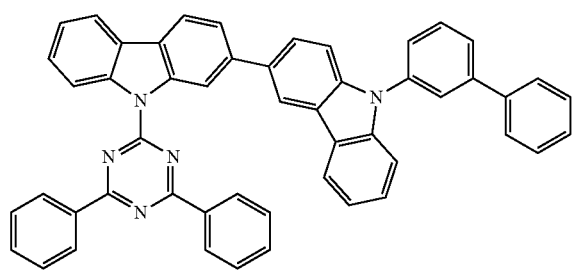

H52

-continued

ET3
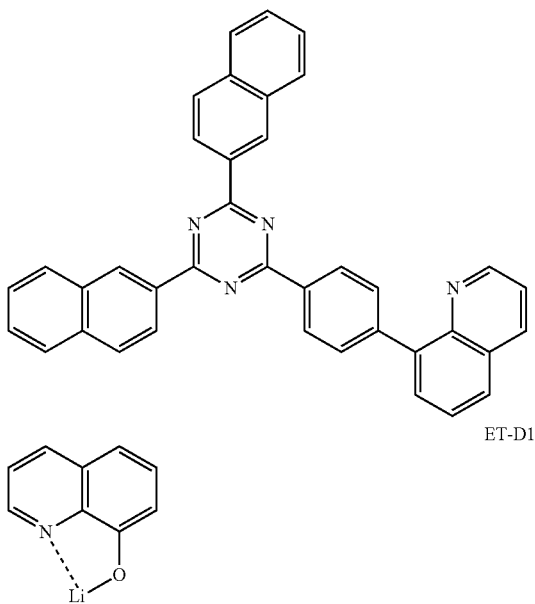

ET-D1
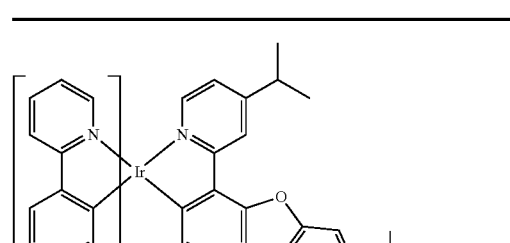

Examples 2 and 3 and Comparative Examples A and B

Organic light-emitting devices were manufactured in the manner as in Example 1, except that Compounds shown in Table 2 were each used instead of Compound 1 as a dopant to form an emission layer.

Evaluation Example 1

For each of the organic light-emitting devices manufactured in Examples 1 to 3 and Comparative Examples A and B, a driving voltage (volts, V), a maximum value of external quantum efficiency (Max EQE, %), a maximum emission wavelength (nm) of an electroluminescence spectrum, and a roll-off ratio (%) were evaluated, and results thereof are shown in Table 2. As evaluation apparatuses, a current-voltage meter (Keithley 2400) and a luminance meter (Minolta Cs-1000A) were used. The roll-off ratio was calculated according to Equation 1 below, where efficiency is in candela per square meter (cd/m², or "nits").

Roll off ratio={1−(efficiency (at 3500cd/m²)/maximum emission efficiency)}×100%  Equation 1

TABLE 2

| Compound No. as a dopant in emission layer | Driving voltage (V) | Maximum value of external quantum efficiency (%) | Maximum emission wavelength (nm) | Roll-off ratio (%) |
|---|---|---|---|---|
| Example 1 | 1 | 4.2 | 20.5 | 521 | 10 |
| Example 2 | 2 | 4.1 | 21.5 | 527 | 10 |
| Example 3 | 3 | 4.15 | 21.0 | 524 | 10 |
| Comparative Example A | A | 4.2 | 19.5 | 526 | 12 |
| Comparative Example B | B | 4.2 | 20.0 | 523 | 11 |

TABLE 2-continued

| Compound No. as a dopant in emission layer | Driving voltage (V) | Maximum value of external quantum efficiency (%) | Maximum emission wavelength (nm) | Roll-off ratio (%) |
|---|---|---|---|---|

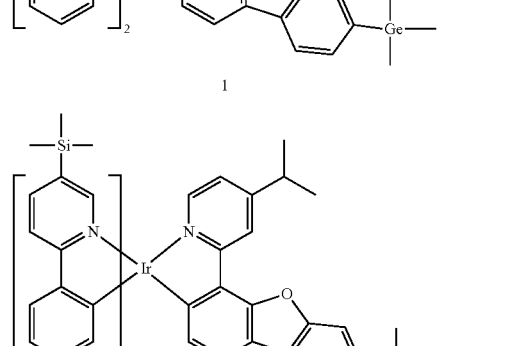

1

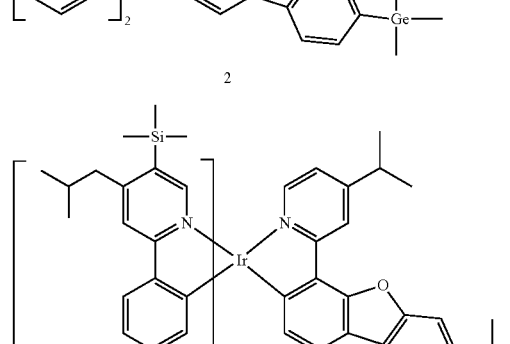

2

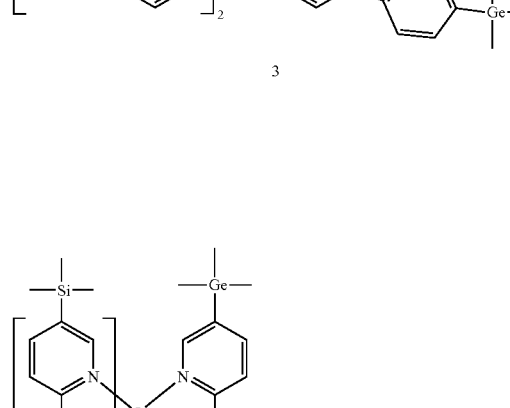

3

A

TABLE 2-continued

| Compound No. as a dopant in emission layer | Driving voltage (V) | Maximum value of external quantum efficiency (%) | Maximum emission wavelength (nm) | Roll-off ratio (%) |
| --- | --- | --- | --- | --- |
| 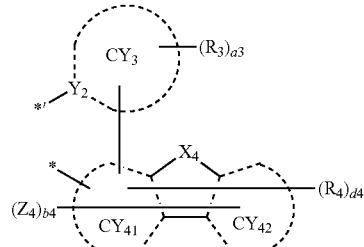 B | | | | |

From Table 2, it was confirmed that the organic light-emitting devices of Examples 1 to 3 have improved characteristics in terms of the driving voltage (V), the maximum value of the external quantum efficiency (Max EQE, %), the maximum emission wavelength (nm) of the electroluminescence spectrum, and the roll-off ratio (%), as compared to the driving voltage, maximum external quantum efficiency, maximum emission wavelength, and roll-off ratio of the organic light-emitting devices of Comparative Examples A and B.

Since the organometallic compound has excellent thermal stability and/or electric characteristics, an electronic device, for example, an organic light-emitting device, including the organometallic compound may have improved external quantum efficiency and improved lifespan characteristics, and high-quality electronic apparatuses may be manufactured using the organic light-emitting device.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. An organometallic compound, represented by Formula 1:

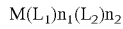   Formula 1 wherein, in Formula 1,

M is a transition metal, $L_1$ is a ligand represented by Formula 2-1, n1 is 0, 1, or 2, wherein, when n1 is 2 the two $L_1$ are identical to or different from each other, $L_2$ is a ligand represented by Formula 2-2, n2 is 1, 2, or 3, wherein, when n2 is 2 or more, two or more $L_2$ (s) are identical to or different from each other, and $L_1$ and $L_2$ are different from each other,

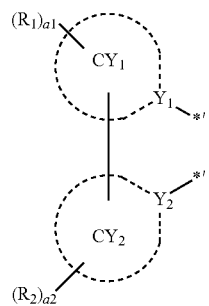

Formula 2-1

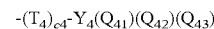

Formula 2-2 wherein, $Y_1$ and $Y_2$ in Formula 2-1 are each independently C or N, $Y_3$ in Formula 2-2 is N, a bond between $Y_3$ in Formula 2-2 and M in Formula 1 is a coordinate bond, ring $CY_1$, $CY_2$, and ring $CY_3$ in Formulae 2-1 and 2-2 are each independently a $C_5$-$C_{30}$ carbocyclic group or a $C_1$-$C_{30}$ heterocyclic group, ring $CY_{41}$ and ring $CY_{42}$ in Formula 2-2 are each independently a π electron-rich $C_5$-$C_{30}$ cyclic group, a carbon atom of ring $CY_{41}$ in Formula 2-2 and M in Formula 1 are bonded to each other via a covalent bond, $X_4$ in Formula 2-2 is O, S, Se, $N(R_{48})$, $C(R_{48})(R_{49})$, or $Si(R_{48})(R_{49})$, $Z_4$ in Formula 2-2 is a group represented by Formula 3, $-(T_4)_{c4}-Y_4(Q_{41})(Q_{42})(Q_{43})$   Formula 3 b4 in Formula 2-2 is an integer from 1 to 20, $Y_4$ in Formula 3 is Si or Ge, $T_4$ in Formula 3 is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, when $T_4$ is not a single bond, c4 in Formula 3 is an integer from 1 to 10, $R_1$ to $R_4$, $R_{48}$, $R_{49}$, and $Q_{41}$ to $Q_{43}$ in Formulae 2-1, 2-2, and 3 are each independently hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge ($Q_3$)($Q_4$)($Q_5$), —B($Q_6$)($Q_7$), —P(=O)($Q_8$)($Q_9$), or —P($Q_8$)($Q_9$), a1 to a4 in Formulae 2-1 and 2-2 are each independently an integer from 0 to 20, wherein when $CY_1$ and $CY_3$ are each a pyridine group and $CY_2$ is a benzene group one of the following is satisfied:
  i) a1 is 1 or more, and at least one of $R_1$(s) in a number of a1 is —Si($Q_3$)($Q_4$)($Q_5$) or —Ge($Q_3$)($Q_4$)($Q_5$);
  ii) a2 is 2 or more, and at least one of $R_2$(s) in a number of a2 is —Si($Q_3$)($Q_4$)($Q_5$) or —Ge($Q_3$)($Q_4$)($Q_5$);

$R_{10a}$ is the same as described in connection with $R_2$,

* and *' in Formulae 2-1 and 2-2 each indicate a binding site to M in Formula 1,

* in Formula 3 indicates a binding site to a neighboring atom, two or more of a plurality of $R_1$(s) in Formula 2-1 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$(s) in Formula 2-1 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$(s) in Formula 2-2 are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$(s) in Formula 2-2 are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_1$ to $R_4$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge ($Q_{23}$)($Q_{24}$)($Q_{25}$), —B($Q_{26}$)($Q_{27}$), —P(=O)($Q_{28}$)($Q_{29}$), P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

2. The organometallic compound of claim 1, wherein ring $CY_1$ and ring $CY_3$ are each independently a pyridine group, a pyrimidine group, a triazine group, a quinoline group, an isoquinoline group, a quinoxaline group, a benzoquinoline group, a benzoisoquinoline group, a benzoquinoxaline group, a naphthoquinoline group, a naphthoisoquinoline group, a naphthoquinoxaline group, a pyridine group condensed with a cyclohexane group, a pyridine group condensed with a norbornane group, an imidazole group, a benzimidazole group, a naphthoimidazole group, or a phenanthrenoimidazole group.

3. The organometallic compound of claim 1, wherein ring $CY_2$ is a benzene group, a naphthalene group, an anthracene group, a phenanthrene group, a triphenylene group, a 1,2,3,4-tetrahydronaphthalene group, a benzene group condensed with a norbornane group, a carbazole group, a fluorene group, a dibenzosilole group, a dibenzothiophene group, a dibenzofuran group, or a dibenzoselenophene group.

4. The organometallic compound of claim 1, wherein ring $CY_{41}$ and ring $CY_{42}$ are each independently:
   i) a benzene group, a naphthalene group, an anthracene group, a phenanthrene group, or a triphenylene group; or
   ii) a polycyclic group wherein at least one benzene group and at least one B group are condensed with each other, wherein
   the at least one B group is a cyclohexane group, a norbornane group, a furan group, a thiophene group, a selenophene group, a pyrrole group, a cyclopentadiene group, or a silole group.

5. The organometallic compound of claim 1, wherein b4 is 1 or 2.

6. The organometallic compound of claim 1, wherein $R_1$ to $R_4$, $R_{48}$, and $R_{49}$ are each independently:
hydrogen, deuterium, —F, or a cyano group;
a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof; or
—Si($Q_3$)($Q_4$)($Q_5$) or —Ge($Q_3$)($Q_4$)($Q_5$).

7. The organometallic compound of claim 1, wherein, in Formula 2-1,
i) a1 is 1 or more, and at least one of $R_1$(s) in a number of a1 is —Si($Q_3$)($Q_4$)($Q_5$) or —Ge($Q_3$)($Q_4$)($Q_5$).

8. The organometallic compound of claim 1, wherein a group represented by

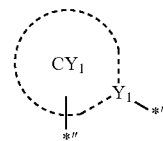

in Formula 2-1 is a group represented by one of Formulae CY1-1 to CY1-25:

CY1-1

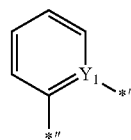

CY1-2

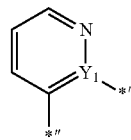

CY1-3

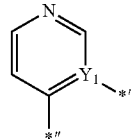

CY1-4

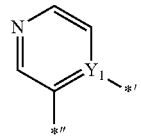

CY1-5

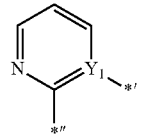

CY1-6

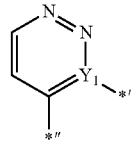

CY1-7

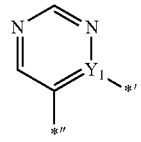

-continued
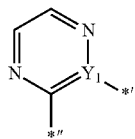
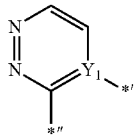
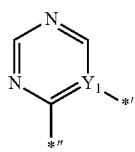
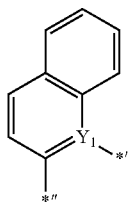
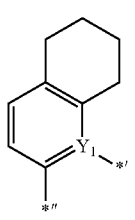
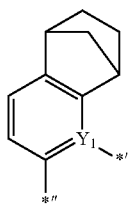
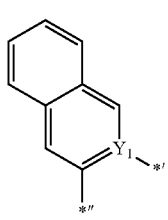
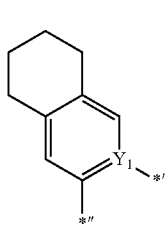
-continued
CY1-8
CY1-9
CY1-10
CY1-11
CY1-12
CY1-13
CY1-14
CY1-15
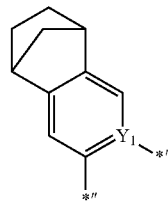
CY1-16
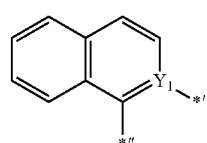
CY1-17
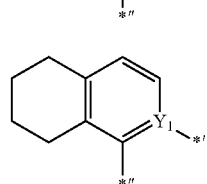
CY1-18
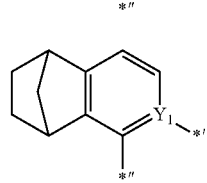
CY1-19
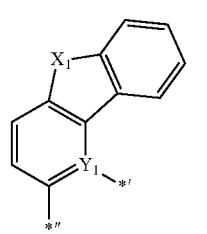
CY1-20
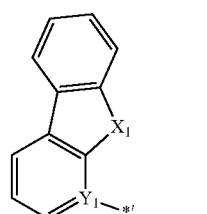
CY1-21
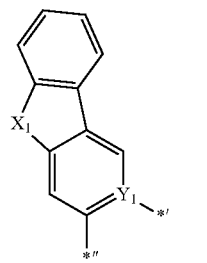
CY1-22

-continued

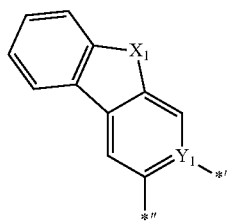
CY1-23

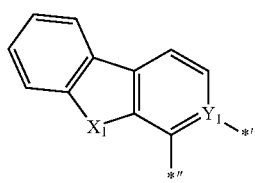
CY1-24

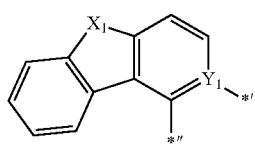
CY1-25 wherein, in Formulae CY1-1 to CY1-25, $Y_1$ is as defined in claim 1, $X_1$ is O, S, Se, $N(R_{18})(R_{19})$, $C(R_{18})(R_{19})$, or $Si(R_{18})(R_{19})$, $R_{18}$ and $R_{19}$ are each as defined in connection with $R_1$ in claim 1,

*' indicates a binding site to M in Formula 1, and

*'' indicates a binding site to a neighboring atom in Formula 2-1.

9. The organometallic compound of claim 1, wherein a group represented by

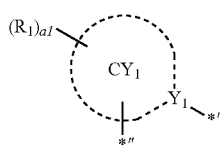

in Formula 2-1 is a group represented by one of Formulae CY1(1) to CY1(16):

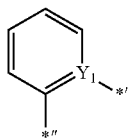
CY1(1)

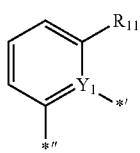
CY1(2)

-continued

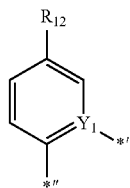
CY1(3)

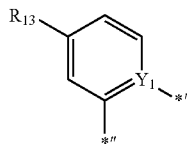
CY1(4)

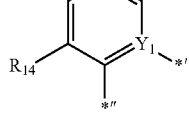
CY1(5)

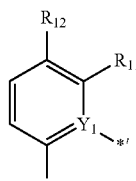
CY1(6)

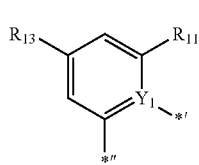
CY1(7)

CY1(8)

CY1(9)

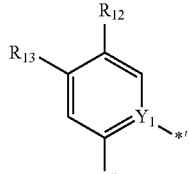
CY1(9)

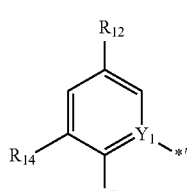
CY1(10)

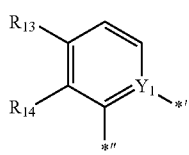
CY1(11)

-continued

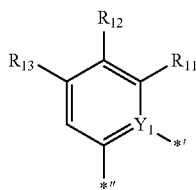
CY1(12)

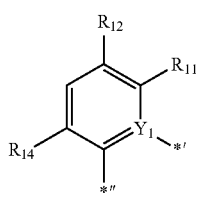
CY1(13)

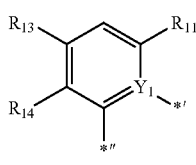
CY1(14)

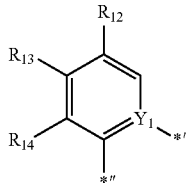
CY1(15)

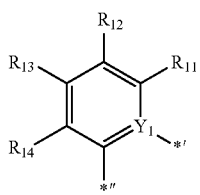
CY1(16)

wherein, in Formulae CY1(1) to CY1(16), $Y_1$ is as defined in claim 1, $R_{11}$ to $R_{14}$ are each as defined in connection with $R_1$ in claim 1, wherein each of $R_{11}$ to $R_{14}$ is not hydrogen,

*' indicates a binding site to M in Formula 1, and

*'' indicates a binding site to a neighboring atom in Formula 2-1.

10. The organometallic compound of claim 1, wherein a group represented by

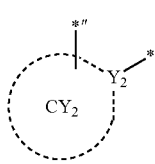

in Formula 2-1 is a group represented by one of Formulae CY2-1 to CY2-50:

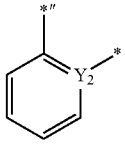
CY2-1

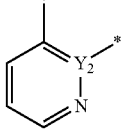
CY2-2

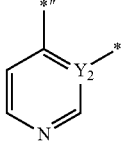
CY2-3

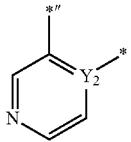
CY2-4

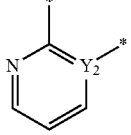
CY2-5

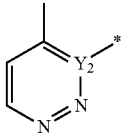
CY2-6

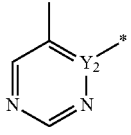
CY2-7

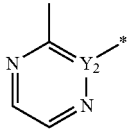
CY2-8

CY2-9

-continued
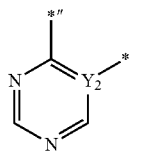
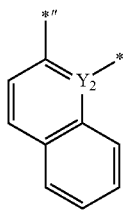
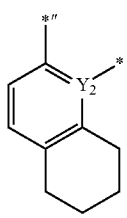
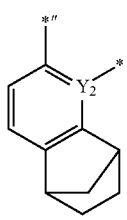
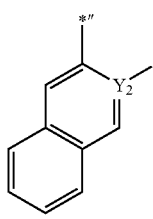
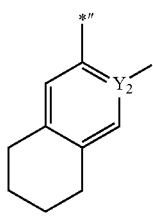
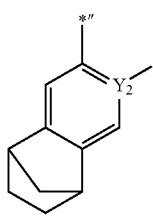
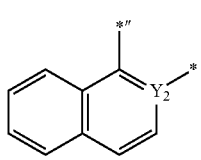
-continued
CY2-10
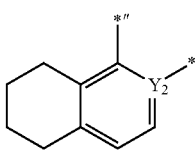
CY2-11
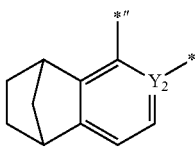
CY2-12
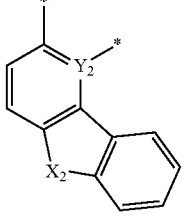
CY2-13
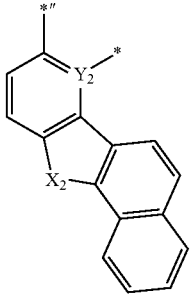
CY2-14
CY2-15
CY2-16
CY2-17
CY2-18
CY2-19
CY2-20
CY2-21
CY2-22
CY2-23
CY2-24
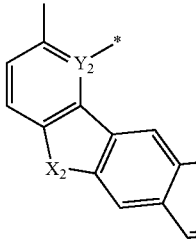
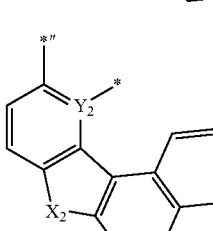
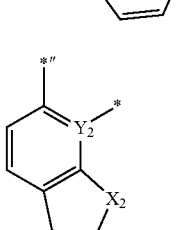

CY2-25 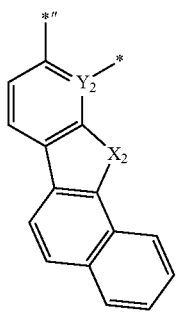
CY2-26 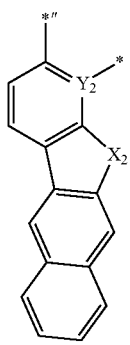
CY2-27 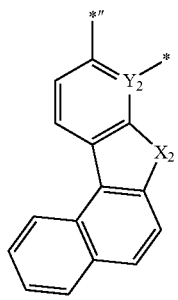
CY2-28 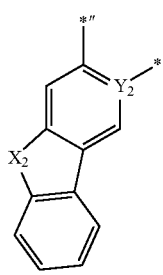
CY2-29 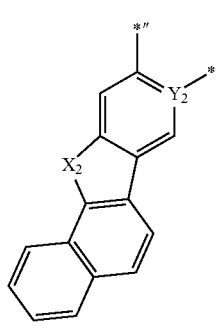
CY2-30 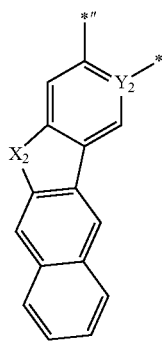
CY2-31 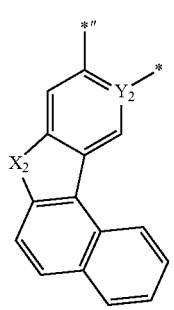
CY2-32 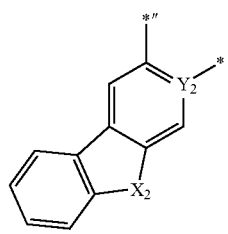
CY2-33 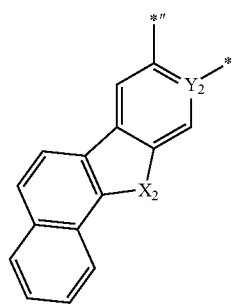
CY2-34 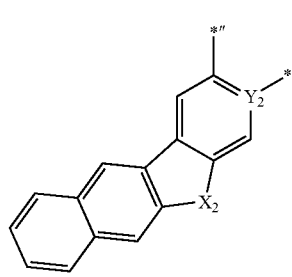

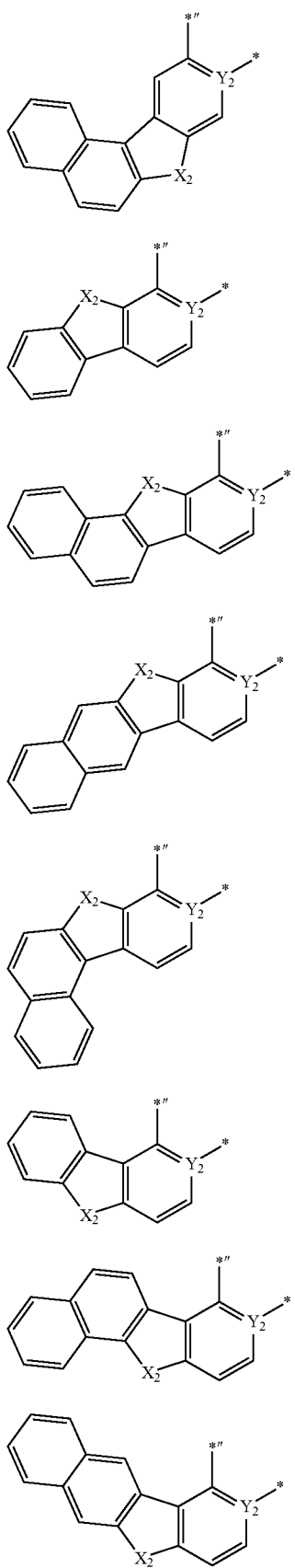
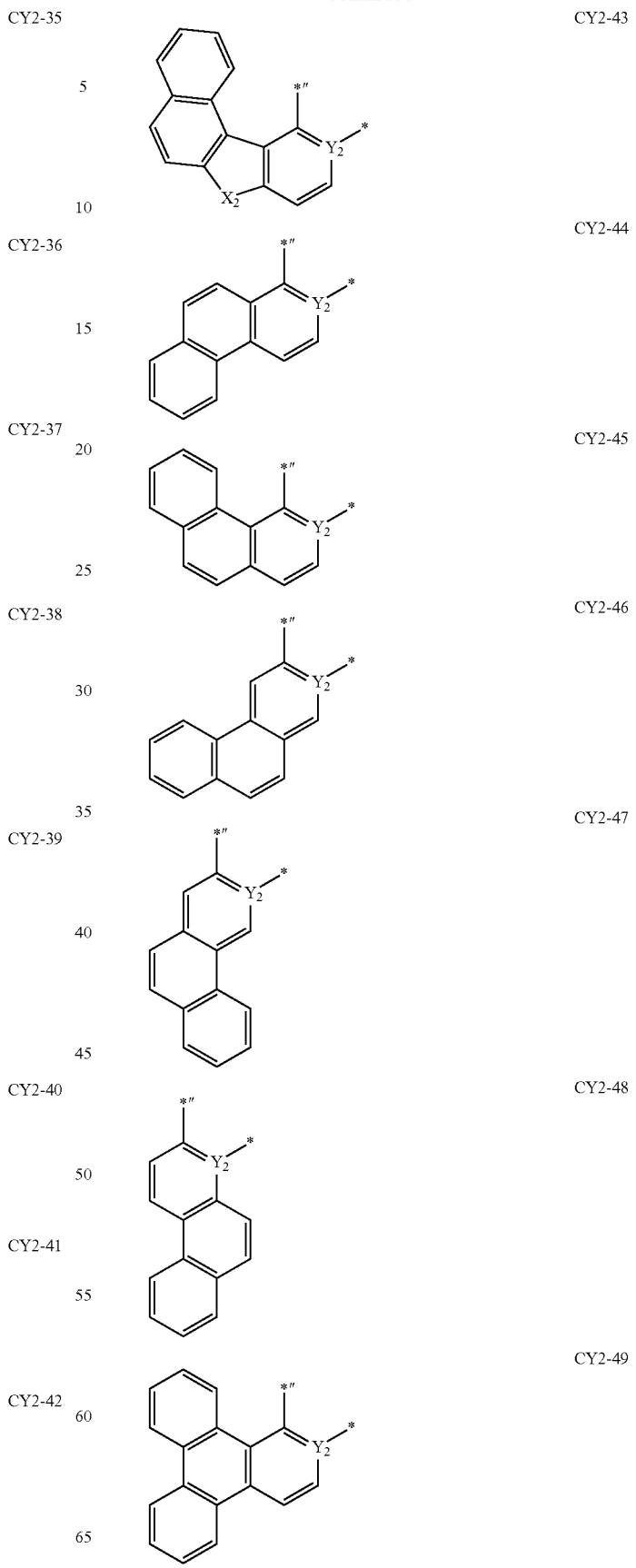

-continued

CY2-50

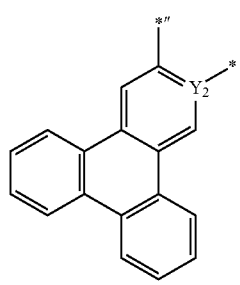

wherein, in Formulae CY2-1 to CY2-50,
$Y_2$ is as defined in claim 1,
$X_2$ is O, S, Se, $N(R_{28})$, $C(R_{28})(R_{29})$, or $Si(R_{28})(R_{29})$,
$R_{28}$ and $R_{29}$ are each as defined in connection with $R_2$ in claim 1,
*″ indicates a binding site to a neighboring atom in Formula 2-1, and
*indicates a binding site to M in Formula 1.

11. The organometallic compound of claim 1, wherein a group represented by

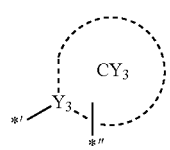

in Formula 2-2 is a group represented by one of Formulae CY3-1 to CY3-33:

CY3-1

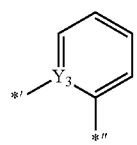

CY3-2

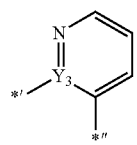

CY3-3

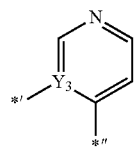

CY3-4

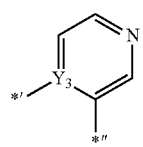

CY3-5

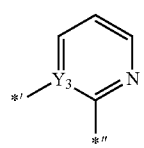

-continued

CY3-6

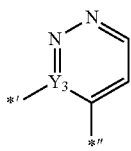

CY3-7

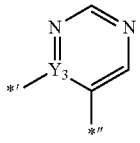

CY3-8

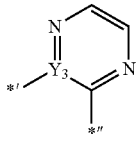

CY3-9

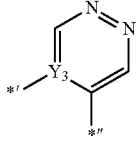

CY3-10

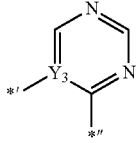

CY3-11

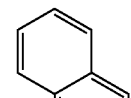

CY3-12

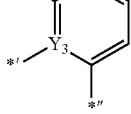

CY3-13

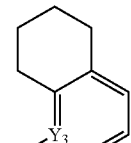

CY3-14

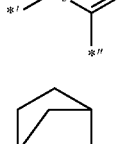

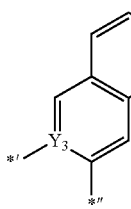

CY3-15
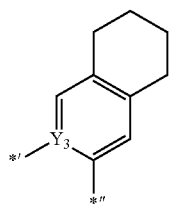
CY3-16
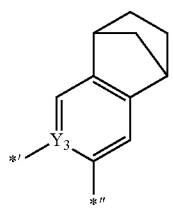
CY3-17
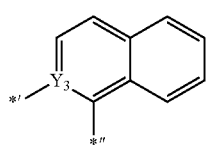
CY3-18
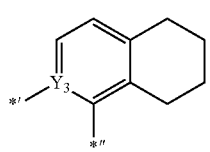
CY3-19
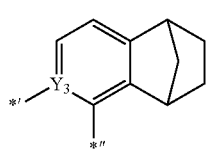
CY3-20
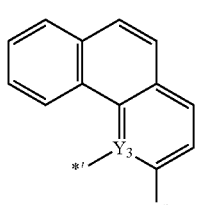
CY3-21
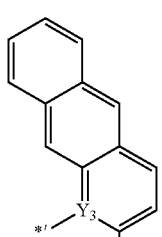
CY3-22
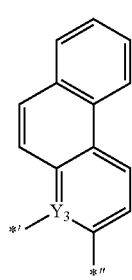
CY3-23
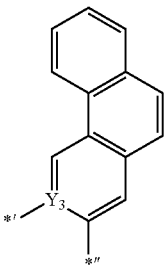
CY3-24
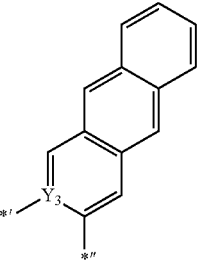
CY3-25
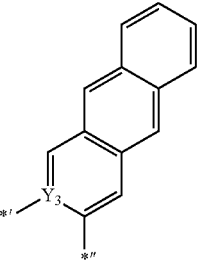
CY3-26
CY3-27
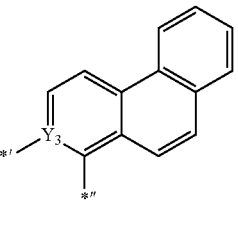
CY3-28
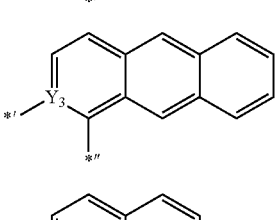
CY3-29
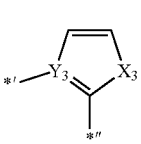
CY3-30
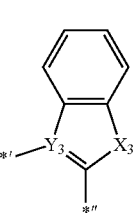

-continued

CY3-31
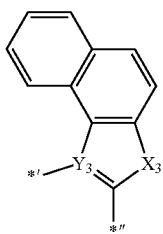

CY3-32
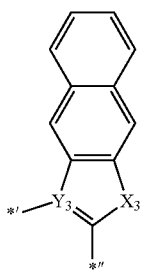

CY3-33
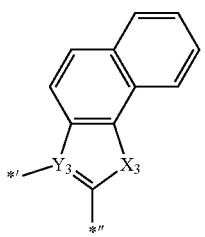

wherein, in Formulae CY3-1 to CY3-33, $Y_3$ is as defined in claim 1, $X_3$ is O, S, Se, $N(R_{38})$, $C(R_{38})(R_{39})$, or $Si(R_{38})(R_{39})$, $R_{38}$ and $R_{39}$ are each as defined in connection with $R_3$ in claim 1,

*' indicates a binding site to M in Formula 1, and

*''' indicates a binding site to a neighboring atom in Formula 2-2.

12. The organometallic compound of claim 1, wherein a group represented by

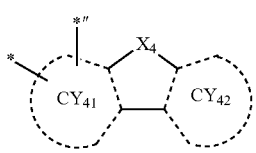

in Formula 2-2 is represented by one of Formulae CY4-1 to CY4-6:

CY4-1
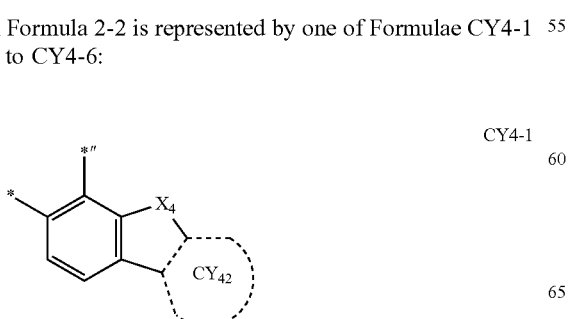

-continued

CY4-2
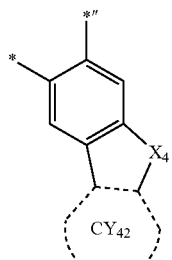

CY4-3
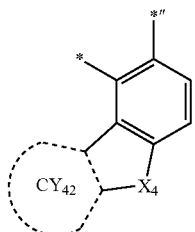

CY4-4
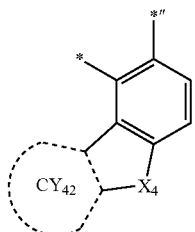

CY4-5
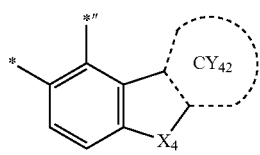

CY4-6
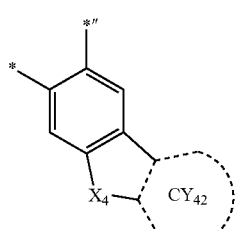

wherein, in Formulae CY4-1 to CY4-6, $X_4$ and ring $CY_{42}$ are as defined in claim 1,

*indicates a binding site to M in Formula 1, and

*''' indicates a binding site to ring $CY_3$ in Formula 2-2.

13. The organometallic compound of claim 1, wherein a group represented by

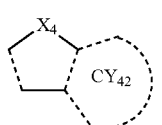

in the structure of

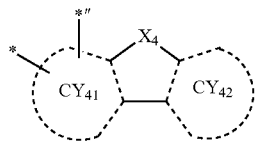

in Formula 2-2 is represented by one of Formulae CY401 to CY413:

CY401
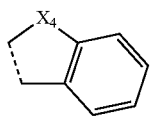

CY402
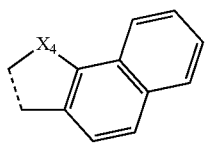

CY403
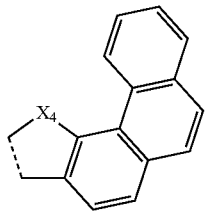

CY404
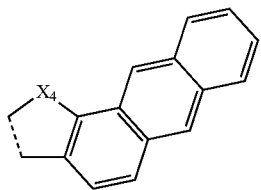

CY405
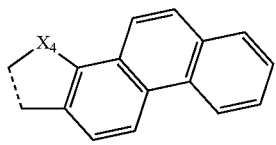

CY406
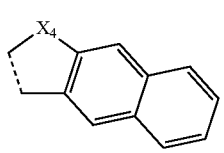

CY407
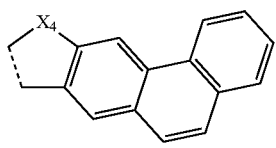

CY408
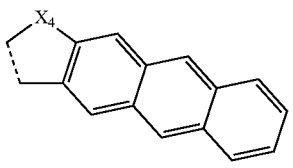

CY409
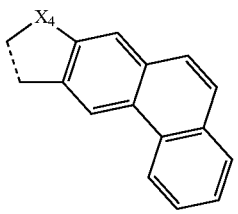

CY410
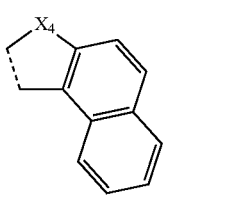

CY411
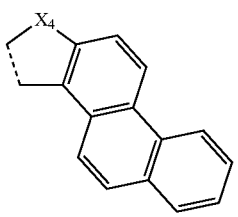

CY412
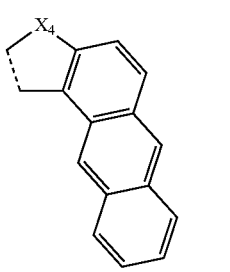

CY413
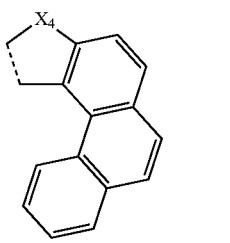

wherein, in Formulae CY401 to CY413,
$X_4$ is as defined in claim 1, and
an $X_4$-containing 5-membered ring is condensed with a neighboring ring $CY_{41}$.

14. The organometallic compound of claim 1, wherein ring $CY_{42}$ in Formula 2-2 is substituted with at least one of $Z_4$.

15. An organic light-emitting device, comprising:
a first electrode;
a second electrode; and
an organic layer located between the first electrode and the second electrode, wherein the organic layer comprises an emission layer, and
wherein the organic layer comprises at least one of the organometallic compound of claim 1.

16. The organic light-emitting device of claim 15, wherein the first electrode is an anode,
the second electrode is a cathode,
the organic layer further comprises a hole transport region located between the first electrode and the emission layer, and an electron transport region located between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.

17. The organic light-emitting device of claim 15, wherein the emission layer comprises the at least one of the organometallic compound.

18. The organic light-emitting device of claim 17, wherein the emission layer emits green light.

19. The organic light-emitting device of claim 17, wherein the emission layer further comprises a host, and an amount of the host in the emission layer is greater than an amount of the at least one of the organometallic compound in the emission layer.

20. An electronic apparatus, comprising the organic light-emitting device of claim 15.

21. The organometallic compound of claim 1, wherein M may be iridium (Ir), platinum (Pt), osmium (Os), titanium (Ti), zirconium (Zr), hafnium (Hf), europium (Eu), terbium (Tb), thulium (Tm), or rhodium (Rh); and
a3 is one or more and at least one $R_3$ is —$CD_3$, —$CD_2H$, —$CDH_2$, —$CF_3$, —$CF_2H$, a group represented by one of Formulae 9-1 to 9-39, a group represented by one of Formulae 9-1 to 9-39 wherein at least one hydrogen is substituted with deuterium, a group represented by one of Formulae 9-1 to 9-39 wherein at least one hydrogen is substituted with —F, a group represented by one of Formulae 9-201 to 9-230, a group represented by one of Formulae 9-201 to 9-230 wherein at least one hydrogen is substituted with deuterium, a group represented by one of Formulae 9-201 to 9-230 wherein at least one hydrogen is substituted with —F, a group represented by one of Formulae 10-1 to 10-145, a group represented by one of Formulae 10-1 to 10-145 wherein at least one hydrogen is substituted with deuterium, a group represented by one of Formulae 10-1 to 10-145 wherein at least one hydrogen is substituted with —F, a group represented by one of Formulae 10-201 to 10-354, a group represented by one of Formulae 10-201 to 10-354 wherein at least one hydrogen is substituted with deuterium, a group represented by one of Formulae 10-201 to 10-354 wherein at least one hydrogen is substituted with —F, 9-1

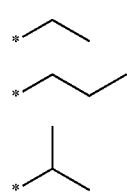

9-2

9-3

-continued

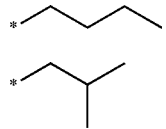

9-4

9-5

9-6

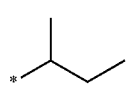

9-7

9-8

9-9

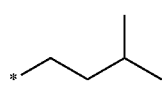

9-10

9-11

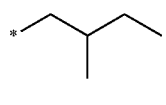

9-12

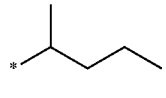

9-13

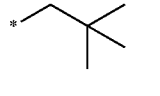

9-14

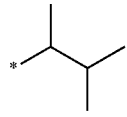

9-15

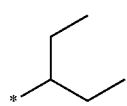

9-16

9-17

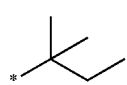

9-18

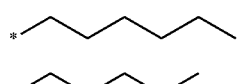

9-19

9-20

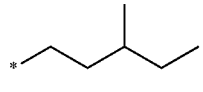

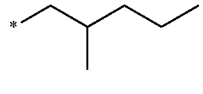

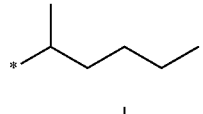

9-21

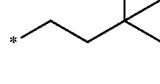

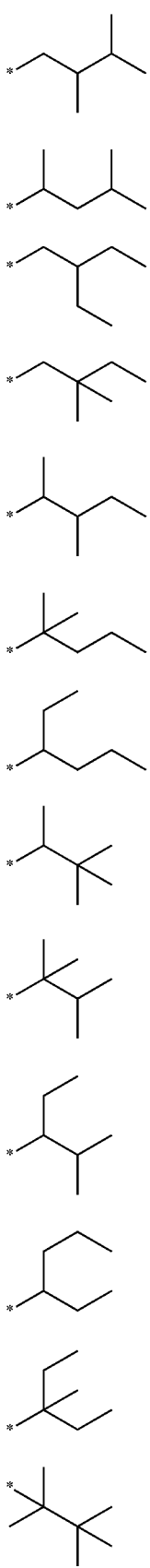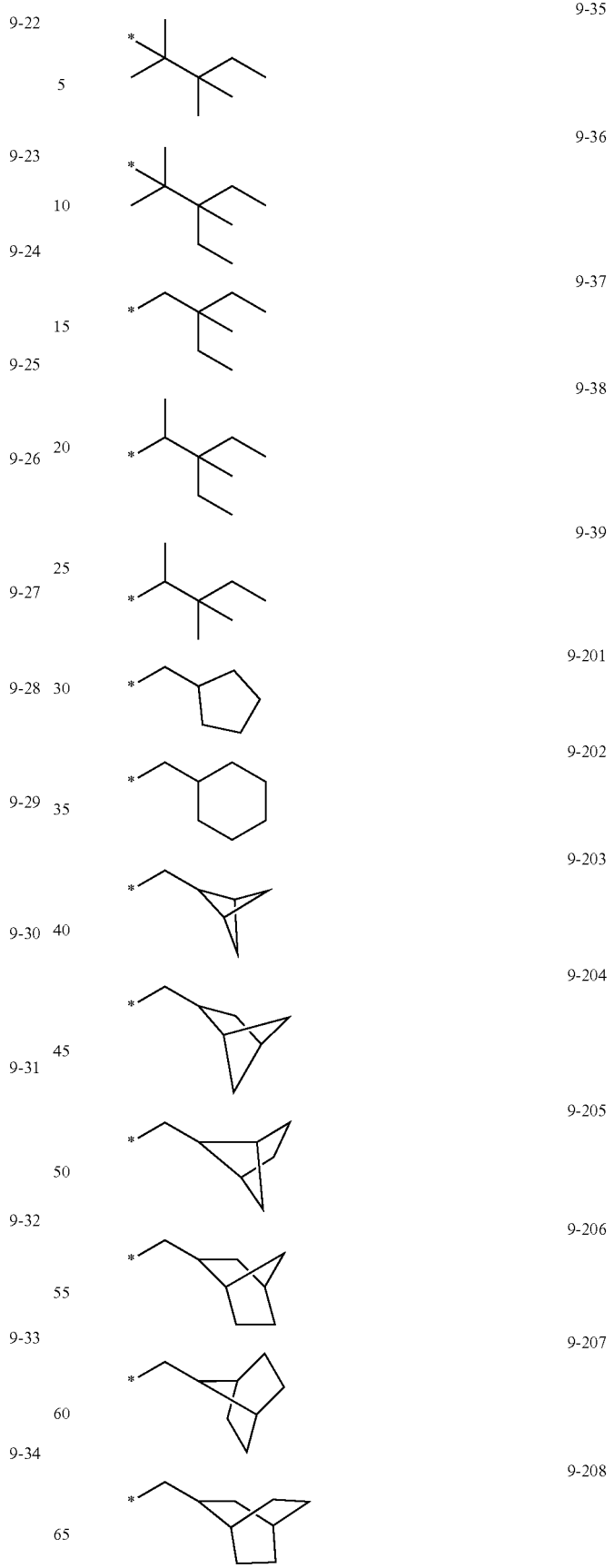

-continued
9-209 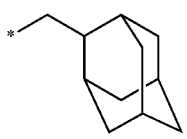
9-210 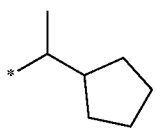
9-211 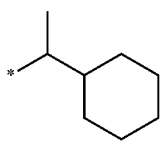
9-212 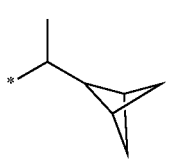
9-213 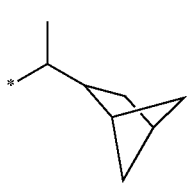
9-214 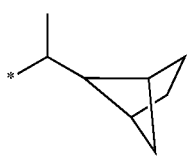
9-215 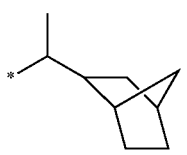
9-216 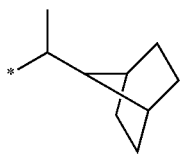
9-217 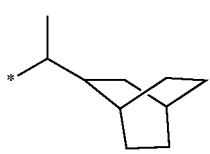
9-218 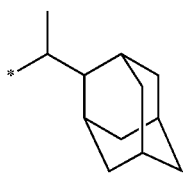
-continued
9-219 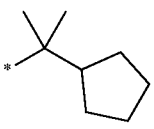
9-220 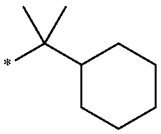
9-221 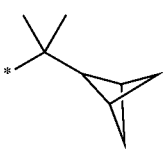
9-222 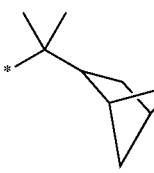
9-223 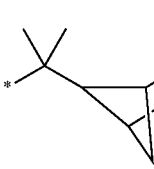
9-224 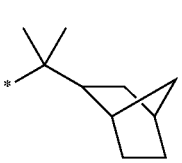
9-225 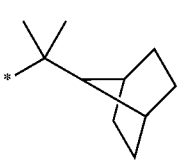
9-226 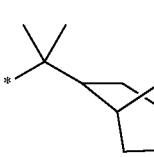
9-227 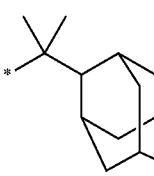
9-228 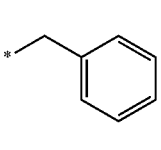

-continued
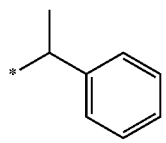
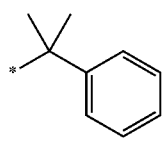
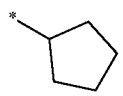
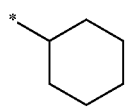
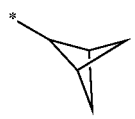
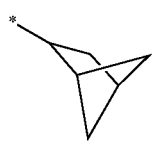
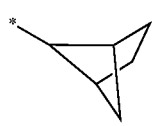
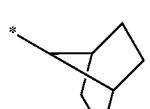
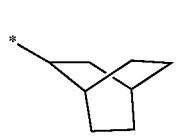
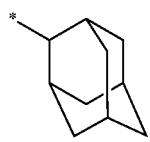
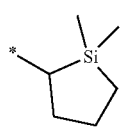
-continued
9-229
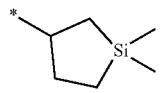
9-230
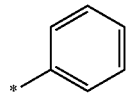
10-1
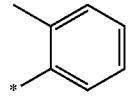
10-2
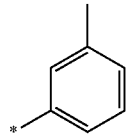
10-3
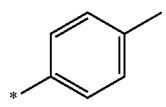
10-4
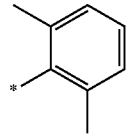
10-5
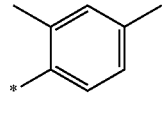
10-6
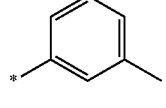
10-7
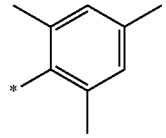
10-8
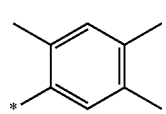
10-9
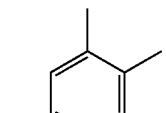
10-10
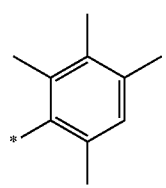
10-11
10-12
10-13
10-14
10-15
10-16
10-17
10-18
10-19
10-20
10-21
10-22

225
-continued
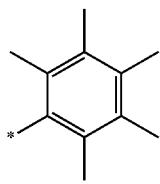
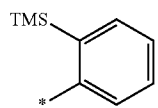  10-23
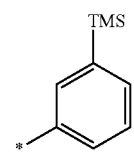  10-24
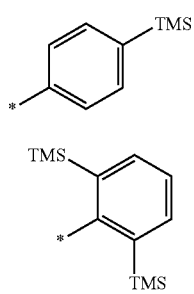  10-25
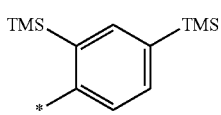  10-26
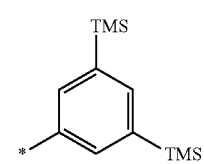  10-27
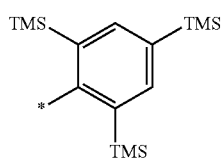  10-28
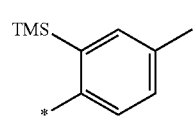  10-29
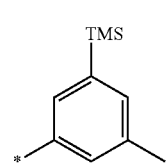  10-30
10-31
10-32
226
-continued
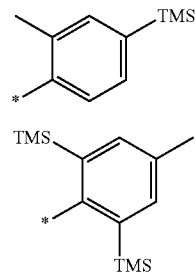  10-33
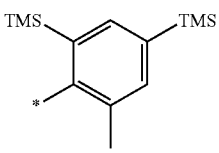  10-34
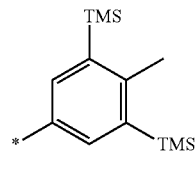  10-35
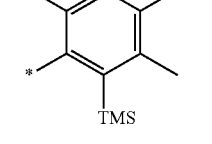  10-36
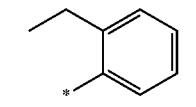  10-37
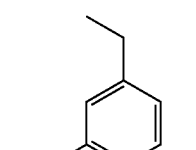  10-38
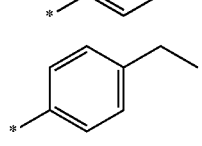  10-39
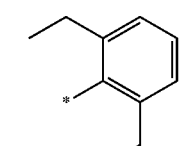  10-40
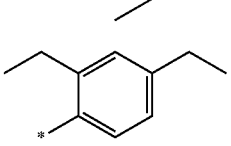  10-41
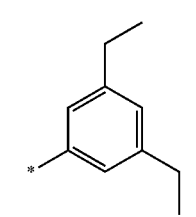  10-42
10-43

| | | | |
|---|---|---|---|
| 10-44 | 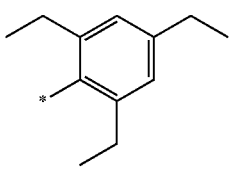 | 10-53 | 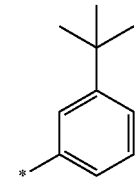 |
| 10-45 | 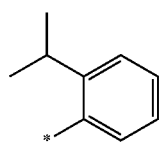 | 10-54 | 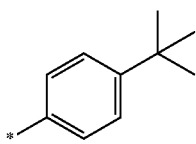 |
| 10-46 | 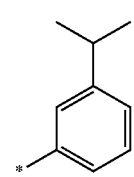 | 10-55 | 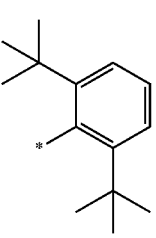 |
| 10-47 | 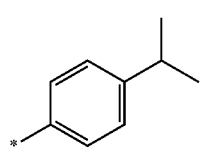 | 10-56 | 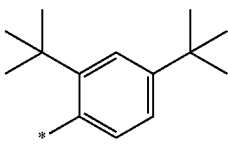 |
| 10-48 | 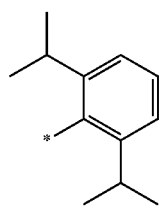 | 10-57 | 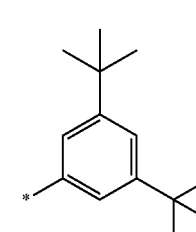 |
| 10-49 | 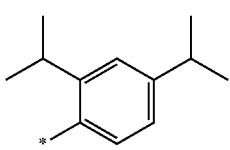 | 10-58 | 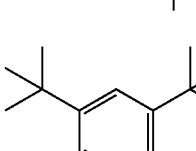 |
| 10-50 | 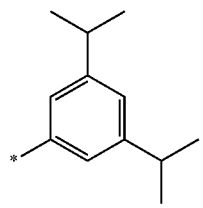 | 10-59 | 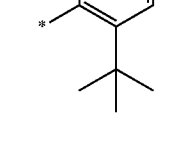 |
| 10-51 | 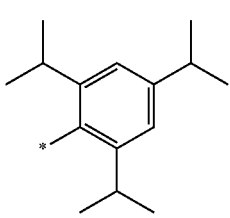 | 10-60 | 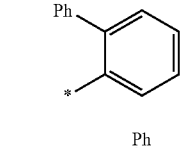 |
| 10-52 | 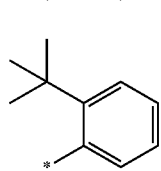 | 10-61 | 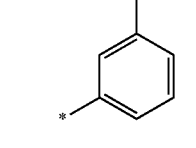 |

-continued
10-62
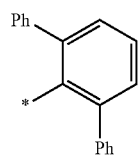
10-63
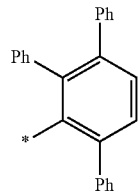
10-64
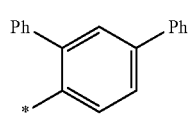
10-65
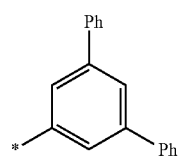
10-66
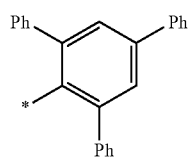
10-67
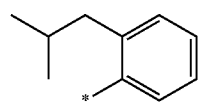
10-68
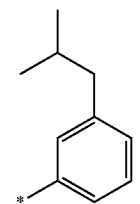
10-69
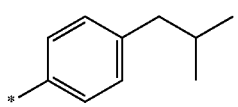
10-70
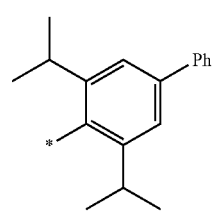
-continued
10-71
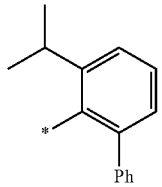
10-72
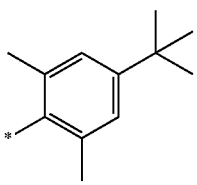
10-73
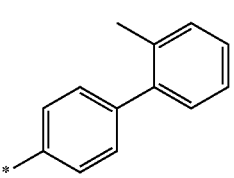
10-74
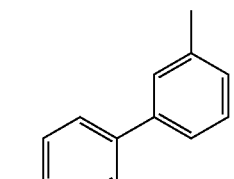
10-75
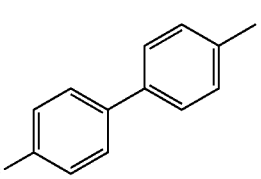
10-76
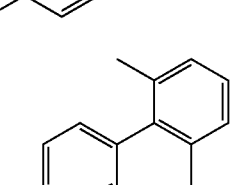
10-77
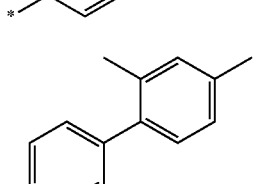
10-78
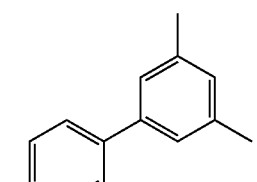

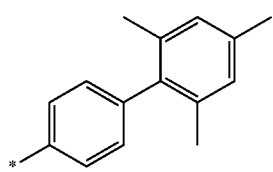
10-79
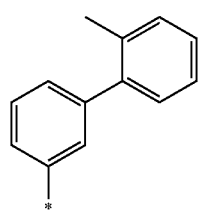
10-80
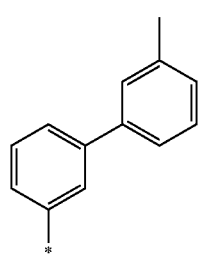
10-81
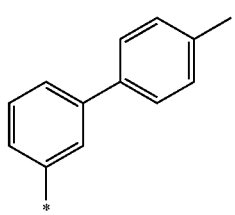
10-82
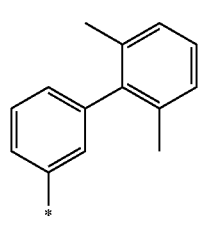
10-83
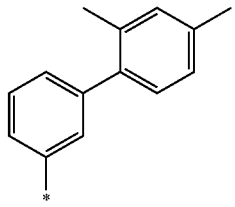
10-84
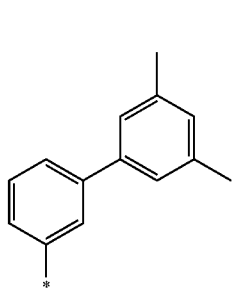
10-85
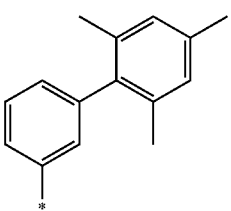
10-86
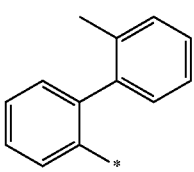
10-87
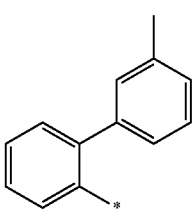
10-88
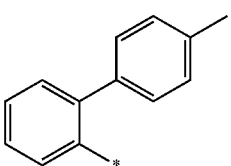
10-89
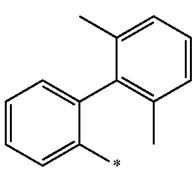
10-90
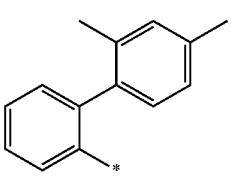
10-91
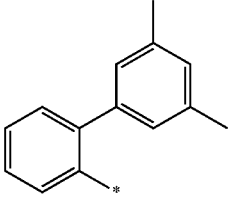
10-92
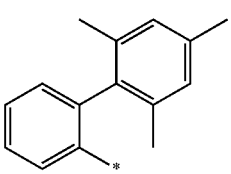
10-93

10-94 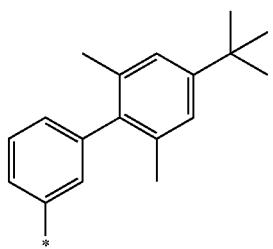
10-95 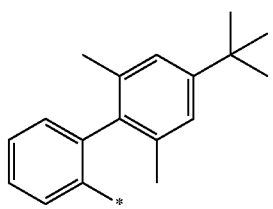
10-96 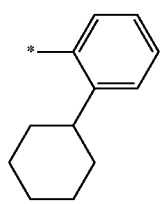
10-97 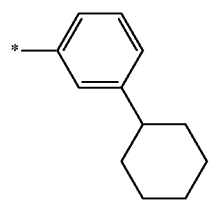
10-98 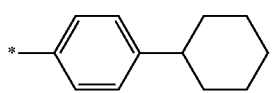
10-99 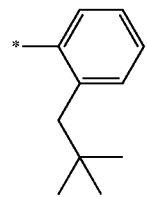
10-100 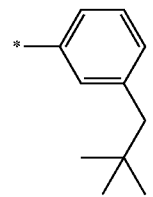
10-101 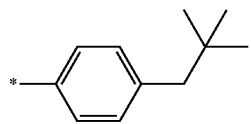
10-102 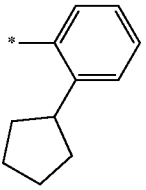
10-103 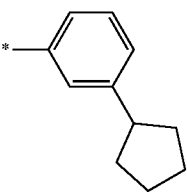
10-104 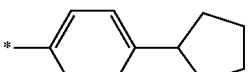
10-105 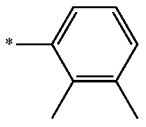
10-106 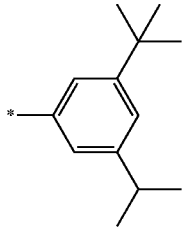
10-107 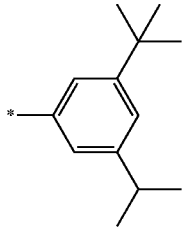
10-108 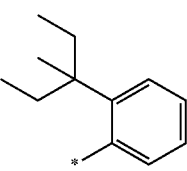
10-109 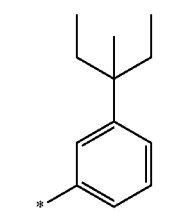
10-110 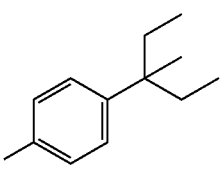

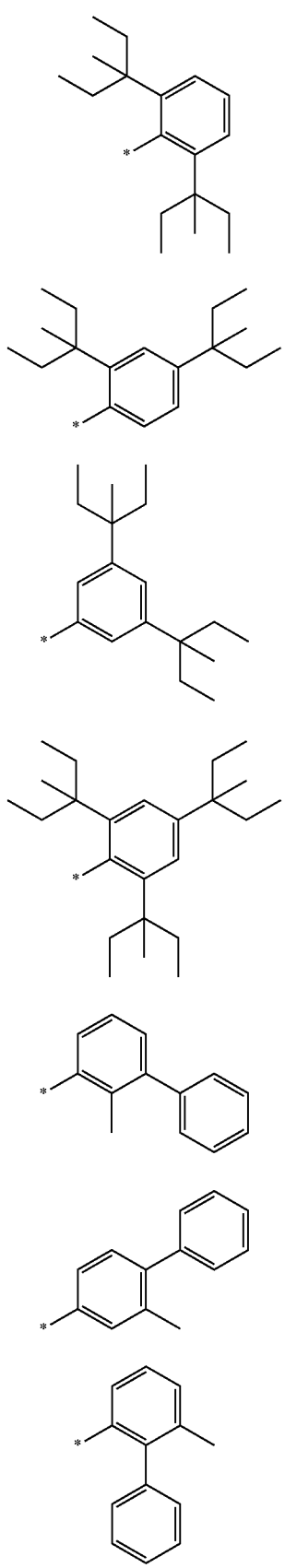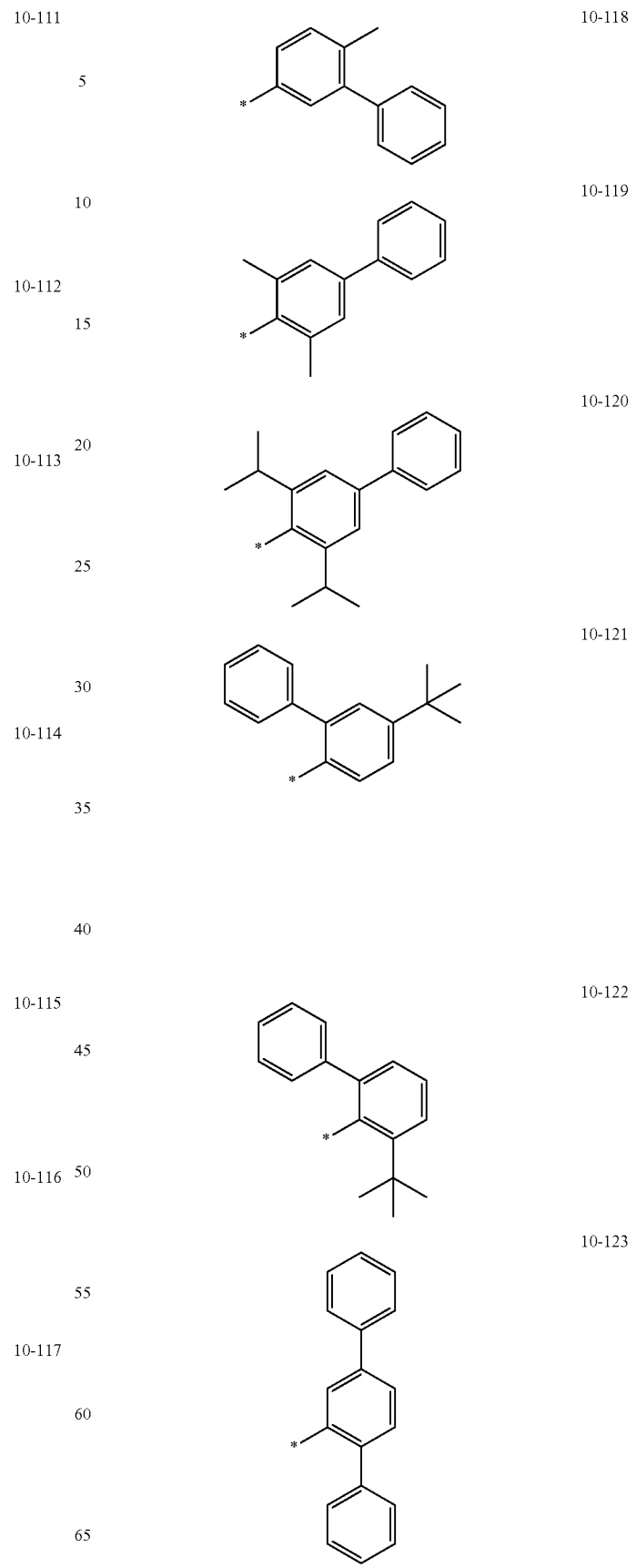

| | |
|---|---|
| 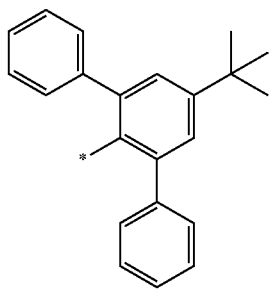 | 10-124 |
| 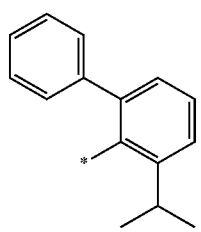 | 10-125 |
| 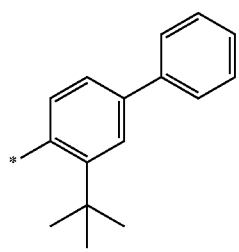 | 10-126 |
| 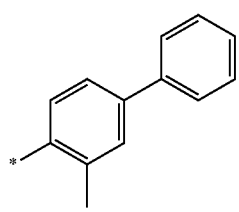 | 10-127 |
| 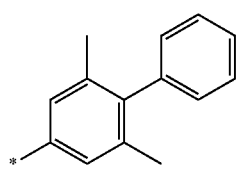 | 10-128 |
| 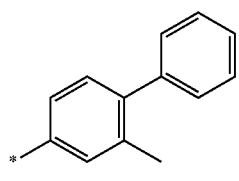 | 10-129 |
| 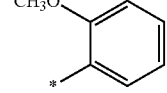 | 10-130 |
| 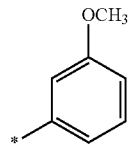 | 10-131 |
| 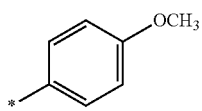 | 10-132 |
| 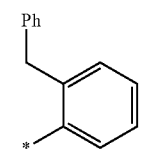 | 10-133 |
| 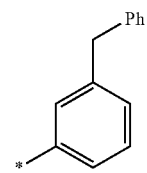 | 10-134 |
| 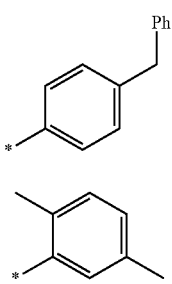 | 10-135 |
| 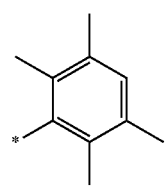 | 10-136 |
| 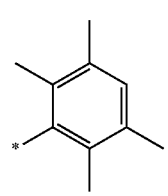 | 10-137 |
| 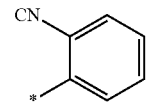 | 10-138 |
| 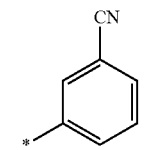 | 10-139 |
| 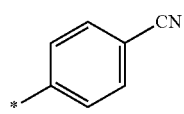 | 10-140 |

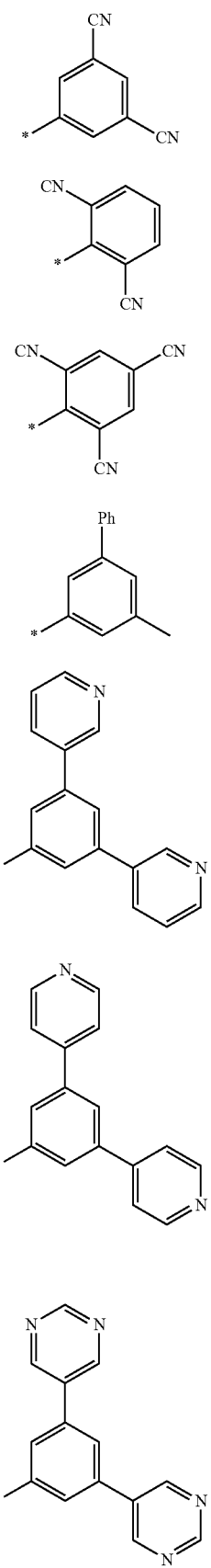
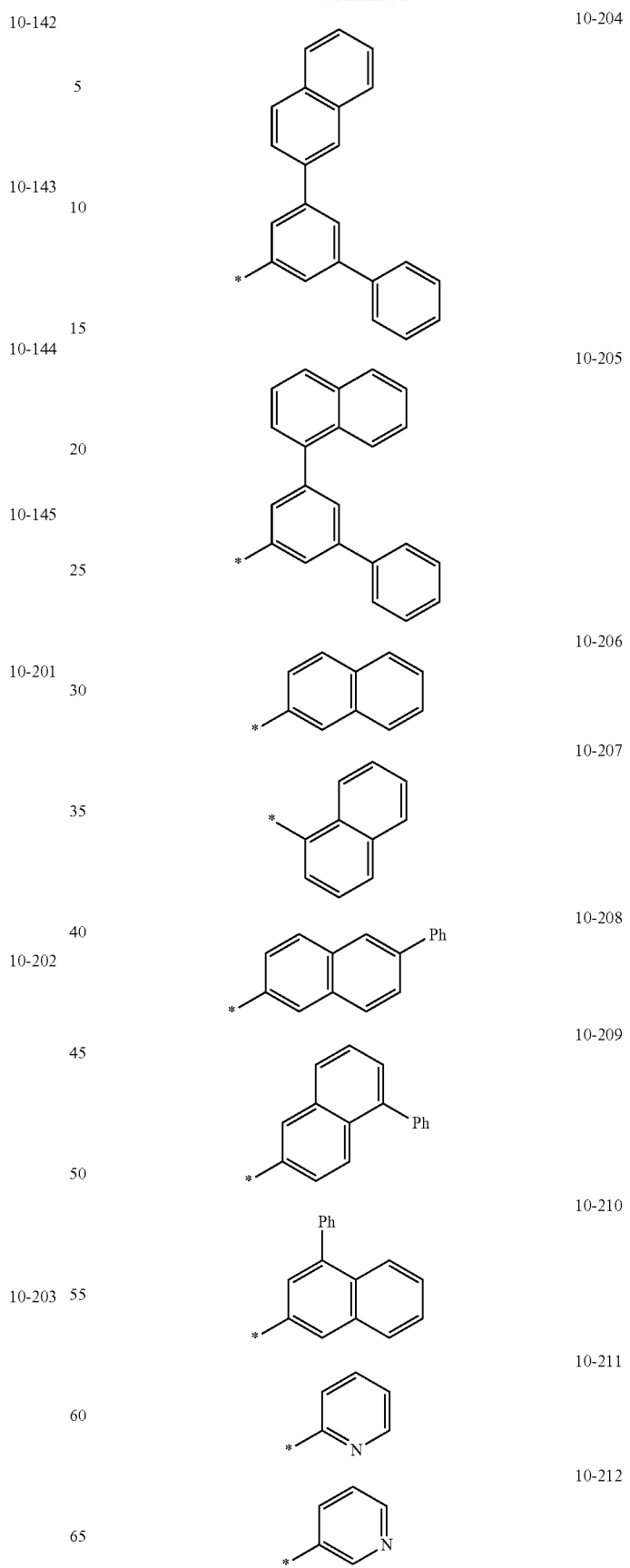

| | |
|---|---|
| 10-213 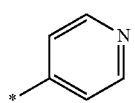 | 10-226 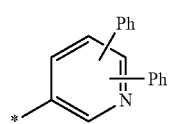 |
| 10-214 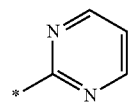 | 10-227 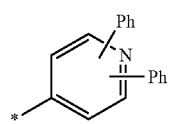 |
| 10-215 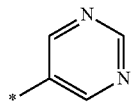 | 10-228 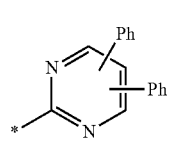 |
| 10-216 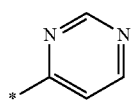 | 10-229 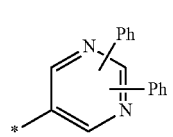 |
| 10-217 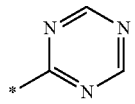 | 10-230 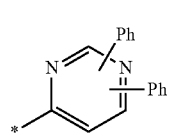 |
| 10-218 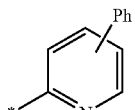 | 10-231 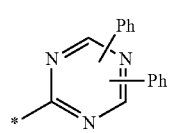 |
| 10-219 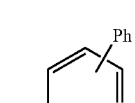 | 10-232 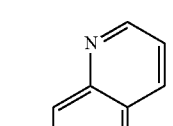 |
| 10-220 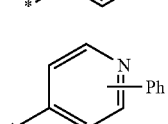 | 10-233 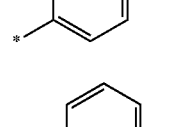 |
| 10-221 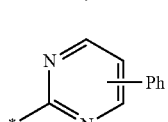 | 10-234  |
| 10-222 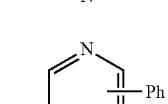 | 10-235 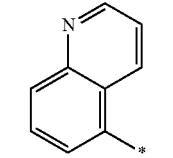 |
| 10-223 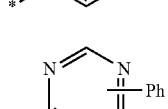 | |
| 10-224 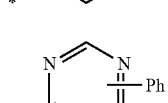 | |
| 10-225 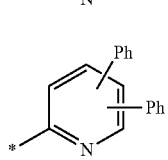 | |

10-236
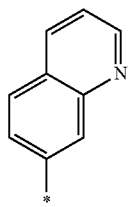
10-237
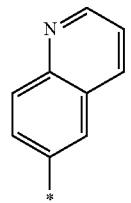
10-238
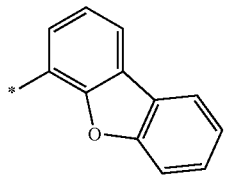
10-239
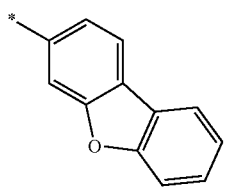
10-240
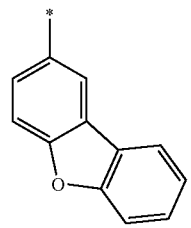
10-241
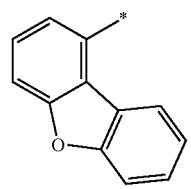
10-242
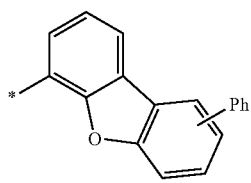
10-243
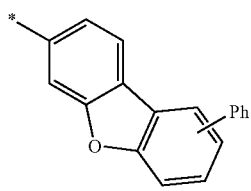
10-244
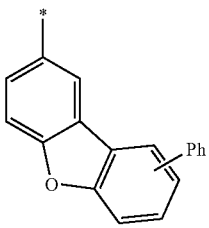
10-245
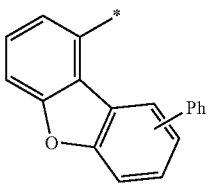
10-246
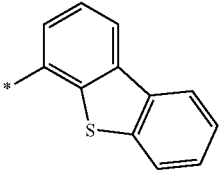
10-247
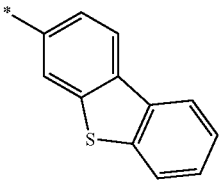
10-248
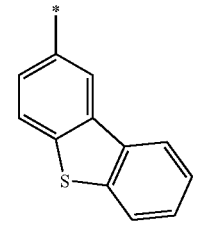
10-249
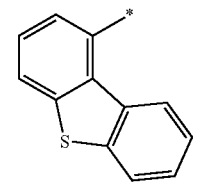
10-250
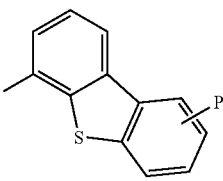
10-251
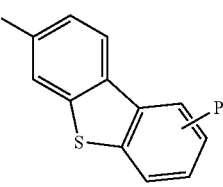

10-252 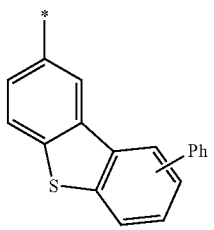
10-253 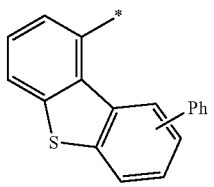
10-254 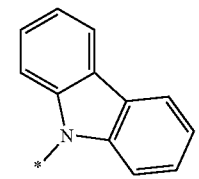
10-255 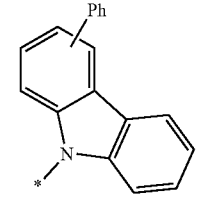
10-256 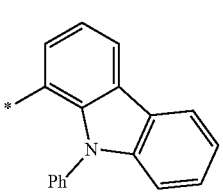
10-257 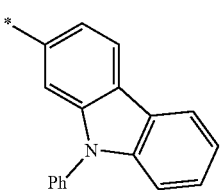
10-258 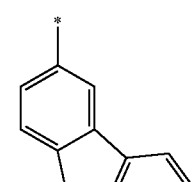
10-259 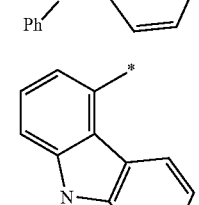
10-260 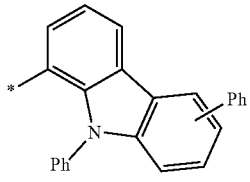
10-261 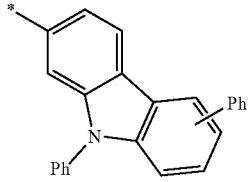
10-262 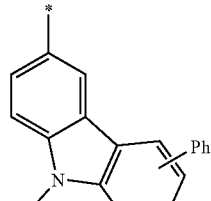
10-263 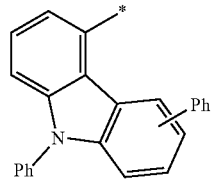
10-264 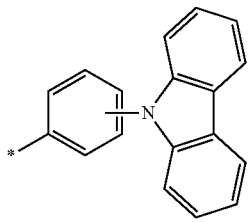
10-265 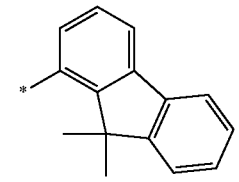
10-266 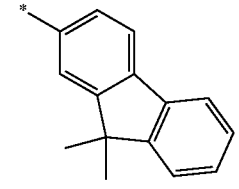

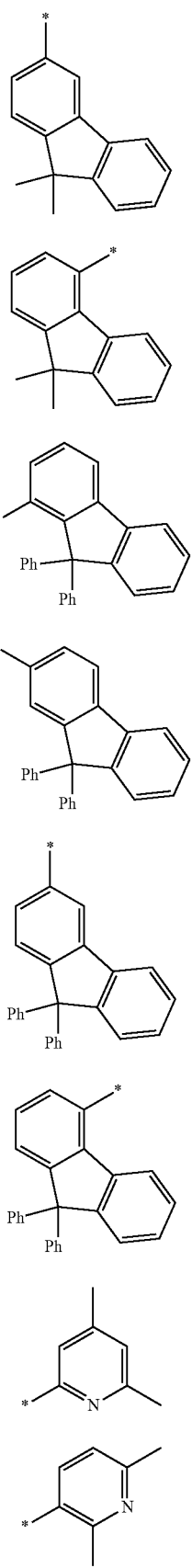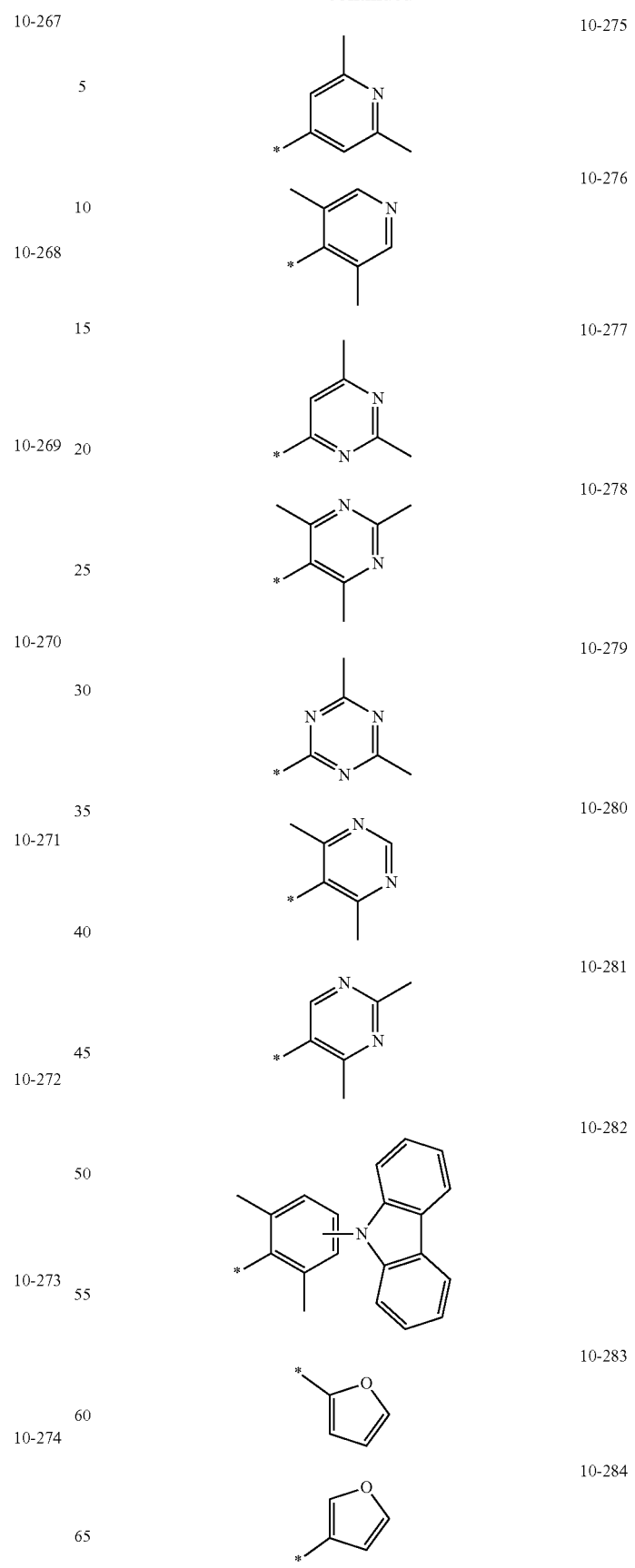

-continued
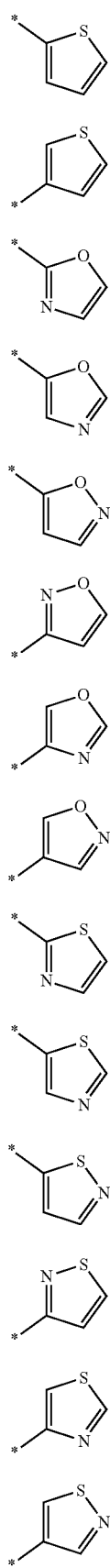
10-285
10-286
10-287
10-288
10-289
10-290
10-291
10-292
10-293
10-294
10-295
10-296
10-297
10-298
-continued
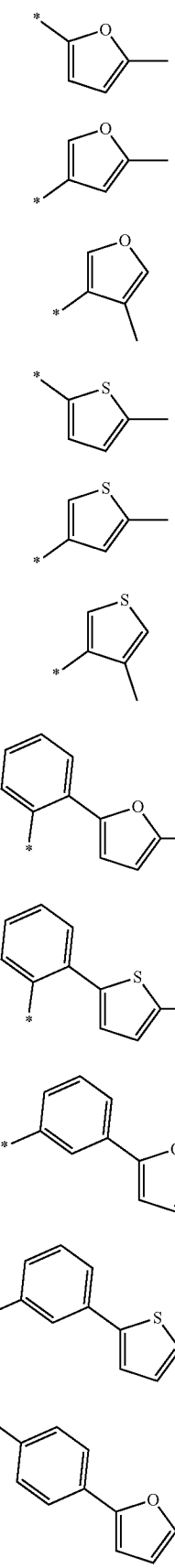
10-299
10-300
10-301
10-302
10-303
10-304
10-305
10-306
10-307
10-308
10-309

| | |
|---|---|
| 10-310 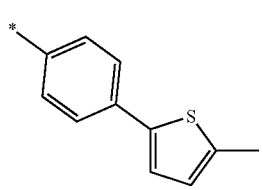 | 10-318 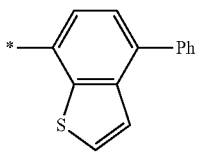 |
| 10-311 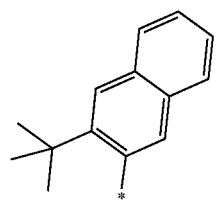 | 10-319 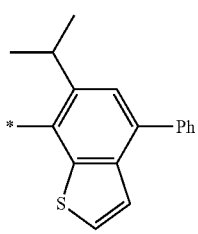 |
| 10-312 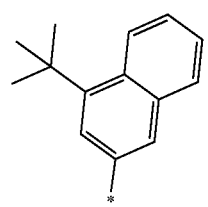 | 10-320 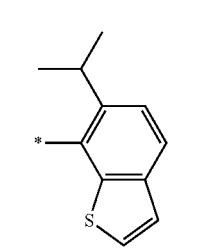 |
| 10-313 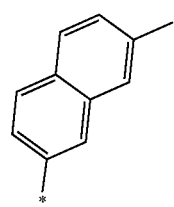 | 10-321 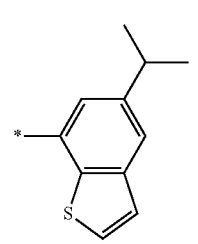 |
| 10-314 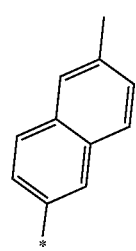 | 10-322 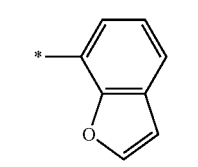 |
| 10-315 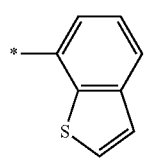 | 10-323 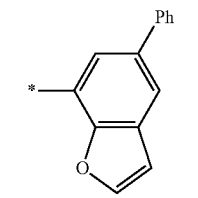 |
| 10-316 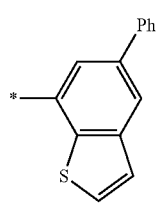 | 10-324 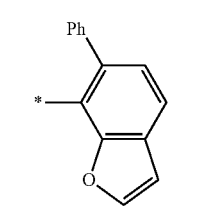 |
| 10-317 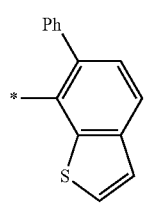 | 10-325 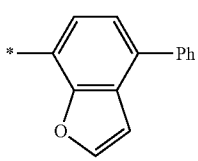 |

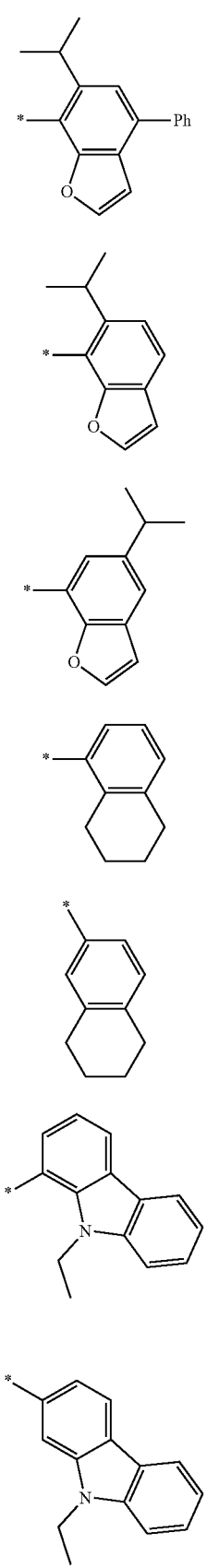
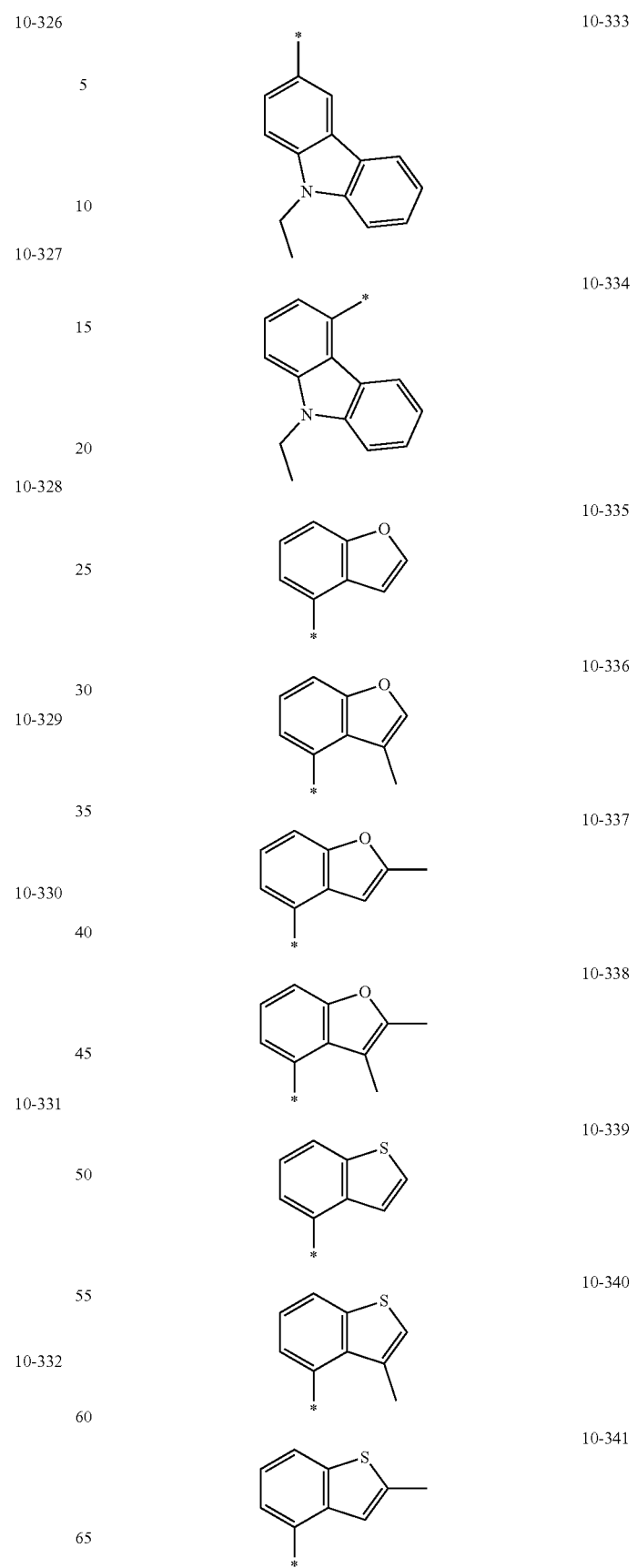

10-342 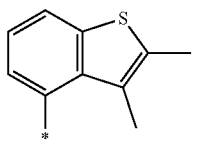
10-343 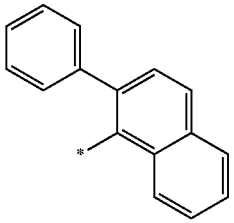
10-344 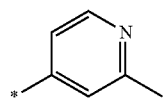
10-345 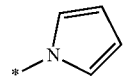
10-346 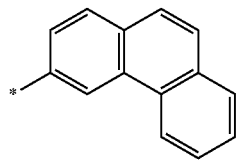
10-347 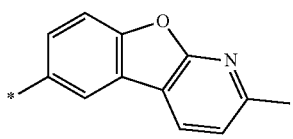
10-348 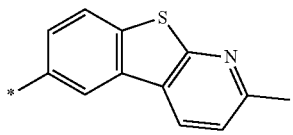
10-349 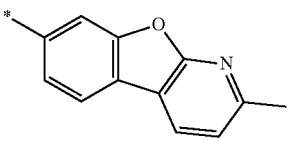
10-350 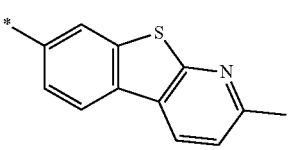
10-351 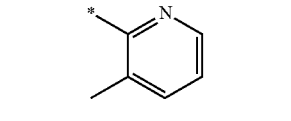
10-352 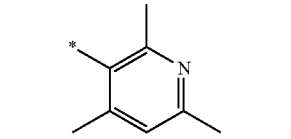
10-353 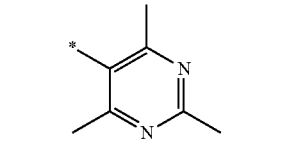
10-354 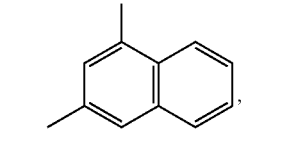
wherein * indicates a binding site to ring $CY_3$, Ph is a phenyl group, TMS is a trimethylsilyl group, TMG is a trimethylgermyl group, and OMe is a methoxy group.
22. An organometallic compound of claim 1, wherein a2 is 2 or more, and at least one of $R_2$(s) in a number of a2 is —Si($Q_3$)($Q_4$)($Q_5$) or —Ge($Q_3$)($Q_4$)($Q_5$).
* * * * *